US009052458B2

(12) United States Patent
Ushijima et al.

(10) Patent No.: US 9,052,458 B2
(45) Date of Patent: Jun. 9, 2015

(54) RADIATION-SENSITIVE COLORED COMPOSITION, COLORED CURED FILM, COLOR FILTER AND METHOD OF PRODUCING THE SAME, SOLID-STATE IMAGING DEVICE, LIQUID CRYSTAL DISPLAY APPARATUS, AND METHOD OF PRODUCING DYE

(75) Inventors: Kenta Ushijima, Shizuoka (JP); Junichi Itou, Shizuoka (JP); Yushi Kaneko, Shizuoka (JP); Yuzo Nagata, Shizuoka (JP); Yoshiharu Yabuki, Shizuoka (JP); Atsuyasu Nozaki, Shizuoka (JP); Hiroaki Idei, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/421,615

(22) Filed: Mar. 15, 2012

(65) Prior Publication Data

US 2012/0235099 A1 Sep. 20, 2012

(30) Foreign Application Priority Data

Mar. 17, 2011 (JP) ................................ P2011-059757

(51) Int. Cl.

| | |
|---|---|
| ***G02B 5/23*** | (2006.01) |
| ***G02B 5/22*** | (2006.01) |
| ***G02B 5/20*** | (2006.01) |
| ***G03F 7/027*** | (2006.01) |
| ***G03F 7/105*** | (2006.01) |
| ***G03F 7/038*** | (2006.01) |
| ***C09B 11/12*** | (2006.01) |
| ***C09B 11/24*** | (2006.01) |
| ***C09B 23/01*** | (2006.01) |
| ***C09B 23/04*** | (2006.01) |
| ***C09B 23/06*** | (2006.01) |
| ***C09B 29/01*** | (2006.01) |
| ***C09B 29/036*** | (2006.01) |
| ***C09B 29/52*** | (2006.01) |
| ***C09B 29/36*** | (2006.01) |
| ***C09B 33/044*** | (2006.01) |
| ***C09B 33/16*** | (2006.01) |
| ***C09B 45/16*** | (2006.01) |
| ***C09B 45/20*** | (2006.01) |
| ***C09B 47/00*** | (2006.01) |
| ***C09B 47/06*** | (2006.01) |
| ***C09B 47/067*** | (2006.01) |
| ***C09B 57/10*** | (2006.01) |
| ***C09B 69/00*** | (2006.01) |
| ***C09B 69/10*** | (2006.01) |
| ***C09B 1/22*** | (2006.01) |
| ***C09B 1/503*** | (2006.01) |
| ***C09B 1/515*** | (2006.01) |
| ***C09B 5/14*** | (2006.01) |
| ***C09B 5/16*** | (2006.01) |
| *G03F 1/00* | (2012.01) |
| *G03C 1/00* | (2006.01) |
| *G03F 7/00* | (2006.01) |

(52) U.S. Cl.

CPC ................ *G02B 5/223* (2013.01); *G02B 5/201* (2013.01); *G03F 7/0007* (2013.01); *G03F 7/027* (2013.01); *G03F 7/105* (2013.01); *G03F 7/0388* (2013.01); *C09B 11/12* (2013.01); *C09B 11/24* (2013.01); *C09B 23/0008* (2013.01); *C09B 23/0066* (2013.01); *C09B 23/04* (2013.01); *C09B 23/06* (2013.01); *C09B 29/0003* (2013.01); *C09B 29/0007* (2013.01); *C09B 29/0037* (2013.01); *C09B 29/3673* (2013.01); *C09B 29/3691* (2013.01); *C09B 33/044* (2013.01); *C09B 33/16* (2013.01); *C09B 45/16* (2013.01); *C09B 45/20* (2013.01); *C09B 47/00* (2013.01); *C09B 47/063* (2013.01); *C09B 47/065* (2013.01); *C09B 47/0675* (2013.01); *C09B 47/0678* (2013.01); *C09B 57/10* (2013.01); *C09B 69/00* (2013.01); *C09B 69/101* (2013.01); *C09B 69/103* (2013.01); *C09B 69/105* (2013.01); *C09B 69/106* (2013.01); *C09B 69/108* (2013.01); *C09B 69/109* (2013.01); *C09B 1/22* (2013.01); *C09B 1/503* (2013.01); *C09B 1/515* (2013.01); *C09B 5/14* (2013.01); *C09B 5/16* (2013.01)

(58) Field of Classification Search

USPC ............... 252/586; 349/106; 359/891; 430/7, 430/270.1, 281.1, 283.1, 285.1; 526/239, 526/241, 258, 259, 265, 266, 280, 312; 548/403

See application file for complete search history.

(56) References Cited

U.S. PATENT DOCUMENTS 7,901,851 B2 3/2011 Mizukawa et al.
8,389,185 B2 * 3/2013 Kaneko et al. .................... 430/7

(Continued)

FOREIGN PATENT DOCUMENTS

JP 08-085764 * 4/1996 .............. C09B 67/54
JP O8-120090 * 5/1996 ................. C08J 3/02

(Continued)

OTHER PUBLICATIONS

Office Action issued on Sep. 17, 2013 from the Japanese Patent Office in Japanese Application No. 2012-058978.

(Continued)

*Primary Examiner* — Bijan Ahvazi
(74) *Attorney, Agent, or Firm* — Sughrue Mion, PLLC

(57) ABSTRACT

The object of the present invention is to provide a radiation-sensitive colored composition which can suppress the generation of the contamination of the device. A radiation-sensitive colored composition includes: (A) a dye containing of from 10 ppm to 1000 ppm of a halogen ion; (B) a polymerizable compound; and (C) a solvent.

17 Claims, No Drawings

(56) References Cited

U.S. PATENT DOCUMENTS

| | | | | |
|---|---|---|---|---|
| 2005/0069810 | A1 | 3/2005 | Goto | |
| 2006/0262174 | A1* | 11/2006 | Aoai | 347/100 |
| 2007/0059638 | A1* | 3/2007 | Namba et al. | 430/270.1 |
| 2007/0117031 | A1* | 5/2007 | Mizukawa et al. | 430/7 |
| 2008/0076044 | A1 | 3/2008 | Mizukawa et al. | |
| 2010/0040963 | A1* | 2/2010 | Kanna et al. | 430/7 |
| 2012/0205599 | A1 | 8/2012 | Matsumoto et al. | |

FOREIGN PATENT DOCUMENTS

| | | | |
|---|---|---|---|
| JP | 11-194213 | A | 7/1999 |
| JP | 2005-099286 | A | 4/2005 |
| JP | 2006-323398 | A | 11/2006 |
| JP | 2007-138051 | A | 6/2007 |
| JP | 2008-292970 | A | 12/2008 |
| JP | 2010-018788 | A | 1/2010 |
| JP | 2011-095732 | A | 5/2011 |
| JP | 2012-013945 | A | 1/2012 |
| JP | 2012-032754 | A | 2/2012 |
| JP | 2012-046712 | A | 3/2012 |
| WO | 2011/027643 | A1 | 3/2011 |
| WO | WO 2011/040628 | A1 * | 4/2011 |

OTHER PUBLICATIONS

Japanese Office Action issued on Jan. 28, 2014 from the Japanese Patent Office in Japanese Application No. 2012-058978.

* cited by examiner

RADIATION-SENSITIVE COLORED COMPOSITION, COLORED CURED FILM, COLOR FILTER AND METHOD OF PRODUCING THE SAME, SOLID-STATE IMAGING DEVICE, LIQUID CRYSTAL DISPLAY APPARATUS, AND METHOD OF PRODUCING DYE

BACKGROUND OF THE INVENTION

1. Field of the Invention

The present invention relates to a dye suitable for color resists which are used for the formation of colored pixels, and a method of producing the dye, a radiation-sensitive colored composition using the dye, a color filter using the radiation-sensitive colored composition, a solid-state imaging device, and a liquid crystal display apparatus.

2. Description of the Related Art

Recently, the propagation of digital cameras and camera phones, and the like has resulted in a significantly increased demand for a solid-state imaging device such as a CCD image sensor. As a key device of these displays or optical devices, color filters have been used, and a demand for high sensitivity or miniaturization has been growing further. Such a color filter usually includes a colored pattern of three primary colors of Red (R), Green (G), and Blue (B), and plays a role for decomposing the transmitted light into three primary colors.

Colorants which are used for color filters are required to have the following properties in common. That is to say, colorants are needed, which have preferable optical absorption characteristics in view of color reproducibility; do not have the optical turbulence called heterogeneity of optical density which causes light scattering, color unevenness, and a coarse texture; have a good fastness property, for example heat resistance, light resistance, and the like, under environmental conditions of the production and the usage thereof; and have a high molar extinction coefficient which enables film thinning, and the like.

A pigment dispersion method can be mentioned as one of the methods of manufacturing the aforementioned color filter. A method of manufacturing color filters by photolithography or by inkjet method, using the pigment dispersion method, uses a pigment, and therefore is stable against light or heat. However, since the pigment itself is a particulate, problems termed light scattering, color unevenness, and coarseness frequently arise. To solve these problems, although the refinement into smaller pigment particles has been performed, there is a problem that it is difficult to achieve both the refinement into smaller particles and the dispersion stability.

The methods of manufacturing color filters which can be transformed these pigment dispersion methods include a method using a dye as a coloring material. Since dyes have been dissolved in resists, light scattering, color unevenness, and coarseness as in pigments can be suppressed. Although there was a problem that dyes have a lower heat resistance and light resistance as compared with pigments, recently, dyes having an excellent fastness property have been developed (for example, see JP2008-292970A and JP2010-18788A).

The dyes having an excellent fastness property as mentioned above are mainly synthetic dyes. When synthetic dyes are produced, since halogens are good detachable groups, from the viewpoint of synthesis, synthetic intermediates containing halogens are frequently used. On the other hand, since halogen ions may cause the contamination of the device at the time of producing color filters, the contents thereof need to be controlled in order not to be more than a certain amount. However, there is also a problem that the use of the raw materials not containing halogens leads to raising the level of difficulty of synthesis. For this reason, from the viewpoint of appropriate synthesis, it is preferable that synthetic dyes be produced with the contents of halogen ions being allowed to be not less than a certain amount.

When pigments are produced, reducing the content of a certain ionic impurity in order to manufacture a liquid crystal display element showing an excellent display performance has been studied (for example, see JP1999-194213A (JP-H11-194213A)).

SUMMARY OF THE INVENTION

However, a technological idea that focuses on the halogen ions contained in dyes, in which the contents thereof are controlled, thereby resulting in various advantages as described below, has not been disclosed.

Under such circumstances, the object of the present invention is to provide a radiation-sensitive colored composition which can decrease the contamination of the device even in a case of using synthetic dyes, and can suppress the generation of residual materials (hereinafter, in the present specification, appropriately referred to as “residues”) derived from the radiation-sensitive colored composition at the time of forming a patternwise colored cured film. In addition, the object is to provide a colored cured film in a high-definition pattern shape, a color filter including the colored cured film, and a solid-state imaging device and a liquid crystal display apparatus provided with the color filter. Further, the object is to provide a method of producing a dye containing of from 10 ppm to 1000 ppm of a halogen ion.

As a result of detailed studies, the present inventors found that by controlling the contents of the halogen ions contained in dyes to a certain amount, the contamination of the device can be suppressed, and further the generation of the residues at the time of forming a patternwise colored cured film can be suppressed. The present invention has been completed based on such findings.

The radiation-sensitive colored composition of the present invention which could solve the aforementioned problems is characterized by containing (A) a dye containing of from 10 ppm to 1000 ppm of a halogen ion, (B) a polymerizable compound, and (C) a solvent.

In the present invention, it is a preferred embodiment that the dye (A) is a colorant multimer, the dye (A) is a colorant multimer containing a repeating unit having an ethylenically unsaturated bond, and that the dye (A) is at least one selected from a group consisting of a dipyrromethene colorant, an azo colorant, an anthraquinone colorant, a triphenylmethane colorant, a xanthene colorant, a cyanine colorant, a squarylium colorant, a quinophthalone colorant, a phthalocyanine colorant and a subphthalocyanine colorant. In the present invention, it is a preferred embodiment that the halogen ion is a bromide ion, and that the radiation-sensitive colored composition further contains (D) a polymerization initiator.

In addition, it is also a preferred embodiment that the radiation-sensitive colored composition of the present invention further contains a pigment, and that the radiation-sensitive colored composition of the present invention further contains an alkali-soluble resin.

The present invention also includes a colored cured film obtained by curing the aforementioned radiation-sensitive colored composition, and a color filter including the colored cured film, a solid-state imaging device equipped with the color filter, and a liquid crystal display apparatus equipped with the color filter.

In the radiation-sensitive colored composition of the present invention, it is also a preferred embodiment that the dye (A) is a dye obtained through a dissolution process of dissolving the dye in a good solvent, and a reprecipitation process of adding a solution of the dye dropwise to a poor solvent to reprecipitate the dye, and that the dye (A) is a dye obtained through a dissolution process of dissolving the dye in a heated solvent, and a reprecipitation process of cooling a solution of the dye to reprecipitate the dye.

The present invention also includes a method of producing (A) a dye containing of from 10 ppm to 1000 ppm of a halogen ion, which includes a dissolution process of dissolving the dye in a good solvent, and a reprecipitation process of adding a solution of the dye dropwise to a poor solvent to reprecipitate the dye, and a method of producing (A) a dye containing of from 10 ppm to 1000 ppm of a halogen ion, which includes a dissolution process of dissolving the dye in a heated solvent, and a reprecipitation process of cooling a solution of the dye to reprecipitate the dye.

The present invention also includes a method of producing a color filter, which includes (A) applying the aforementioned radiation-sensitive colored composition onto a support to form a radiation-sensitive colored composition layer, and (B) exposing the radiation-sensitive colored composition layer formed in the process (A) via a mask, and then developing the exposed layer to form a patternwise colored cured film.

The present invention can provide a radiation-sensitive colored composition which can decrease the contamination of the device even in a case of using synthetic dyes, and can suppress the generation of the residues at the time of forming a patternwise colored cured film. In addition, the present invention can provide a colored cured film in a high-definition pattern shape, a color filter including the colored cured film, and a solid-state imaging device and a liquid crystal display apparatus equipped with the color filter. Further, the present invention can provide a method of producing a dye containing of from 10 ppm to 1000 ppm of a halogen ion.

DESCRIPTION OF THE PREFERRED EMBODIMENTS

Hereinafter, the radiation-sensitive colored composition, the color filter, the solid-state imaging device, and the liquid crystal display apparatus of the present invention will be described in detail. While the explanation of the constitutional requirements which will be described below is based on the representative embodiments of the present invention, the present invention is not intended as being limited to such embodiments.

In addition, in the present specification, a numerical range represented by using "to" means a range which embraces the numerical values described before and after the "to" as a lower limit and an upper limit.

In the present specification, the "alkyl group" represents a "linear, branched, and cyclic" alkyl group. In addition, in the present specification, when a group (atomic group) is denoted without specifying whether substituted or unsubstituted, the group includes not only a group having no substituent but also a group having a substituent. For example, the term "alkyl group" includes not only an alkyl group having no substituent (an unsubstituted alkyl group) but also an alkyl group having a substituent (a substituted alkyl group).

In addition, in the present specification,"(meth)acrylate" represents both of acrylate and methacrylate, or either one of them, and "(meth)acrylic" represents both of acrylic and methacrylic, or either one of them, and "(meth)acryloyl" represents both acryloyl and methacryloyl, or either one of them.

The monomer in the present specification refers to a compound having a weight-average molecular weight of 2,000 or less, which is differentiated from an oligomer and a polymer. In the present specification, the term polymerizable compound refers to a compound having a polymerizable functional group, and may be a monomer, an oligomer or a polymer. The term polymerizable functional group refers to a group involved in a polymerization reaction.

The term "process" in the present specification includes not only an independent process but also a case where the desired effect of a process is achieved even if it cannot be clearly distinguished from other processes.

In the present invention, the term "radiation" has a meaning of including visible rays, ultraviolet rays, extreme ultraviolet rays, electron beams, and X-rays, and the like.

The present invention relates to a radiation-sensitive colored composition which contains (A) a dye containing of from 10 ppm to 1000 ppm of a halogen ion, (B) a polymerizable compound, and (C) a solvent.

The effect of the present invention is presumed as follows, although it is not certain.

That is to say, it is presumed that when a colored pattern is formed by using a radiation-sensitive colored composition by exposing and heating, and the like, the halogen ions contained in the radiation-sensitive colored composition change into a hydrogen halide gas (for example, hydrogen bromide gas or hydrogen chloride gas), which causes the contamination of the device. In addition, it is presumed that when the halogen ions contained in the radiation-sensitive colored composition reach not less than a certain proportion, a ligand exchange occurs between the halogen ions and the dye, and the balance between hydrophilicity and hydrophobicity of the dye is broken and inclines toward hydrophobicity, and thereby the developing property decreases and the residues increase. It is considered that in the present invention, the content of halogen ions in the radiation-sensitive colored composition is set to a certain proportion, which suppresses or reduces the aforementioned problems.

The radiation-sensitive colored composition, the color filter, the solid-state imaging device and liquid crystal display apparatus of the present invention will be described in detail below.

<<Radiation-Sensitive Colored Composition>>

The radiation-sensitive colored composition of the present invention contains (A) a dye containing of from 10 ppm to 1000 ppm of a halogen ion, (B) a polymerizable compound, and (C) solvent, and may further contain other components as necessary.

Hereinafter, each component which constitutes the radiation-sensitive colored composition of the present invention will be described.

<(A) Dye>

The dye (A) used in the radiation-sensitive colored composition of the present invention is a monomer which contains a partial structure derived from a colorant compound, or a multimer which contains a partial structure derived from a colorant compound.

Among the dyes (A) contained in the radiation-sensitive colored composition of the present invention, the term "colorant multimer" means that the multimer has two or more partial structures derived from a colorant compound (hereinafter, referred to as the "colorant structure" in some cases) in the molecule. That is to say, the term "colorant multimer" includes structures of a dimer, a trimer, a polymer, and the like.

In addition, it is preferable that the dye (A) used in the radiation-sensitive colored composition of the present invention be a dye containing of from 10 ppm to 1000 ppm of a halogen ion, which is obtained through a dissolution process of dissolving the dye in a good solvent, and a reprecipitation process of adding a solution of the dye dropwise to a poor solvent to reprecipitate the dye.

In addition, it is also preferable that the dye be a dye containing of from 10 ppm to 1000 ppm of a halogen ion, which is obtained through a dissolution process of dissolving the dye in a heated solvent, and a reprecipitation process of cooling a solution of the dye to reprecipitate the dye.

If the dye (A) used in the radiation-sensitive colored composition of the present invention has a maximum absorption wavelength in a solvent in which the dye is dissolved, of a range of from 300 nm to 700 nm, it is not particularly limited.

The dye (A) used in the radiation-sensitive colored composition of the present invention can use a variety of compounds including known dye compounds. Examples of the known colorant compounds can include azo compounds, azomethine compounds (indoaniline compounds, indophenol compounds, and the like), dipyrromethene compounds, quinone-based compounds (benzoquinone compounds, naphthoquinone compounds, anthraquinone compounds, anthrapyridone compounds, and the like), carbonium compounds (diphenylmethane compounds, triphenylmethane compound, xanthene compounds, acridine compounds, and the like), quinoneimine compounds (oxazine compound, thiazine compounds, and the like), azine compounds, polymethine compounds (oxonol compounds, merocyanine compounds, arylidene compounds, styryl compounds, cyanine compounds, especially squarylium compounds from the cyanine compounds, croconium compounds, and the like), quinophthalone compounds, phthalocyanine compounds, subphthalocyanine compounds, perinone compounds, indigo compounds, thioindigo compounds, quinoline compounds, nitro compounds, nitroso compounds and dye compounds derived from the metal complex dyes thereof, and the like. Among these dye compounds, from the viewpoints of the color characteristics, anthraquinone compounds, perylene compounds, diketopyrrolopyrrole compounds, bisazo compounds, isoindoline compounds, quinophthalone compounds, halogenated phthalocyanine compounds, azomethine compounds, dioxazine compounds, dipyrromethene compounds, and the like are preferable, and further dipyrromethene compounds are more preferable. The specific dye compounds have been described in "New edition of Handbook of Dyes" (edited by The Society of Synthetic Organic Chemistry; Maruzen, 1970), "Colour Index" (The Society of Dyers and Colourists), "Pigment Handbooks" (edited by Okawara, et. al., Kodansha, 1986), and the like.

The content of dyes is preferably 10% by mass to 70% by mass and more preferably 10% by mass to 50% by mass, based on a total solid content of the radiation-sensitive colored composition.

The colorant multimer may contain two or more colorant structures in the molecule, and preferably contain a repeating unit having a colorant structure.

In addition, the colorant multimer may also contain other repeating units, in addition to the repeating unit having a colorant structure.

Examples of the other repeating units include a repeating unit having an ethylenically unsaturated bond, a repeating unit having an alkali-soluble group, and a repeating unit having a hydrophilic group. From viewpoints of decrease of the device contamination and the suppression of the generation of the residues, a repeating unit having an ethylenically unsaturated bond is preferable.

Examples of the partial structures derived from the colorant compound contained in the colorant multimer include the partial structures derived from those exemplified in the colorant compound. From the viewpoints of the color characteristics, as a colorant compound, colorant compounds selected from azo compounds (hereinafter, also referred to as "azo colorants"), dipyrromethene compounds (hereinafter, also referred to as "dipyrromethene colorants"), carbonium compounds (hereinafter, also referred to as "carbonium colorants"), polymethine compounds (hereinafter, also referred to as "polymethine colorants"), and phthalocyanine compounds (hereinafter, also referred to as "phthalocyanine colorants") are preferable; colorant compounds selected from dipyrromethene colorants, azo colorants, and phthalocyanine colorants are more preferable; colorant compounds selected from dipyrromethene colorants and phthalocyanine colorants are still more preferable; and dipyrromethene colorants are particularly preferable. The partial structures derived from these colorant compounds are preferably used for the Dye (A) of the present invention.

Hereinbelow, among the colorant compounds, the colorant compounds which can suitably be used for the radiation-sensitive colored composition of the present invention, will be described in detail.

<Dipyrromethene Compound>

Examples of the colorant compounds include a dipyrromethene compound, and a dipyrromethene metal complex compound obtained from a dipyrromethene compound and a metal or a metal compound is preferable.

The aforementioned dipyrromethene metal complex compound is preferably a dipyrromethene metal complex compound and a tautomer thereof, obtained from a dipyrromethene compound represented by the following general formula (M) and a metal or a metal compound, and among them, as a preferred embodiment, a dipyrromethene metal complex compound represented by the following general formula (7) or a dipyrromethene metal complex compound represented by the following general formula (8) is most preferable.

(A Dipyrromethene Metal Complex Compound and a Tautomer Thereof, obtained from a dipyrromethene compound represented by the following general formula (M) and a metal or a metal compound)

One preferred embodiment of the dye structures of the present invention is a dye structure having, as a dye site, a complex wherein a compound represented by the following general formula (M) (a dipyrromethene compound) or a tautomer thereof is coordinated to a metal or a metal compound (hereinafter, appropriately referred to as "a specific complex").

Furthermore, in the present invention, a compound having a dipyrromethene structure is referred to as a dipyrromethene compound, and a complex wherein a compound having a dipyrromethene structure is coordinated to a metal or a metal compound, is referred to as a dipyrromethene metal complex compound.

(M)

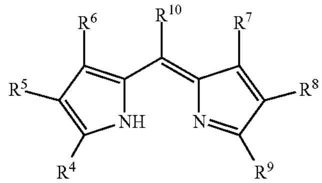

In the general formula (M), $R^4$ to $R^{10}$) each independently represent a hydrogen atom or a monovalent substituent, with the proviso that $R^4$ and $R^9$ do not bond to each other to form a ring.

In a case where $R^4$ to $R^9$ in the general formula (M) represent a monovalent substituent, examples of the monovalent substituent include a substituent group (which will be hereinafter also referred to as a "substituent group A"), such as a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group, and the like. These will be described in detail.

Specific examples of the substituent group A include halogen atoms (such as a fluorine atom, a chlorine atom, a bromine atom, and an iodine atom), an alkyl group (a linear, branched chain or cyclic alkyl group having preferably 1 to 48, more preferably 1 to 24 carbon atoms, such as a methyl group, an ethyl group, a propyl group, an n-propyl group, an isopropyl group, a butyl group, a t-butyl group, a pentyl group, a hexyl group, a heptyl group, an octyl group, an n-octyl group, a 2-chloroethyl group, a 2-cyanoethyl group, a 2-ethylhexyl group, a dodecyl group, a hexadecyl group, a cyclopropyl group, a cyclopentyl group, a cyclohexyl group, a 1-norbornyl group and a 1-adamantyl group), an alkenyl group (a linear, branched, or cyclic alkenyl group having preferably 2 to 48, more preferably 2 to 18 carbon atoms, such as a vinyl group, an allyl group and a 3-buten-1-yl group), a furenyl group, a geranyl group, an oleyl group, a 2-cyclopenten-1-yl group, a 2-cyclohexen-1-yl group, a bicycloalkenyl group (such as bicyclo[2,2,1]hept-2-en-1-yl and bicyclo [2,2,2]oct-2-en-4-yl groups), and a tricycloalkenyl group), alkynyl groups (preferably substituted or unsubstituted alkynyl groups having 2 to 30 carbon atoms, for example, an ethynyl group, a propargyl group, and a trimethylsilylethynyl group), an aryl group (an aryl group having preferably 6 to 48, more preferably 6 to 24 carbon atoms, such as a phenyl group, a p-tolyl group, a naphthyl group, an m-chlorophenyl group, and an o-hexadecanoylaminophenyl group), a heterocyclic group (a heterocyclic group having preferably 1 to 32, more preferably 1 to 18 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group and a benzotriazol-1-yl group), a silyl group (a silyl group having preferably 3 to 28, more preferably 3 to 18, such as a trimethylsilyl group, a triethylsilyl group, a tributylsilyl group, a t-butylekmethylsilyl group, a t-hexyldimethylsilyl group), a hydroxyl group, a cyano group, a nitro group, an alkoxy group (an alkoxy group having preferably 1 to 48, more preferably 1 to 24 carbon atoms, such as a methoxy group, an ethoxy group, a 1-butoxy group, a 2-butoxy group, an isopropoxy group, a t-butoxy group, an n-octyloxy group, a 2-methoxyethoxy group, a dodecyloxy group, and cycloalkyloxy groups having preferably 1 to 48, more preferably 1 to 24 carbon atoms, such as a cyclopentyloxy group and a cyclohexyloxy group), an aryloxy group (an aryloxy group having preferably 6 to 48, more preferably 6 to 24 carbon atoms, such as a phenoxy group, a 1-naphthoxy group, a 2-methylphenoxy group, a 2,4-di-t-amylphenoxy group, a 4-t-butylphenoxy group, a 3-nitrophenoxy group, a 2-tetradecanoylaminophenoxy group), a heterocyclic oxy group (a heterocyclic oxy group having preferably 1 to 32, more preferably 1 to 18 carbon atoms, such as a 1-phenyltetrazole-5-oxy group and a 2-tetrahydropyranyloxy group), silyloxy groups (preferably silyloxy groups having 1 to 32 carbon atoms, and more preferably silyloxy groups having 1 to 18 carbon atoms, for example, a trimethylsilyloxy group, a t-butyldimethylsilyloxy group, and a diphenylmethylsilyloxy group), an acyloxy group (an acyloxy group having preferably 2 to 48, more preferably 2 to 24 carbon atoms, such as an acetoxy group, a pivaloyloxy group, a benzoyloxy group, a dodecanoyloxy group, a formyloxy group, an acetyloxy group, a stearoyloxy group, and a p-methoxyphenylcarbonyloxy group), an alkoxycarbonyloxy group (an alkoxycarbonyloxy group having preferably 2 to 48, more preferably 2 to 24 carbon atoms, such as a methoxycarbonyloxy group, an ethoxycarbonyloxy group, a t-butoxycarbonyloxy group, an n-octylcarbonyloxy group, and a cycloalkyloxycarbonyloxy group having preferably 2 to 48, more preferably 2 to 24 carbon atoms, such as a cyclohexyloxycarbonyloxy group), an aryloxycarbonyloxy group (an aryloxycarbonyloxy group having preferably 7 to 32, more preferably 7 to 24 carbon atoms, such as a phenoxycarbonyloxy group, a p-methoxyphenoxycarbonyloxy group, and a p-n-hexadecyloxyphenoxycarbonyloxy group), a carbamoyloxy group (a carbamoyloxy group having preferably 1 to 48, more preferably 1 to 24 carbon atoms, such as an N,N-di methylcarbamoyl oxy group, an N-butylcarbamoyloxy group, an N-phenylcarbamoyloxy group, an N-ethyl-N-phenylcarbamoyloxy group, an N,N-diethylcarbamoyloxy group, a morpholinecarbonyloxy group, an N,N-di-n-octylaminocarbonyl oxy group, and an N-n-octylcarbamoyloxy group), sulfamoyloxy groups (preferably sulfamoyloxy groups having 1 to 32 carbon atoms, and more preferably sulfamoyloxy groups having 1 to 24 carbon atoms, for example, an N,N-diethylsulfamoyloxy group and an N-propylsulfamoyloxy group), alkylsulfonyloxy groups (preferably alkylsulfonyloxy groups having 1 to 38 carbon atoms, and more preferably alkylsulfonyloxy groups having 1 to 24 carbon atoms, for example, a methylsulfonyloxy group, a hexadecylsulfonyloxy group, and a cyclohexylsulfonyloxy group), arylsulfonyloxy groups (preferably arylsulfonyloxy groups having 6 to 32 carbon atoms, and more preferably arylsulfonyloxy groups having 6 to 24 carbon atoms, for example, a phenylsulfonyloxy group), an acyl group (an acyl group having preferably 1 to 48, more preferably 1 to 24 carbon atoms, such as a formyl group, an acetyl group, a pivaloyl group, a benzoyl group, a tetradecanoyl group, a cyclohexanoyl group, a 2-chloroacetyl group, a stearoyl group, and a p-n-octyloxyphenylcarbonyl group), an alkoxycarbonyl group (an alkoxycarbonyl group having preferably 2 to 48, more preferably 2 to 24 carbon atoms, such as a methoxycarbonyl group, an ethoxycarbonyl group, an octadecyloxycarbonyl group, a t-butoxycarbonyl group, a cyclohexyloxycarbonyl group and a 2,6-di-tert-butyl-4-methylcyclohexyloxycarbonyl group), an aryloxycarbonyl group (an aryloxycarbonyl group having preferably 7 to 32, more preferably 7 to 24 carbon atoms, such as a phenoxycarbonyl group, an o-chlorophenoxycarbonyl group, an m-nitrophenoxycarbonyl group, and a p-t-butylphenoxycarbonyl group), a carbamoyl group (a carbamoyl group having preferably 1 to 48, more preferably 1 to 24 carbon atoms, such as a carbamoyl group, an N-methylcarbamoyl group, an N,N-dimethylcarbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, a N-methyl-N-phenylcarbamoyl group and an N,N-dicyclohexylcarbamoyl group, an N,N-di-n-octylcarbamoyl group, and an N-(methylsulfonyl)carbamoyl group), an amino group (an amino group having preferably 32 or less, more preferably 24 or less carbon atoms, such as an amino group, a methylamino group, an N,N-dibutylamino group, a tetradecylamino group, a 2-ethylhexylamino group and a cyclohexylamino group, a dimethylamino group, an anilino group, an N-methyl-anilino group, a diphenylamino group, and an N-1,3,5-triazin-2-ylamino group), acylamino groups (preferably formylamino groups, substituted or unsubstituted alkyl carbonyl amino groups having 1 to 30 carbon atoms, and substituted or unsubstituted arylcarbonylamino groups having 6 to 30 carbon atoms, for example, formylamino, acetylamino, pivaloylamino, lauroylamino, benzoylamino, and 3,4,5-tri-n-octyloxyphenylcarbonylamino), aminocarbonylamino groups (preferably substituted or unsubstituted aminocarbonylamino groups having 1 to 30 carbon atoms, for example, carbamoylamino, N,N-dimethylaminocarbonylamino, N,N-diethylaminocarbonylamino, and morpholinecarbonylamino), an anilino group (an anilino group having preferably 6 to 32, more preferably 6 to 24 carbon atoms, such as an anilino group and an N-methylanilino group), a heterocyclic amino group (a heterocyclic amino group having preferably 1 to 32, more preferably 1 to 18 carbon atoms, such as a 4-pyridylamino group), a carbonamide group (a carbonamide group having preferably 2 to 48, more preferably 2 to 24 carbon atoms, such as an acetamide group, a benzamide group, a tetradecanamide group, a pivaloylamide group and a cyclohexanamide group), an ureido group (an ureido group having preferably 1 to 32, more preferably 1 to 24 carbon atoms, such as an ureido group, an N,N-dimethylureido group and an N-phenylureido group), an imide group (an imide group having preferably 36 or less, more preferably 24 or less carbon atoms, such as an N-succinimide group and an N-phthalimide group), an alkoxycarbonylamino group (an alkoxycarbonylamino group having preferably 2 to 48, more preferably 2 to 24 carbon atoms, such as a methoxycarbonylamino group, an ethoxycarbonylamino group, a t-butoxycarbonylamino group, an octadecyloxycarbonylamino group, a cyclohexyloxycarbonylamino group, and an N-methyl-methoxycarbonylamino group), an aryloxycarbonylamino group (an aryloxycarbonylamino group having preferably 7 to 32, more preferably 7 to 24 carbon atoms, such as an phenoxycarbonylamino group, a p-chlorophenoxycarbonylamino group, and an m-n-octyloxyphenoxycarbonylamino group), sulfonamide groups (preferably sulfonamide groups having 1 to 48 carbon atoms, and more preferably sulfonamide groups having 1 to 24 carbon atoms, for example, a methane sulfonamide group, a butanesulfonamide group, a benzene sulfonamide group, a hexadecanesulfoneamide group, and a cyclohexane sulfonamide group), sulfamoylamino groups (preferably sulfamoylamino groups having 1 to 48 carbon atoms, and more preferably sulfamoylamino groups having 1 to 24 carbon atoms, for example, an N,N-dipropylsulfamoylamino group, an N-ethyl-N-dodecylsulfamoylamino group, a sulfamoylamino group, an N,N-dimethylaminosulfonylamino group, and an N-n-octylaminosulfonylamino group), alkyl or arylsulfonylamino groups (preferably substituted or unsubstituted alkylsulfonylamino group having 1 to 30 carbon atoms and substituted or unsubstituted arylsulfonylamino groups having 6 to 30 carbon atoms, for example, methylsulfonylamino, butylsulfonylamino, phenylsulfonylamino, 2,3,5-trichlorophenylsulfonylamino, and p-methylphenylsulfonylamino), mercapto groups, azo groups (preferably azo groups having 1 to 32 carbon atoms, and more preferably azo groups having 1 to 24 carbon atoms, for example, a phenylazo group, a 3-pyrazolylazo group, a p-chlorophenylazo group, and a 5-ethylthio-1,3,4-thiadiazol-2-ylazo group), an alkylthio group (an alkylthio group having preferably 1 to 48, more preferably 1 to 24 carbon atoms, such as a methylthio group, an ethylthio group, an octylthio group, a cyclohexylthio group and an n-hexadecylthio group), an arylthio group (an arylthio group having preferably 6 to 48, more preferably 6 to 24 carbon atoms, such as a phenylthio group, a p-chlorophenylthio group, and an m-methoxyphenylthio group), a heterocyclic thio group (a heterocyclic thio group having preferably 1 to 32, more preferably 1 to 18 carbon atoms, such as a 2-benzothiazolylthio group, a 2-pyridylthio group, and a 1-phenyltetrazolylthio group), alkylsulfinyl groups (preferably alkylsulfinyl groups having 1 to 32 carbon atoms, and more preferably alkylsulfinyl groups having 1 to 24 carbon atoms, for example, a methylsulfinyl group, an ethylsulfinyl group, and a dodecanesulfinyl group), arylsulfinyl groups (preferably arylsulfinyl groups having 6 to 32 carbon atoms, and more preferably arylsulfinyl groups having 6 to 24 carbon atoms, for example, a phenylsulfinyl group, a p-methylphenylsulfinyl group), alkylsulfonyl groups (preferably alkylsulfonyl groups having 1 to 48 carbon atoms, and more preferably alkylsulfonyl groups having 1 to 24 carbon atoms, for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, and a cyclohexylsulfonyl group), arylsulfonyl groups (preferably arylsulfonyl groups having 6 to 48 carbon atoms, and more preferably arylsulfonyl groups having 6 to 24 carbon atoms, for example, a phenylsulfonyl group, a 1-naphthylsulfonyl group, and a p-methylphenylsulfonyl group), sulfamoyl groups (preferably sulfamoyl groups having 32 or less carbon atoms, and more preferably sulfamoyl groups having 24 or less carbon atoms, for example, a sulfamoyl group, an N,N-dipropylsulfamoyl group, an N-ethyl-N-dodecylsulfamoyl group, an N-ethyl-N-phenylsulfamoyl group, an N-cyclohexylsulfamoyl group, an N-ethylsulfamoyl group, an N-(3-dodecyloxy propyl)sulfamoyl group, an N,N-dimethylsulfamoyl group, an N-acetylsulfamoyl group, an N-benzoylsulfamoyl group, and an N—(N'-phenylcarbamoyl)sulfamoyl group), a sulfo group, phosphonyl groups (preferably phosphonyl groups having 1 to 32 carbon atoms, and more preferably phosphonyl groups having 1 to 24 carbon atoms, for example, a phenoxyphosphonyl group, an octyloxyphosphonyl group, and a phenylphosphonyl group), phosphinoylamino groups (preferably phosphinoylamino groups having 1 to 32 carbon atoms, and more preferably phosphinoylamino groups having 1 to 24 carbon atoms, for example, a diethoxyphosphinoylamino group and a dioctyloxyphosphinoylamino group), phosphino groups (preferably substituted or unsubstituted phosphino groups having 2 to 30 carbon atoms, for example, dimethylphosphino, diphenylphosphino, and methylphenoxyphosphino), phosphinyl groups (preferably substituted or unsubstituted phosphinyl groups having 2 to 30 carbon atoms, for example, phosphinyl, dioctyloxyphosphinyl, and diethoxyphosphinyl), phosphinyloxy groups (preferably substituted or unsubstituted phosphinyloxy groups having 2 to 30 carbon atoms, for example, diphenoxyphosphinyloxy and dioctyloxyphosphinyloxy), phosphinylamino groups (preferably substituted or unsubstituted phosphinylamino groups having 2 to 30 carbon atoms, for example, dimethoxyphosphinylamino and dimethylaminophosphinylamino), and silyl groups (preferably substituted or unsubstituted silyl groups having 3 to 30 carbon atoms, for example, trimethylsilyl, t-butyldimethylsilyl, and phenyldimethylsilyl).

In a case where the monovalent substituent represented by $R^4$ to $R^9$ in the general formula (M) is a group that can be further substituted, it may further have the substituents mentioned in the substituent group A; and in a case where it has two or more substituents, these substituents may be the same as or different from each other.

$R^4$ and $R^5$, $R^5$ and $R^6$, $R^7$ and $R^8$, and $R^5$ and $R^9$ in the general formula (M) may each independently bond to each other to form a 5-, 6- or 7-membered saturated or unsaturated ring, with the proviso that $R^4$ and $R^9$ do not bond to each other to form a ring. In a case where the 5-, 6-, or 7-membered ring formed is a group which can be further substituted, it may be substituted with the substituents mentioned in the substituent group A, and in a case where it is substituted with two or more substituents, these substituents may be the same as or different from each other.

In a case where $R^4$ and $R^5$, $R^5$ and $R^6$, $R^7$ and $R^8$, and $R^8$ and $R^9$ in the general formula (M) may each independently bond to each other to form a 5-, 6- or 7-membered saturated or unsaturated ring having no substituent, examples of the 5-, 6- or 7-membered saturated or unsaturated ring having no substituent include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, preferably a benzene ring, and a pyridine ring.

$R^{10}$ in the general formula (M) preferably represents a hydrogen atom, a halogen atom, an alkyl group, an aryl group, or a heterocyclic group, and the halogen atom, the alkyl group, the aryl group and the heterocyclic group each have the same definition as the substituents mentioned in the substituent group A, and the preferable ranges thereof are also the same.

In a case where $R^{10}$ in the general formula (M) preferably represents an alkyl group, an aryl group, or a heterocyclic group, wherein the alkyl group, the aryl group, or the heterocyclic group is a group that can be further substituted, it may be substituted with the substituents mentioned in the substituent group A, and in a case where it is substituted with two or more substituents, these substituents may be the same as or different from each other.

—Metal or Metal Compound—

The specific complex in the present invention is the complex wherein the compound represented by the general formula (M) or a tautomer thereof is coordinated to a metal or a metal compound.

The metal or the metal compound as used herein may be any metal or metal compound so long as it can form a complex, and examples thereof include bivalent metal atoms, bivalent metal oxides, bivalent metal hydroxides, or bivalent metal chlorides. Examples of the metal or the metal compound include Zn, Mg, Si, Sn, Rh, Pt, Pd, Mo, Mn, Pb, Cu, Ni, Co, Fe and the like, as well as metal chlorides such as AlCl, InCl, FeCl, $TiCl_2$, $SnCl_2$, $SiCl_2$ and $GeCl_2$, metal oxides such as TiO and VO, and metal hydroxides such as $Si(OH)_2$.

Among them, from the viewpoints of the stability, spectroscopic properties, heat resistance, light resistance, and production efficiency of the complex, and the like Fe, Zn, Mg, Si, Pt, Pd, Mo, Mn, Cu, Ni, Co, TiO, or VO are preferable, Zn, Mg, Si, Pt, Pd, Cu, Ni, Co, or VO are more preferable, and Zn is most preferable.

Hereinafter, further preferable ranges of the specific complex in the present invention of the compound represented by the general formula (M) will be described.

The preferable range of the specific complex in the present invention is a range wherein in the general formula (M), $R^4$ and $R^9$ each independently represent a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, an ureido group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group, $R^5$ and $R^8$ each independently represent a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group, $R^6$ and $R^7$ each independently represent a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, an ureido group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group, and $R^{10}$ represents a hydrogen atom, a halogen atom, an alkyl group, an aryl group, or a heterocyclic group, and the metal or the metal compound is Zn, Mg, Si, Pt, Pd, Mo, Mn, Cu, Ni, Co, TiO, or VO.

The more preferable range of the specific complex in the present invention is a range wherein in the general formula (M), $R^4$ and $R^9$ each independently represent a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamide group, an ureido group, an imide group, an alkoxycarbonylamino group, an aryloxycarbonylamino group, a sulfonamide group, an azo group, an alkylsulfonyl group, an arylsulfonyl group, or a phosphinoylamino group, $R^5$ and $R^8$ each independently represent an alkyl group, an alkenyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an arylsulfonyl group, or a sulfamoyl group, $R^6$ and $R^7$ each independently represent a hydrogen atom, an alkyl group, an alkenyl group, an aryl group, a heterocyclic group, a cyano group, an acyl group, an alkoxycarbonyl group, a carbamoyl group, a carbonamide group, an ureido group, an imide group, an alkoxycarbonylamino group, a sulfonamide group, an alkylthio group, an arylthio group, a heterocyclic thio group, an alkylsulfonyl group, an arylsulfonyl group, or a sulfamoyl group, and $R^{10}$ represents a hydrogen atom, a halogen atom, an alkyl group, an aryl group, or a heterocyclic group, and the metal or the metal compound is Zn, Mg, Si, Pt, Pd, Cu, Ni, Co, or VO.

The particularly preferable range of the specific complex in the present invention is a range wherein in the general formula (M), $R^4$ and $R^9$ each independently represent a hydrogen atom, an alkyl group, an aryl group, a heterocyclic group, an amino group, a heterocyclic amino group, a carbonamide group, an ureido group, an imide group, an alkoxycarbonylamino group, a sulfonamide group, an azo group, an alkylsulfonyl group, an arylsulfonyl group, or a phosphinoylamino group, $R^5$ and $R^8$ each independently represent an alkyl group, an aryl group, a heterocyclic group, a cyano group, an acyl group, an alkoxycarbonyl group, a carbamoyl group, an alkylsulfonyl group, or an arylsulfonyl group, $R^6$ and $R^7$ each independently represent a hydrogen atom, an alkyl group, an aryl group, a heterocyclic group, and $R^{10}$ represents a hydrogen atom, an alkyl group, an aryl group, or a heterocyclic group, and the metal or the metal compound is Zn, Cu, Co, or VO.

Further, an embodiment as represented by the general formula (7) or the general formula (8) is also a particularly preferable embodiment.

(Dipyrromethene Metal Complex Compound Represented by the General Formula (7))

One of the embodiments of the dye structures of the present invention is a dipyrromethene metal complex compound represented by the following general formula (7).

(7)

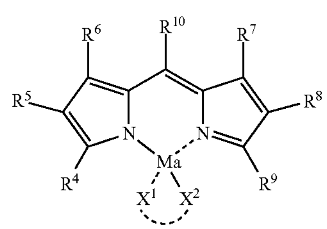

In the general formula (7), $R^4$ to $R^9$ each independently represent a hydrogen atom, or a monovalent substituent, $R^{10}$ represents a hydrogen atom, a halogen atom, an alkyl group, an aryl group, or a heterocyclic group. Ma represents a metal atom, or a metal compound. $X^1$ represents a group capable of bonding to Ma, and $X^2$ represents a group which neutralizes the charge of Ma, and $X^1$ and $X^2$ may bond to each other, together with Ma, to form a 5-, 6- or 7-membered ring, with the proviso that $R^4$ and $R^9$ do not bond to each other to form a ring.

Furthermore, the dipyrromethene metal complex compound represented by the general formula (7) includes a tautomer thereof.

$R^4$ to $R^9$ in the general formula (7) have the same definitions as $R^4$ to $R^9$ in the general formula (M), and the preferable embodiments thereof are also the same.

Ma in the general formula (7) represents a metal atom or a metal compound. The metal atom or the metal compound may be any metal atom or metal compound so long as it can form a complex, and examples thereof include bivalent metal atoms, bivalent metal oxides, bivalent metal hydroxides, or bivalent metal chlorides.

Examples thereof include Zn, Mg, Si, Sn, Rh, Pt, Pd, Mo, Mn, Pb, Cu, Ni, Co, Fe and the like, and metal chlorides such as AlCl, InCl, FeCl, $TiCl_2$, $SnCl_2$, $SiCl_2$ and $GeCl_2$, metal oxides such as TiO and VO, and metal hydroxides such as $Si(OH)_2$.

Among them, from the viewpoints of the stability, spectroscopic properties, heat resistance, light resistance, and production efficiency of the complex, and the like, as the metal or the metal compound, Fe, Zn, Mg, Si, Pt, Pd, Mo, Mn, Cu, Ni, Co, TiO, and VO are preferable, Zn, Mg, Si, Pt, Pd, Cu, Ni, Co, and VO are more preferable, Zn, Co, VO, and Cu are particularly preferable, and Zn is most preferable.

In the general formula (7), $R^{10}$ represents a hydrogen atom, a halogen atom, an alkyl group, an aryl group, or a heterocyclic group, and is preferably a hydrogen atom.

$X^1$ in the general formula (7) may be any group so long as it is capable of bonding to Ma, and specific examples thereof include water, alcohols (for example, methanol, ethanol, propanol), and the like, and further, the compounds described in "Metal Chelates" ([1] Takeichi Sakaguchi and Kyohei Ueno (1995 Nankodo), [2] (1996), [3] (1997), and the like). Among them, from the viewpoint of the production, water, a carboxylic acid compound, and alcohols are preferable, and water and a carboxylic acid compound are more preferable.

In the general formula (7), examples of the "group which neutralizes the charge of Ma" represented by $X^2$ include a halogen atom, a hydroxyl group, a carboxylic acid group, a phosphoric acid group, a sulfonic acid group, and the like. Among them, from the viewpoint of production, a halogen atom, a hydroxyl group, a carboxylic acid group, and a sulfonic acid group are preferable, and a hydroxyl group and a carboxylic acid are more preferable.

In the general formula (7), $X^1$ and $X^2$ may bond to each other, together with Ma, to form a 5-, 6- or 7-membered ring. The 5-, 6- or 7-membered ring formed may be a saturated or unsaturated ring. In addition, the 5-, 6- or 7-membered ring may be composed of only carbon atoms, or may form a heterocycle having at least one atom selected from a nitrogen atom, an oxygen atom, or/and a sulfur atom.

As a preferred embodiment of the compound represented by the general formula (7), $R^4$ to $R^9$ each independently are preferred embodiments as described for $R^4$ to $R^9$; $R^{10}$ is a preferred embodiment as described for $R^{10}$; Ma is Zn, Cu, Co, or VO; $X^1$ is water, or a carboxylic acid compound; $X^2$ is a hydroxyl group, or a carboxylic acid compound, and $X^1$ and $X^2$ may bond to each other to form a 5- or 6-membered ring.

(Dipyrromethene Metal Complex Compound Represented by the General Formula (8))

One of the embodiments of the dye structures used in the radiation-sensitive colored composition of the present invention is a dipyrromethene metal complex compound represented by the following general formula (8).

(8)

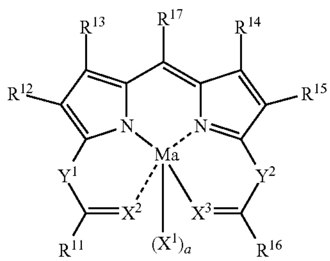

In the general formula (8), $R^{11}$ and $R^{16}$ each independently represent an alkyl group, an alkenyl group, an aryl group, a heterocyclic group, an alkoxy group, aryloxy group, an alkylamino group, an arylamino group, or a heterocyclic amino group. $R^{12}$ to $R^{15}$ each independently represent a hydrogen atom, or a monovalent, substituent. $R^{17}$ represents a hydrogen atom, a halogen atom, an alkyl group, an aryl group, or a heterocyclic group. Ma represents a metal atom, or a metal compound. $X^2$ and $X^3$ each independently represent NR (wherein R represents a hydrogen atom, an alkyl group, an alkenyl group, an aryl group, a heterocyclic group, an acyl group, an alkylsulfonyl group, or an aryl sulfonyl group), a nitrogen atom, an oxygen atom, or a sulfur atom. $Y^1$ and $Y^2$ each independently represent $NR^c$ (wherein $R^c$ represents a hydrogen atom, an alkyl group, an alkenyl group, an aryl group, a heterocyclic group, an acyl group, an alkylsulfonyl group, or an arylsulfonyl group), a nitrogen atom, or a carbon atom, $R^{11}$ and $Y^1$ may bond to each other to form a 5-, 6-, or 7-membered ring, $R^{16}$ and $Y^2$ may bond to each other to form a 5-, 6-, or 7-membered ring. $X^1$ represents a group capable of bonding to Ma, and a represents 0, 1, or 2.

Furthermore, the dipyrromethene metal complex compound represented by the general formula (8) includes a tautomer thereof.

The above $R^{12}$ to $R^{15}$ have the same definitions as $R^5$ to $R^8$ in the general formula (M), and the preferable embodiments thereof are also the same. The above $R^{17}$ has the same definitions as $R^{10}$ in the general formula (M), and the preferable embodiments thereof are also the same. The above Ma has the same definitions as Ma in the general formula (7), and the preferable embodiments thereof are also the same.

More specifically, among the above $R^{12}$ and $R^{15}$ in the general formula (8), as the above $R^{12}$ and $R^{15}$, an alkoxycarbonyl group, an aryloxycarbonyl group, a carbamoyl group, an alkylsulfonyl group, an arylsulfonyl group, a nitrile group, an imide group, or a carbamoylsulfonyl group are preferable; an alkoxycarbonyl group, an aryloxycarbonyl group, a carbamoyl group, an alkylsulfonyl group, a nitrile group, an imide group, or a carbamoylsulfonyl group are more preferable; an alkoxycarbonyl group, an aryloxycarbonyl group, a carbamoyl group, a nitrile group, an imide group, or a carbamoylsulfonyl group are still more preferable; and an alkoxycarbonyl group, an aryloxycarbonyl group, or a carbamoyl group are particularly preferable.

As the above $R^{13}$ and $R^{14}$, a substituted or unsubstituted alkyl group, a substituted or unsubstituted aryl group, and a substituted or unsubstituted heterocyclic group are preferable; and a substituted or unsubstituted alkyl group, and a substituted or unsubstituted aryl group are further preferable. Here, specific examples of the more preferred alkyl group, aryl group, and heterocyclic group can include those as numerated for the above $R^6$ and $R^7$ of the general formula (M).

In the general formula (8), $R^{11}$ and $R^{16}$ each independently represent an alkyl group (a linear, branched chain or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group and a 1-adamantyl group), an alkenyl group (an alkenyl group having preferably 2 to 24, more preferably 2 to 12 carbon atoms, such as a vinyl group, an allyl group and a 3-buten-1-yl group), an aryl group (an aryl group having preferably 6 to 36, more preferably 6 to 18 carbon atoms, such as a phenyl group and a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group and a benzotriazol-1-yl group), an alkoxy group (an alkoxy group having preferably 1 to 36, more preferably 1 to 18 carbon atoms, such as a methoxy group, an ethoxy group, a propyloxy group, a butoxy group, a hexyloxy group, a 2-ethylhexyloxy group, a dodecyloxy group and a cyclohexyloxy group), an aryloxy group (an aryloxy group having preferably 6 to 24, more preferably 1 to 18 carbon atoms, such as a phenoxy group and a naphthyloxy group), an alkylamino group (an alkylamino group having preferably 1 to 36, more preferably 1 to 18 carbon atoms, such as a methylamino group, an ethylamino group, a propylamino group, a butylamino group, a hexylamino group, a 2-ethylhexylamino group, an isopropylamino group, a t-butylamino group, a t-octylamino group, a cyclohexylamino group, an N,N-diethylamino group, an N,N-dipropylamino group, an N,N-dibutylamino group and an N-methyl-N-ethylamino group), an arylamino group (an aryl amino group having preferably 6 to 36, more preferably 6 to 18 carbon atoms, such as a phenylamino group, a naphthylamino group, an N,N-diphenylamino group and an N-ethyl-N-phenylamino group), or a heterocyclic amino group (a heterocyclic amino group having preferably 1 to 24, more preferably 1 to 12 carbon atoms, such as a 2-aminopyrrole group, a 3-aminopyrazole group, a 2-aminopyridine group and a 3-aminopyridine group).

As $R^{11}$ and $R^{16}$, among those described above, an alkyl group, an alkenyl group, an aryl group, a heterocyclic group, an alkylamino group, an arylamino group, and a heterocyclic amino group are preferable; an alkyl group, an alkenyl group, an aryl group, and a heterocyclic group are more preferable; an alkyl group, an alkenyl group, and an aryl group are still more preferable; and an alkyl group is particularly preferable.

In a case where the alkyl group, the alkenyl group, the aryl group, the heterocyclic group, the alkoxy group, the aryloxy group, the alkylamino group, the arylamino group, or the heterocyclic amino group as $R^{11}$ and $R^{16}$ in the general formula (8) is a group that can be further substituted, it may be substituted with the substituents described for the substituents of $R^1$ of the following general formula (1), and in a case where it is substituted with two or more substituents, these substituents may be the same as or different from each other.

In the general formula (8), $X^2$ and $X^3$ represents NR, a nitrogen atom, an oxygen atom or a sulfur atom. Here, R represents a hydrogen atom, an alkyl group (a linear, branched chain, or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, a 1-adamantyl group), an alkenyl group (an alkenyl group having preferably 2 to 24, more preferably 2 to 12 carbon atoms, such as a vinyl group, an allyl group and a 3-buten-1-yl group), an aryl group (an aryl group having preferably 6 to 36, more preferably 6 to 18 carbon atoms, such as a phenyl group and a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group and a benzotriazol-1-yl group), an acyl group (an acyl group having preferably 1 to 24, more preferably 2 to 18 carbon atoms, such as an acetyl group, a pivaloyl group, a 2-ethylhexyl group, a benzoyl group and a cyclohexanoyl group), an alkylsulfonyl group (an alkylsulfonyl group having preferably 1 to 24, more preferably 1 to 18 carbon atoms, such as a methylsulfonyl group, an ethylsulfonyl group, an isopropylsulfonyl group and a cyclohexylsulfonyl group), or an arylsulfonyl group (an arylsulfonyl group having preferably 6 to 24, more preferably 6 to 18 carbon atoms, such as a phenylsulfonyl group and a naphthylsulfonyl group).

In the general formula (8), $Y^1$ and $Y^2$ each independently represent $NR^C$, a nitrogen atom, or a carbon atom, and $R^c$ has the same definition as R for $X^2$ and $X^3$, and the preferable embodiments are also same.

In the general formula (8), $R^{11}$ and $Y^1$ may bond to each other, together with carbon atoms, to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring and a benzothiophene ring), a 6-membered ring (for example, a cyclohexane ring, a piperidine ring, a piperazine ring, a morpholine ring, a tetrahydropyran ring, a dioxane ring, a pentamethylenesulfide ring, a dithiane ring, a benzene ring, a piperidine ring, a piperazine ring, a pyridazine ring, a quinoline ring and a quinazoline ring), or a 7-membered ring (for example, a cycloheptane ring and a hexamethyleneimine ring).

In the general formula (8), $R^{16}$ and $Y^2$ may bond to each other, together with carbon atoms, to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring and a benzothiophene ring), a 6-membered ring (for example, a cyclohexane ring, a piperidine ring, a piperazine ring, a morpholine ring, a tetrahydropyran ring, a dioxane ring, a pentamethylenesulfide ring, a dithiane ring, a benzene ring, a piperidine ring, a piperazine ring, a pyridazine ring, a quinoline ring and a quinazoline ring), or a 7-membered ring (for example, a cycloheptane ring and a hexamethyleneimine ring).

In the general formula (8), in a case where the 5-, 6- or 7-membered ring formed by bonding of $R^{11}$ and $Y^1$, and $R^{16}$ and $Y^2$ is a ring that can be further substituted, it may be substituted with the substituents described for the substituents of $R^1$ of the following general formula (1), and in a case where it is substituted with two or more substituents, these substituents may be the same as or different from each other.

In the general formula (8), $R^{11}$ and $R^{16}$ each independently are preferably a monovalent substituent having a steric parameter "—Es value" of 1.5 or more, more preferably 2.0 or more, still more preferably 3.5 or more, and particularly preferably 5.0 or more.

Here, the steric parameter "—Es value" is a parameter representing the steric bulkiness of the substituents; an "—Es value" as shown in the literature (J. A. Macphee, et al, Tetrahedron, Vol. 34, pp 3553~3562, Chemistry Enlarged Edition 107, edited by Toshio FUJITA, Structure-Activity Relationships and Drug Design, published on Feb. 20, 1986 (Kagaku Dojin)) is used.

In the general formula (8), $X^1$ represents a group capable of bonding to Ma, and specific examples thereof include the same groups as defined for $X^1$ in the general formula (7), and the preferable embodiment is also the same; and a represents 0, 1 or 2.

As a preferred embodiment of the compound represented by the general formula (8), $R^{12}$ to $R^{15}$ each independently are preferred embodiments as described for $R^5$ to $R^8$ in the general formula (M); $R^{17}$ is a preferred embodiment as described for $R^{10}$ in the general formula (M); Ma is Zn, Cu, Co, or VO; $X^2$ is NR(R represents a hydrogen atom or an alkyl group), a nitrogen atom, or an oxygen atom; $X^3$ is NR(R represents a hydrogen atom or an alkyl group), a nitrogen atom, or an oxygen atom; $Y^1$ is $NR^c$ ($R^c$ represents a hydrogen atom or an alkyl group), a nitrogen atom, or a carbon atom, $Y^2$ is a nitrogen atom, or a carbon atom; $R^{11}$ and $R^{16}$ each independently are an alkyl group, an aryl group, a heterocyclic group, an alkoxy group, or an alkylamino group; $X^1$ is a group which is linked via an oxygen atom; and a represents 0 or 1. $R^{11}$ and $Y^1$ may bond to each other to form a 5- or 6-membered ring, or $R^{16}$ and $Y^2$ may bond to each other to form a 5- or 6-membered ring.

As a more preferred embodiment of the compound represented by the general formula (8), $R^{12}$ to $R^{15}$ each independently are preferred embodiments as described for $R^5$ to $R^8$ in the general formula (M); $R^{17}$ is a preferred embodiment as described for $R^{10}$ in the general formula (M); Ma is Zn; $X^2$ and $X^3$ is a hydrogen atom; $Y^1$ is a hydrogen atom; $Y^2$ is a nitrogen atom; $R^{11}$ and $R^{16}$ each independently are an alkyl group, an aryl group, a heterocyclic group, an alkoxy group, or an alkylamino group; $X^1$ is a group which is linked via an oxygen atom; and a represents 0 or 1. $R^{11}$ and $Y^1$ may bond to each other to form a 5- or 6-membered ring, or $R^{16}$ and $Y^2$ may bond to each other to form a 5- or 6-membered ring.

It is preferable that the molar extinction coefficient of the dipyrromethene metal complex compounds represented by the general formula (7) and the general formula (8) be as high as possible, from the viewpoint of coloring power. In addition, the maximum absorption wavelength λmax is preferably 520 nm to 580 nm, more preferably 530 nm to 570 nm, from the viewpoint of improvement of color purity. When properties in this range are applied to the radiation-sensitive colored composition, and the like, color filters having a good color reproducibility can be manufactured. Further, as to the absorbance at 450 nm with respect to the dye multimer of the present invention, the absorbance of the maximum absorption wavelength of (λmax) is preferably 1,000 times or more, more preferably 10,000 times or more, and still more preferably 100,000 times or more. With this ratio in this range, when the dye multimer of the present invention is applied to the radiation-sensitive colored composition, and the like, particularly in a case of manufacturing a blue color filter, a color filter with high transmittance can be formed. Furthermore, the maximum absorption wavelength, and molar extinction coefficient is measured by a Cary 5 spectrophotometer (manufactured by Varian Inc.).

It is preferable that the melting point of the dipyrromethene metal complex compounds represented by the general formula (7) and the general formula (8) be not too high, in view of solubility.

The dipyrromethene metal complex compound represented by the general formula (7) and the general formula (8) can be synthesized by the methods described in U.S. Pat. No. 4,774,339A and U.S. Pat. No. 5,433,896A, JP2001-240761A, JP2002-155052A, JP3614586B, Aust. J. Chem., 1965, 11, 1835-1845, J. H. Boger et al, Heteroatom Chemistry, Vol. 1, No. 5, 389 (1990), and the like. Specifically, the method described in the paragraphs [0131] to [0157] of JP 2008-292970A can be applied.

Specific examples of the dipyrromethene colorant are shown below, but the present invention is not limited thereto.

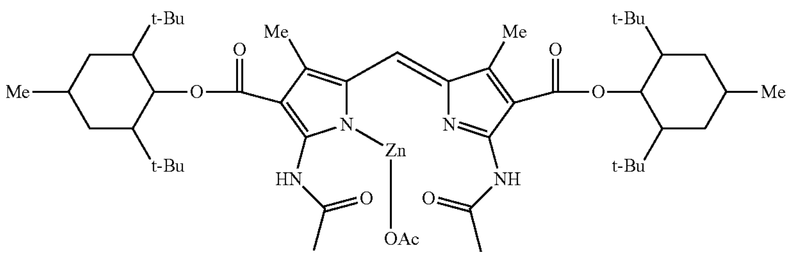

(PM-1)

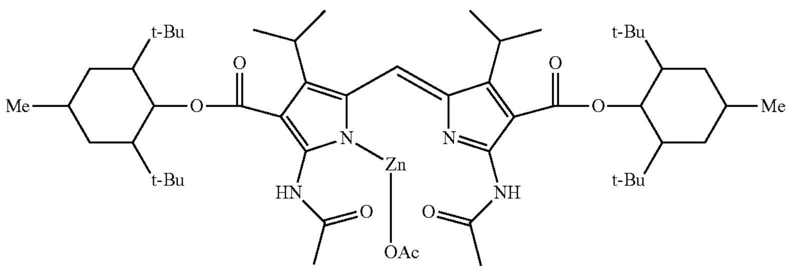

(PM-2)

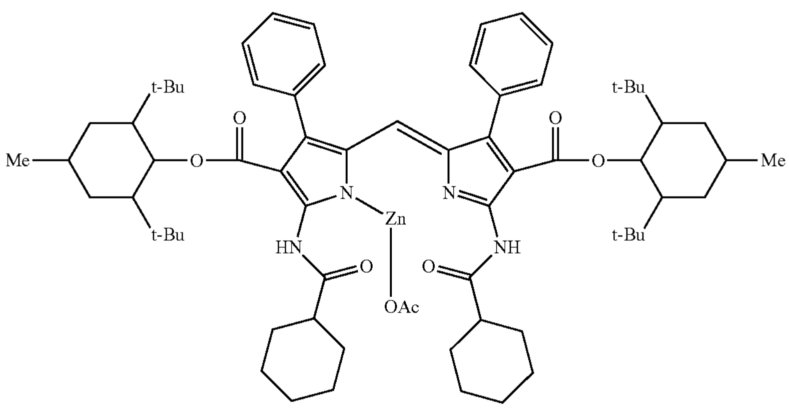

(PM-3)

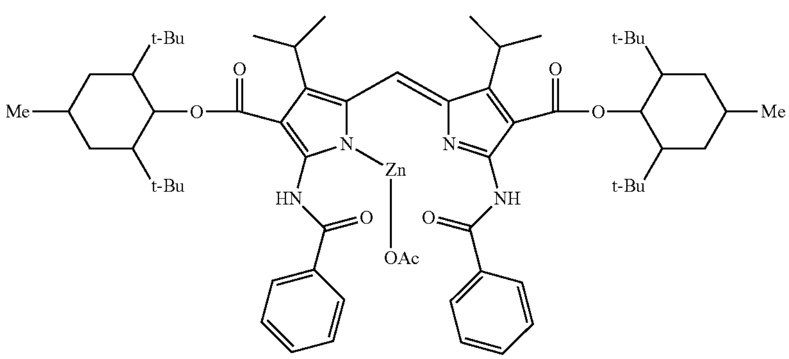

(PM-4)

-continued
(PM-5)
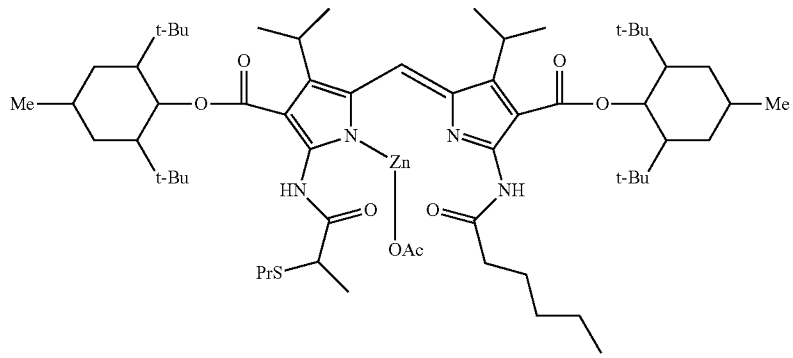
(PM-6)
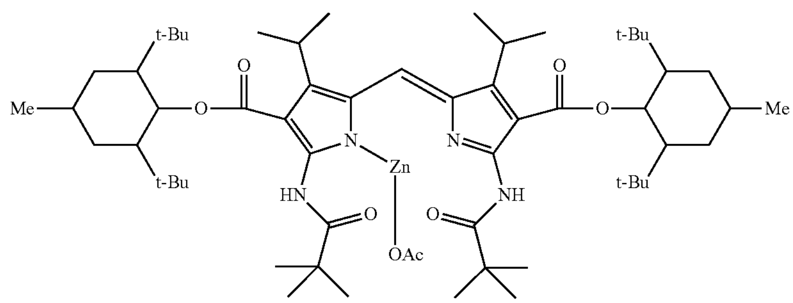
(PM-7)
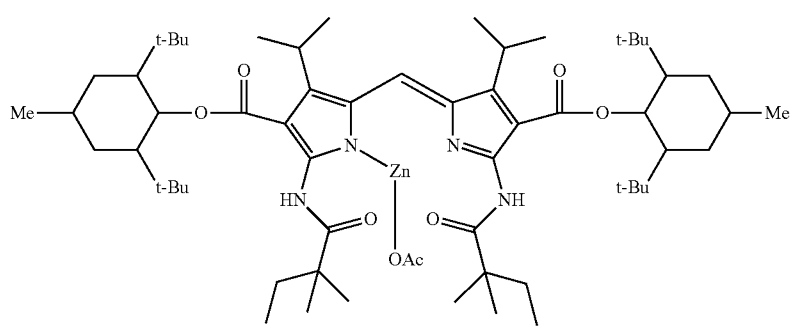
(PM-8)
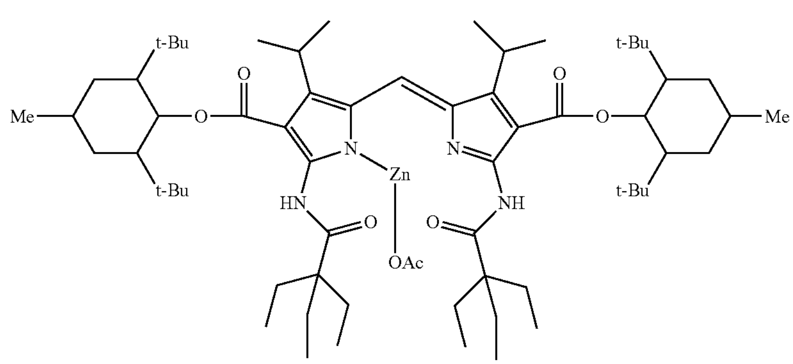

-continued
(PM-9)
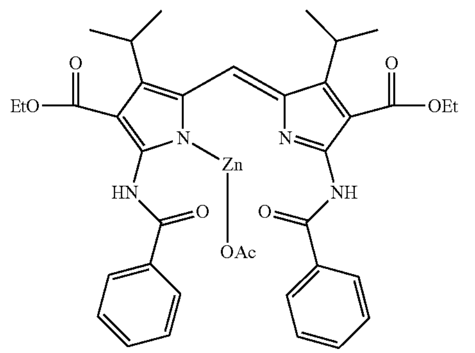
(PM-10)
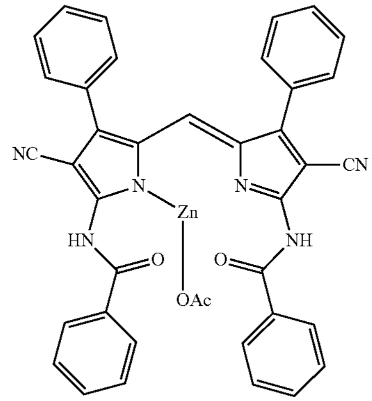
(PM-11)
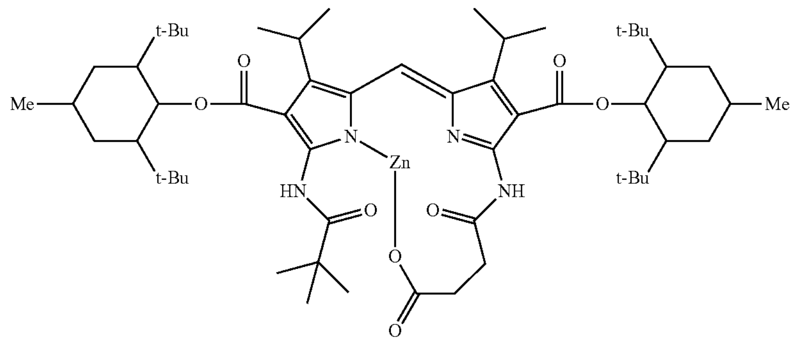
(PM-12)
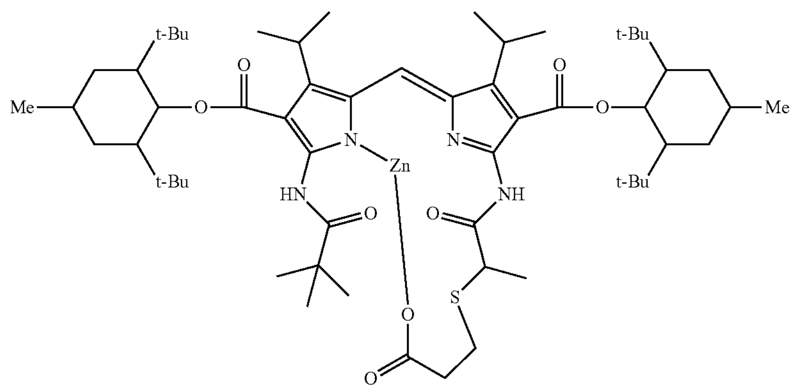
(PM-13)
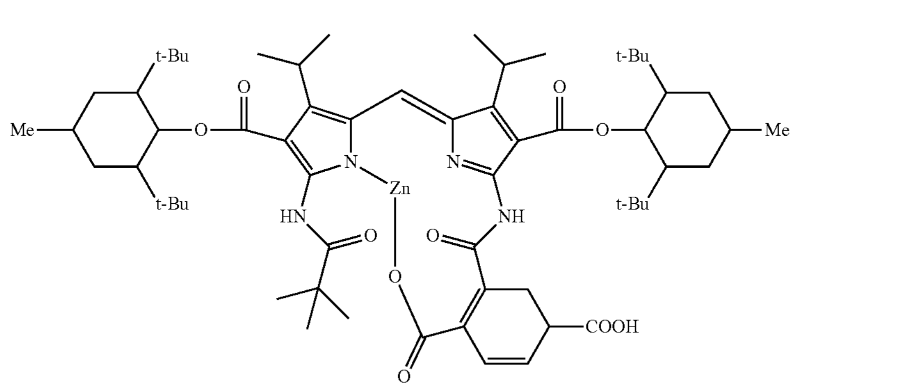

-continued
(PM-14)
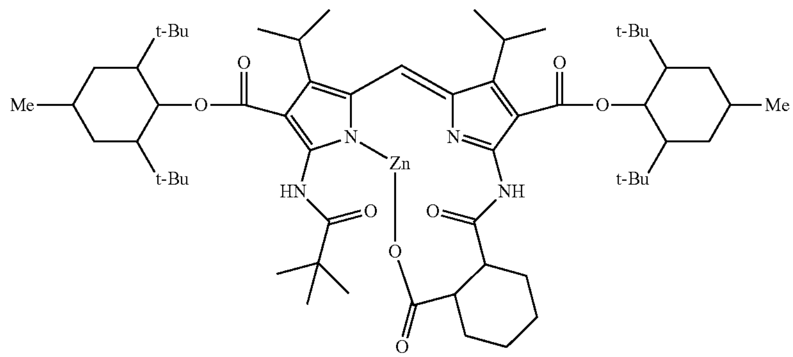
(PM-15)
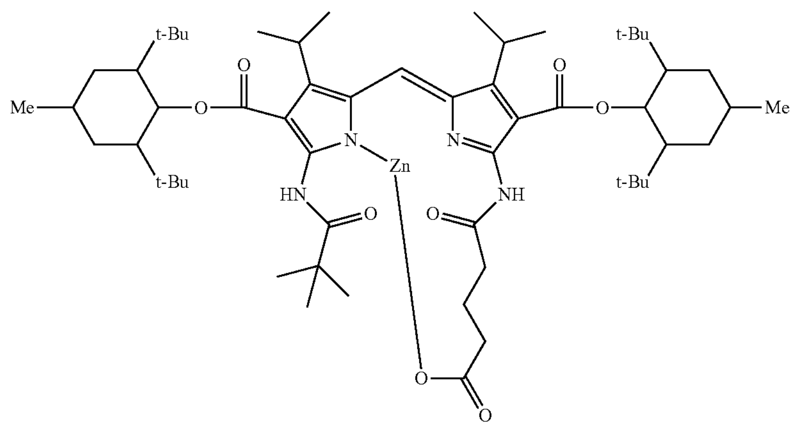
(PM-16)
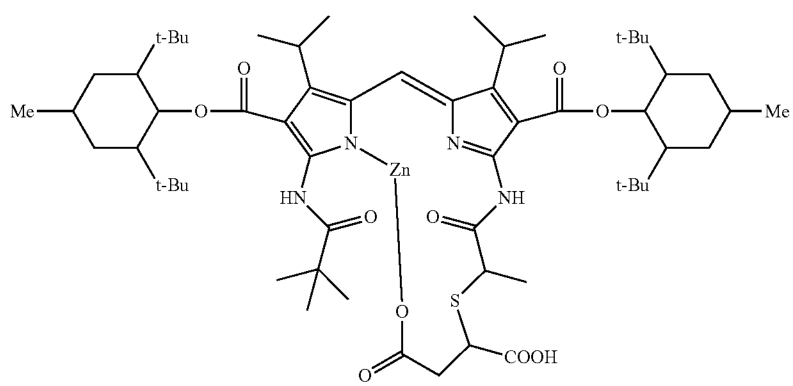
(PM-17)
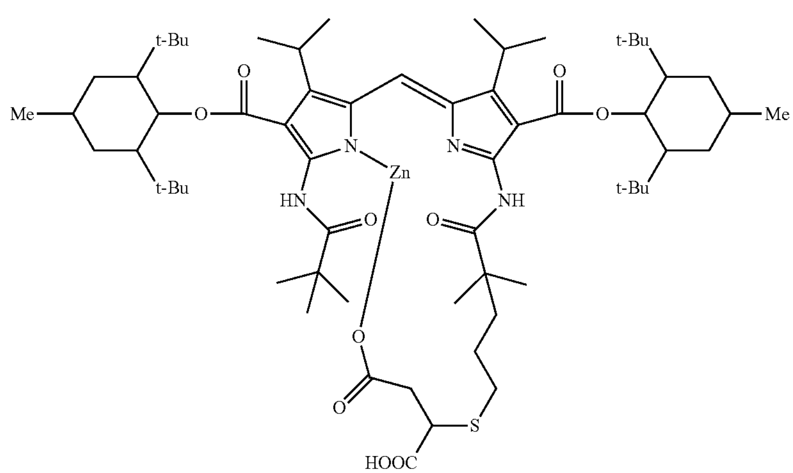

-continued
(PM-18)
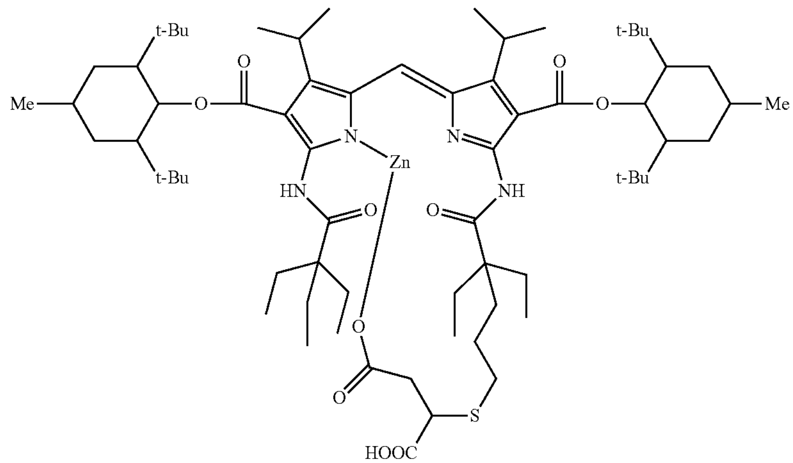
(PM-19)
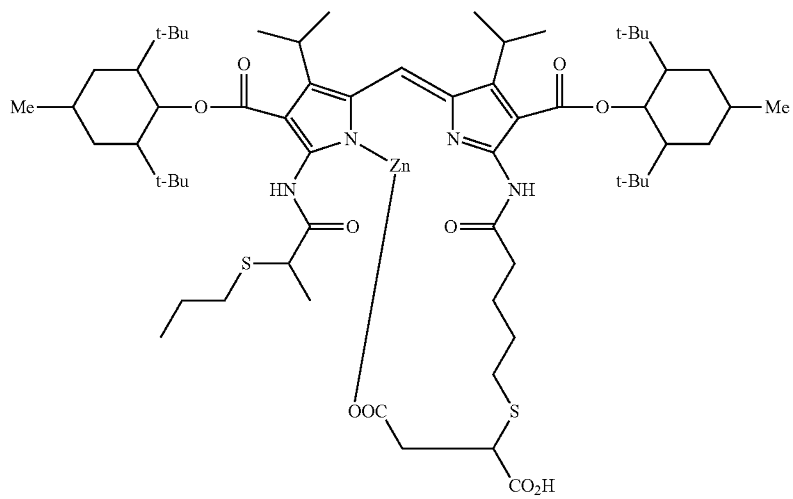
(PM-20)
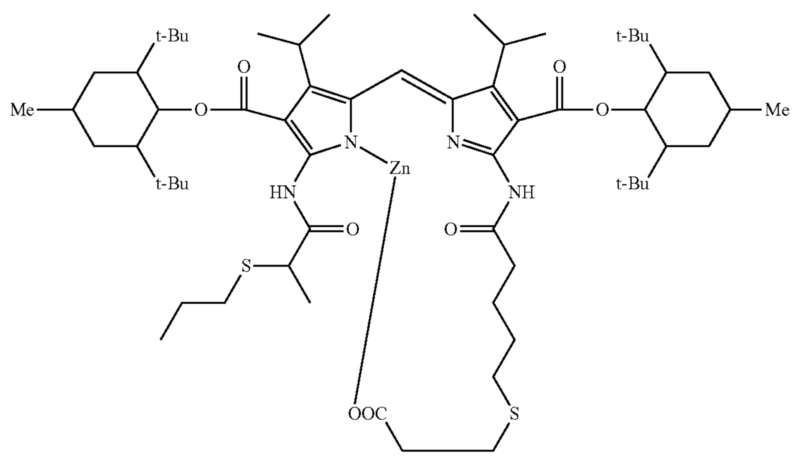

-continued (PM-21)

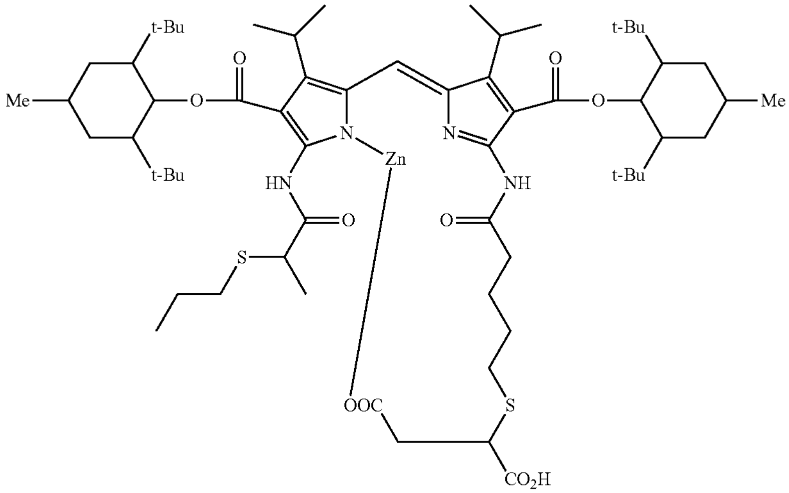

(PM-22)

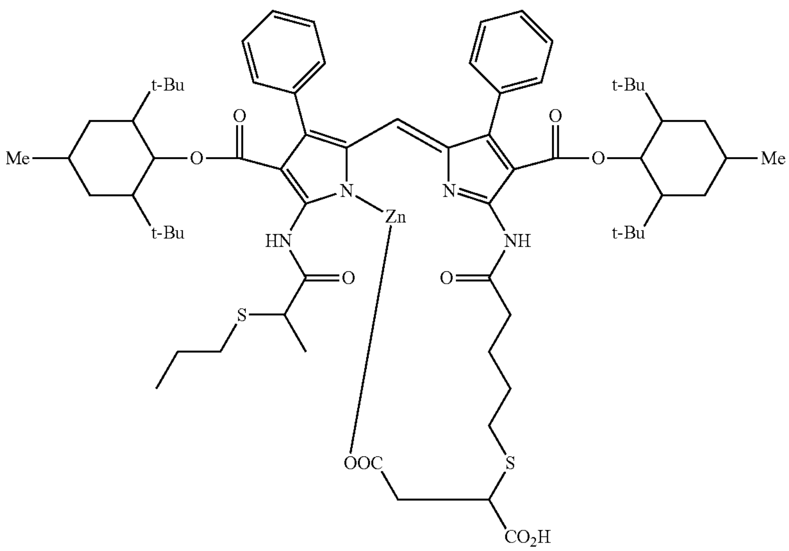

Among the specific examples, (PM-8), and (PM-11) to (PM-22) are particularly preferable; (PM-8), and (PM-16) to (PM-22) are still more preferable, and (PM-8) and (PM-18) are most preferable, from the viewpoints of color characteristics, developability, and heat resistance.

<Azo Colorant>

Examples of the colorant compounds include an azo colorant (azo compound). The azo compound in the present invention totally refers to a compound having a colorant moiety containing an N═N group in the molecule.

As the azo colorant, one that is suitably selected from known azo colorants (such as substituted azobenzene (specific examples thereof include (AZ-4) to (AZ-6) as described later, and the like)) can be employed.

As the azo colorant, azo colorants known as a magenta colorant and a yellow colorant can be employed, and among them, azo colorants represented by the following general formula (E), the general formula (F), the general formula (H), the general formula (I-1), the general formula (I-2), and the general formula (V) are particularly preferable.

—Magenta Colorant—

An azo colorant represented by the following general formula (E) is preferably used as a magenta colorant used for a red color resist or an ink jet ink.

General Formula (E)

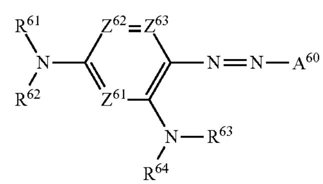

In the general formula (E), $R^{61}$ to $R^{64}$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $A^{60}$ represents an aryl group or an aromatic heterocyclic group; $Z^{61}$ to $Z^{63}$ each independently represent —C($R^{65}$)═ or —N═; and $R^{65}$ represents a hydrogen atom or a monovalent substituent.

Each of the substituents of the general formula (E) will be described in detail.

In the general formula (E), $R^{61}$ to $R^{64}$ each independently represent a hydrogen atom or alkyl groups (preferably linear, branched, or cyclic alkyl groups having 1 to 36 carbon atoms, and more preferably linear, branched, or cyclic alkyl groups having 1 to 12 carbon atoms, for example, cyclopropyl, cyclopentyl, cyclohexyl, and 1-adamantyl), alkenyl groups (preferably alkenyl groups having 2 to 24 carbon atoms, and more preferably alkenyl groups having 2 to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), acyl groups (preferably acyl groups having 1 to 24 carbon atoms, and more preferably acyl groups having 2 to 18 carbon atoms, for example, acetyl, pivaloyl, 2-ethylhexyl, benzoyl, cyclohexanoyl), alkoxycarbonyl groups (preferably alkoxycarbonyl groups having 1 to 10 carbon atoms, and more preferably alkoxycarbonyl groups having 1 to 6 carbon atoms, for example, methoxycarbonyl and ethoxycarbonyl), aryloxycarbonyl groups (preferably aryloxycarbonyl groups having 6 to 15 carbon atoms, and more preferably aryloxycarbonyl groups having 6 to 10 carbon atoms, for example, phenoxycarbonyl), carbamoyl groups (preferably carbamoyl groups having 1 to 8 carbon atoms, and more preferably carbamoyl groups having 2 to 6 carbon atoms, for example, dimethylcarbamoyl), alkylsulfonyl groups (preferably alkylsulfonyl groups having 1 to 24 carbon atoms, and more preferably alkylsulfonyl groups having 1 to 18 carbon atoms, for example, methyl sulfonyl, ethyl sulfonyl, isopropylsulfonyl, and cyclohexylsulfonyl), or arylsulfonyl groups (preferably arylsulfonyl groups having 6 to 24 carbon atoms, and more preferably arylsulfonyl groups having 6 to 18 carbon atoms, for example, phenylsulfonyl and naphthyl sulfonyl).

In the general formula (E), it is preferable that $R^{61}$ and $R^{63}$ each independently represent an alkyl group, an alkenyl group, an aryl group, or a heterocyclic group; and it is preferable that $R^{62}$ and $R^{64}$ each independently represent a hydrogen atom or an alkyl group.

In the general formula (E), when $R^{61}$ to $R^{64}$ are each a group that may be substituted, it may be substituted with, for example, any of the substituents mentioned as $R^{12}$ to $R^{15}$ in the general formula (8). In the case where $R^{61}$ to $R^{64}$ are substituted with two or more substituents, the substituents may be the same as or different from each other.

In the general formula (E), $R^{61}$ and $R^{62}$, $R^{61}$ and $R^{65}$ (when $Z^{61}$ or $Z^{62}$ is —C($R^{65}$)═), $R^{63}$ and $R^{64}$, and $R^{63}$ and $R^{65}$ (when $Z^{61}$ is —C($R^{65}$)═) may be bonded to each other to form a 5- or 6-membered ring.

In the general formula (E), $Z^{61}$ to $Z^{63}$ each independently represent —C($R^{65}$)═ or —N═, $R^{65}$ represents a hydrogen atom or a monovalent substituent. Examples of the substituent of $R^{65}$ include the substituents mentioned as $R^{12}$ to $R^{15}$ in the general formula (8). When the substituent of $R^{65}$ is a group which may further be substituted, it may be substituted with, for example, any of the substituents mentioned as $R^{12}$ to $R^{15}$ in the general formula (8). When the substituent of $R^{65}$ is substituted with two or more substituents, the substituents may be the same as or different from each other.

In the general formula (E), for $Z^{61}$ to $Z^{63}$, it is preferable that $Z^{61}$— be N═; $Z^{62}$ be —C($R^{65}$)═ or —N═; and $Z^{63}$ be —C($R^{65}$)═. It be more preferable that $Z^{61}$ be —N═; and $Z^{62}$ and $Z^{63}$ be —C($R^{65}$)═.

In the general formula (E), $A^{60}$ represents an aryl group or an aromatic heterocyclic group. The aryl group and the aromatic heterocyclic group of $A^{60}$ may further have, for example, any of the substituents mentioned as $R^{12}$ to $R^{15}$ in the general formula (8). When the aryl group and the aromatic heterocyclic group are substituted with two or more substituents, the substituents may be the same as or different from each other.

In the general formula (E), $A^{60}$ preferably represents an aromatic heterocyclic group, and more preferable examples thereof include an imidazole ring, a pyrazole ring, a triazole ring, a thiazole ring, an oxazole ring, a 1,2,4-thiadiazole ring, a 1,3,4-thiadiazole ring, a pyridine ring, a pyrimidine ring, a pyrazine ring, a benzopyrazole ring, a benzothiazole ring, and the like.

In the general formula (E), the position to which a polymerizable group involved in the multimerization (relating to the formation of the colorant multimer) is introduced is not particularly limited, but is preferably any one or two or more of $R^{61}$, $R^{62}$ and $A^{60}$, and more preferably $R^{61}$ and/or $A^{60}$, in view of synthetic suitability.

The azo colorant represented by the general formula (E) is preferably an azo colorant represented by the following general formula (E').

General Formula (E')

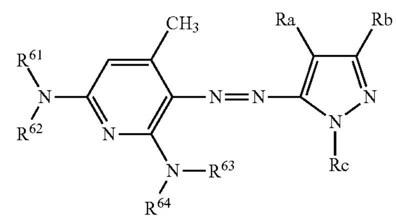

In the general formula (E'), $R^{61}$ to $R^{64}$ each have the same definitions as $R^1$ to $R^4$ in the general formula (E), and have the same preferable definitions as $R^1$ to $R^4$ in the general formula (E). In the general formula (E'), Ra represents an electron withdrawing group having a Hammett substituent constant, a σp value, of 0.2 or more; Rb represents a hydrogen atom or a monovalent substituent; and Rc represents an alkyl group, an alkenyl group, an aryl group, a heterocyclic group, an acyl group, an alkoxycarbonyl group, a carbamoyl group, an alkyl sulfonyl group, or an arylsulfonyl group.

In the general formula (E'), examples of the substituent of Rb include substituents such as those represented by $R^{12}$ to $R^{15}$ in the general formula (8).

An azo colorant represented by the following general formula (F) is also preferably used as a magenta colorant used for a red color resist or an ink jet ink.

General Formula (F)

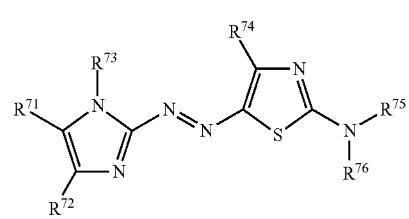

In the general formula (F), $R^{71}$ to $R^{76}$ each independently represent a hydrogen atom or a monovalent substituent. $R^{71}$ and $R^{72}$, and $R^{75}$ and $R^{76}$ may be independently bonded to each other to form a ring.

Each of the substituents of the general formula (F) will be described in detail.

In the general formula (F), $R^{71}$ to $R^{76}$ each independently represent a hydrogen atom or a monovalent substituent. Examples of the monovalent substituent include a halogen atom, an alkyl group having 1 to 30 carbon atoms (indicating herein a saturated aliphatic group, such as a cycloalkyl group and a bicycloalkyl group), an alkenyl group having 2 to 30 carbon atoms (indicating herein an unsaturated aliphatic group having a double bond, such as a cycloalkenyl group and a bicycloalkenyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group 2 to 30 carbon atoms, an aryloxy carbonyloxy group having 7 to 30 carbon atoms, an amino group having 0 to 30 carbon atoms (such as an alkylamino group, an anilino group, and a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarbonylamino group having 7 to 30 carbon atoms, a sulfamoylamino group having 0 to 30 carbon atoms, an alkylsulfonylamino, and arylsulfonylamino group having 1 to 30 carbon atoms, an alkylthio group having 1 to 30 carbon atoms, an arylthio group having 6 to 30 carbon atoms, a sulfamoyl group having 0 to 30 carbon atoms, an alkyl sulfinyl, or arylsulfinyl group having 1 to 30 carbon atoms, an alkyl sulfonyl or arylsulfonyl group having 1 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an aryl azo or heterocyclic azo group having 3 to 30 carbon atoms, and an imido group. Each of these substituents may further have a substituent.

In the general formula (F), it is preferable that $R^{71}$ and $R^{72}$ each independently represent a hydrogen atom, a heterocyclic group, or a cyano group; and it is more preferable that $R^{71}$ and $R^{72}$ represent a cyano group.

In the general formula (F), it is preferable that $R^{73}$ and $R^{74}$ each independently represent a hydrogen atom, a substituted or unsubstituted alkyl group, or a substituted or unsubstituted aryl group; and it is more preferable that $R^{73}$ and $R^{74}$ represent a substituted or unsubstituted alkyl group.

In the general formula (F), it is preferable that $R^{75}$ and $R^{76}$ each independently represent a hydrogen atom, a substituted or unsubstituted alkyl group, or a substituted or unsubstituted aryl group; and it is more preferable that $R^{75}$ and $R^{76}$ represent a substituted or unsubstituted alkyl group.

In the general formula (F), the position to which a polymerizable group involved in the multimerization (the formation of a colorant multimer) is introduced is not particularly limited, but is preferably any one or two or more of $R^{73}$, $R^{75}$, and $R^{76}$, more preferably $R^{73}$ and/or $R^{75}$, and still more preferably $R^{73}$, in view of synthetic compatibility.

—Yellow Colorant—

As a yellow colorant used for a red color resist and a green color resist, or an ink jet ink, azo colorants represented by the general formula (G), the following general formula (H) and the following general formula (I) below are preferable (including tautomers thereof).

General Formula (G)

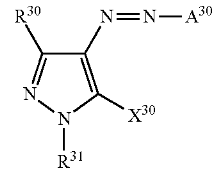

In the general formula (G), $R^{30}$ represents a hydrogen atom or a monovalent substituent; $R^{31}$ represents a hydrogen atom, an alkyl group, an alkenyl group, an aryl group, a heterocyclic group, an acyl group, an alkoxycarbonyl group, or a carbamoyl group; $X^{30}$ represents an —OM group or —N($R^{32}$)($R^{33}$); M represents a hydrogen atom or an alkyl group, or a metal atom or an organic base pair required for neutralization of charges; $R^{32}$ and $R^{33}$ each independently represent a hydrogen atom, an alkyl group, an alkenyl group, an aryl group, a heterocyclic group, an acyl group, an alkoxycarbonyl group, or a carbamoyl group; and $A^{30}$ represents an aryl group or an aromatic heterocyclic group.

Each of the substituents of the general formula (G) will be described in detail.

In the general formula (G), $R^{30}$ represents a hydrogen atom or a monovalent substituent. Examples of the substituent include the substituents mentioned as $R^{12}$ to $R^{15}$ in the general formula (8). Among these, a substituted or unsubstituted alkyl group, a substituted or unsubstituted aryl group, or a heterocyclic group is preferable, and a substituted or unsubstituted alkyl group or a substituted or unsubstituted aryl group is more preferable.

In the general formula (G), $R^{31}$ represents a hydrogen atom, alkyl groups (preferably linear, branched, or cyclic alkyl groups having 1 to 36 carbon atoms, and more preferably linear, branched, or cyclic alkyl groups having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), alkenyl groups (preferably alkenyl groups having 2 to 24 carbon atoms, and more preferably alkenyl groups having 2- to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), acyl groups (preferably acyl groups having 1 to 24 carbon atoms, and more preferably acyl groups having 2 to 18 carbon atoms, for example, acetyl, pivaloyl, 2-ethylhexyl, benzoyl, and cyclohexanoyl), alkoxycarbonyl groups (preferably alkoxycarbonyl groups having 1 to 6 carbon atoms, and more preferably alkoxycarbonyl groups having 1 to 4 carbon atoms, for example, a methoxycarbonyl group), or carbamoyl groups (preferably carbamoyl groups having 1 to 6 carbon atoms, and more preferably carbamoyl groups having 1 to 4 carbon atoms, for example, an N,N-dimethylcarbamoyl).

In the general formula (G), $X^{30}$ represents an -OM group or —N($R^{32}$)($R^{33}$); M represents a hydrogen atom, an alkyl group, or a metal atom or an organic base pair required for neutralization of charges; and $R^{32}$ and $R^{33}$ each independently represent a hydrogen atom, an alkyl group, an alkenyl group, an aryl group, a heterocyclic group, an acyl group, an alkoxycarbonyl group, or a carbamoyl group.

In the general formula (G), $A^{30}$ has the same definition as $A^{60}$ in the general formula (E), and a preferable embodiment thereof is also the same.

In the general formula (G), the position to which a polymerizable group involved in the multimerization (the formation of a colorant multimer) is introduced is not particularly limited, but is preferably $R^{31}$ and/or $A^{30}$ in view of synthetic compatibility.

General Formula (H)

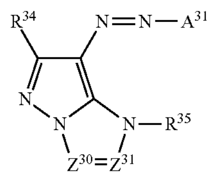

In the general formula (H), $R^{34}$ represents a hydrogen atom or a monovalent substituent; $R^{35}$ represents a hydrogen atom, an alkyl group, an alkenyl group, an aryl group, a heterocyclic group, an acyl group, an alkoxycarbonyl group, or carbamoyl group; $Z^{30}$ and $Z^{31}$ each independently represent —C($R^{36}$)═, or —N═; $R^{36}$ represents a hydrogen atom or a monovalent substituent; and $A^{31}$ represents an aryl group or an aromatic heterocyclic group.

Each of the substituents of the general formula (H) will be described in detail.

In the general formula (H), $R^{34}$ represents a hydrogen atom or a monovalent substituent and has the same definition as $R^{30}$ in the general formula (G), and a preferable embodiment thereof is also the same.

In the general formula (H), $R^{35}$ represents a hydrogen atom, alkyl groups (preferably linear, branched, or cyclic alkyl groups having 1 to 36 carbon atoms, and more preferably linear, branched, or cyclic alkyl groups having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), alkenyl groups (preferably alkenyl groups having 2 to 24 carbon atoms, and more, preferably alkenyl groups having 2 to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), acyl groups (preferably acyl groups having 1 to 24 carbon atoms, and more preferably acyl groups having 2 to 18 carbon atoms, for example, acetyl, pivaloyl, 2-ethylhexyl, benzoyl, and cyclohexanoyl), alkoxycarbonyl groups (preferably alkoxycarbonyl groups having 1 to 10 carbon atoms, and more preferably alkoxycarbonyl groups having 1 to 6 carbon atoms, for example, a methoxycarbonyl group and an ethoxycarbonyl group), or carbamoyl groups (preferably carbamoyl groups having 1 to 10 carbon atoms, and more preferably carbamoyl groups having 1 to 6 carbon atoms, for example, N,N-dim ethyl carbamoyl).

In the general formula (H), $Z^{30}$ and $Z^{31}$ each independently represent —C($R^{36}$)═ or —N═; and $R^{36}$ represents a hydrogen atom or a monovalent substituent. Examples of the substituent of $R^{36}$ include the substituents mentioned as $R^{12}$ to $R^{15}$ in the general formula (8). When the substituent of $R^{36}$ is a group which may further be substituted, it may be substituted with, for example, any of the substituents mentioned as $R^{12}$ to $R^{15}$ in the general formula (8). When the substituent of $R^{36}$ is substituted with two or more substituents, the substituents may be the same as or different from each other.

In the general formula (H), for $Z^{30}$ and $Z^{31}$, it is preferable that $Z^{30}$ represent —N═; and $Z^{31}$ represent —C($R^{36}$)═.

In the general formula (H), $A^{31}$ has the same definition as $A^{60}$ in the general formula (E), and a preferable embodiment thereof is also the same.

In the general formula (H), the position to which a polymerizable group involved in the multimerization (the formation of a colorant multimer) is introduced is not particularly limited, but is preferably $R^{34}$ and/or $A^{31}$, in view of synthetic compatibility.

General Formula (I)

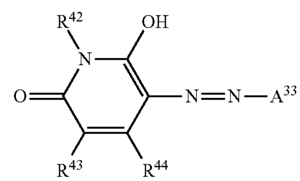

In the general formula (I), $R^{42}$ represents a hydrogen atom, an alkyl group, an alkenyl group, an aryl group, or a heterocyclic group; $R^{43}$ and $R^{44}$ each independently represent a hydrogen atom or a monovalent substituent; and $A^{33}$ represents an aryl group or an aromatic heterocyclic group.

Each of the substituents of the general formula (I) will be described in detail.

In the general formula (I), $R^{42}$ represents a hydrogen atom, alkyl groups (preferably linear, branched, or cyclic alkyl groups having 1 to 36 carbon atoms, and more preferably linear, branched, or cyclic alkyl groups having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), alkenyl groups (preferably alkenyl groups having 2 to 24 carbon atoms, and more preferably alkenyl groups having 2 to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), or heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl).

In the general formula (I), $R^{43}$ and $R^{44}$ each independently represent a hydrogen atom or a monovalent substituent, and examples of the substituent include the substituents mentioned as $R^{12}$ to $R^{15}$ in the general formula (8). When the substituent of $R^{43}$ and $R^{44}$ is a group which may further be substituted, it may be substituted with, for example, any of the substituents mentioned as $R^{12}$ to $R^{15}$ in the general formula (8). When the substituent of $R^{43}$ and $R^{44}$ is substituted with two or more substituents, the substituents may be the same as or different from each other.

In the general formula (I), $A^{33}$ has the same definition as $A^{60}$ in the general formula (E), and a preferable embodiment thereof is also the same.

In the general formula (I), the position to which a polymerizable group involved in the multimerization (the formation of a colorant multimer) is introduced is not particularly limited, but is preferably $R^{42}$ and/or $A^{33}$, in view of synthetic compatibility.

General Formula (I-1)

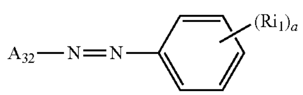

General Formula (I-2)

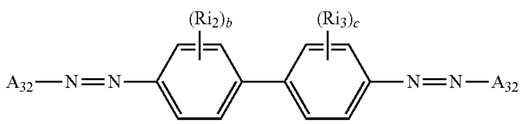

In the general formula (I-1) and the general formula (I-2), $Ri_1$, $Ri_2$, and $Ri_3$ each independently represent a monovalent substituent; a represents an integer of 0 to 5, and when a is 2 or more, two adjacent $Ri_1$'s may be bonded to each other to form a fused ring; b and c each independently represent an integer of 0 to 4 and when b and c are 1 or more, two adjacent $Ri_1$'s may be bonded to each other to form a fused ring; and $A_{32}$ represents the following general formula (IA), the general formula (IB), or the general formula (IC).

General Formula (IA)

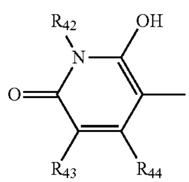

In the general formula (IA), $R_{42}$ represents a hydrogen atom, an alkyl group, or an aryl group; $R_{43}$ represents a monovalent substituent; and $R_{44}$ represents a hydrogen atom, an alkyl group, or an aryl group.

General Formula (IB)

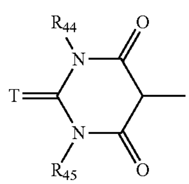

In the general formula (IB), $R_{44}$ and $R_{45}$ each independently represent a hydrogen atom, an alkyl group, or an aryl group; and T represents an oxygen atom or a sulfur atom.

General Formula (IC)

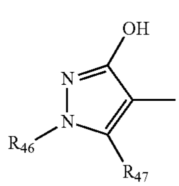

In the general formula (IC), $R_{46}$ represents a hydrogen atom, an alkyl group, or an aryl group; and $R_{47}$ represents a monovalent substituent.

In the general formula (I-1) and the general formula (I-2), examples of the monovalent substituent represented by any of $Ri_1$, $Ri_2$, and $Ri_3$ include the substituents as mentioned in the section of the substituent group A. More specific examples of the monovalent substituent include alkyl groups (preferably linear, branched, or cyclic alkyl groups having 1 to 10 carbon atoms, and more preferably linear, branched, or cyclic alkyl groups having 1 to 5 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), aryl groups (preferably aryl groups having 6 to 36 carbon atoms, and more preferably aryl groups having 6 to 18 carbon atoms, for example, phenyl, naphthyl, and sulfonamide groups), alkenyl groups (preferably linear, branched, or cyclic alkenyl groups having 1 to 10 carbon atoms, and more preferably linear, branched, or cyclic alkenyl groups having 1 to 5 carbon atoms, for example, vinyl, allyl, furenyl, geranyl, and oleyl), sulfo groups, and sulfamoyl groups (preferably alkylsulfamoyl groups having 1 to 10 carbon atoms), and particularly preferably alkyl groups having 1 to 5 carbon atoms and alkylsulfamoyl groups having 1 to 10 carbon atoms. a is preferably 1 to 3. b and c are preferably 1 to 3.

In the general formula (IA), $R_{42}$ represents a hydrogen atom, an alkyl group, or an aryl group, and particularly an alkyl group having 1 to 5 carbon atoms, or a phenyl group. Examples of the monovalent substituent represented by $R_{43}$ include the substituents as mentioned in the section of the substituent group A, and particularly preferably a cyano group and a carbamoyl group. $R_{44}$ represents a hydrogen atom, an alkyl group, or an aryl group; and particularly preferably an alkyl group having 1 to 5 carbon atoms, or a phenyl group.

In the general formula (IB), T represents an oxygen atom or a sulfur atom, and preferably an oxygen atom. $R_{44}$ and $R_{45}$ each independently represent a hydrogen atom, an alkyl group, or an aryl group, and particularly preferably an alkyl group having 1 to 5 carbon atoms, or a phenyl group.

In the general formula (IC), $R_{46}$ represents a hydrogen atom, an alkyl group, or an aryl group, and particularly preferably an alkyl group having 1 to 5 carbon atoms, or a phenyl group. Examples of the monovalent substituent represented by $R_{47}$ include the substituents as mentioned in the section of the substituent group A, preferably a hydrogen atom, an alkyl group, and an aryl group, and particularly preferably an alkyl group having 1 to 5 carbon atoms, or a phenyl group.

General Formula (V)

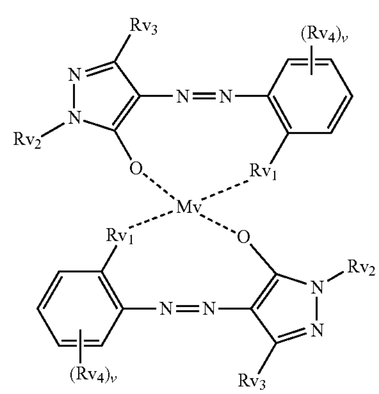

In the general formula (V), My represents Cr or Co. $Rv_1$ represents an oxygen atom or —COO—; $Rv_2$ and $Rv_3$ each independently represent a hydrogen atom, an alkyl group, or aryl group; v represents an integer of 0 to 4; and $Rv_4$ represents a monovalent substituent, and when v is 2 or more, adjacent $Rv_4$'s may be bonded to each other to form a ring.

In the general formula (V), $Rv_2$ and $Rv_3$ particularly preferably an alkyl group having 1 to 5 carbon atoms, or a phenyl group. Examples of the monovalent substituent represented by $Rv_4$ include the substituents as mentioned in the section of the substituent group A, particularly preferably an alkyl group, an aryl group, a nitro group, a sulfamoyl group, and a sulfo group, and most preferably an alkyl group having 1 to 5 carbon atoms, a phenyl group, or a nitro group.

When $Rv_2$, $Rv_3$, and $Rv_4$ are each a group which may further be substituted, they may further have a substituent mentioned in the section of the substituent group A, and when they are substituted with two or more substituents, the substituents may be the same as or different from each other.

Specific examples of the azo colorant are shown below, and the present invention is not limited thereto.

(AZ-1)

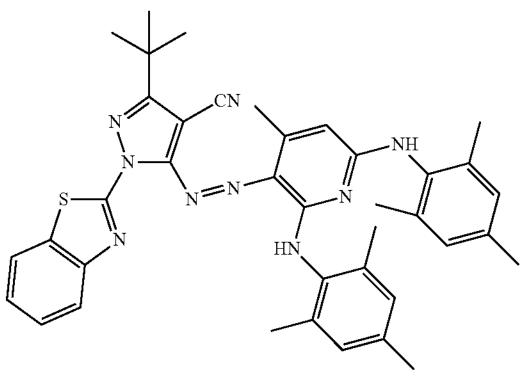

(AZ-2)

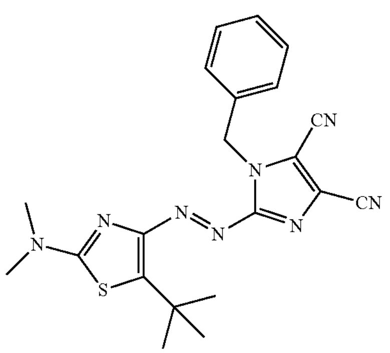

(AZ-3)

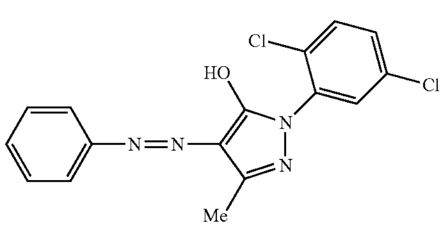

(AZ-4)

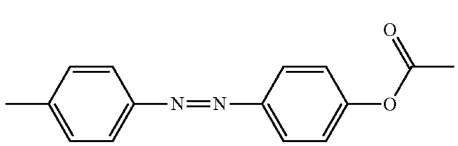

-continued (AZ-5)

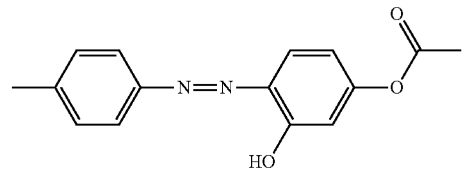

(AZ-6)

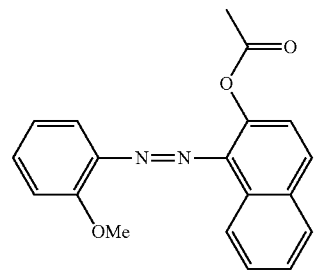

(AZ-7)

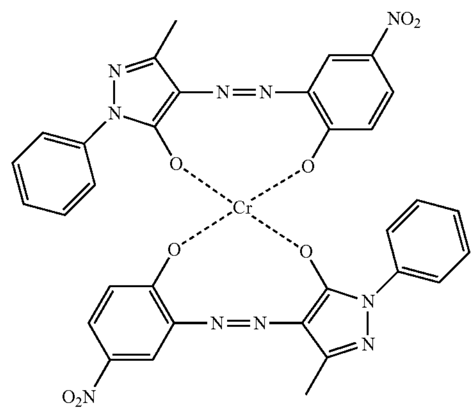

(AZ-8)

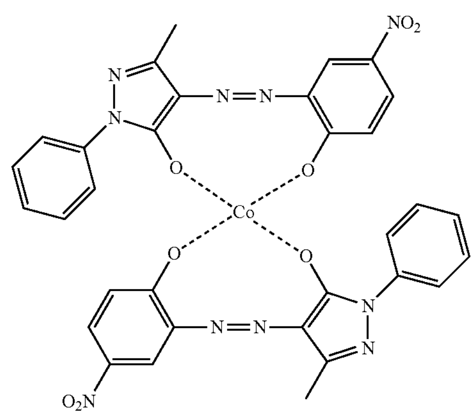

-continued
(AZ-9)
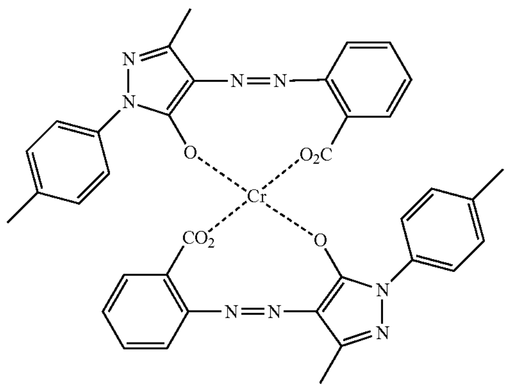
(AZ-10)
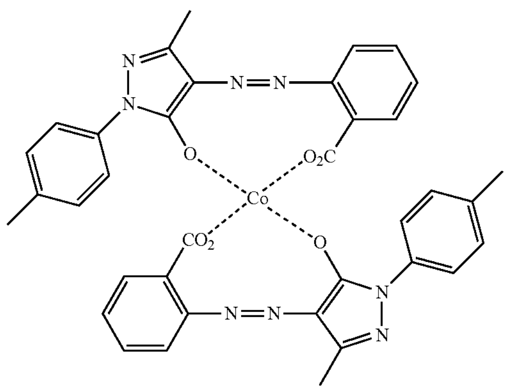
(AZ-11)
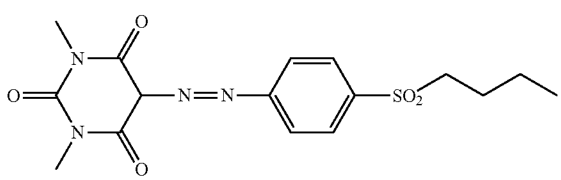
(AZ-12)
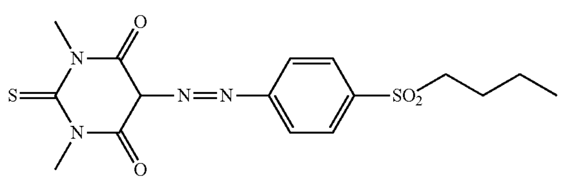
(AZ-13)
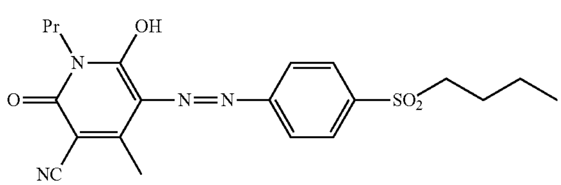
(AZ-14)
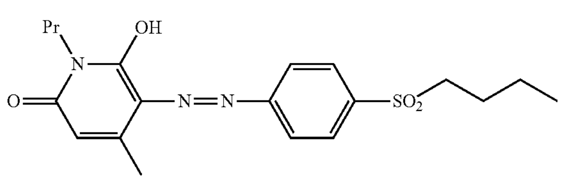
-continued
(AZ-15)
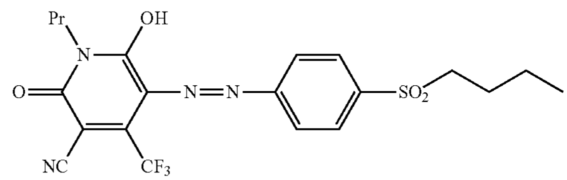
(AZ-16)
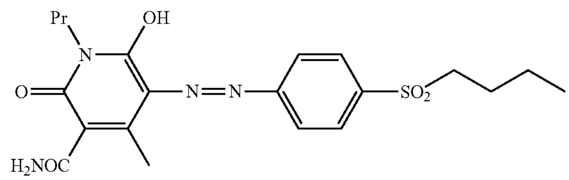
(AZ-17)
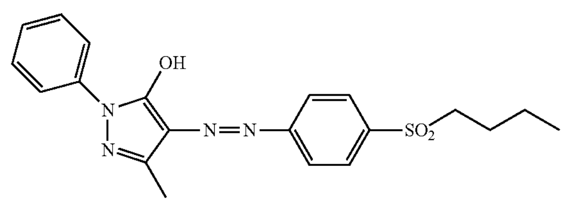
(AZ-18)
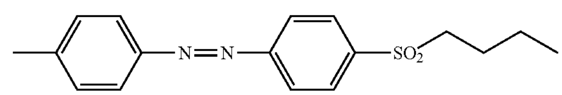
(AZ-19)
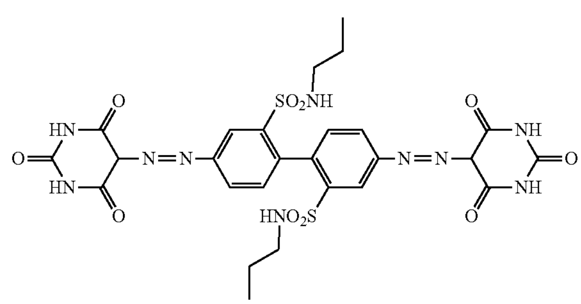
(AZ-20)
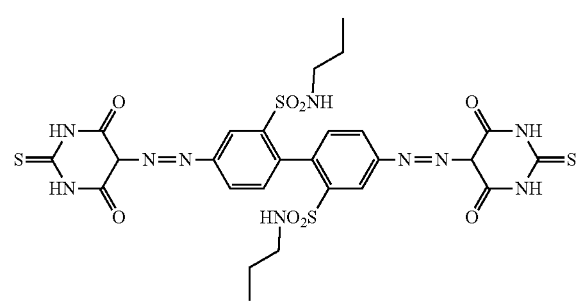

-continued (AZ-21)

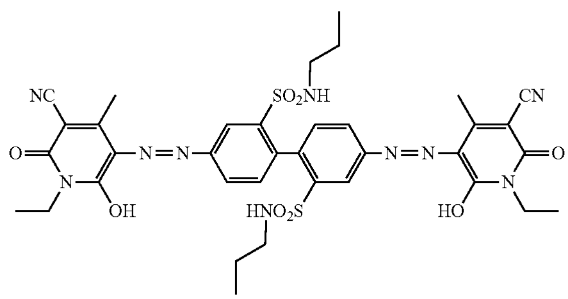

(AZ-22)

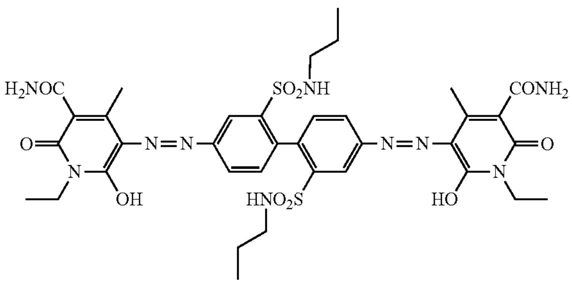

Among the specific examples above, (AZ-7), (AZ-8), (AZ-9), (AZ-11), (AZ-13), (AZ-14), (AZ-15), (AZ-16), (AZ-17), (AZ-19), (AZ-20), (AZ-21), and (AZ-22) are particularly preferable, from the viewpoints of color characteristics and heat resistance.

Among the azo colorants above, the azo colorant represented by the general formula (I) is preferable as a yellow colorant from the viewpoint of spectroscopic properties, and the azo colorant represented by the general formula (G) as a yellow colorant from the viewpoint of light resistance and heat resistance.

The azo colorant or the dipyrromethene colorant can be easily synthesized in accordance with the methods described in JP2005-189802A, JP2007-250224A, JP2006-124634A, JP2007-147784A, JP2007-277176A, and JP2008-292970A, U.S. Pat. No. 5,789,560, and the like.

Furthermore, the azo colorant or the dipyrromethene colorant can be synthesized using known methods such as a method of multimerizing the colorant, or a method of introducing a polymerizable group into a colorant. Specific examples of the methods are described in Examples.

<Xanthene Colorant>

Examples of the colorant compounds include a xanthene colorant (xanthene compound) represented by the following general formula (J).

General Formula (J)

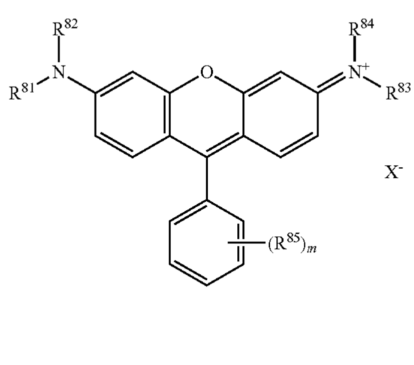

In the general formula (J), $R^{81}$, $R^{82}$, $R^{83}$, and $R^{84}$ each independently a hydrogen atom or a monovalent substituent; $R^{85}$'s each independently a monovalent substituent; m represents an integer of 0 to 5; and $X^-$ represents an anion.

When $R^{81}$ to $R^{84}$, and $R^{85}$ in the general formula (J) each represent a monovalent substituent, examples of the monovalent substituent are the same as the substituents mentioned in the section of the substituent group A.

When the monovalent substituent presented by $R^{81}$ to $R^{85}$ in the general formula (J) is a group that may further be substituted, the monovalent substituent may further be substituted with the substituents as mentioned in the section of the susbstituent group A. When the monovalent substituent has two or more substituents, these substituents may be the same as or different from each other.

$R^{81}$ and $R^{82}$, $R^{83}$ and $R^{84}$, and any two $R^{85}$'s when m is 2 or more in the general formula (J) may be each independently bonded to each other to form a 5-, 6-, or 7-membered saturated ring or unsaturated ring. When the 5-, 6-, or 7-membered ring thus formed is a group which may further be substituted, they may be substituted with the substituents as mentioned in the section of the susbstituent group A., and when they are substituted with two or more substituents, the substituents may be the same as or different from each other.

When $R^{81}$ and $R^{82}$, $R^{83}$ and $R^{84}$, and any two $R^{85}$'s when m is 2 or more in the general formula (J) each independently bonded to each other to form a 5-, 6-, or 7-membered saturated ring or unsaturated ring having no substituent, examples of the 5-, 6-, or 7-membered saturated ring or unsaturated ring having no substituent include a pyrrole ring, furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyridine ring, and a pyridazine ring, and preferably a benzene ring and a pyridine ring.

Particularly, in the general formula (J), it is preferable that $R^{82}$ and $R^{83}$ be hydrogen atoms; and $R^{81}$ and $R^{84}$ be unsubstituted phenyl groups. Further, it is preferable that $R^{85}$ be a halogen atom, a linear or branched alkyl group having 1 to 5 carbon atoms, a sulfo group, a sulfonamide group, or a carboxyl group. It is most preferable that the substituent introduced in the phenyl group of $R^{81}$ and $R^{84}$ represent a hydrogen atom, a halogen atom, a linear or branched alkyl group having 1 to 5 carbon atoms, a sulfo group, a sulfonamide group, or a carboxyl group.

In the general formula (J), $X^-$ represents an anion. Specific examples of $X^-$ include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. $X^-$ may be linked to a colorant skeleton or to a part (a polymer chain and the like) of a colorant multi mer.

In the general formula (J), $X^-$ is preferably a fluorine anion, a chlorine anion, a bromine anion, an iodine anion, a perchlorate anion, or a carboxylic acid anion, and most preferably a perchlorate anion or a carboxylic acid anion.

Specific examples of the xanthene compound are shown below, but the present invention is not limited thereto.

(1a)

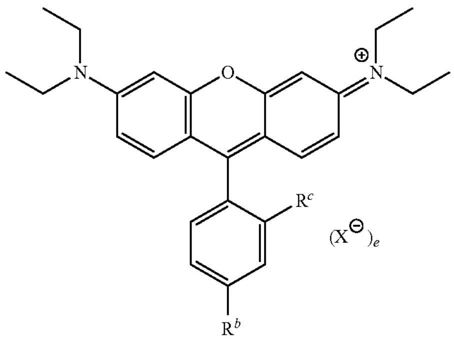

(1b)

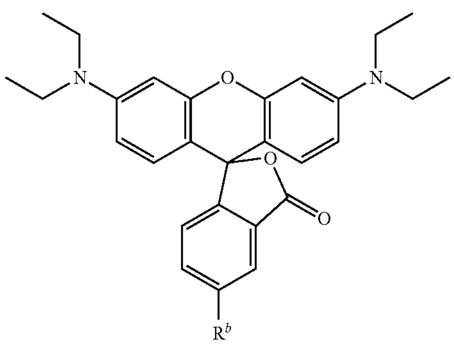

(1b-1)

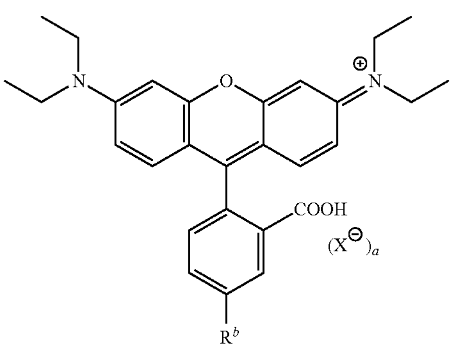

(1c)

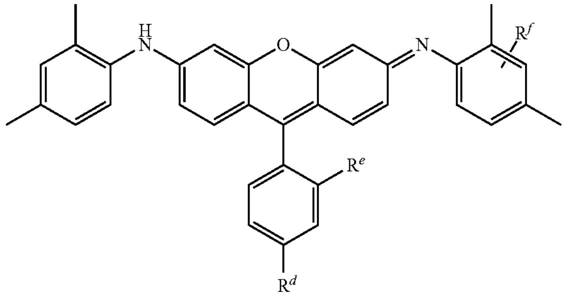

-continued (1d)

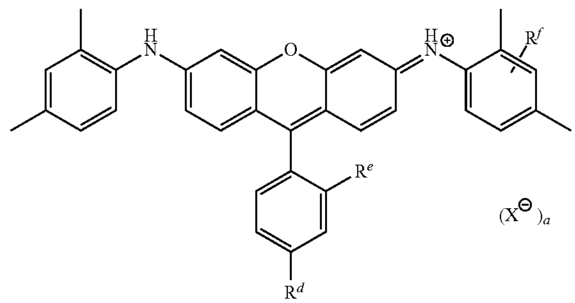

(1e)

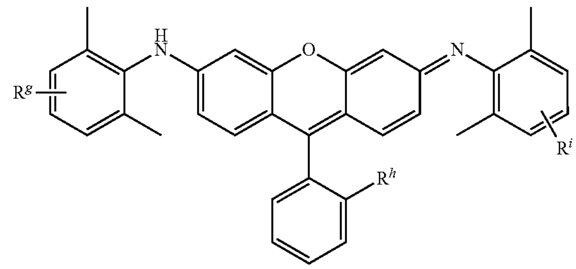

(1f)

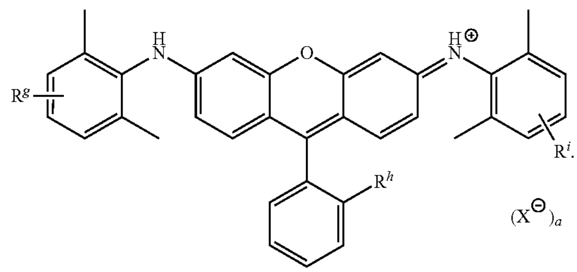

In the formulae (1a) to (10, $R^b$ and $R^c$ each independently represent a hydrogen atom, —$SO_3$—, —$CO_2H$, or —$SO_2NHR^a$, and $R^d$, $R^e$, and $R^f$ each independently represent —$SO_3$—, —$SO_3Na$, or —$SO_2NHR^a$.

$R^g$, $R^h$, and $R^i$ each independently represent a hydrogen atom, —$SO_3$—, —$SO_3H$, or —$SO_2NHR^a$.

$R^a$ represents an alkyl group having 1 to 10 carbon atoms, and preferably a 2-ethylhexyl group. X and a have the same definitions as above, respectively.)

A compound, represented by the formula (1b) is a tautomer of a compound represented by the formula (1b-1).

Among these, the formulae (1e) and (1f) are preferable from the viewpoints of color characteristics and heat resistance.

It is preferable that the molar extinction coefficient of the compound having the xanthene skeleton represented by the general formula (J) be as high as possible in view of the film thickness. Further, the maximum absorption wavelength λmax is preferably from 520 nm to 580 nm, and more preferably from 530 nm to 570 nm, from the viewpoint of the improvement of color purity. Further, the maximal absorption wavelength and the molar extinction coefficient are measured by means of a spectrophotometer UV-2400PC (manufactured by Shimadzu Corporation).

It is preferable that the melting point of the compound having a xanthene skeleton represented by the general formula (J) be not too high, in view of solubility.

The compound having the xanthene skeleton represented by the general formula (J) can be synthesized by the method described in Documents above. Specifically, the method described in Tetrahedron Letters, 2003, vol. 44, No. 23, pp. 4355 to 4360, Tetrahedron, 2005, vol. 61, No. 12, pp. 3097 to 3106, or the like can be employed.

<Squarylium Colorant>

Examples of the colorant compounds include a squarylium colorant (squarylium compound) represented by the following general formula (K). The squarylium compound in the present invention totally refers to a compound having a colorant moiety including a squarylium skeleton in the molecule.

General Formula (K)

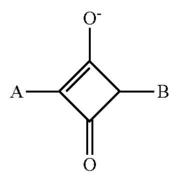

In the general formula (K), A and B each independently represent an aryl group or a heterocyclic group. Examples of the aryl group preferably include aryl groups having 6 to 48 carbon atoms, and more preferably aryl groups having 6 to 24 carbon atoms, for example, phenyl, naphthyl, and the like. As the heterocyclic group, a heterocyclic group of a 5- or 6-membered ring is preferable, and examples thereof include pyrrolyl, imidazoyl, pyrazoyl, thienyl, pyridyl, pyrimidyl, pyridazyl, triazol-1-yl, thienyl, furyl, thiadiazolyl, and the like.

As the compound represented by the general formula (K), a compound represented by the following general formula (K-1), the following general formula (K-2), the following general formula (K-3) or the following general formula (K-4) is particularly preferable.

General Formula (K-1)

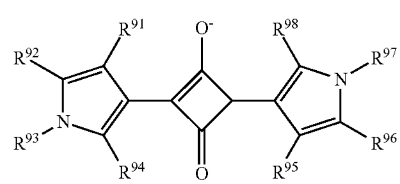

In the general formula (K-1), $R^{91}$, $R^{92}$, $R^{94}$, $R^{95}$, $R^{96}$, and $R^{98}$ each independently represent a hydrogen atom, a halogen atom, a linear or branched alkyl group, a cycloalkyl group, a linear or branched alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, or a silyl group.

$R^{93}$ and $R^{97}$ each independently represent a hydrogen atom, a linear or branched alkyl group, a cycloalkyl group, a cycloalkenyl group, an alkynyl group, an aryl group, or a heterocyclic group.

$R^{91}$ and $R^{92}$, and $R^{95}$ and $R^{96}$ may be bonded to each other to form a ring.

General Formula (K-2)

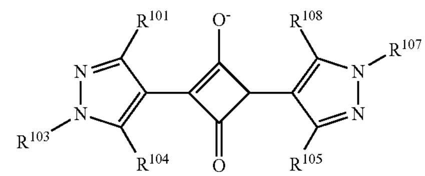

In the general formula (K-2), $R^{101}$, and $R^{103}$, $R^{104}$, $R^{105}$, $R^{107}$, $R^{108}$ have the same definitions as $R^{91}$, $R^{93}$, $R^{94}$, $R^{95}$, $R^{97}$, and $R^{98}$, respectively.

The substituents which $R^{91}$, $R^{92}$, $R^{94}$, $R^{95}$, $R^{96}$, and $R^{98}$ in the general formula (K-1) can take are the same as the substituents mentioned in the section of the substituent group A.

In the general formula (K-1), it is preferable that $R^{91}$ to $R^{98}$ each independently represent a hydrogen atom, an alkyl group, a hydroxyl group, an amino group; an aryl group, or a heterocyclic group; it is more preferable that $R^{93}$, $R^{94}$, $R^{97}$, and $R^{98}$ each represent an alkyl group, and $R^{91}$ and $R^{92}$, and $R^{95}$ and $R^{96}$ are bonded to each other to form an aryl ring; and it is most preferable that $R^{93}$, $R^{94}$, $R^{97}$, and $R^{98}$ each represent alkyl groups having 1 to 20 carbon atoms, and $R^{91}$ and $R^{92}$, and $R^{95}$ and $R^{96}$ are bonded to each other to form a benzene ring.

In the general formula (K-2), $R^{101}$, $R^{103}$, $R^{104}$, $R^{105}$, $R^{107}$, and $R^{108}$ have the same definitions as $R^{91}$, $R^{93}$, $R^{94}$, $R^{95}$, $R^{97}$, and $R^{98}$, respectively, in the general formula (K-1).

Particularly, it is preferable that $R^{101}$, $R^{103}$, $R^{105}$, and $R^{107}$ each represent a hydrogen atom, an alkyl group, a hydroxyl group, an amino group, an aryl group, or a heterocyclic group; it is more preferable that $R^{101}$, $R^{103}$, $R^{105}$, and $R^{107}$ each represent an alkyl group or an aryl group; it is still more preferable that $R^{104}$ and $R^{108}$ each represent a hydroxyl group or an amino group; it is even still more preferable that $R^{101}$, $R^{103}$, $R^{105}$, and $R^{107}$ each represent an alkyl group having 1 to 20 carbon atoms, and $R^{104}$ and $R^{108}$ are each a hydroxyl group.

When $R^{91}$, $R^{92}$, $R^{93}$, $R^{94}$, $R^{95}$, $R^{96}$, $R^{97}$, $R^{98}$, $R^{101}$, $R^{103}$, $R^{104}$, $R^{105}$, $R^{107}$, $R^{108}$ are each a group which may further be substituted, they may be substituted with a substituent selected from the monovalent substituents exemplified as $R^{94}$ to $R^{98}$. When they have two or more substituents, the substituents may be the same as or different from each other.

As the colorant compound which may be included in the colorant structure of the present invention, it is also preferable to have a structure derived from a squarylium compound represented by the general formula (K-2) as from the viewpoints of a hue.

When the squarylium-based compound represented by the general formula (K) is introduced into the structural units represented by the general formula (A) and the general formula (C), the multimer represented by the general formula (D) or the monomer represented by the general formula (1), the position to be introduced is not particularly limited, but is preferably any one of A and B in view of the synthetic compatibility. Particularly, when the squarylium compound represented by the general formula (K-1) or the general formula (K-2) is introduced into the structural units represented by the general formula (A) and the general formula (C), the multimer represented by the general formula (D) or the monomer represented by the general formula (1), the position to be introduced is not particularly limited, but is preferably any one of $R^{91}$, $R^{93}$, $R^{94}$, $R^{95}$, $R^{97}$, and $R^{98}$, or $R^{101}$, $R^{103}$, $R^{104}$, $R^{105}$, $R^{107}$, and $R^{108}$, and most preferably any one of $R^{93}$ and $R^{97}$, or $R^{103}$ and $R^{107}$ in view of the synthetic compatibility.

Examples of the method of introducing an alkali-soluble group into the colorant multimer according to the present invention include a method in which the alkali-soluble group is introduced into one, or two or more substituents of any of A and B. Particularly, when the squarylium compound is represented by the general formula (K-1) or (K-2), an alkali-soluble group may be introduced into one, or two or more substituents of any of $R^{91}$, $R^{93}$, $R^{94}$, $R^{95}$, $R^{97}$, and $R^{98}$, or $R^{101}$, $R^{103}$, $R^{104}$, $R^{105}$, $R^{107}$, and $R^{108}$. Among these, it is a most preferable embodiment that an alkali-soluble group is introduced into any one of $R^{93}$ and $R^{97}$, or $R^{103}$ and $R^{107}$.

General Formula (K-3)

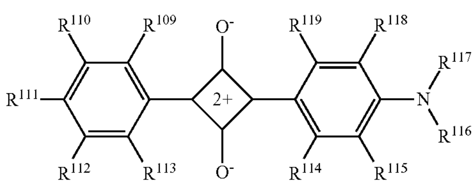

In the general formula (K-3), $R^{109}$, $R^{110}$, $R^{111}$, $R^{112}$, $R^{113}$, $R^{114}$, $R^{115}$, $R^{118}$, and $R^{119}$ have the same definitions as $R^{91}$, $R^{93}$, $R^{94}$, $R^{95}$, $R^{97}$, and $R^{98}$ in the general formula (K-3). $R^{116}$ and $R^{117}$ have the same definitions as $R^{93}$ and $R^{97}$ in the general formula (K-1).

In the general formula (K-3), it is preferable that $R^{109}$, $R^{110}$, $R^{111}$, $R^{112}$, $R^{113}$, $R^{114}$, $R^{115}$, $R^{118}$, and $R^{119}$ be a hydrogen atom, a halogen atom, a linear or branched alkyl group, a hydroxyl group, or an alkoxy group; and particularly, it is most preferable that $R^{109}$, $R^{113}$, $R^{115}$, $R^{118}$, and $R^{119}$ be a hydrogen atom, and $R^{110}$, $R^{111}$, and $R^{112}$ be a hydrogen atom or an alkoxy group, and $R^{114}$ be a hydrogen atom, a halogen atom, a hydroxyl group, an alkyl group having 1 to 5 carbon atoms, or an alkoxy group having 1 to 0.5 carbon atoms.

General Formula (K-4)

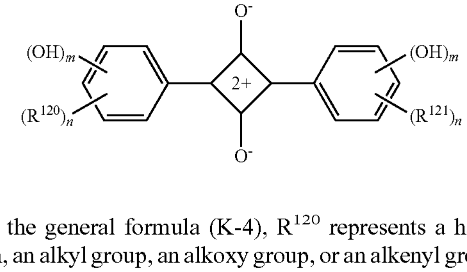

In the general formula (K-4), $R^{120}$ represents a halogen atom, an alkyl group, an alkoxy group, or an alkenyl group; m represents an integer of 1 to 4; and n represents an integer of 0 to 4.

$R^{120}$ is particularly preferably an alkyl group having 1 to 5 carbon atoms or an alkoxy group having 1 to 5 carbon atoms. m is preferably 1 to 3, and most preferably 3. n is preferably 0 to 3, and more preferably 0 or 1.

As the colorant compound which is capable of forming the colorant structure in the present invention, the squarylium compound represented by the general formula (K-1) is preferable from the viewpoint of a hue.

The squarylium compounds represented by the general formula (K-1) to the general formula (K-4) can be synthesized by employing the method described in J. Chem. Soc., Perkin Trans. 1, 2000, 599.

(sq-1)

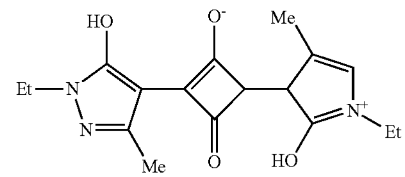

(sq-2)

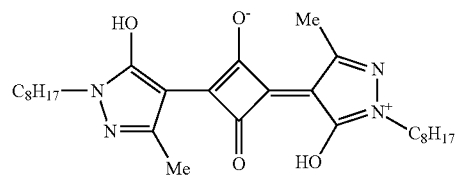

(sq-3)

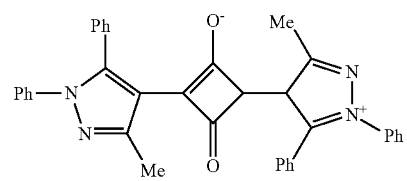

(sq-4)

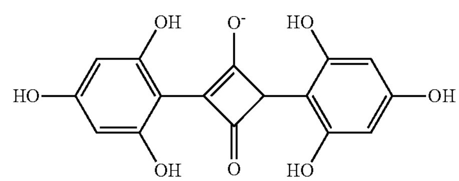

(sq-5)

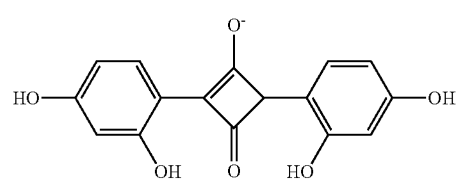

(sq-6)

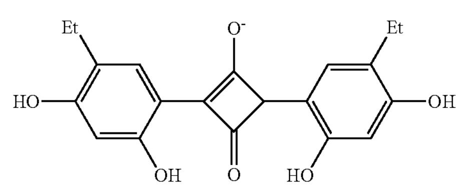

(sq-7)

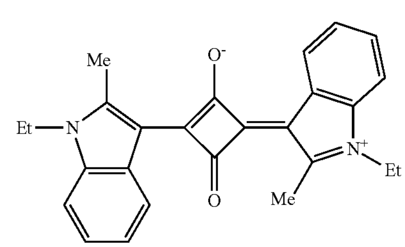

-continued (sq-8)

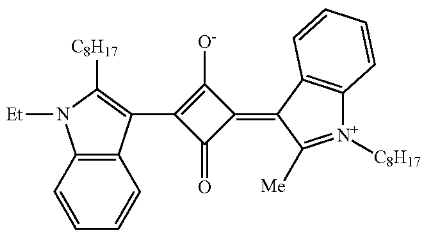

(sq-9)

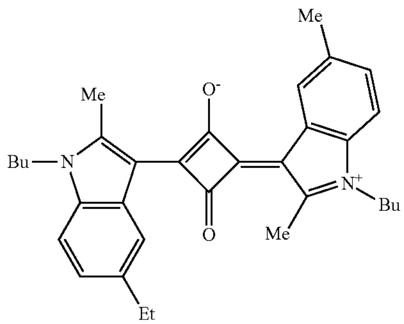

(sq-10)

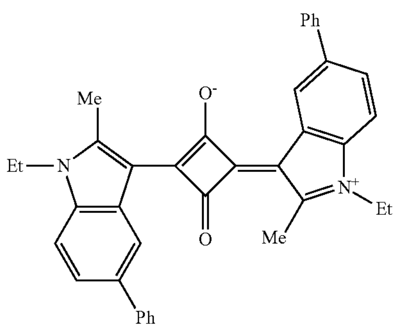

(sq-11)

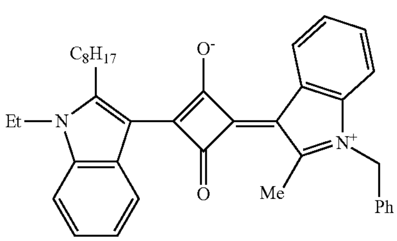

(sq-12)

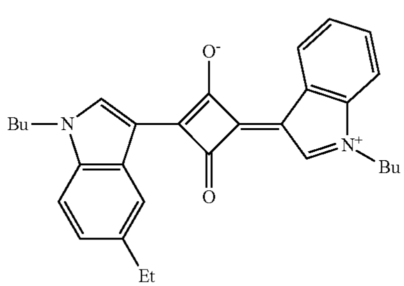

(sq-13)

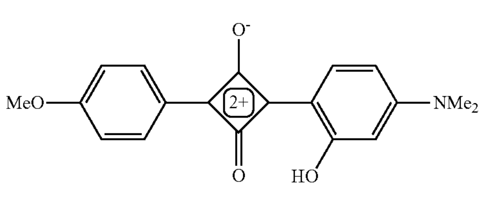

-continued (sq-14)

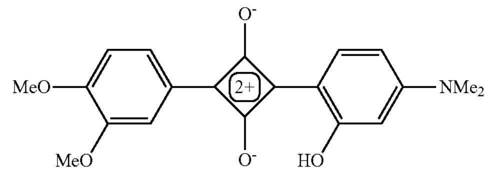

(sq-15)

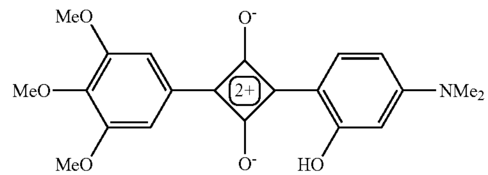

(sq-16)

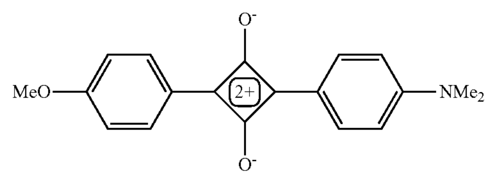

Among the specific examples above, (sq-1), (sq-2), (sq-3), (sq-7), (sq-8), (sq-9), (s9-9), (sq-10), (sq-11), and (sq-12) are preferable from the viewpoints of color characteristics and heat resistance.

The squarylium compound represented by any of the general formula (K) and the general formula (K-1) to the general formula (K-4) may have a functional group in addition to the alkali-soluble group; which is included as necessary, unless the effect of the present invention is impaired.

It is preferable that the molar extinction coefficient of the squarylium compound represented by any of the general formula (K) and the general formula (K-1) to the general formula (K-4) be as high as possible in view of the film thickness. Further, the maximum absorption wavelength λmax is preferably from 520 nm to 580 nm, and more preferably from 530 nm to 570 nm, from the viewpoint of improvement of the color purity. Further, the maximal absorption wavelength and the molar extinction coefficient are measured by means of a spectrophotometer UV-2400PC (manufactured by Shimadzu Corporation).

It is preferable that the melting point of the squarylium compound represented by any of the general formula (K) and the general formula (K-1) to the general formula (K-4) be not too high in view of solubility. More specifically, the melting point is preferably from 50° C. to 150° C.

The squarylium compound represented by any of the general formula (K) and the general formula (K-1) to the general formula (K-4) can be synthesized by employing the method described in J. Chem. Soc., Perkin Trans. 1, 2000, 599.

(Phthalocyanine Colorant)

Examples of the colorant compounds include a phthalocyanine colorant (phthalocyanine compound) represented by the following general formula (PH). The phthalocyanine compound in the present invention totally refers to a compound having a colorant moiety containing a phthalocyanine skeleton in the molecule.

General Formula (PH)

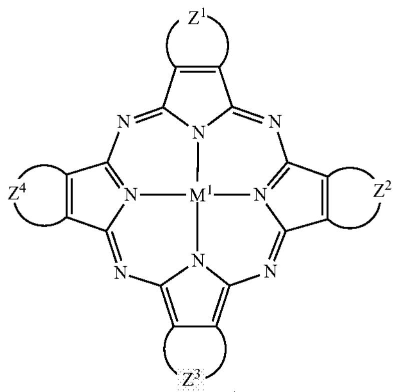

In the general formula (PH), $M^1$ represents a metal; $Z^1$, $Z^2$, $Z^3$, and $Z^4$ each independently represent an atomic group required for forming a 6-membered ring constituted with atoms selected from a hydrogen atom, a carbon atom, and a nitrogen atom.

The general formula (PH) will be described in detail.

In the general formula (PH), examples of the metal represented by M' include metal atoms such as Zn, Mg, Si, Sn, Rh, Pt, Pd, Mo, Mn, Pb, Cu, Ni, Co, Fe, and the like, metal chlorides such as AlCl, InCl, FeCl, $TiCl_2$, $SnCl_2$, $SiCl_2$, $GeCl_2$, and the like, metal oxides such as TiO, VO, and the like, and metal hydroxides such as $Si(OH)_2$ and the like, particularly preferably Cu and Zn.

In the general formula (PH), $Z^1$, $Z^2$, $Z^3$, and $Z^4$ each independently represent an atomic group required for forming a 6-membered ring constituted with atoms selected from a hydrogen atom, a carbon atom, and a nitrogen atom. The 6-membered ring may be either a saturated ring or an unsaturated ring, and may or may not have a substituent. Examples of the substituent include the substituents as mentioned in the section of the substituent group A above. Further, when the 6-membered ring has two or more substituents, the substituents may be the same as or different from each other. Further, the 6-membered ring may be fused with another 5-membered ring or 6-membered ring.

Examples of the 6-membered ring include a benzene ring, a cyclohexane ring, and the like.

Among the phthalocyanine colorant residues represented by the general formula (PH), a residue derived from a phthalocyanine colorant represented by the following general formula (PH-1) is particularly preferable.

General Formula (PH-1)

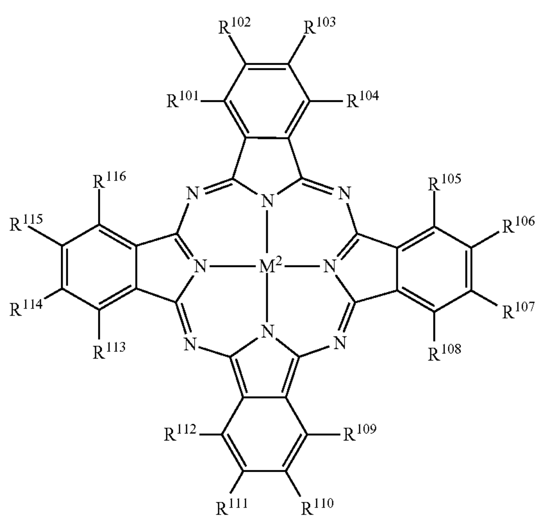

In the general formula (PH-1), $M^2$ has the same definition as $M^1$ in the general formula (PH), and in the general formula. (PH-1), $M^2$ has the same definition as $M^1$ in the general formula (PH) and a preferable embodiment thereof is also the same.

In the general formula (PH-1), when $R^{101}$ to $R^{116}$ are each independently a hydrogen atom or a substituent, and the substituents represented by $R^{101}$ to $R^{116}$ are each a group which may further be substituted, they may be substituted with a group mentioned in the section of the substituent group A above. When they have two or more substituents, the substituents may be the same as or different from each other.

Among these, the substituents represented by $R^{101}$ to $R^{116}$ are each preferably a hydrogen atom, $SO^2NR^{117}R^{118}$ (wherein $R^{117}$ and $R^{118}$ each represent a hydrogen atom or a linear or branched alkyl group which may have 3 to 20 carbon atoms), $SR^{119}$ (wherein $R^{119}$ represents a linear or branched alkyl group which may have 3 to 20 carbon atoms).

Specific examples of the compound represented by the general formula (PH) are shown below, but the present invention is not limited thereto.

(Ph-1)

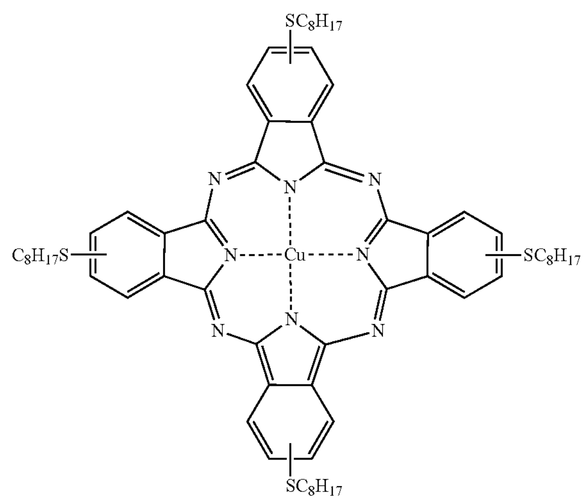

(Ph-2)

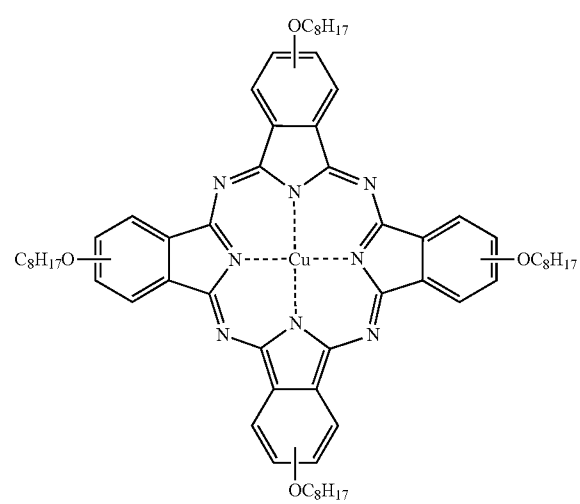

-continued
(Ph-3)
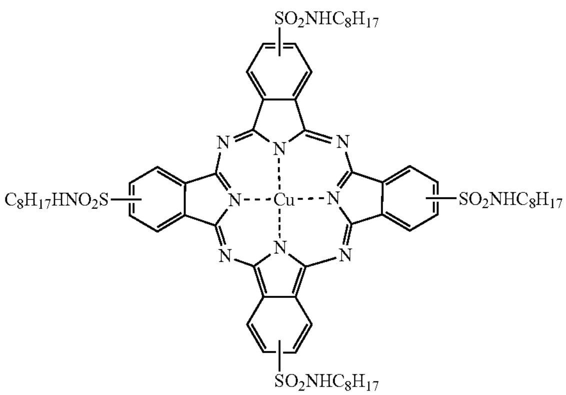
(Ph-4)
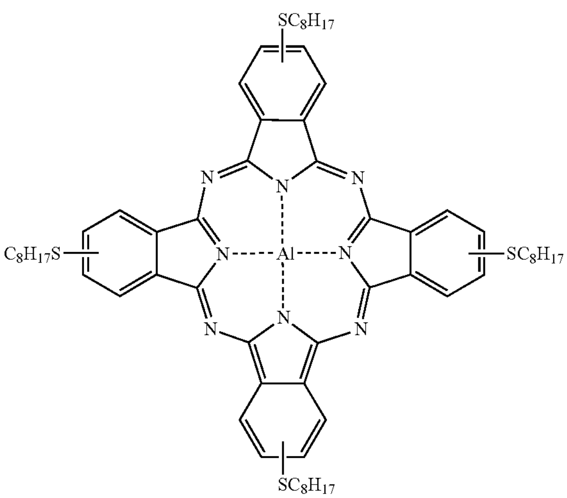
(Ph-5)
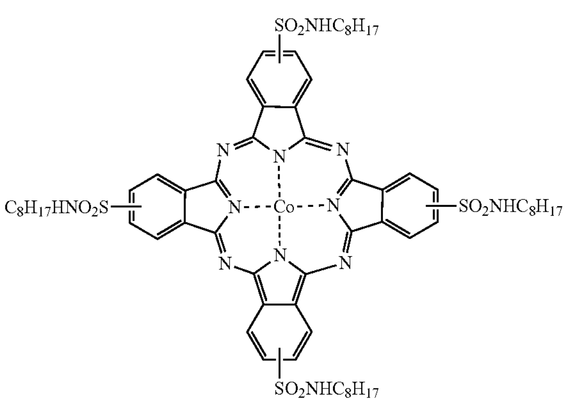
-continued
(Ph-6)
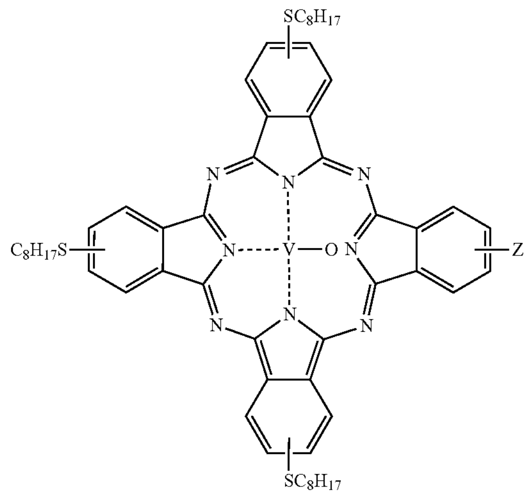
(Ph-7)
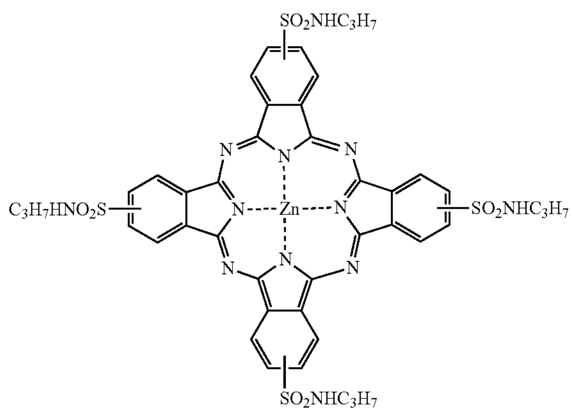
(Ph-8)
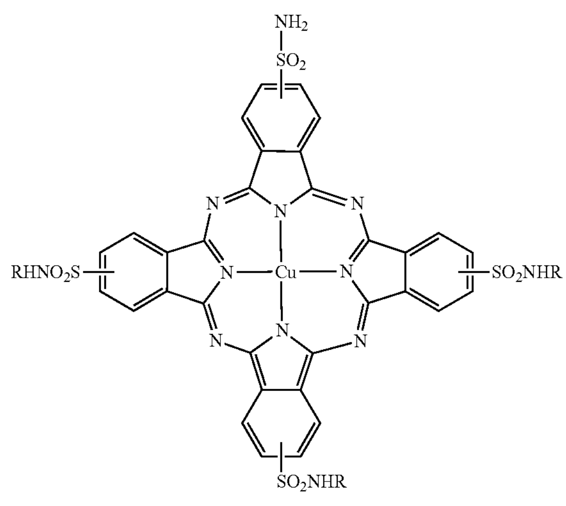
R = $CH_2CH_2CH_2OH$ -continued (Ph-9)

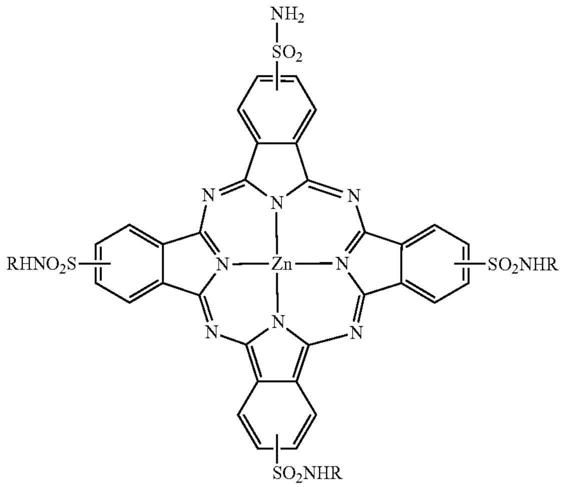

R = $CH_2CH_2CH_2OH$ (Ph-10)

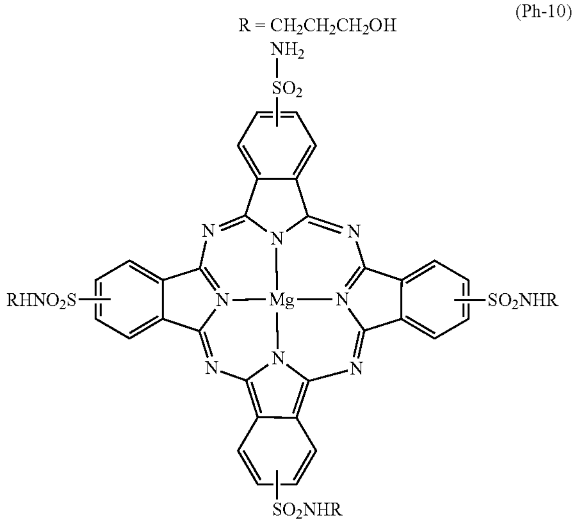

R = $CH_2CH_2CH_2OH$

Among the specific examples above, (Ph-1) to (Ph-3), and (Ph-7) to (Ph-10) are particularly preferable from the viewpoints of color characteristics and heat resistance.

(Subphthalocyanine Compound)

Examples of the colorant compounds include a subphthalocyanine colorant (subphthalocyanine compound) represented by the following general formula (SP). The subphthalocyanine compound in the present invention totally refers to a compound having a colorant moiety including a subphthalocyanine skeleton in the molecule.

General Formula (SP)

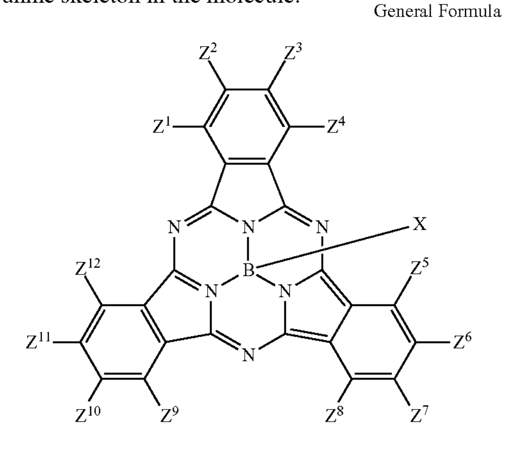

In the general formula (SP), $Z^1$ to $Z^{12}$ each independently represent a hydrogen atom, an alkyl group, an aryl group, a hydroxyl group, a mercapto group, an amino group, an alkoxy group, an aryloxy group, or a thioether group; and X represents an anion.

The general formula (SP) will be described in detail.

The alkyl group which $Z^1$ to $Z^{12}$ in the general formula (SP) may have is a linear or branched substituted or unsubstituted alkyl group. $Z^1$ to $Z^{12}$ particularly preferably have 1 to 20 carbon atoms, and still more preferably 1 to 10 carbon atoms. Examples of the substituent which $Z^1$ to $Z^{12}$ may have include the substituents as mentioned in the section of the substituent group A above, but particularly preferably include a fluorine atom, a hydroxyl group, and a mercapto group.

X in the general formula (SP) is an anion. Specific examples of X include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. X may be linked to a colorant skeleton or to a part (a polymer chain and the like) of a colorant multimer.

X is preferably a fluorine anion, a chlorine anion, a bromine anion, an iodine anion, a perchlorate anion, or a carboxylic acid anion, and most preferably a perchlorate anion or a carboxylic acid anion.

Specific examples of the subphthalocyanine compound are shown below, but the present invention is not limited thereto.

(SP-1)

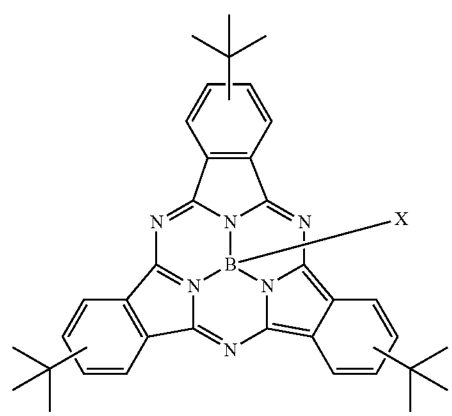

(SP-2)

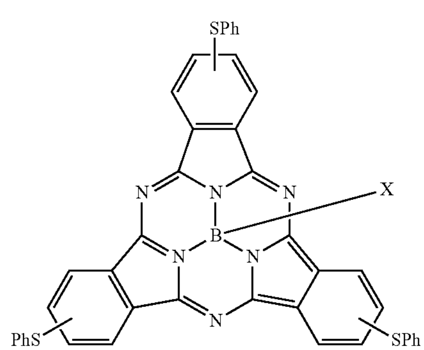

-continued (SP-3)

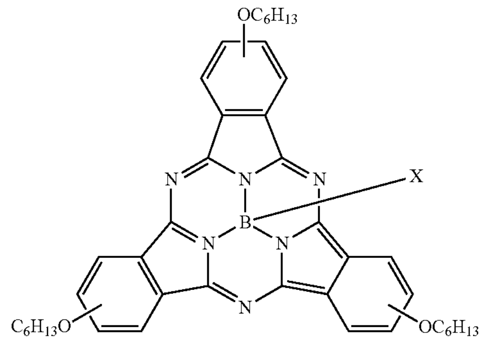

(SP-4)

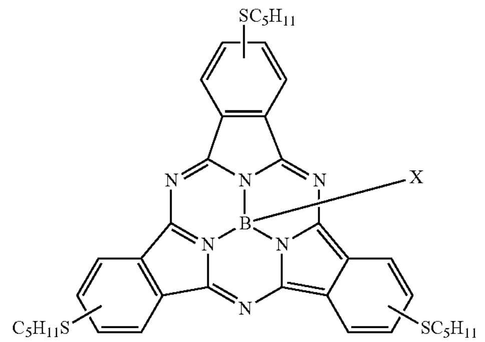

(SP-5)

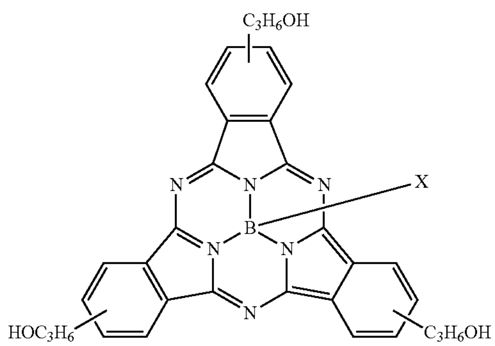

(SP-6)

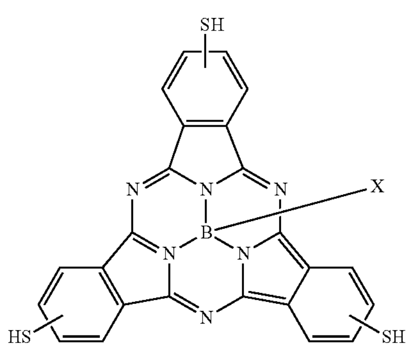

-continued (SP-7)

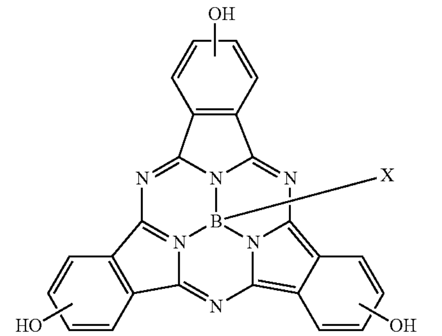

(SP-8)

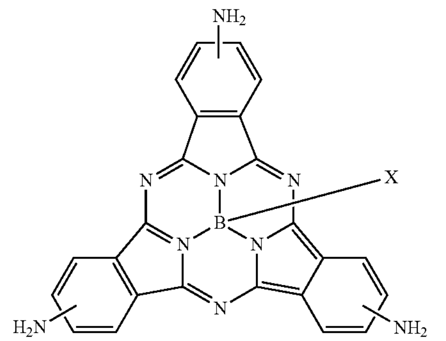

(SP-9)

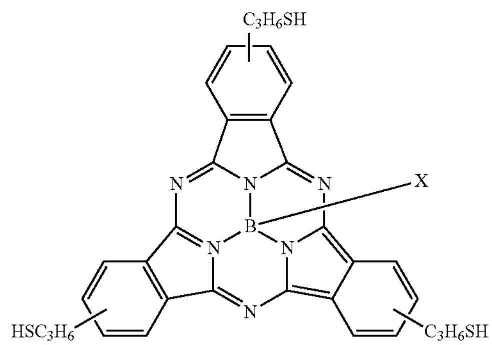

(S0-10)

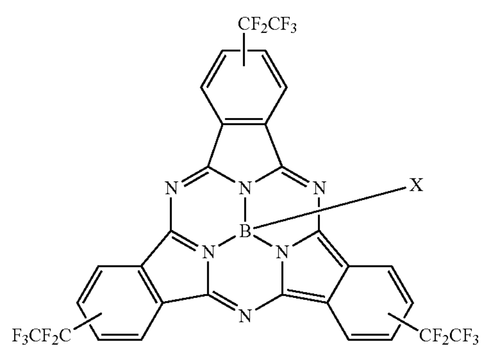

Among the specific examples above, (SP-2), (SP-3), (SP-4), (SP-5), (SP-6), and (SP-7) are particularly preferable from the viewpoints of color characteristics and heat resistance.

(Anthraquinone Colorant)

Examples of the colorant compounds include an anthraquinone colorant (anthraquinone compound) represented by any of the following general formulae (AQ-1) to (AQ-3). The anthraquinone compound in the present invention totally refers to a compound having a colorant moiety including an anthraquinone skeleton in the molecule.

General Formula (AQ-1)

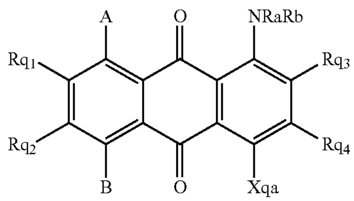

General Formula (AQ-2)

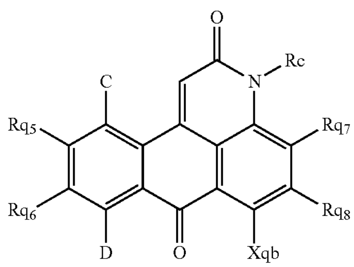

General Formula (AQ-3)

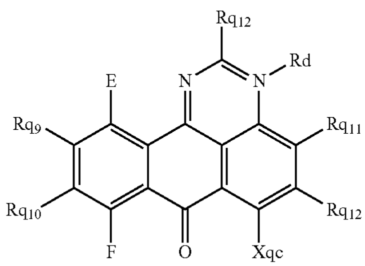

In the general formula (AQ-1), A and B each independently represent an amino group, a hydroxyl group, an alkoxy group, or a hydrogen atom; Xqa represents $ORqa_1$ or $NRqa_2Rqa_3$; $Rqa_1$ to $Rqa_3$ each independently represent a hydrogen atom, an alkyl group, or an aryl group; and $Rq_1$ to $Rq_4$ each represent a substituent. The substituents which $Rq_1$ to $Rq_4$ may have are the same as the substituents as mentioned in the section of the substituent group A above. Ra and Rb each independently represent a hydrogen atom, an alkyl group, or aryl group.

In the general formula (AQ-2), C and D have the same definitions as A and B in the general formula (AQ-1); Xqb represents $ORqb_1$ or $NRqb_2Rqb_3$; $Rqb_1$ to $Rqb_3$ each independently represent a hydrogen atom, an alkyl group, or an aryl group; and $Rq_5$ to $Rq_8$ each represent a substituent. $Rq_5$ to $Rq_8$ have the same definitions as $Rq_1$ to $Rq_4$ in the general formula (AQ-1). Rc has the same definition as Ra or Rb in the general formula (AQ-1).

In the general formula. (AQ-3), E and F have the same definitions as A and B in the general formula (AQ-1); Xqc represents $ORqc_1$ or $NRqc_2Rqc_3$; and $Rqc_1$ to $Rqc_3$ each independently represent a hydrogen atom, an alkyl group, or an aryl group. $Rq_9$ to $Rq_{12}$ have the same definitions as $Rq_1$ to $Rq_4$ in the general formula (AQ-1). Rd has the same definition as Ra or Rb in the general formula (AQ-1).

In the general formula, (AQ-1), A and B are preferably a hydrogen atom. Xqa is preferably $ORqa_1$ (wherein $Rqa_1$ represents a hydrogen atom, an alkyl group having 1 to 5 carbon atoms, or a phenyl group), $NRqa_2Raq_3$ (wherein $Rqa_2$ represents a hydrogen atom, and $Rqa_3$ represents an alkyl group having 1 to 5 carbon atoms, or a phenyl group). $Rq_1$ to $Rq_4$ preferably represent a hydrogen atom, a halogen atom, or an alkoxy group. Ra is preferably a, hydrogen atom. Rb preferably represents a hydrogen atom, an alkyl group having 1 to 5 carbon atoms, or a phenyl group, In the general formula (AQ-2), C and D are preferably a hydrogen atom. Xqb is preferably $ORqb_1$ (wherein $Rqb_1$ represents a hydrogen atom, an alkyl group having 1 to 5 carbon atoms, or a phenyl group), $NRqb_2Rbq_3$ (wherein $Rqb_2$ represents a hydrogen atom, and $Rqb_3$ represents an alkyl group having 1 to 5 carbon atoms, or a phenyl group). $Rq_5$ to $Rq_8$ preferably represent a hydrogen atom, a halogen atom, or an alkoxy group. Rc preferably represents a hydrogen atom, an alkyl group having 1 to 5 carbon atoms, or a phenyl group.

In the general formula (AQ-3), E and F are preferably a hydrogen atom. Xqb is preferably $ORqc_1$ (wherein $Rqc_1$ represents a hydrogen atom, an alkyl group having 1 to 5 carbon atoms, or a phenyl group), $NRqc_2Rbq_3$ (wherein $Rqc_2$ represents a hydrogen atom, and $Rqc_3$ represents an alkyl group having 1 to 5 carbon atoms, or a phenyl group). $Rq_9$ to $Rq_{12}$ preferably represent a hydrogen atom, a halogen atom, or an alkoxy group. Rd, preferably represents a hydrogen atom, an alkyl group having 1 to 5 carbon atoms, or a phenyl group.

Specific examples of the anthraquinone colorant are shown below, but the present invention is not limited thereto.

(aq-1)

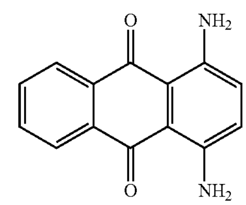

(aq-2)

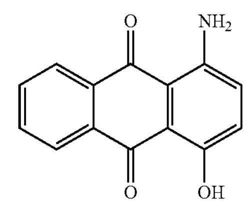

(aq-3)

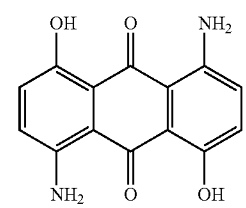

(aq-4)

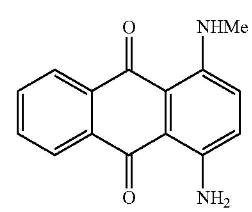

(aq-5)

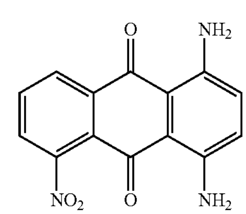

-continued (aq-6)

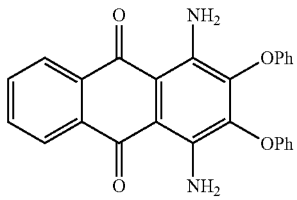

(aq-7)

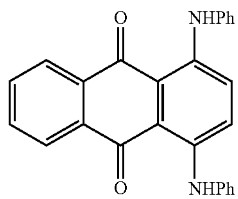

(aq-8)

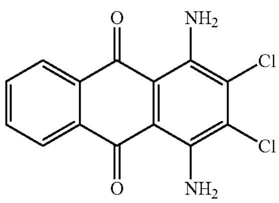

(aq-9)

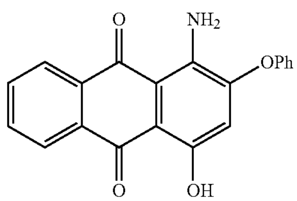

(aq-10)

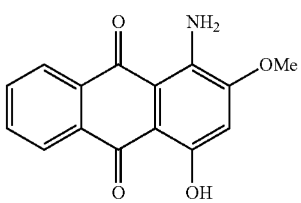

(aq-11)

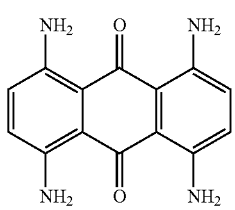

(aq-12)

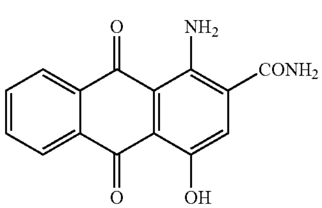

-continued (aq-13)

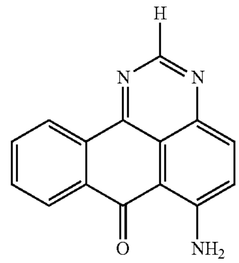

(aq-14)

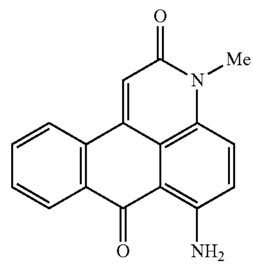

(aq-15)

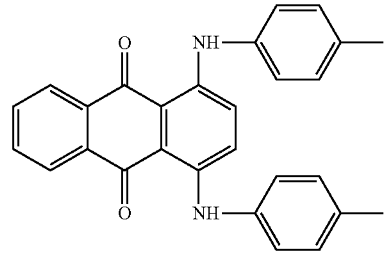

Among the specific examples above, (aq-1) to (aq-4), (aq-13), (aq-14), and (aq-15) are particularly preferable from the viewpoints of color characteristics and heat resistance.

(Triphenylmethane Colorant)

Examples of the colorant compounds include a triphenylmethane colorant (triphenylmethane compound) represented by the following general formula (TP). The triphenylmethane compound in the present invention totally refers to a compound having a colorant moiety containing a triphenylmethane skeleton in the molecule.

General Formula (TP)

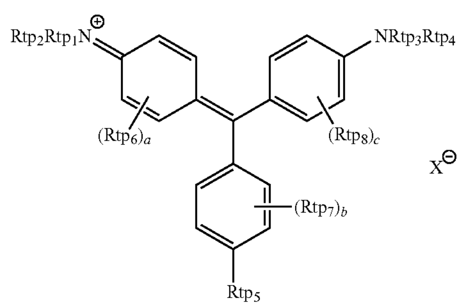

In the general formula (TP), $Rtp_1$ to $Rtp_4$ each independently represent a hydrogen atom, an alkyl group, or an aryl group; $Rtp_5$ represents a hydrogen atom, an alkyl group, an aryl group or $NRtp_9Rtp_{10}$ (wherein $Rtp_9$ and $Rtp_{10}$ each, represent a hydrogen atom, an alkyl group, or an aryl group); $Rtp_6$, $Rtp_7$, and $Rtp_8$ each represent a substituent; and a, b, and c each represent an integer of 0 to 4, and when a, b, and c are 2 or more, $Rtp_6$, $Rtp_7$, and $Rtp_8$ may be bonded to each other to form a ring; and K represents an anion.

In the general formula (TP), $Rtp_1$ to $Rtp_6$ are preferably a hydrogen atom, a linear or branched alkyl group having 1 to 5 carbon atoms, or a phenyl group. $Rtp_5$ is preferably a hydrogen atom or $NRtp_9Rtp_{10}$, and most preferably $NRtp_9Rtp_{10}$. $Rtp_9$ and $Rtp_{10}$ each represent a hydrogen atom, a linear or branched alkyl group having 1 to 5 carbon atoms, or a phenyl group. As the substituents represented by $Rtp_6$, $Rtp_7$, and $Rtp_8$, any of the substituents mentioned in the section of the substituent group A above may be used, but a linear or branched alkyl group having 1 to 5 carbon atoms, an alkenyl group having 1 to 5 carbon atoms, an aryl group having 6 to 15 carbon atoms, a carboxyl group, or a sulfo group is particularly preferable, and a linear or branched alkyl group having 1 to 5 carbon atoms, an alkenyl group having 1 to 5 carbon atoms, a phenyl group, or a carboxyl group is still more preferable. Particularly, $Rtp_6$ and $Rtp_8$ are preferably an alkyl group having 1 to 5 carbon atoms, $Rtp_7$ is preferably an alkenyl group (particularly a phenyl group formed by linking adjacent two alkenyl groups is preferable), a phenyl group, or a carboxyl group.

In the general formula (TP), a, b, or c each independently represent an integer of 0 to 4. Particularly, a and b are preferably 0 to 1, and c is preferably 0 to 2.

In the general formula (TP), $X^-$ represents an anion. Specific examples of $X^-$ include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. $X^-$ may be linked to a colorant skeleton or to a part (a polymer chain and the like) of a colorant multimer.

In the general formula (TP), $X^-$ is preferably a fluorine anion, a chlorine anion, a bromine anion, an iodine anion, a perchlorate anion, or a carboxylic acid anion, and most preferably a perchlorate anion or a carboxylic acid anion.

Specific examples of the compound represented by the general formula (TP) are shown below, but the present invention is not limited thereto.

(tp-1)

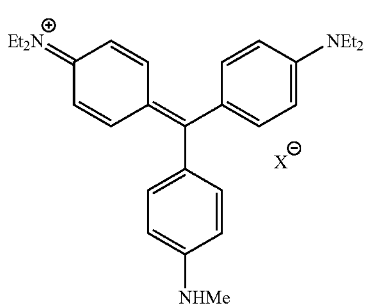

-continued (tp-2)

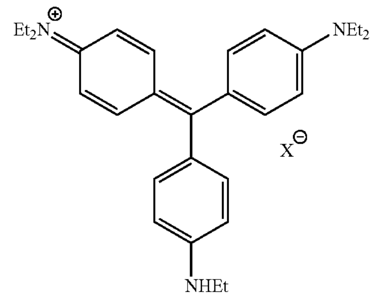

(tp-3)

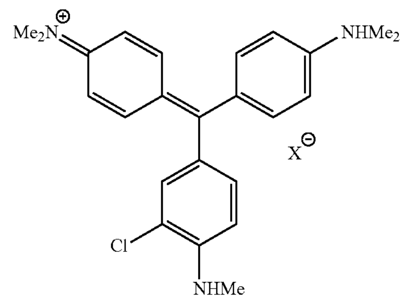

(tp-4)

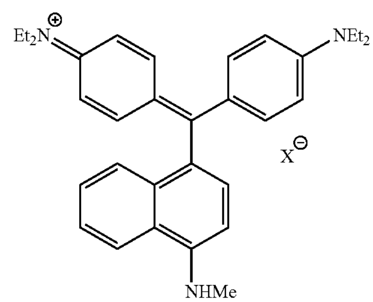

(tp-5)

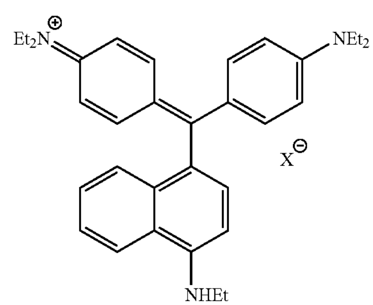

(tp-6)

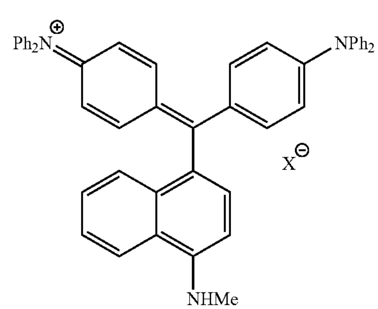

-continued
(tp-7)
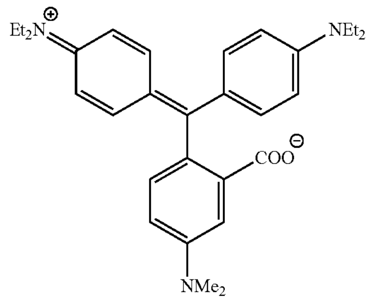
(tp-8)
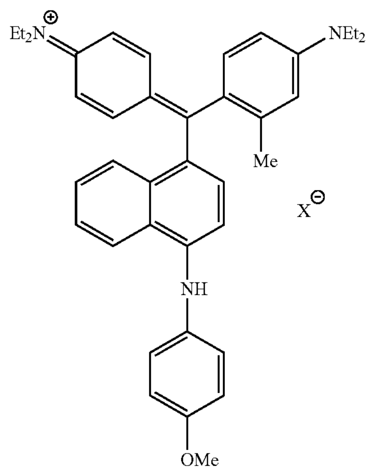
(tp-9)
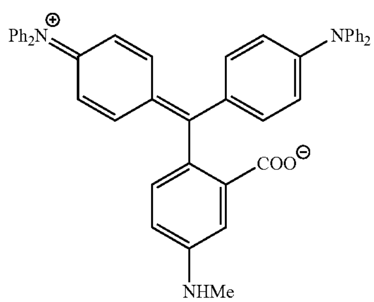
(tp-10)
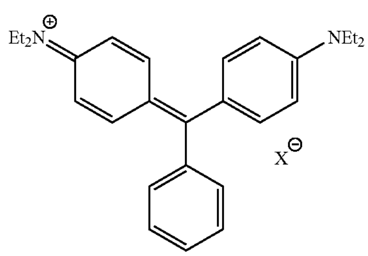
(tp-11)
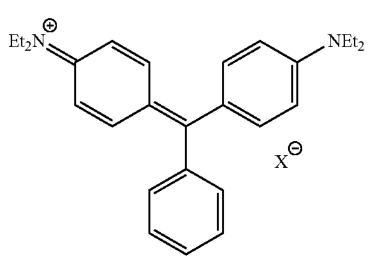
-continued
(tp-12)
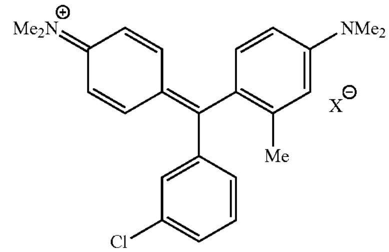
(tp-13)
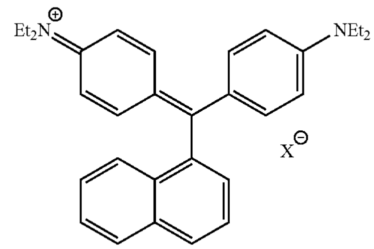
(tp-14)
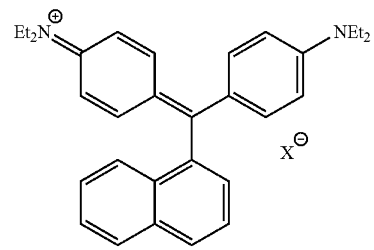
(tp-15)
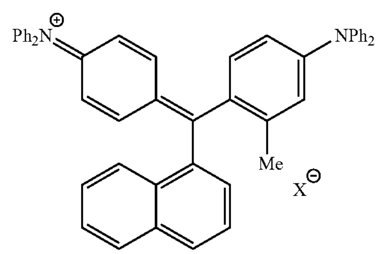
(tp-16)
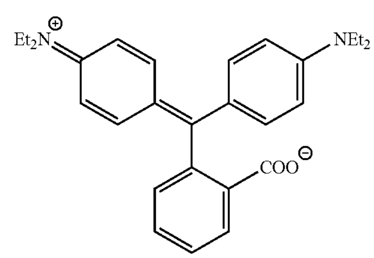
(tp-17)
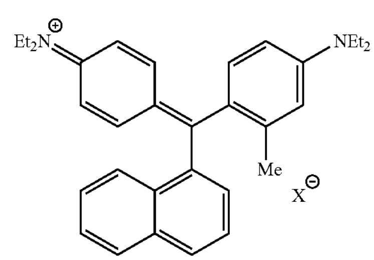

-continued (tp-18)

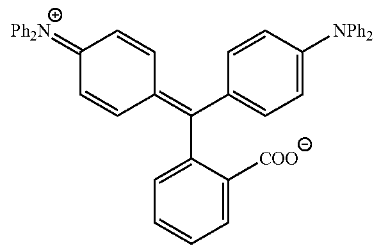

Among the specific examples above, (tp-4), (tp-5), (tp-6), and (tp-8) are particularly preferable from the viewpoints of color characteristics and heat resistance.

(Cyanine Colorant)

Examples of the colorant compounds include a cyanine colorant (cyanine compound) represented by the following general formula (PM). The cyanine compound in the present invention totally refers to a compound having a colorant moiety including a cyanine skeleton in the molecule.

General Formula (PM)

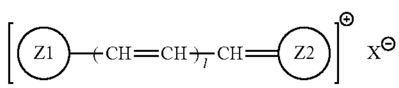

In the general formula (PM), the rings Z1 and Z2 each independently represent a heterocycle which may have a substituent; 1 represents an integer of 0 to 3; and $X^-$ represents an anion.

In the general, formula (PM), examples of the rings Z1 and Z2 each independently include oxazole, benzoxazole, oxazoline, thiazole, thiazoline, benzothiazole, benzoindolenine, 1,3-thiadiazine, and the like.

In the general formula (PM), the substituents which the rings. Z1 and Z2 may have are the same as the substituents mentioned in the section of the substituent group A above. Specific of $X^-$ include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. $X^-$ may be linked to a colorant skeleton or to a part (a polymer chain and the like) of a colorant multimer.

The compound represented by the general formula (PM) is a preferably a compound represented by the following general formula (PM-2)

General Formula (PM-2)

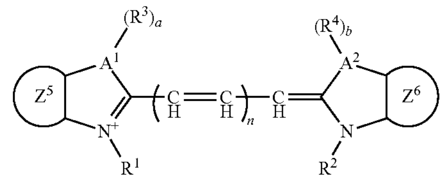

In the general formula (PM-2), the rings $Z^5$ and the rings $Z^6$ each independently represent a benzene ring which may have a substituent or a naphthalene ring which may have a substituent.

In the general formula (PM-2), Y represents $Cl^-$, $Br^-$, $I^-$, $ClO_4^-$, $OH^-$, a monovalent organic carboxylic acid anion, a monovalent organic sulfonic acid anion, a monovalent bromine anion, or a monovalent organic metal complex anion. $Y^-$ may be linked to a colorant skeleton or to a part (a polymer chain and the like) of a colorant multimer.

In the general formula (PM-2), n represents an integer of an integer of 0 to 3.

In the general formula (PM-2), $A^1$ and $A^2$ each independently represent an oxygen atom, a sulfur atom, a selenium atom, a carbon atom, or a nitrogen atom.

In the general formula (PM-2), $R^1$ and $R^2$ each independently represent a monovalent aliphatic hydrocarbon group having 1 to 20 carbon atoms which may have a substituent.

In the general formula (PM-2), $R^3$ and $R^4$ each independently represent a hydrogen atom or a monovalent aliphatic hydrocarbon group having 1 to 6 carbon atoms, but one $R^3$ and one $R^4$ may be bonded to each other to form a divalent aliphatic hydrocarbon group having 2 to 6 carbon atoms.

In the general formula (PM-2), a and b each independently represent an integer of 0 to 2.

In the general formula (PM-2), $Y^-$ is preferably a fluorine anion, a chlorine anion, a bromine anion, an iodine anion, a perchlorate anion, or a carboxylic acid anion, and most preferably a chlorine anion, a perchlorine anion, or a carboxylic acid anion. n is preferably 1. $A^1$ and $A^2$ each independently represent an oxygen atom, a sulfur atom, or a carbon atom, and most preferably the both are carbon atoms.

Specific examples of the cyanine compound are shown below, but the present invention is not limited thereto.

(pm-1)

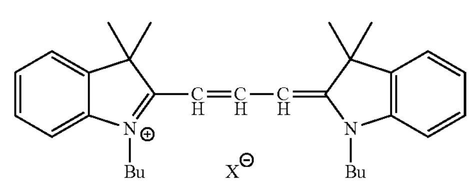

(pm-2)

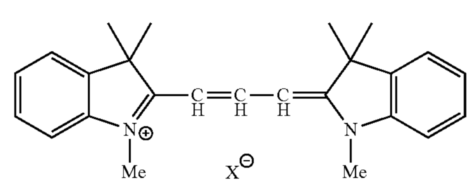

-continued (pm-3)

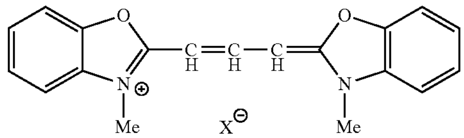

(pm-4)

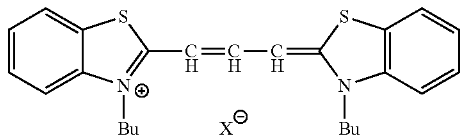

(pm-5)

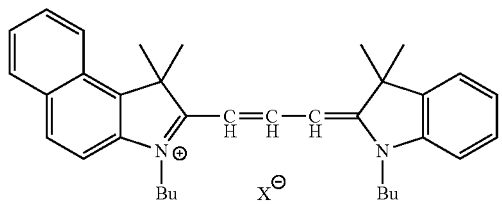

(pm-6)

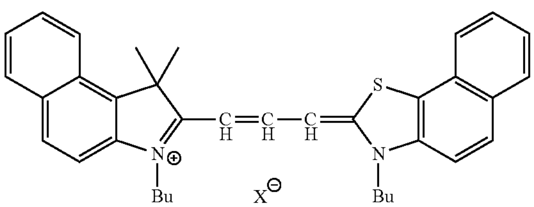

(pm-7)

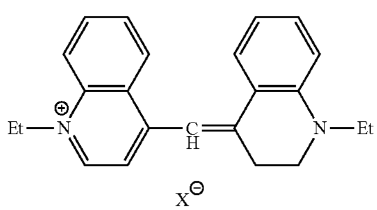

(pm-8)

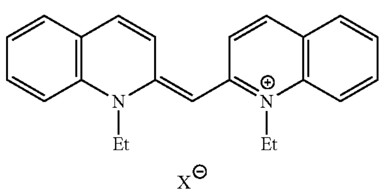

(pm-9)

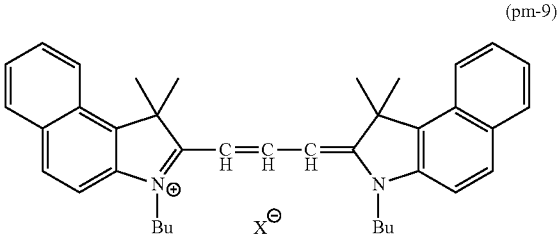

(pm-10)

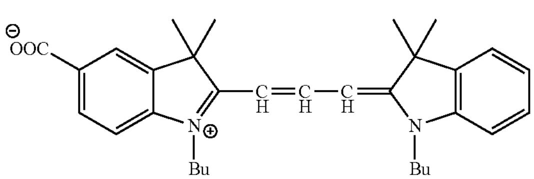

-continued (pm-11)

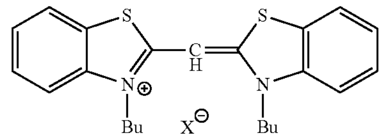

(pm-12)

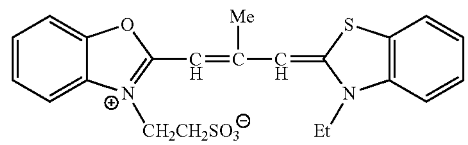

(pm-13)

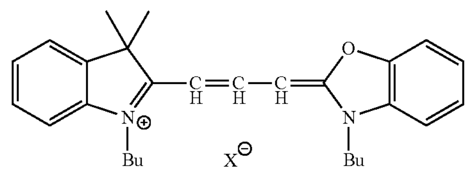

(pm-14)

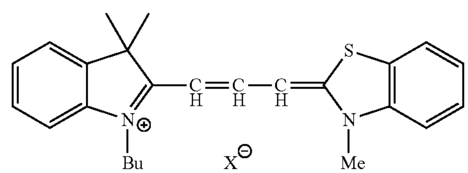

(pm-15)

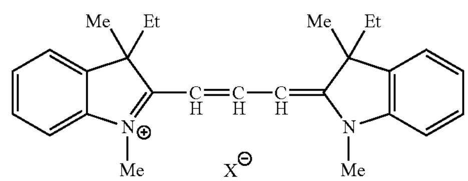

(pm-16)

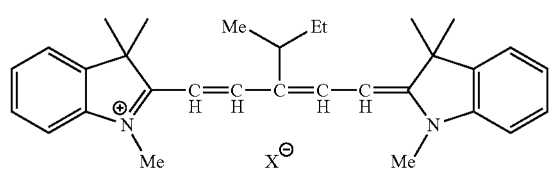

(pm-17)

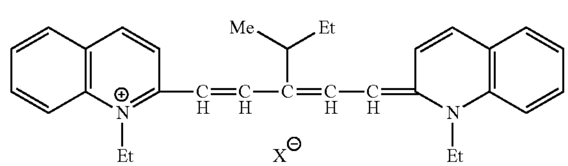

Among the specific examples above, the structures represented by (pm-1) to (pm-6), (pm-9), and (pm-10) are preferable, and among these, the colorant structures represented by (pm-1), (pm-2), and (pm-10) are particularly preferable from the viewpoints of color characteristics and heat resistance.

(Quinophthalone Colorant)

Examples of the colorant compounds include a quinophthalone colorant (quinophthalone compound) represented by the following general formula (QP). The a quinophthalone compound in the present invention totally refers to a compound having a colorant moiety containing a quinophthalone skeleton in the molecule.

General Formula (QP)

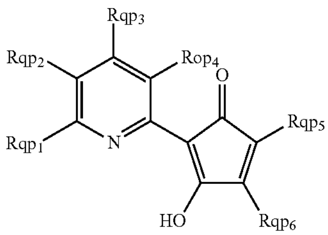

In the general formula (QP), $Rqp^1$ to $Rqp^6$ each independently represent a hydrogen atom or a substituent. When at least two of $Rqp^1$ to $Rqp^6$ are adjacent, they may be bonded to each other to form a ring and this ring may further have a substituent.

In the general formula (QP), the substituents represented by $Rqp^1$ to $Rqp^6$ represent the substituents as mentioned in the section of the substituent group A above. As the substituents represented by $Rqp^1$ to $Rqp^6$, a halogen atom, an alkyl group, an alkenyl group, and an aryl group are preferable, and $Rqp^1$ and $Rqp^2$, and $Rqp^5$ and $Rqp^6$ may be particularly preferably bonded to each other to form a substituted or unsubstituted phenyl group. $Rqp^3$ and $Rqp^4$ are preferably a hydrogen atom, a chlorine atom, or a bromine atom.

In the general formula (QP), examples of the substituent which the phenyl group formed by linking $Rqp^1$ and $Rqp^2$, and $Rqp^5$ and $Rqp^6$ may have include the substituents as mentioned in the section of the substituent above, but preferably a halogen atom, a carbamoyl group, an amino group, an alkoxy group, an aryloxy group, an alkylthio group, an arylthio group, and alkoxycarbonyl group.

Specific examples of the compound represented by the general formula (QP) are shown below, but the present invention is not limited thereto.

(QP-1)

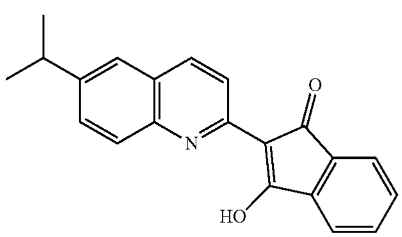

(QP-2)

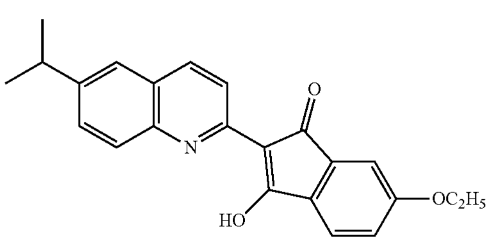

-continued (QP-3)

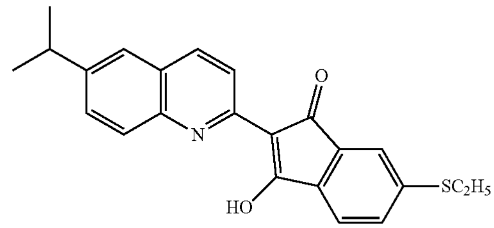

(QP-4)

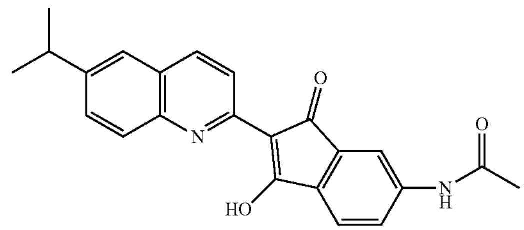

(QP-5)

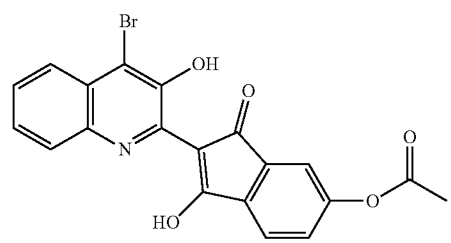

(QP-6)

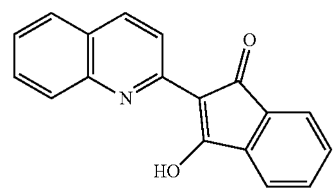

(QP-7)

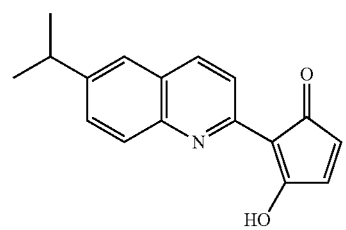

(QP-8)

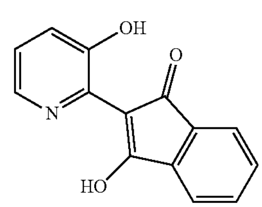

(QP-9)

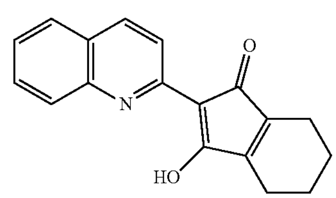

Among the specific examples above, (QP-1) to (QP-5) are preferable from the viewpoints of color characteristics and heat resistance.

It is preferable that the colorant structure used for the radiation-sensitive colored composition of the present invention further have a polymerizable group.

The method for introducing a polymerizable group into the colorant structure is not particularly limited, but a polymerizable compound having an ethylenically unsaturated group (such as a methacryl group, an acryl group, a styryl group, and the like), a cyclic ether group (such as an epoxy group, an oxetanyl group, and the like), and the like may be added to the colorant structure for introduction.

Specifically, a colorant structure having a polymerizable group can be synthesized by adding a polymerizable compound (methacryl chloride, acryl chloride, 4-(chloromethyl) styrene, glycidyl methacrylate, methacryloxyethyl isocyanate, and the like) to a colorant structure having a group which reacts with the polymerizable compound (such as a hydroxyl group, an amino group, a carboxyl group, and the like).

By introducing the polymerizable group to the colorant structure, curability, heat resistance, and solvent resistance are improved.

It is preferable that the colorant structure used for the radiation-sensitive colored composition of the present invention further have an alkali-soluble group.

The method for introducing an alkali-soluble group into the colorant structure is not particularly limited, but a compound having an alkali-soluble group may be added to the colorant structure for introduction.

Specifically, for example, by adding an alkali-soluble compound (such as thiomaleic acid, thioglycolic acid, 5-mercaptoisophthalic acid, 3-mercaptobenzoic acid, maleic acid, glycolic acid, 5-hydroxyisophthalic acid, 3-hydroxybenzoic acid, and the like) to a colorant structure having a group which reacts with a compound having an alkali-soluble group (such as an halogenated alkyl group, an α-halogenated acyl group, and the like), a colorant structure having an alkali-soluble group can be synthesized. By introducing the alkali-soluble group into the colorant structure, the formability of the color pattern is improved.

The colorant structure used for the radiation-sensitive colored composition of the present invention, from the viewpoint of the decrease of the device contamination and the suppression of the generation of the residues, preferably contains the alkali-soluble group to have an acid value of 10 mg KOH/g to 400 mg KOH/g, more preferably an acid value of 20 mg KOH/g to 300 mg KOH/g, and still more preferably an acid value of 30 mg KOH/g to 150 mg KOH/g.

In the present invention, the acid value is determined by the method as described in JIS Standard (JIS K 0070:1992).

(Colorant Multimer)

The colorant multimer used for the radiation-sensitive colored composition of the present invention is a colorant multimer including the above-described colorant structure as a partial structure of a colorant moiety. Particularly, it may be a colorant multimer including a colorant structure derived from a dipyrromethene compound as a partial structure of a colorant moiety, or a colorant multimer including a colorant structure derived from a dipyrromethene metal complex compound as a partial structure of a colorant moiety.

Any of methods for introducing a colorant structure into the colorant multimer of the present invention may be used, and thus, a multimer may be obtained by polymerizing or copolymerizing polymerizable monomers having the colorant skeleton introduced therein; or a multimer may be formed in advance and then a colorant skeleton may be introduced by a molecular reaction or the like.

In a preferable embodiment, examples of the colorant multimer include a colorant multimer including at least one constitutional unit represented by any of the following general formulae (A) to (C), a colorant multimer represented by the following general formula (D), and a multimer including colorant monomers represented by the following general formula (1) as a polymerization component.

(Preferable Physical Properties of Colorant Multimer Used in Radiation-Sensitive Colored Composition of the Present Invention)

The colorant multimer used for the radiation-sensitive colored composition of the present invention decreases the device contamination and suppresses the generation of the residues, and also, has excellent heat resistance and solvent resistance and less color transfer, and is capable of forming a good colored cured film having pattern formability, and therefore, it can be used for a radiation-sensitive colored composition which is preferable for formation of a color pattern of the color filter. From such a viewpoint, mentioning the preferable properties of the colorant multimers, from the viewpoints of improving the formability of the color pattern when forming a radiation-sensitive colored composition, the colorant multimer preferably has an alkali-soluble group.

The method for introducing an alkali-soluble group into the colorant multimer used for the radiation-sensitive colored composition of the present invention is not particularly limited, but may be introduced by synthesizing a colorant multimer using a monomer having an alkali-soluble group, or an alkali-soluble group may be introduced after synthesizing a colorant multimer.

In the case where a colorant multimer is synthesized using a monomer having an alkali-soluble group, the structure is different from ones of a colorant multimer including at least one constitutional unit represented by any of the following general formula (A), the following general formula (B), and the following general formula (C), a colorant multimer represented by the following general formula (D), and a colorant monomer represented by the general formula (1), and at least one of the monomers having a terminal ethylenically unsaturated bond preferably has an alkali-soluble group.

In the case where the constitutional unit represented by the following general formula (A), the following general formula (B), and the following general formula (C), or the colorant monomer represented by the following general formula (1) is a monomer having an alkali-soluble group, the monomer may have an alkali-soluble group at a Dye part (colorant residue). From the viewpoints of synthetic compatibility, a monomer in which at least one monomer having another ethylenically unsaturated bond, included as a copolymerization component, has an alkali-soluble group is preferable for a monomer which forms a constitutional unit having a Dye part (colorant residue).

From the viewpoint of formability of the color pattern, the colorant multimer used for the radiation-sensitive colored composition of the present invention has an acid value of 10 mg KOH/g to 400 mg KOH/g, more preferably an acid value of 20 mg KOH/g to 300 mg KOH/g, and still more preferably an acid value of 30 mg KOH/g to 150 mg KOH/g.

In the present invention, the acid value is determined by the method as described in JIS Standard (JIS K 0070:1992).

The solubility of the colorant multimer used for the radiation-sensitive colored composition of the present invention in an alkaline solution (pH of 9 to 15) which is a developing liquid is preferably from 0.1% by mass to 80% by mass, more preferably from 0.5% by mass to 50% by mass, and still more preferably from 1% by mass to 30% by mass. With the above-described range, a suitable pattern shape can be obtained and the residues on a substrate can be reduced when the colorant multimer of the present invention is used in the applications, which require of the alkali development of the radiation-sensitive colored composition.

Furthermore, the colorant multimer used for the radiation-sensitive colored composition of the present invention suppresses color transfer, and from the viewpoints of improving formability of the color pattern, it preferably has a polymerizable group. The polymerizable group included in the colorant multimer may be used singly or in combination of two or more kinds thereof.

Examples of the polymerizable group include an ethylenically unsaturated group (such as a methacryl group, an acryl group, a styryl group, and the like), a cyclic ether group (such as an epoxy group, an oxetanyl group, and the like), etc. Among these, in view of heat resistance after polymerization and solvent resistance, an ethylenically unsaturated group is preferable.

The colorant multimer containing a polymerizable group preferably includes a constitutional unit having a polymerizable group and a group derived from a colorant, as repeating units.

Furthermore, the colorant multimer containing a polymerizable group may include constitutional units other than a constitutional unit having a polymerizable group and a group derived from a colorant.

In the colorant multimer containing a polymerizable group, from the viewpoints of obtaining a thinner layer of a color filter, the constitutional unit having a group derived from the colorant is preferably included in an amount of 60% by mass to 99% by mass, more preferably 70% by mass to 97% by mass, and still more preferably 80% by mass to 95% by mass, in terms of the mass ratio, relative to the total solid contents of the radiation-sensitive colored composition.

Furthermore, from the viewpoint of heat resistance and solvent resistance, the constitutional unit having a polymerizable group is preferably included in the amount of 1% by mass to 40% by mass, preferably 3% by mass to 30% by mass, and still more preferably 5% by mass to 20% by mass, relative to the total content of the radiation-sensitive colored composition.

Herein, in the present specification, the total solid contents refer to the total content of all the components except for the solvent constituting the radiation-sensitive colored composition in the radiation-sensitive colored composition.

The constitutional unit having a polymerizable group can be introduced into the colorant multimer, for example, by the method as described later.

That is, copolymerization of the colorant structure and a copolymerization component having no colorant structure (such as methacrylic acid, acrylic acid, hydroxyethyl methacrylate, and the like) can be carried out to obtain a multimer, and then a polymerizable compound (such as glycidyl methacrylate, methacryloxyethyl isocyanate, and the like) having a group which reacts with a constitutional unit derived from the copolymerization component can be added thereto to introduce the constitutional unit having a polymerizable group.

Furthermore, in the colorant structure, a polymerizable group other than the polymerizable group involved in the multimerization of the colorant structure can be introduced into the colorant structure, and the colorant structure can also be polymerized to obtain a polymerizable group-containing colorant multimer.

(Structure of Colorant Multimer Used for Radiation-Sensitive Colored Composition of the Present Invention)

As the colorant multimer used for the radiation-sensitive colored composition of the present invention, a colorant multimer having a colorant structure derived from a dipyrromethene metal complex compound, an azo colorant, a xanthene colorant, a squarylium colorant, a phthalocyanine colorant, a subphthalocyanine colorant, an anthraquinone colorant, a triphenylmethane colorant, a cyanine colorant, a quinophthalone colorant, or the like is preferable; a dipyrromethene metal complex compound, an azo colorant, a xanthene colorant, a squarylium colorant, or a phthalocyanine colorant is more preferable; and a dipyrromethene metal complex compound, an azo colorant, or a phthalocyanine colorant is still more preferable; and a dipyrromethene metal complex compound is particularly preferable. Examples of the colorant multimer having the colorant structure include a colorant multimer including at least one of the structural units represented by the general formula (A), the general formula (B), and the general formula (C) below, a colorant multimer represented by the general formula (D), or a colorant monomer represented by the following general formula (1) as the polymerization components. These will be described sequentially.

<Constitutional Unit Represented by General Formula (A)>

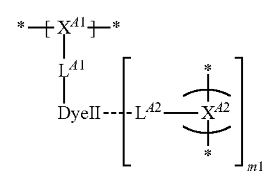

(A)

(in the general formula (A), $X^{A1}$ represents a linking group formed by polymerization; $L^{A1}$ represents a single bond or a divalent linking group; DyeII represents a color structure, and examples thereof include a colorant structure formed by removing any one to p hydrogen atoms from the dipyrromethene metal complex compound or tautomer thereof obtained from the dipyrromethene compound represented by the general formula (M) and a metal or a metal compound; p represents 1 or 2; $X^{A2}$ represents a linking group formed by polymerization; $L^{A2}$ represents a single bond or a divalent linking group; m1 represents an integer of 0 to 3, and when m1 is 2 or more, the structure in [ ] may be the same as or different from each other; and DyeII and $L^{A2}$ may be linked to each other by a covalent bond, an ionic bond or a coordinate bond.)

In the general formula (A), $X^{A1}$ and $X^{A2}$ each independently represent a linking group formed by polymerization, that is, they indicate parts that form repeating units corresponding main chains formed by a polymerization reaction. Further, the moieties represented by two *'s become units. $X^{A1}$ and $X^{A2}$ are not limited as long as they are formed from known polymerizable monomers, but examples thereof include linking groups formed by the polymerization of substituted or unsubstituted unsaturated ethylene groups, linking groups formed by the ring-opening polymerization of cyclic ethers, and the like, and preferably linking groups formed by the polymerization of unsaturated ethylene groups. Further, the groups shown below are preferable, and among these, styrenic and (meth)acrylic linking groups such as (X-11), (X-15), (XX-1), (XX-2), (XX-9), (XX-10), (XX-11), (XX-12), (XX-13), (XX-14), and (XX-15) are preferable from the heat resistance.
Furthermore, in (X-1) to (X-15), and (XX-1) to (XX-19) below, the moiety represented by * is linked with $L^{A1}$. Me represents a methyl group. R in (XX-14) and (XX-15) represents a hydrogen atom, an alkyl group having 1 to 5 carbon atoms, or a phenyl group.
(X-1)
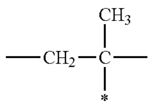
(X-2)
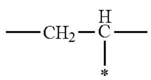
(X-3)
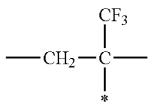
(X-4)
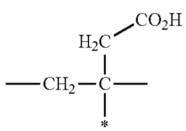
(X-5)
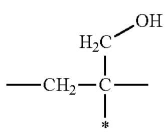
(X-6)
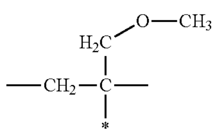
(X-7)
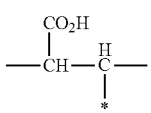
(X-8)
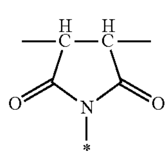
(X-9)
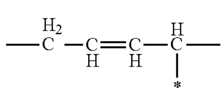
(X-10)
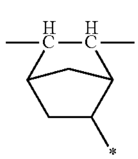
-continued
(X-11)
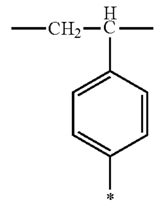
(X-12)
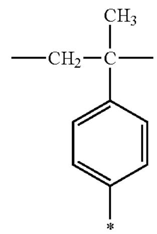
(X-13)
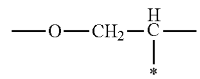
(X-14)
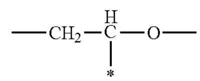
(X-15)
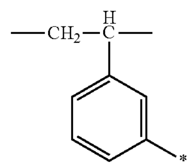
(XX-1)
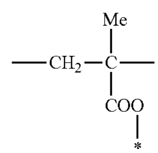
(XX-2)
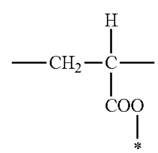
(XX-3)
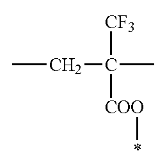
(XX-4)
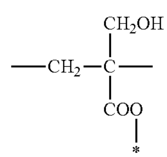
(XX-5)
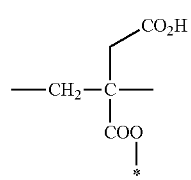

-continued
(XX-6)
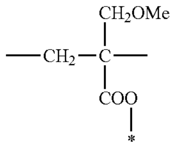
(XX-7)
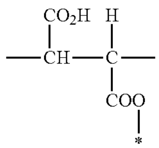
(XX-8)
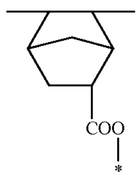
(XX-9)
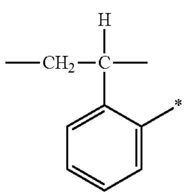
(XX-10)
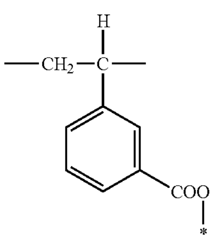
(XX-11)
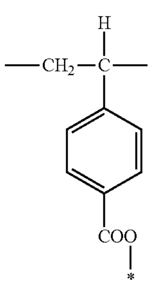
(XX-12)
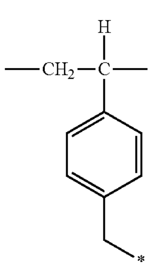
-continued
(XX-13)
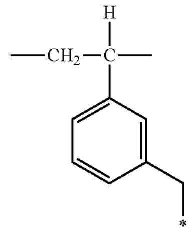
(XX-14)
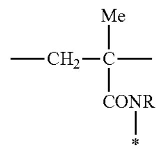
(XX-15)
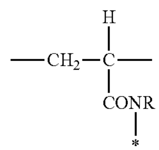
(XX-16)
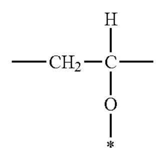
(XX-17)
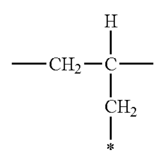
(XX-18)
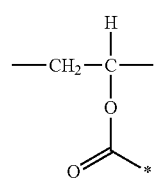
(XX-19)
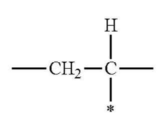
(in the general formula (A), $L^{A1}$ represents a single bond or a divalent linking group; and examples of the divalent linking group in the case where $L^{A1}$ represents a divalent linking group include substituted or unsubstituted alkylene groups having 1 to 30 carbon atoms (such as a methylene group, an ethylene group, a trimethylene group, a propylene group, a butylene group, and the like), substituted or unsubstituted allylene groups having 6 to 30 carbon atoms (such as a phenylene group, a naphthalene group, and the like), substituted or unsubstituted heterocyclic linking groups, —CH═CH—, —O—, —S—, —NR— (wherein R's each independently represent a hydrogen atom, an alkyl group, an aryl group, or a heterocyclic group), —C(═O)—, —SO—, —$SO_2$—, and a linking group formed by linking two or more of these groups.)

The divalent linking group in the general formula (A) is not limited in any way as long as it is within the range not impairing the effect of the present invention.

In the general formula (A), DyeII represents a colorant structure derived from the above-described colorant compound. For example, in the general formula (A), the colorant structure represented by DyeII represents a residue formed by removing any one to p hydrogen atoms from the dipyrromethene metal complex compound obtained from the dipyrromethene compound represented by the general formula (M) and a metal or a metal compound; and p represents 1 or 2.

The colorant multimer having a constitutional unit represented by the general formula (A) can be synthesized by (1) a method for synthesizing a monomer having a colorant residue by addition polymerization, or (2) a method for reacting a polymer having a highly reactive functional group such as an isocyanate group, an acid anhydride group, an epoxy group, and the like with a functional group that can react with a highly reactive functional group (a hydroxyl group, a primary or secondary amino group, a carboxyl group, and the like).

For the addition polymerization, known addition polymerization (radical polymerization, anion polymerization, or cationic polymerization) can be employed, but among these, particularly, synthesis by the radical polymerization can make the reaction condition milder and do not cause decomposition of the colorant structure, which is thus preferable. For the radical polymerization, known reaction conditions can be employed.

Among these, the colorant multimer having the constitutional unit represented by the general formula (A) in the present invention is preferably a radical polymer obtained by the radical polymerization using a colorant monomer having an ethylenically unsaturated bond from the viewpoint of heat resistance.

Specific examples of the constitutional unit represented by the general formula (A) are shown below, but the present invention is not limited thereto.

(A-dp-1)

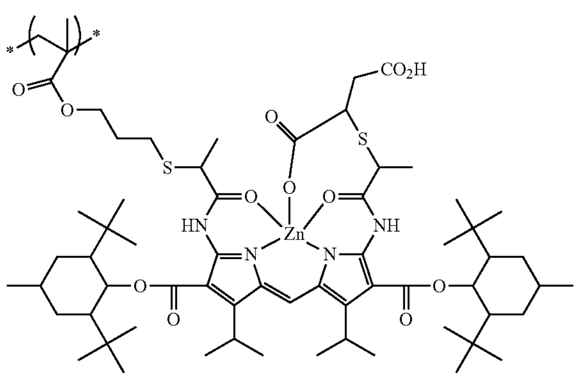

(A-dp-2)

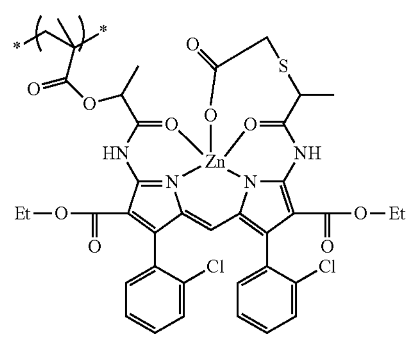

(A-dp-3)

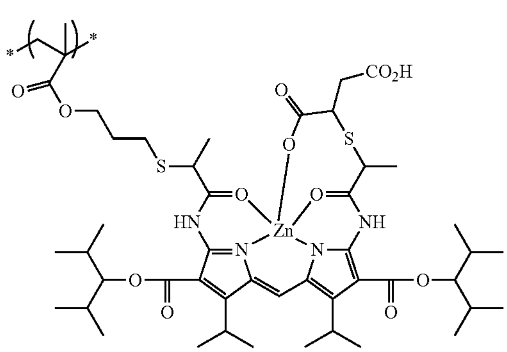

(A-dp-4)

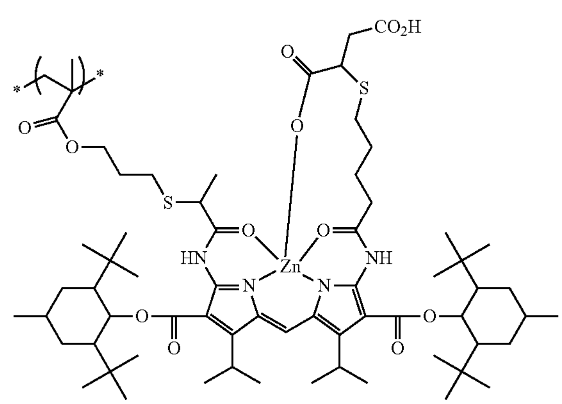

-continued
(A-dp-5)
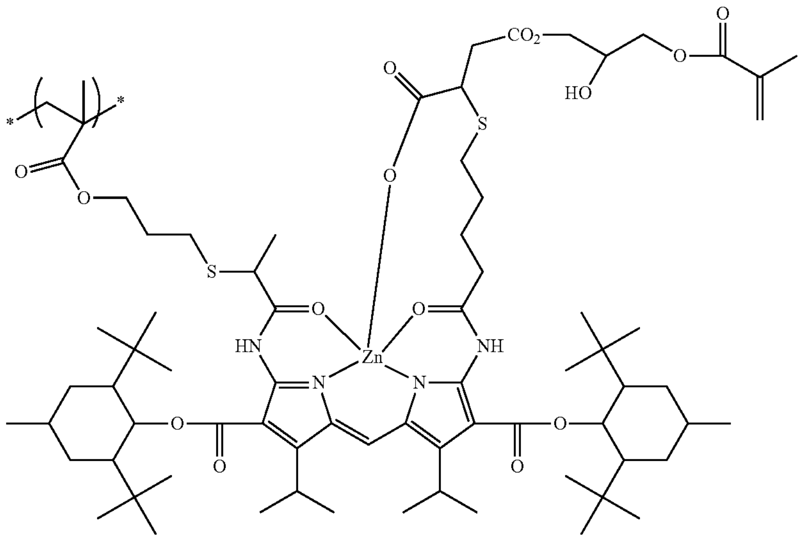
(A-dp-6)
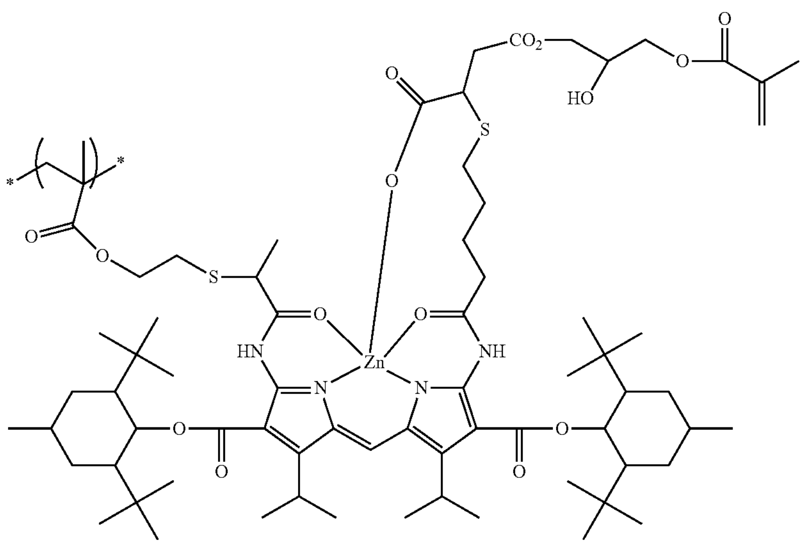
(A-dp-7)
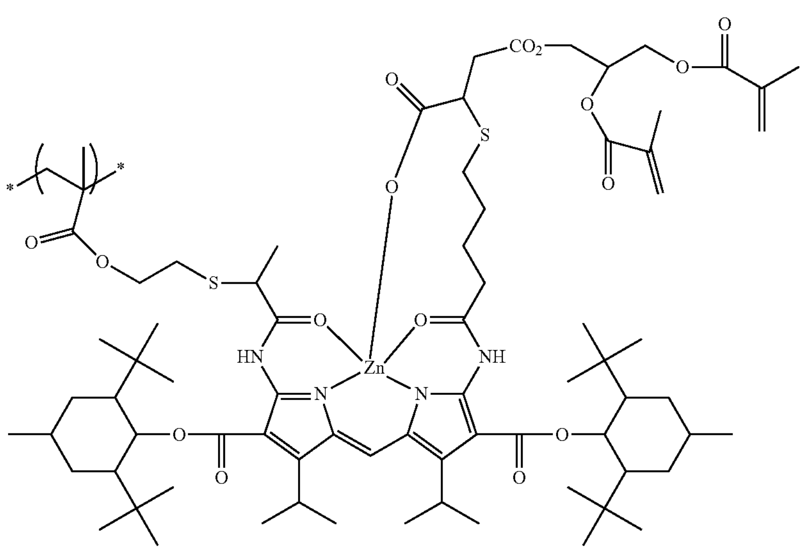

-continued
(A-dp-8)
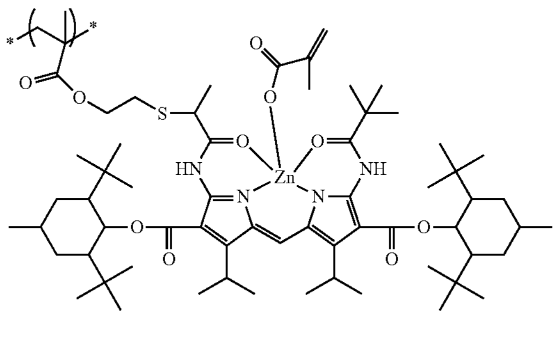
(A-dp-9)
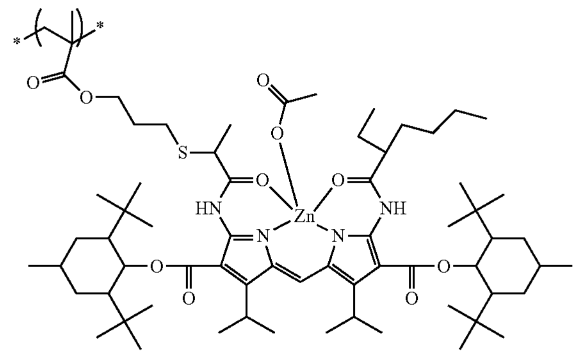
(A-dp-10)
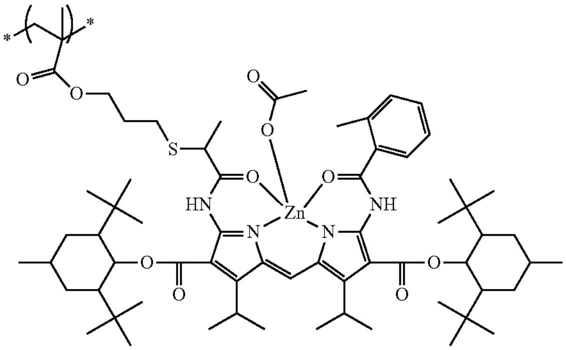
(A-dp-11)
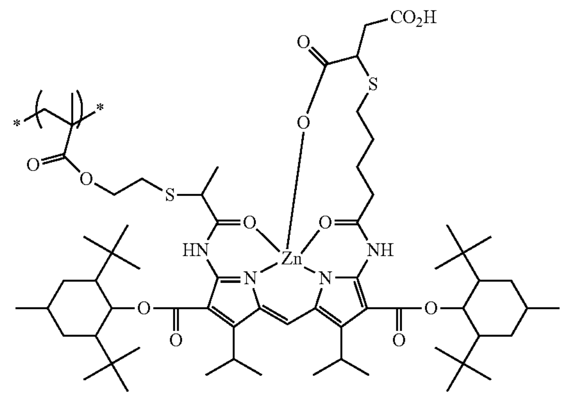
(A-dp-12)
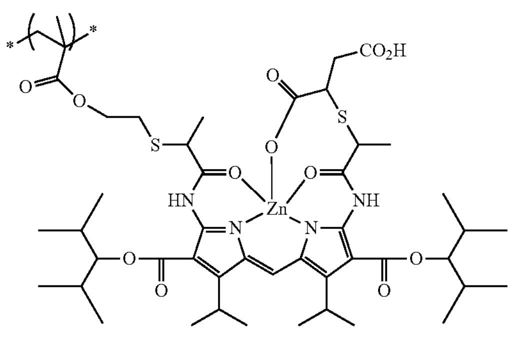
(A-dp-13)
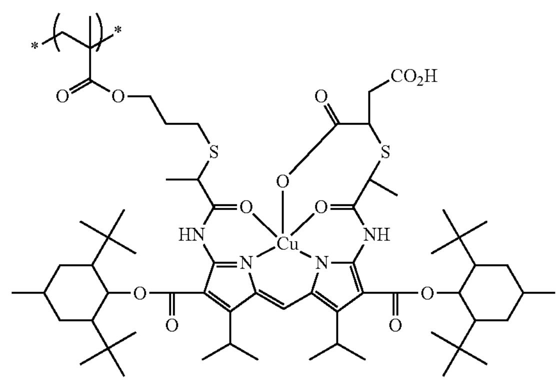
(A-dp-14)
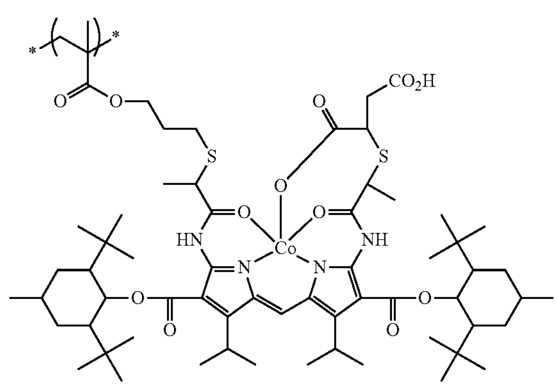
(A-dp-15)
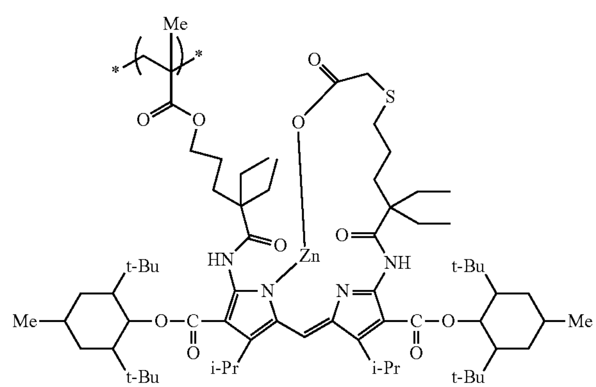

-continued
(A-dp-16)
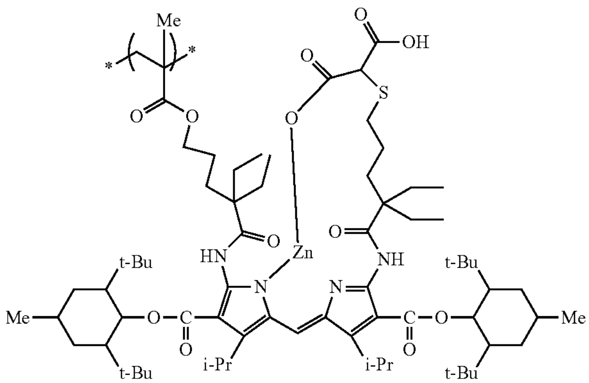
(A-dp-17)
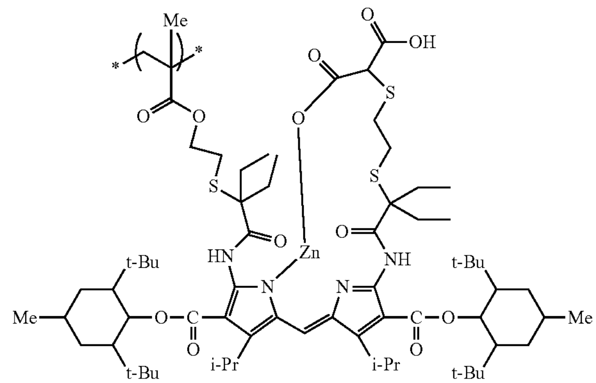
(A-dp-18)
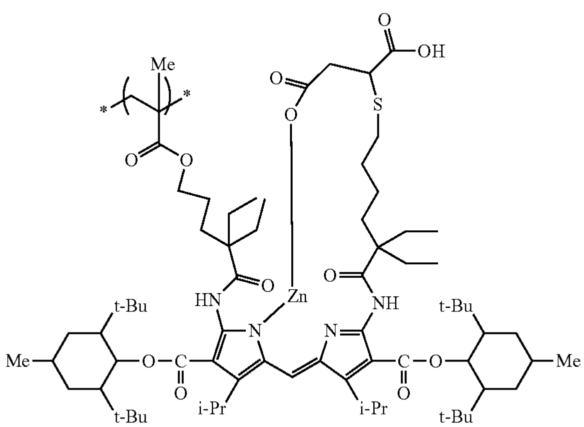
(A-dp-19)
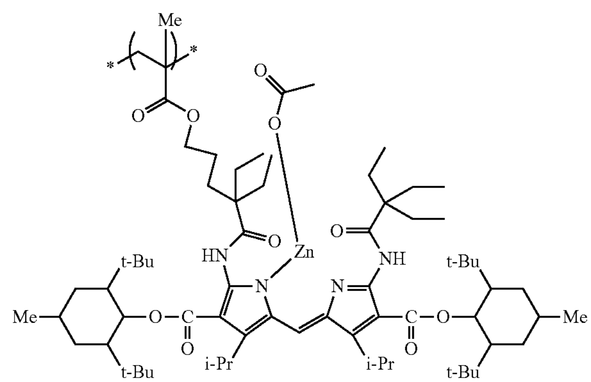
(A-dp-20)
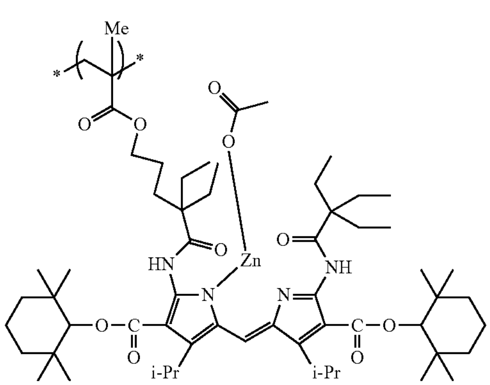
(A-dp-21)
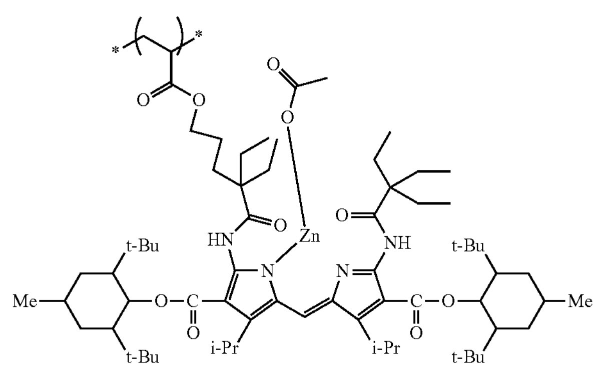

-continued
(A-dp-22)
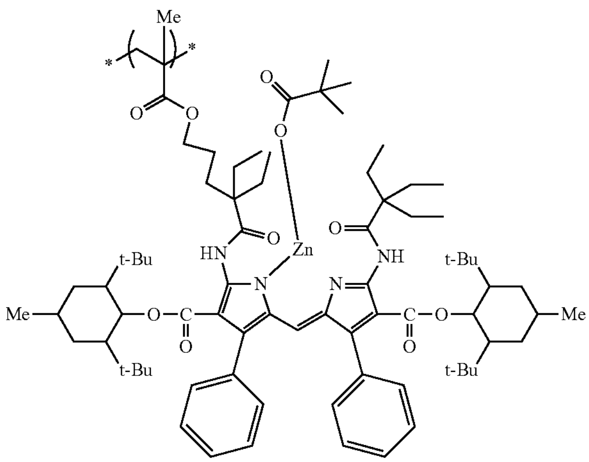
(A-dp-23)
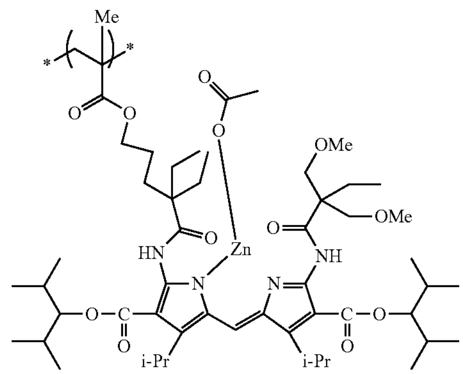
(A-dp-24)
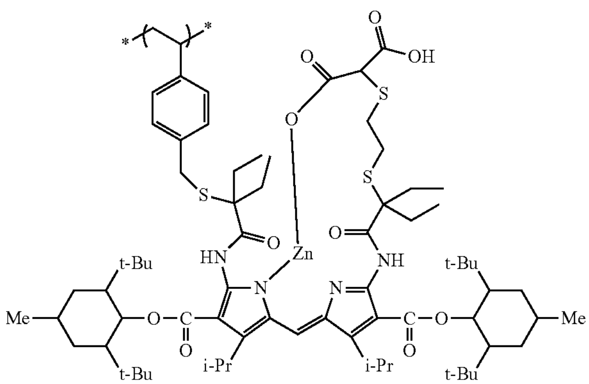
(A-dp-25)
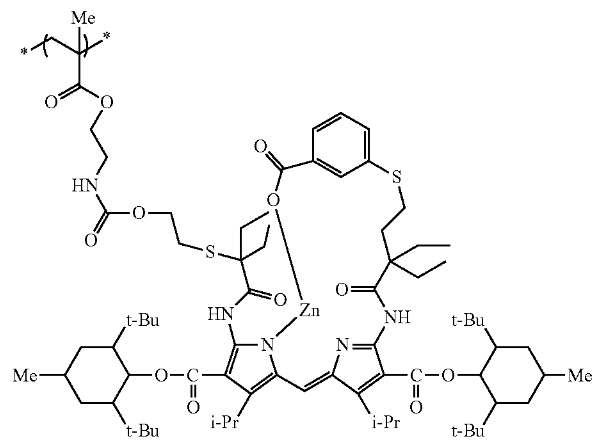
(A-dp-26)
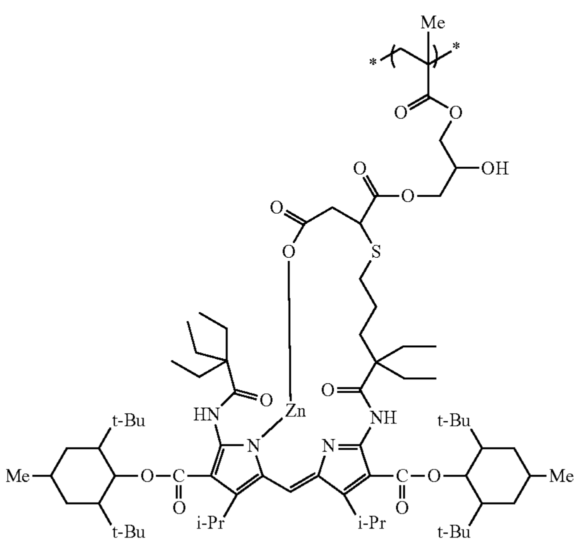
(A-az-1)
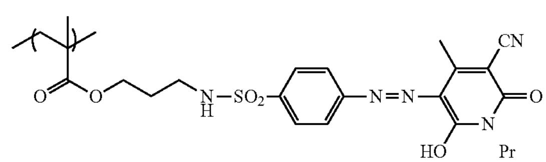
(A-az-2)
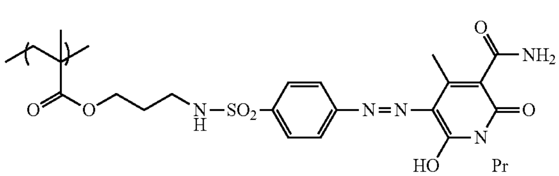

-continued
(A-az-3)
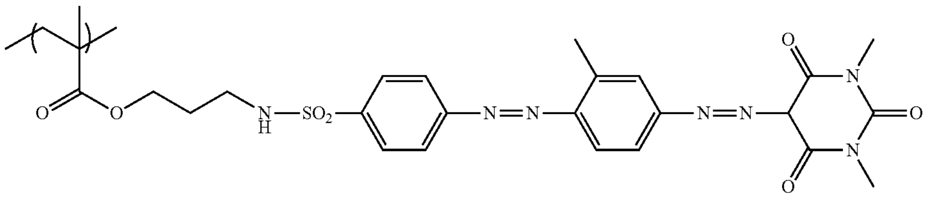
(A-az-4)
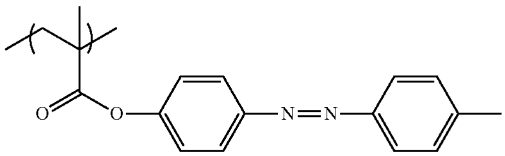
(A-az-5)
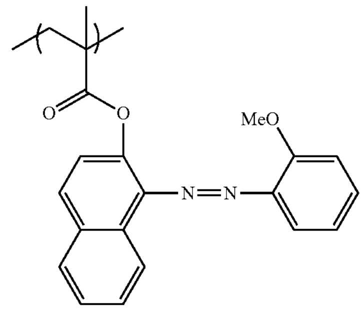
(A-az-6)
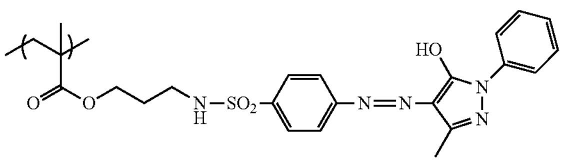
(A-az-7)
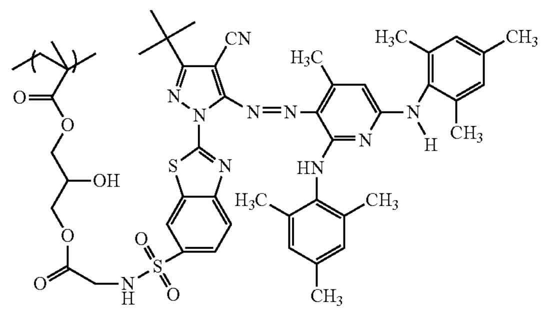
(A-az-8)
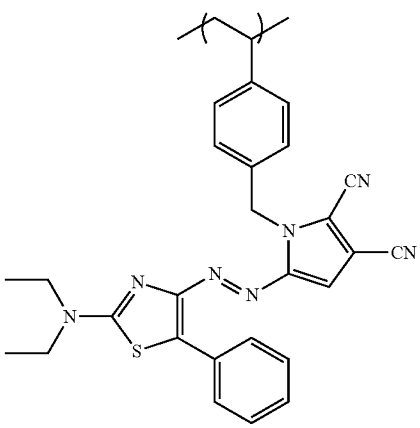
(A-az-9)
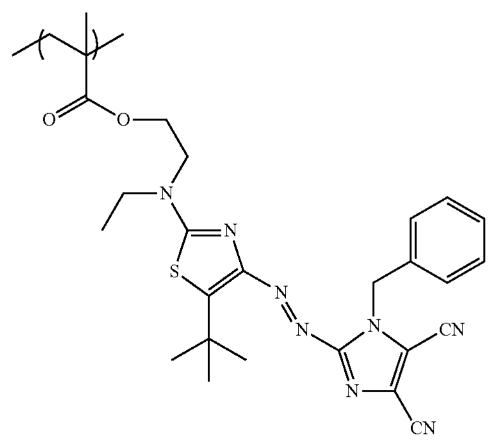
(A-az-10)
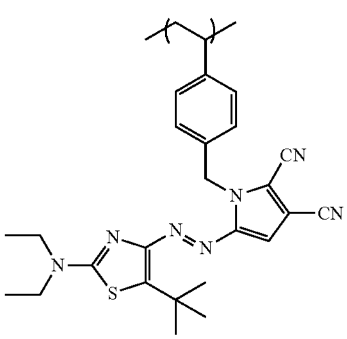
(A-az-11)
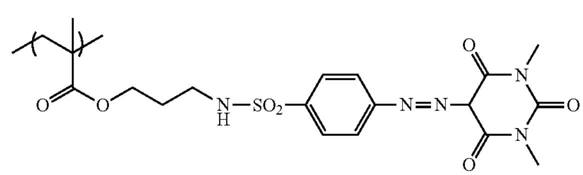

-continued
(A-aq-1)
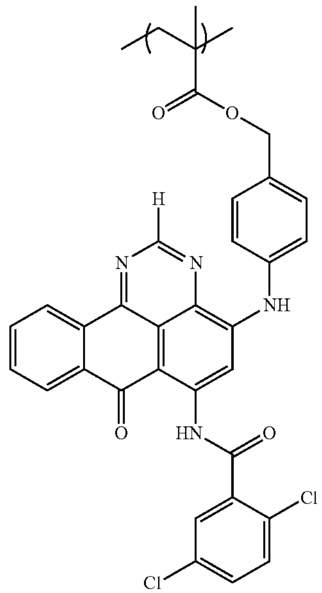
(A-aq-2
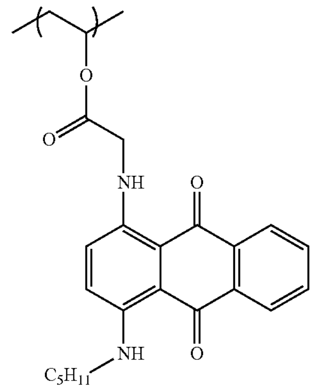
(A-aq-3)
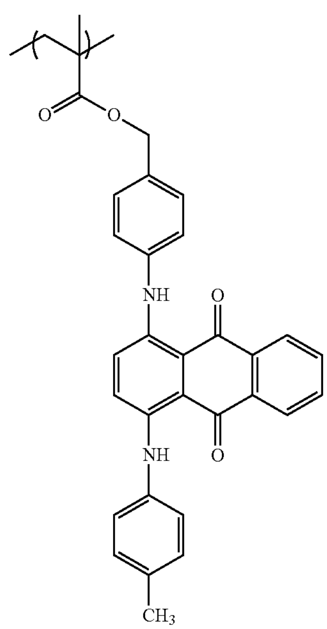
(A-aq-4)
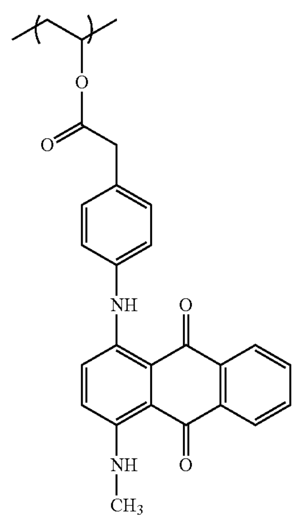

-continued
(A-aq-5)
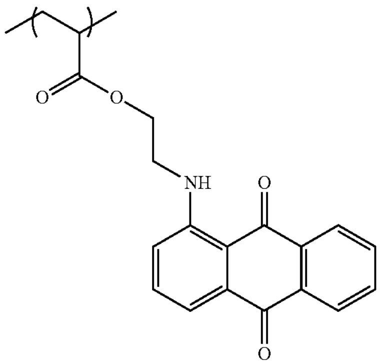
(A-aq-6)
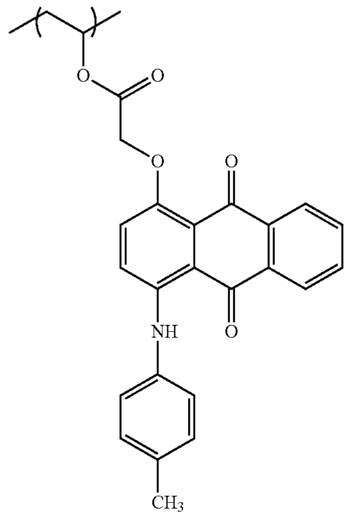
(A-aq-7)
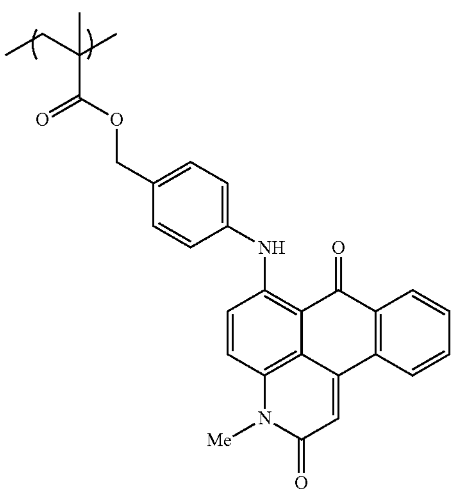
(A-aq-8)
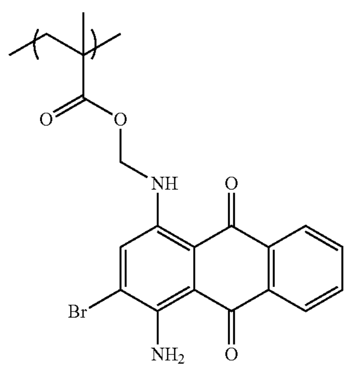
(A-aq-9)
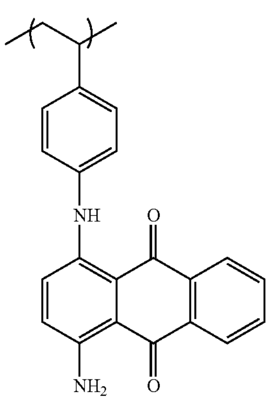
(A-aq-10)
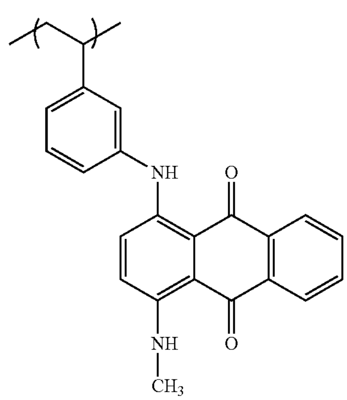

-continued
(A-aq-11)
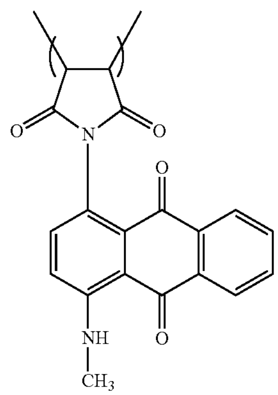
(A-aq-12)
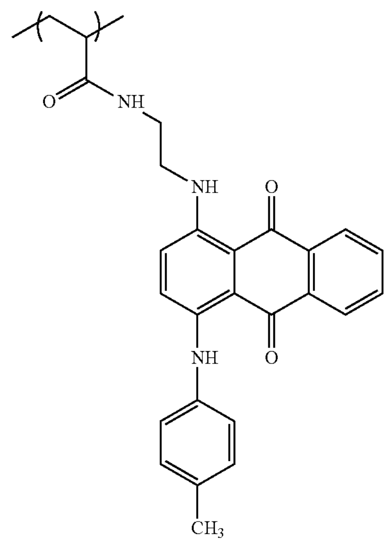
(A-tp-1)
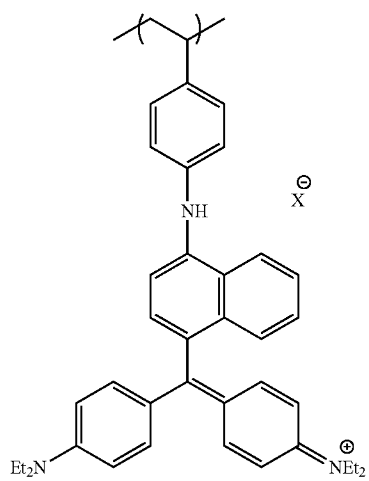
(A-tp-2)
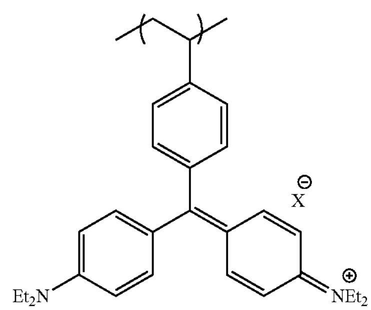
(A-tp-3)
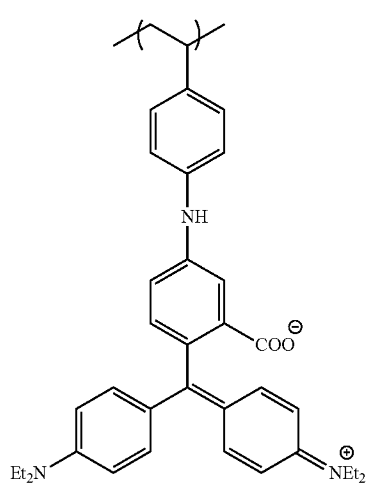
(A-xt-1)
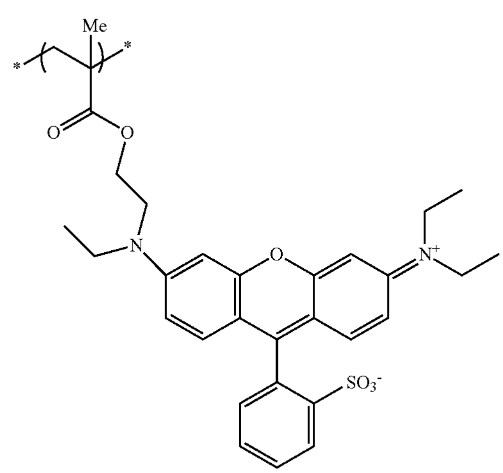

-continued
(A-xt-2)
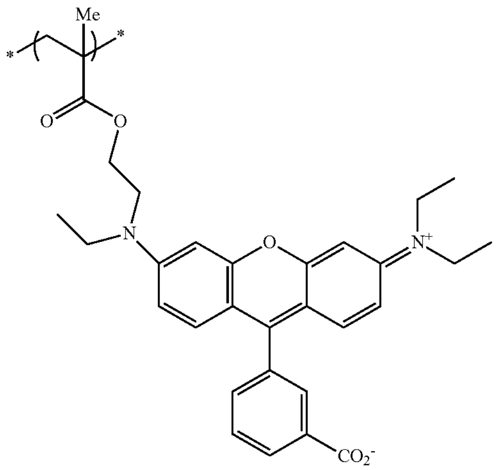
(A-xt-3)
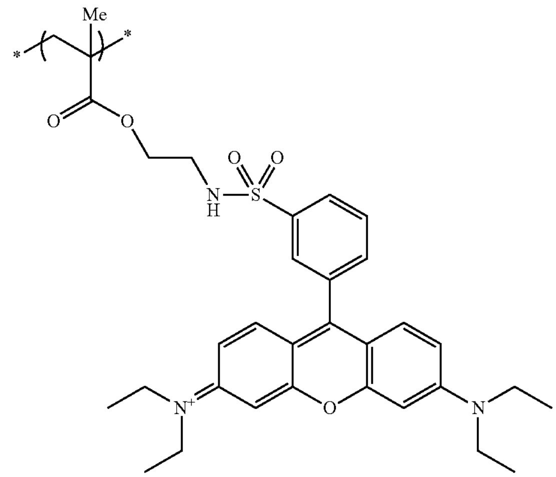
(A-xt-4)
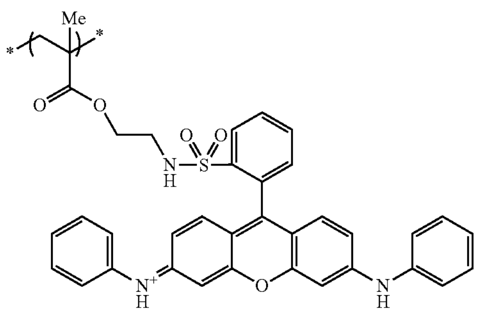
(A-xt-5)
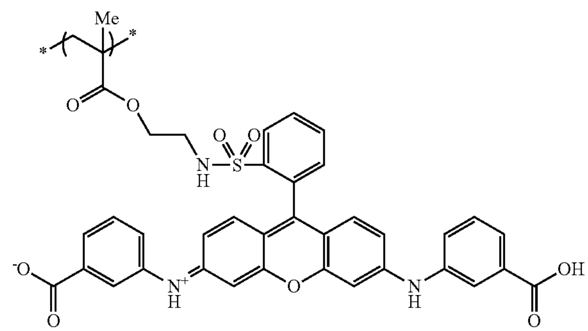
(A-xt-6)
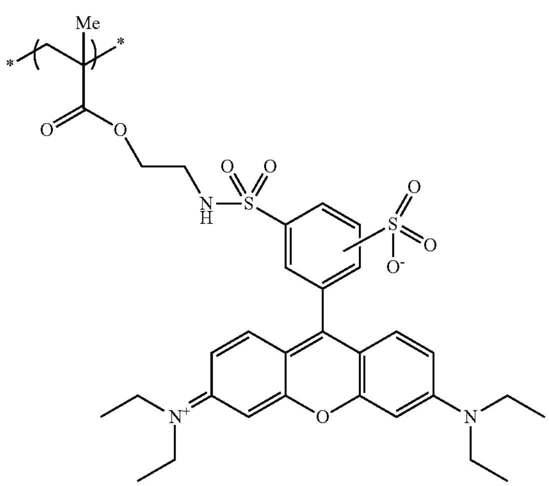
(A-pm-1)
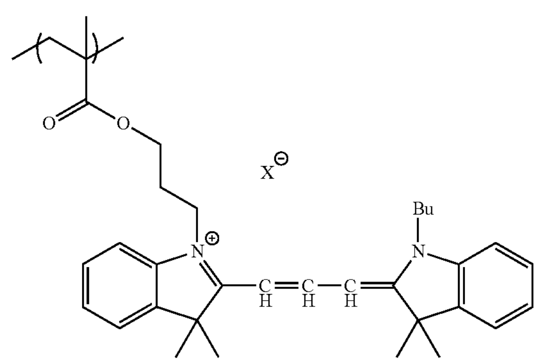

-continued
(A-pm-2)
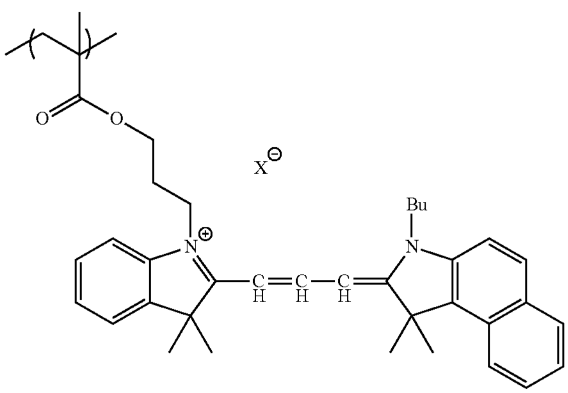
(A-pm-3)
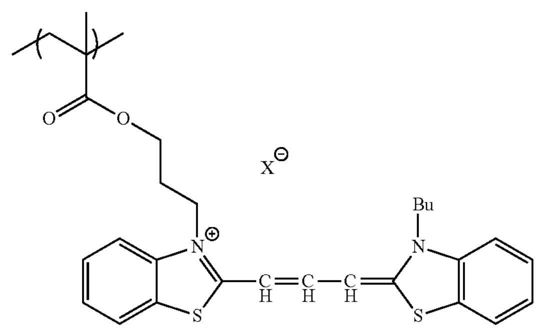
(A-pm-4)
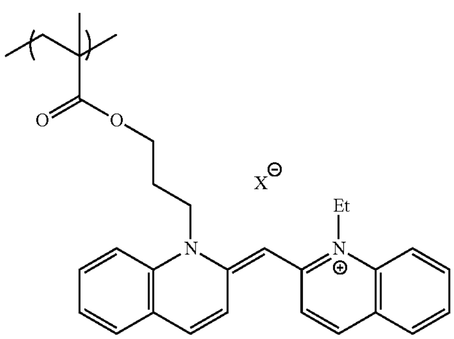
(A-pm-5)
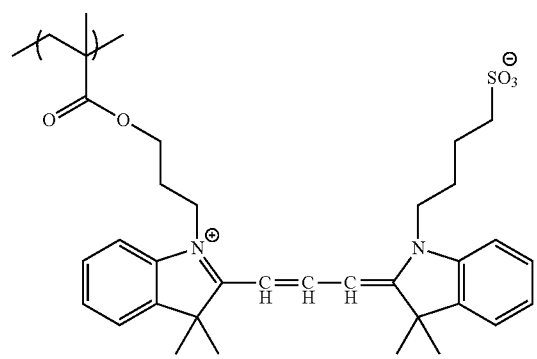
(A-pm-6)
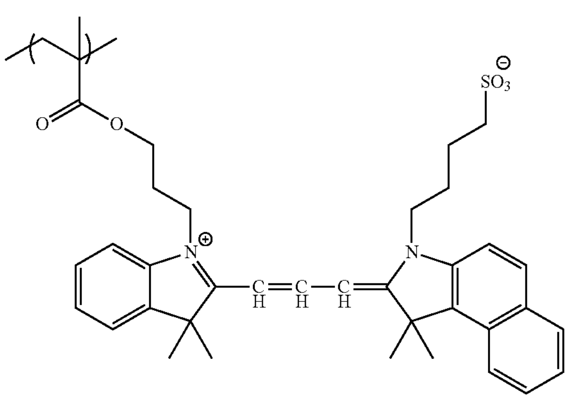
(A-sq-1)
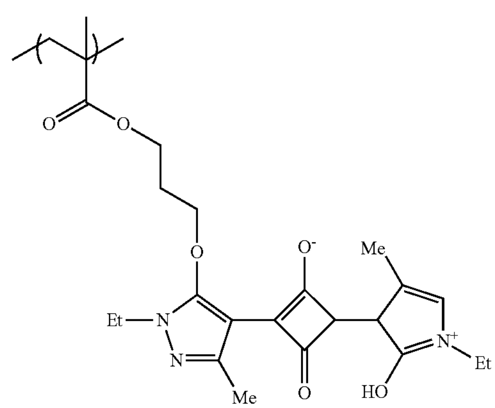
(A-sq-2)
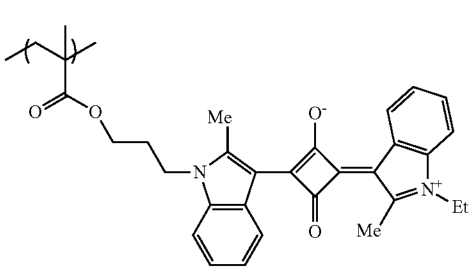
(A-sq-3)
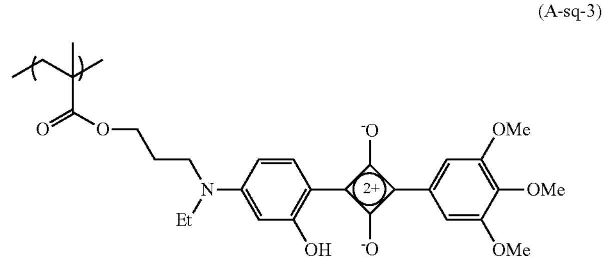

-continued
(A-sq-4)
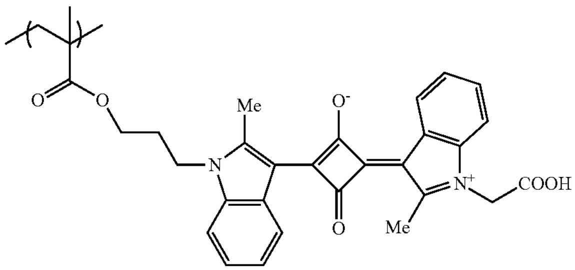
(A-sq-4)
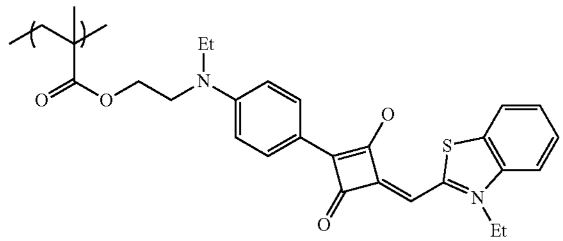
(A-qp-1)
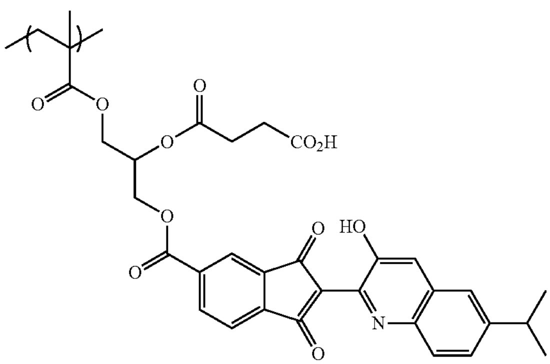
(A-qp-2)
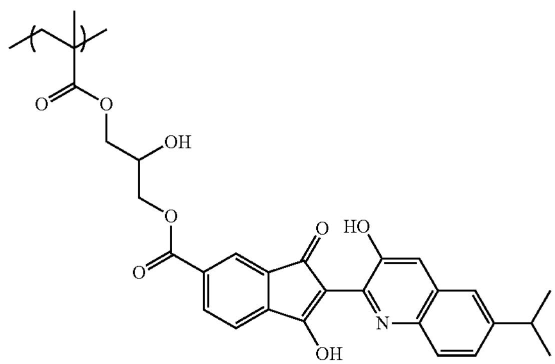
(A-SP-1)
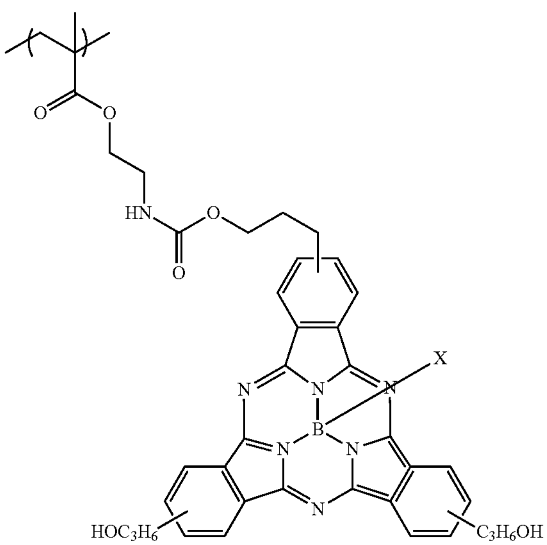
(A-SP-2)
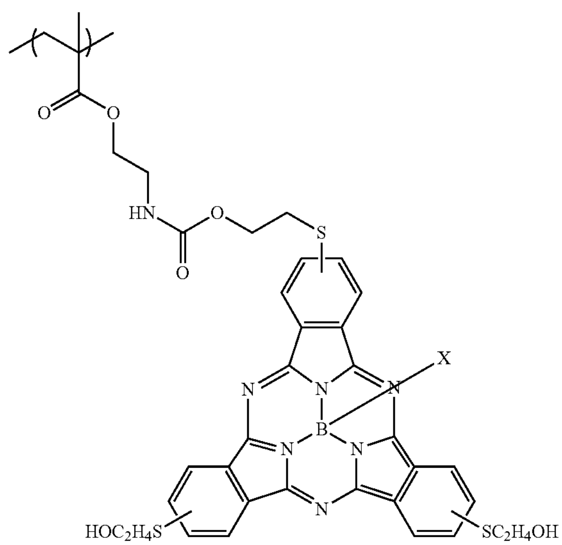

-continued
(A-SP-3)
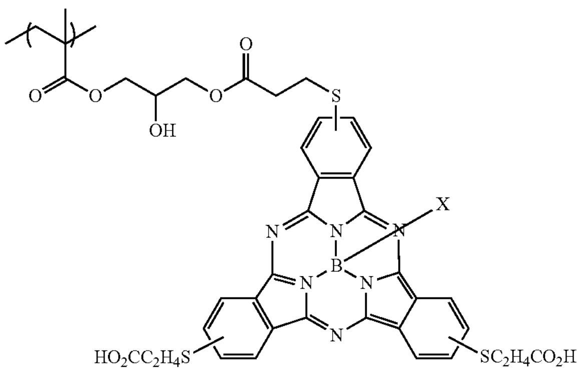
(A-SP-4)
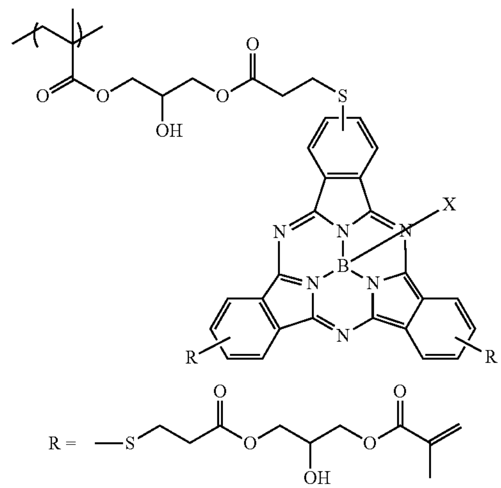
(A-ph-1)
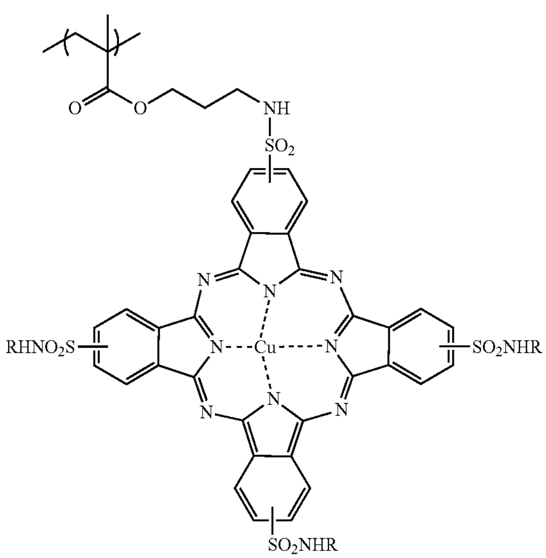
R = CH2CH2CH2OH
(A-ph-2)
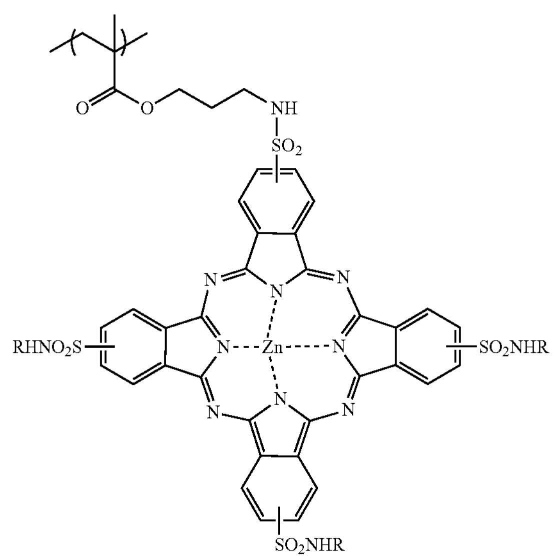
R = CH2CH2CH2OH -continued
(A-ph-3)
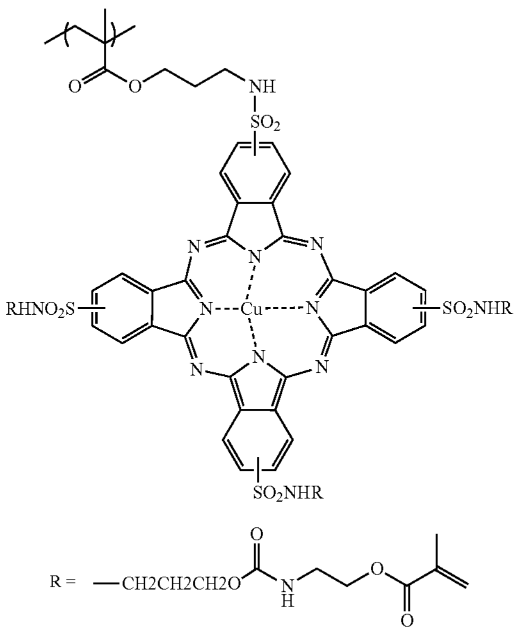
(A-ph-4)
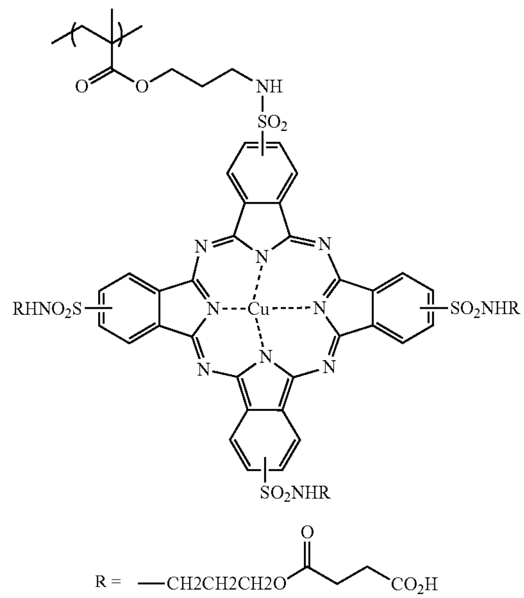
(A-st-1)
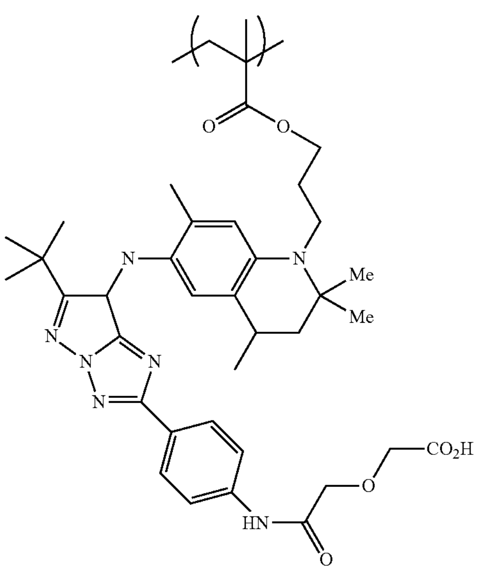
(A-st-2)
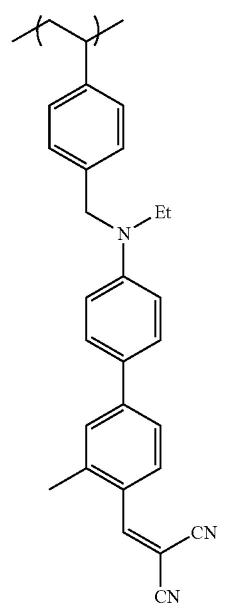

-continued (A-st-3)

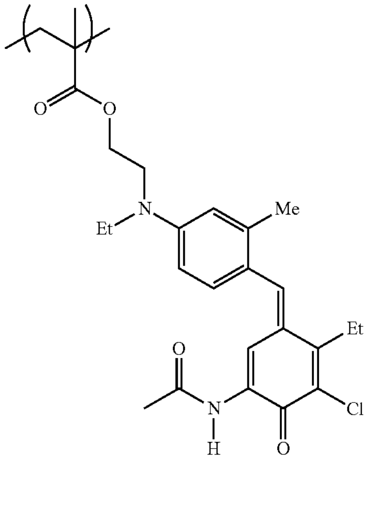

(A-st-4)

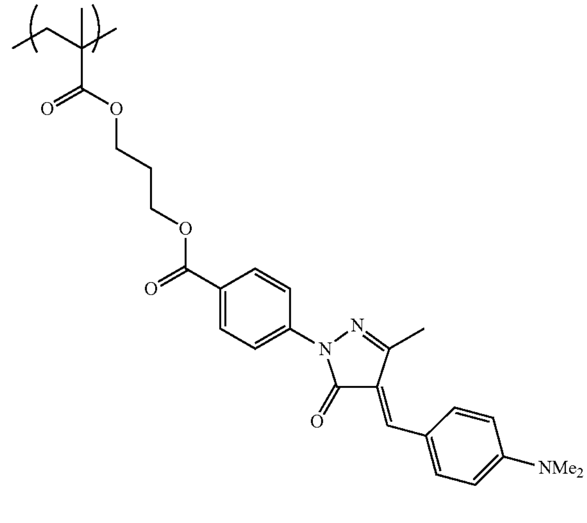

Furthermore, more preferable embodiments of the colorant structure include the colorant structures formed by removing any m1+1 hydrogen atoms of the dipyrromethene metal complex compound represented by the following general formula (6).

(6)

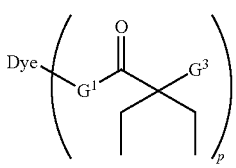

(in the general formula (6), Dye represents a colorant structure; $G^1$ represents a nitrogen atom or an oxygen atom; $G^3$ represents carbon atom, sulfur atom, an oxygen atom, or a nitrogen atom; and p represents 1 or 2, and when p is 2, the structures in [ ] may be the same as or different from each other. Dye is preferably, for example, a colorant structure formed by removing any one to p hydrogen atoms from the dipyrromethene metal complex compound obtained from the dipyrromethene compound represented by the general formula (M) and a metal or a metal compound; or the like.)

Specific examples of the constitutional unit represented by the general formula (A) in the case where a colorant structure formed by removing any m1+1 hydrogen atoms from the dipyrromethene metal complex compound represented by the general formula (6) is used are shown below, but the present invention is not limited thereto.

(A-1)

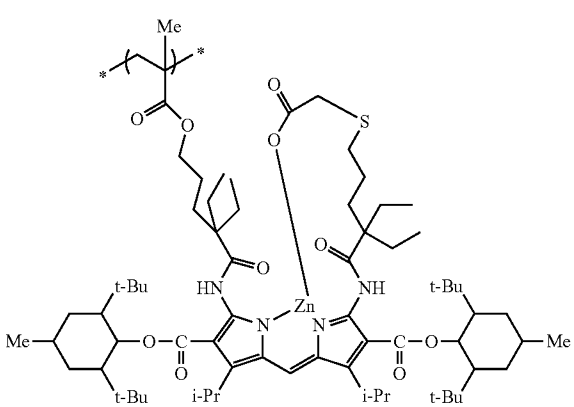

(A-2)

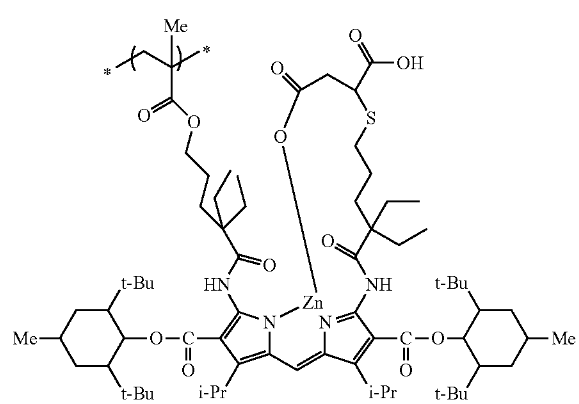

-continued
(A-3)
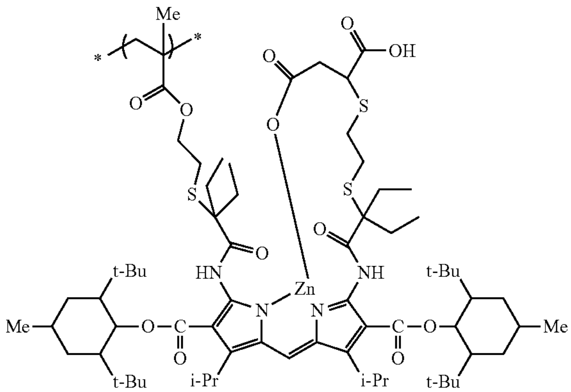
(A-4)
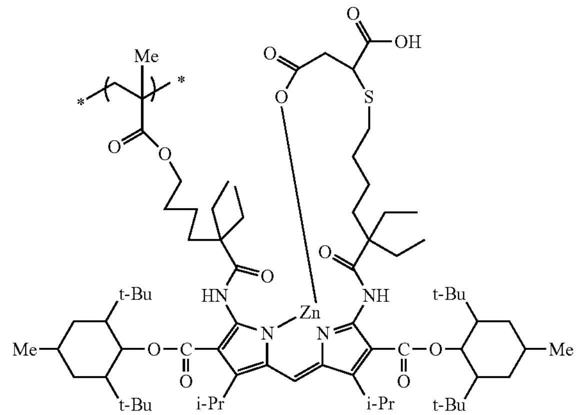
(A-5)
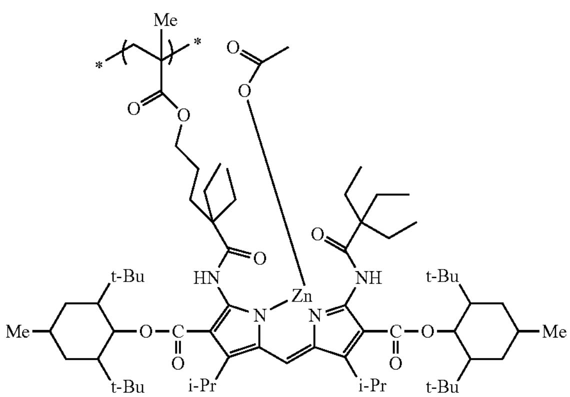
(A-6)
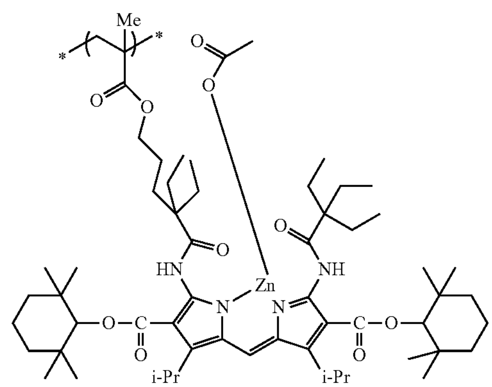
(A-7)
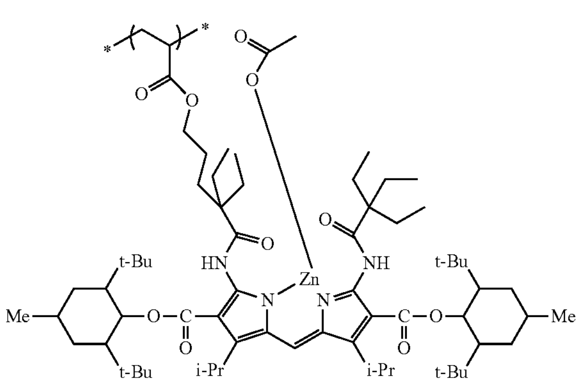
(A-8)
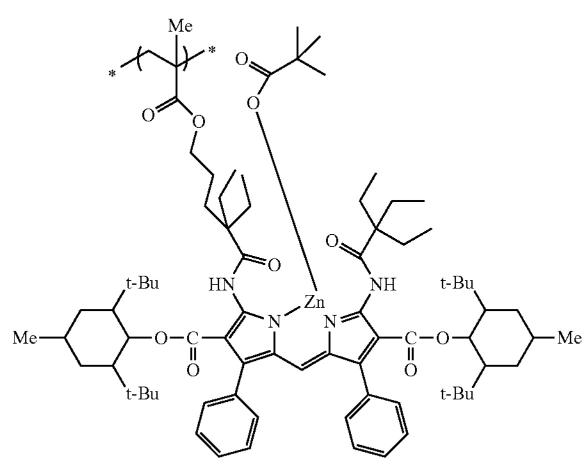

-continued
(A-9)
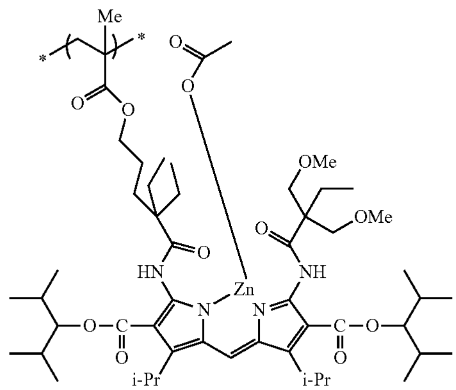
(A-10)
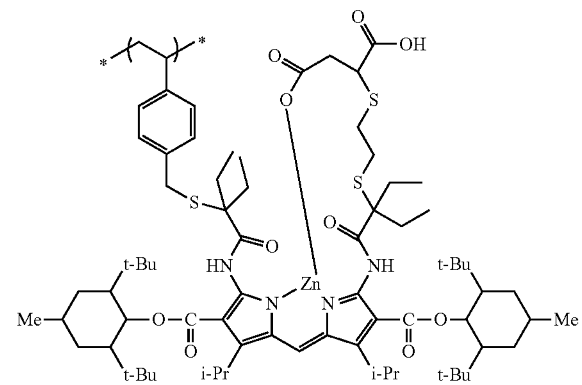
(A-11)
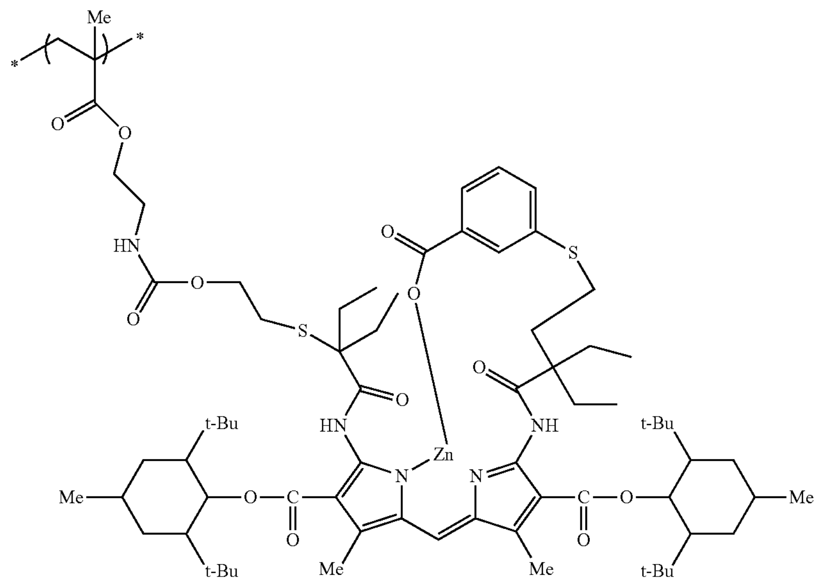
(A-12)
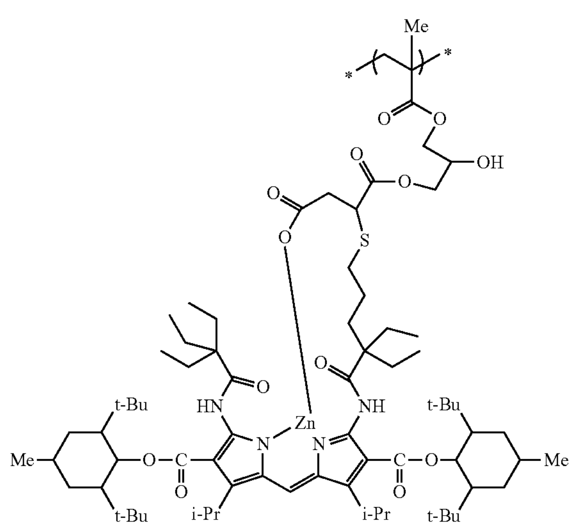
(A-13)
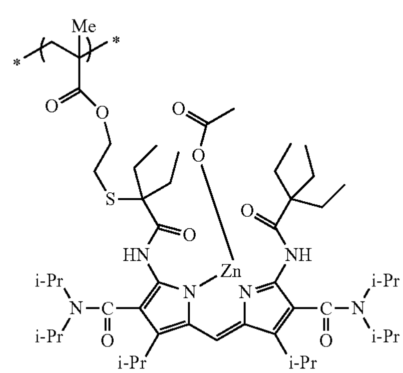

-continued
(A-14)
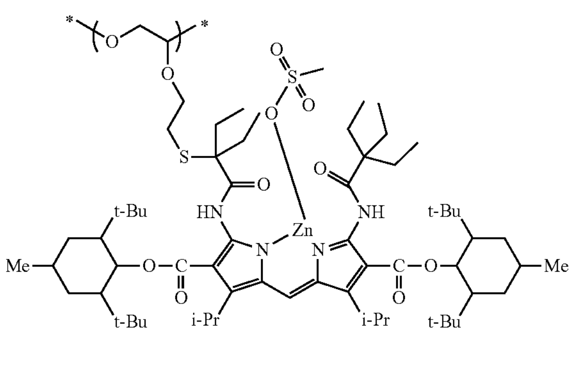
(A-15)
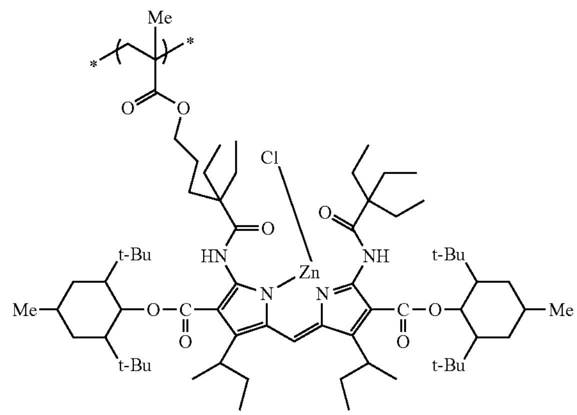
(A-16)
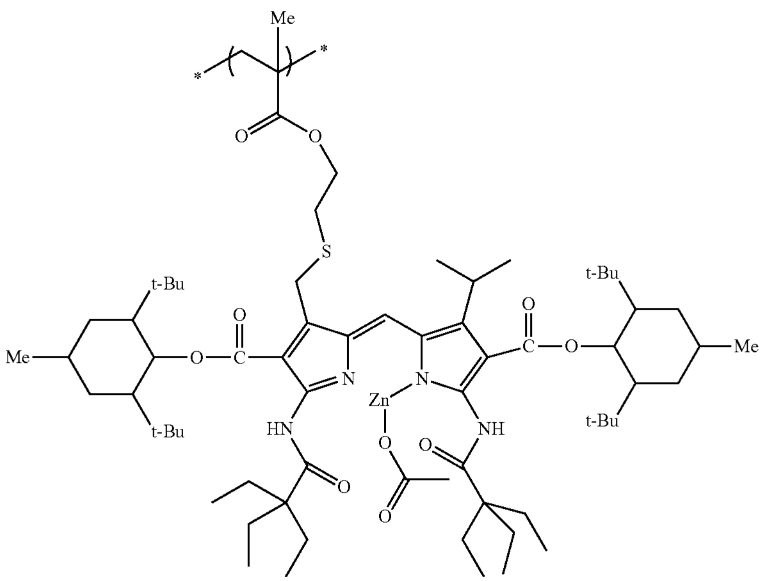
(A-17)
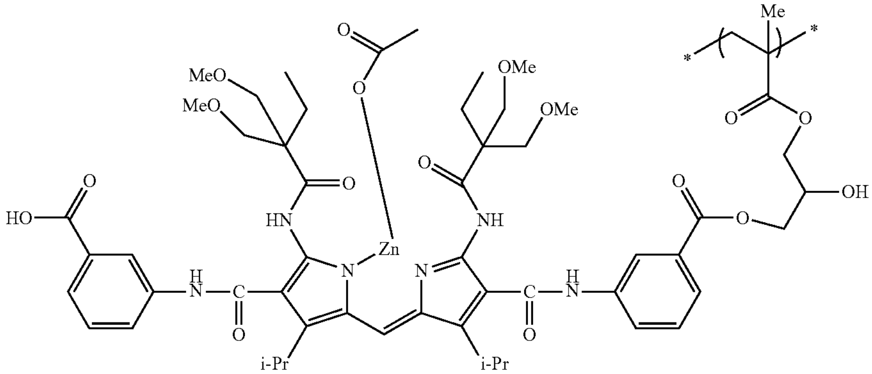

-continued
(A-18)
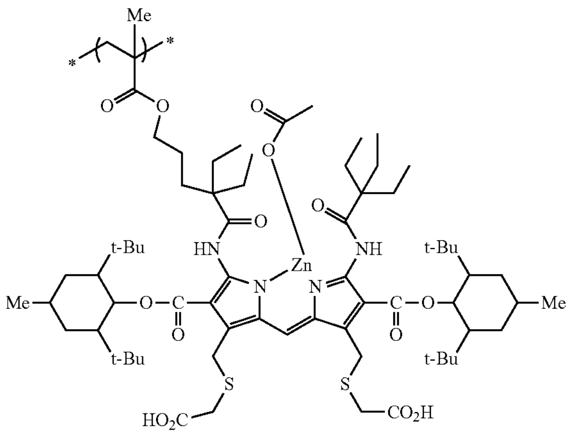
(A-19)
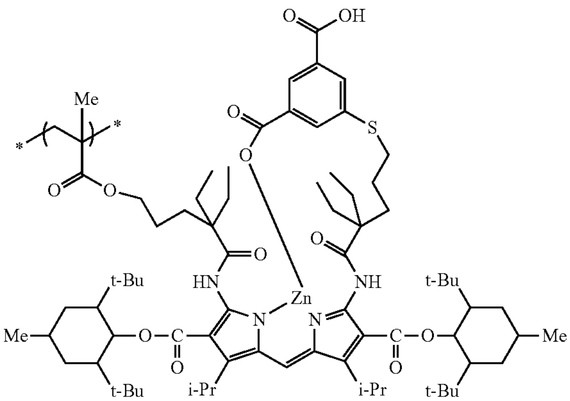
(A-20)
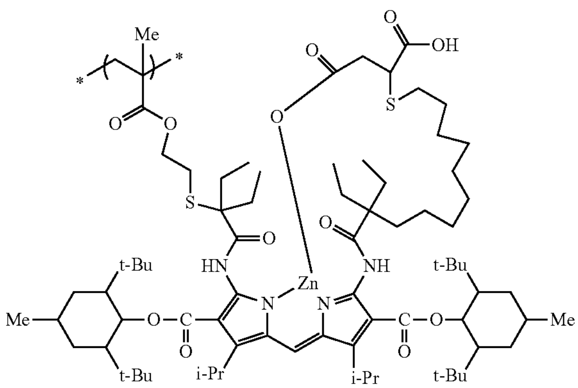
(A-21)
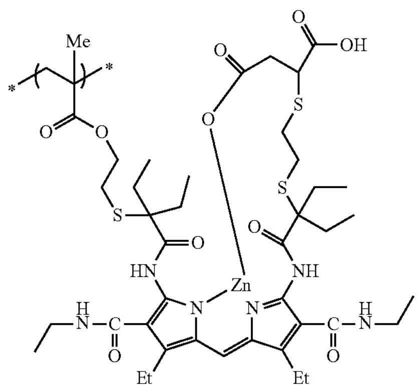
(A-22)
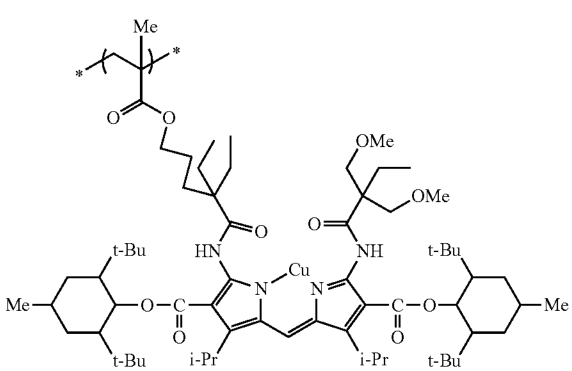
(A-23)
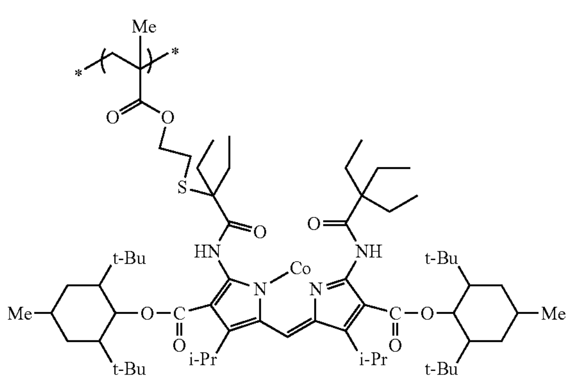

-continued
(A-24)
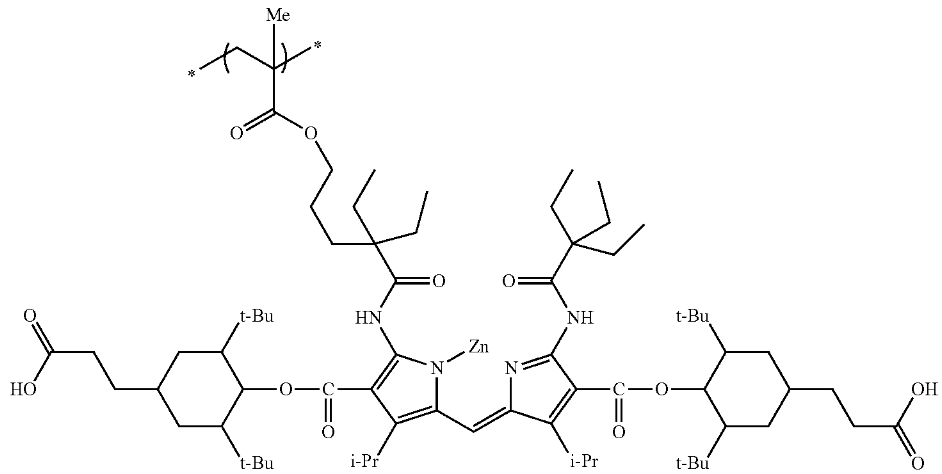
(A-25)
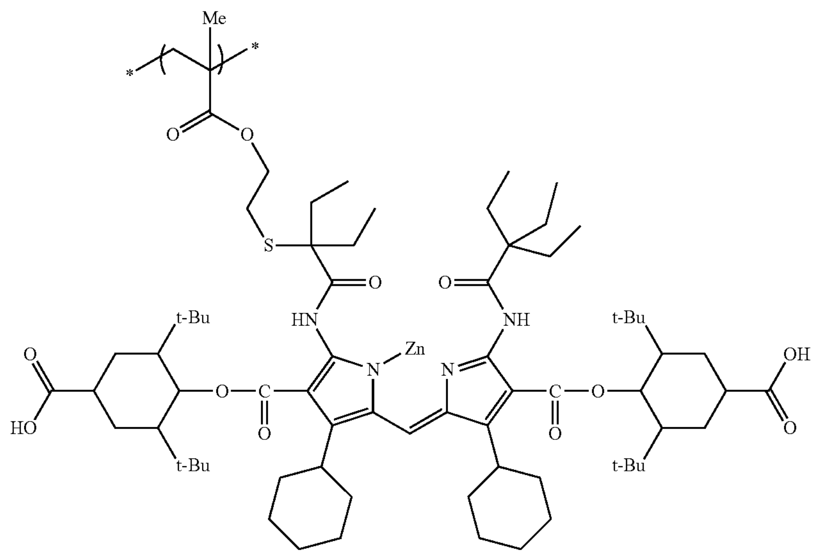
(A-26)
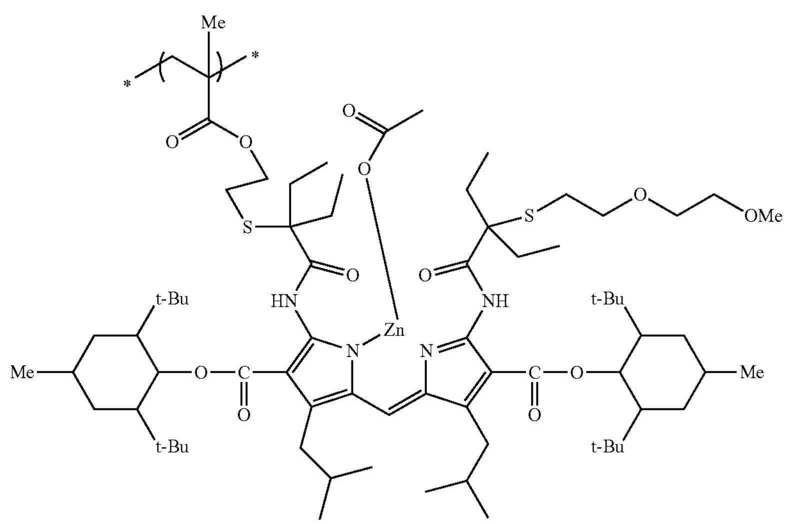

-continued
(A-27)
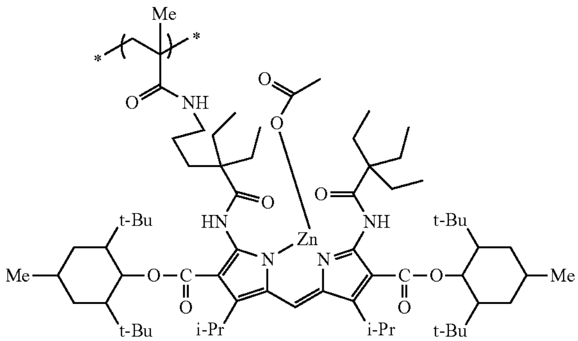
(A-28)
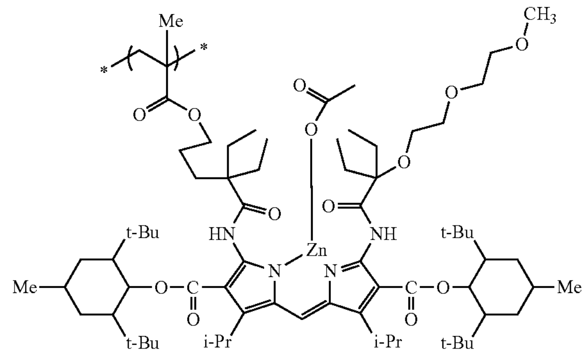
(A-29)
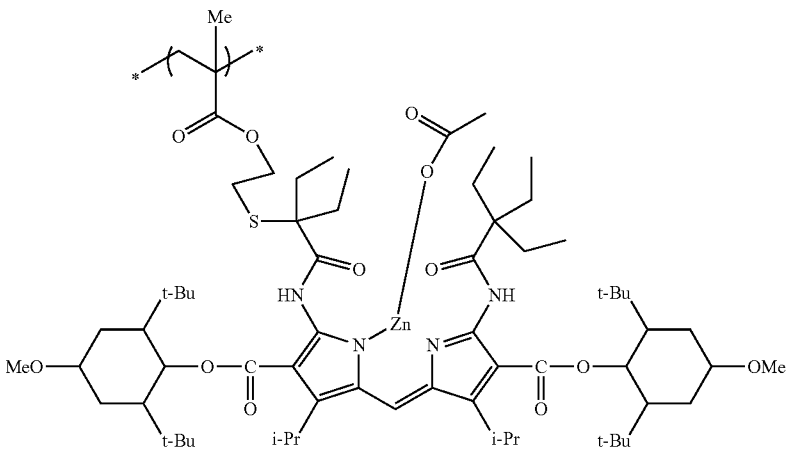
(A-30)
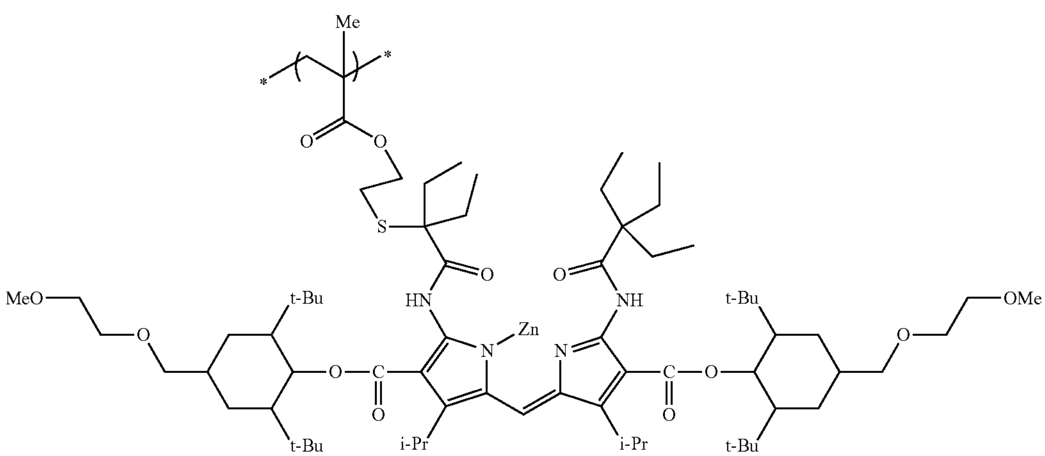

-continued
(A-31)
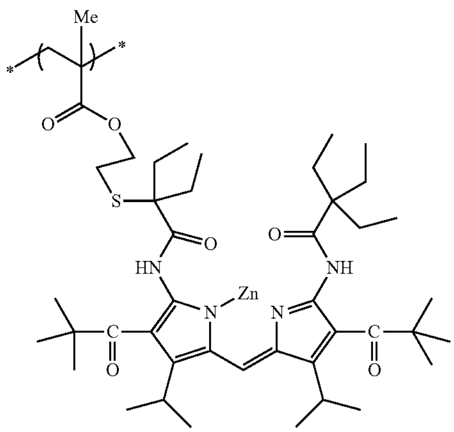
(A-32)
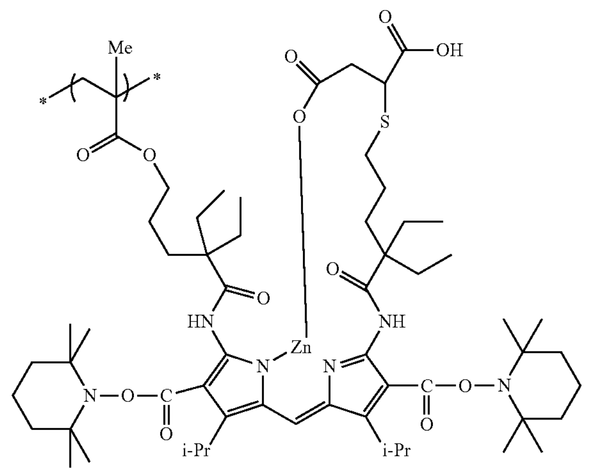
(A-33)
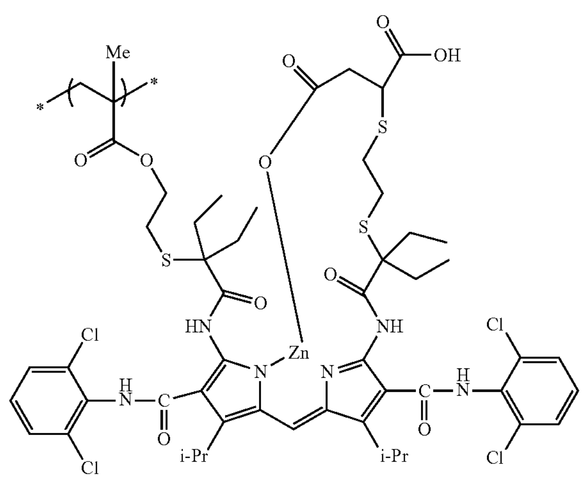
(A-34)
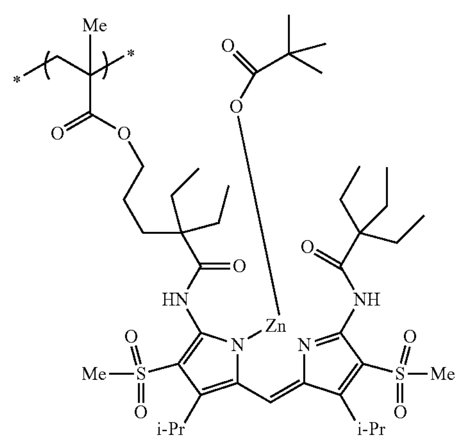
(A-35)
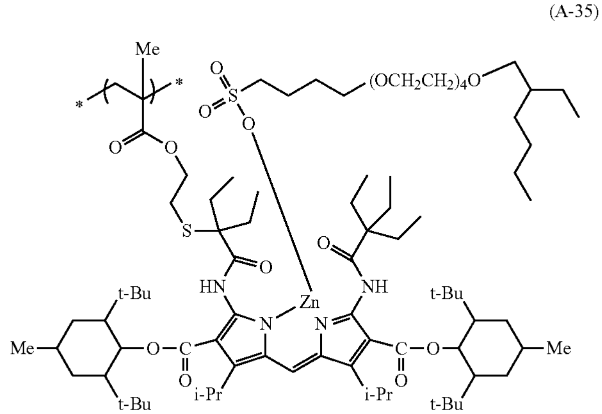
(A-36)
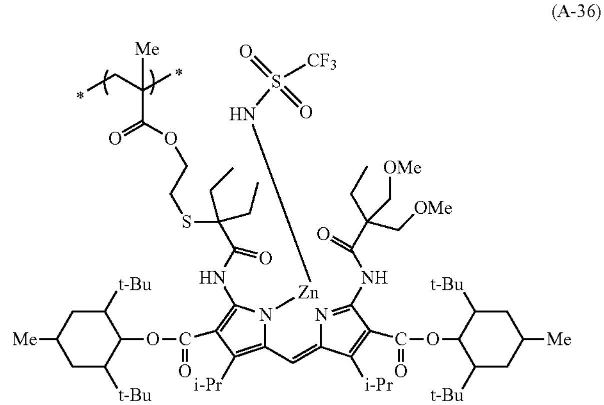

-continued
(A-37)
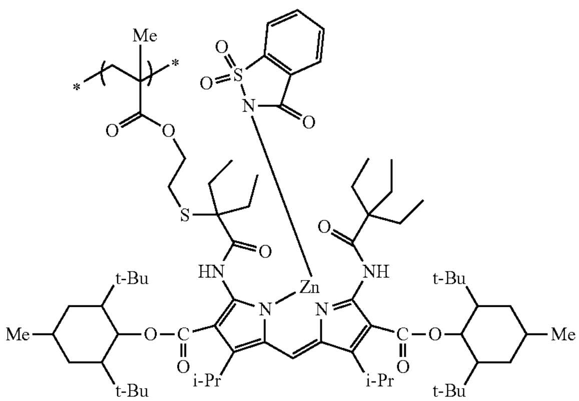
(A-38)
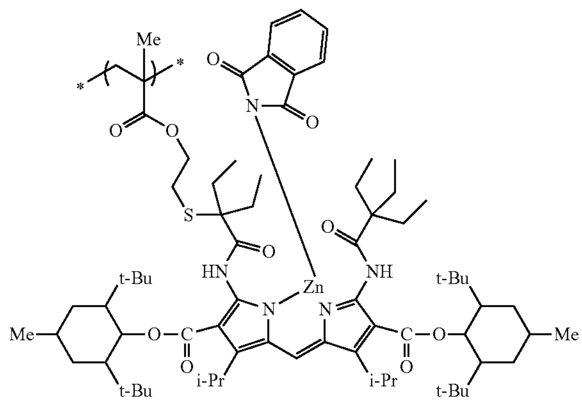
(A-39)
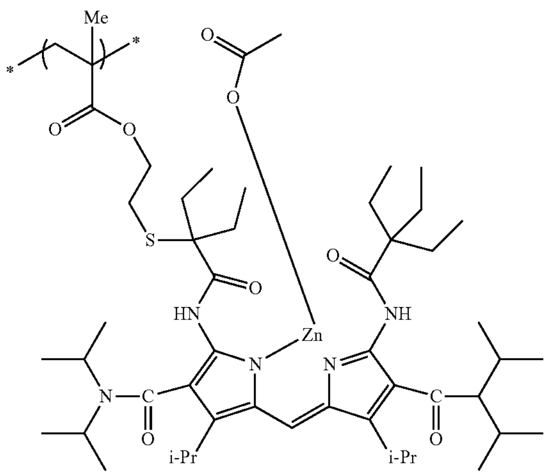
(A-40)
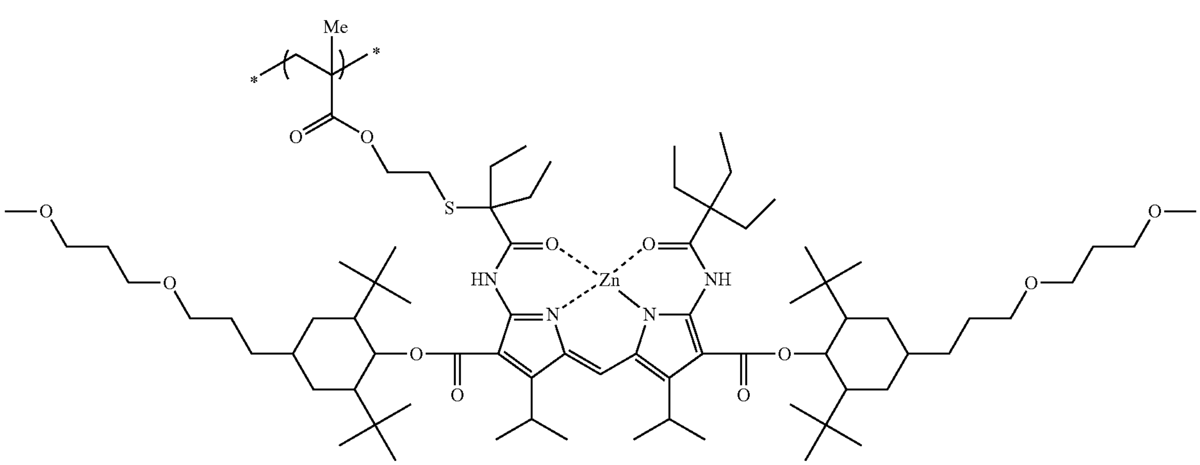

-continued
(A-41)
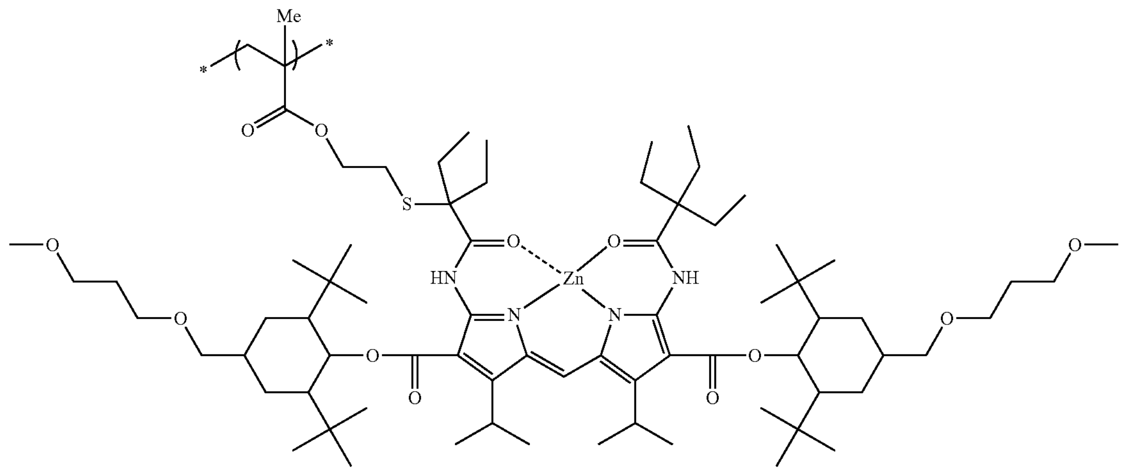
(A-42)
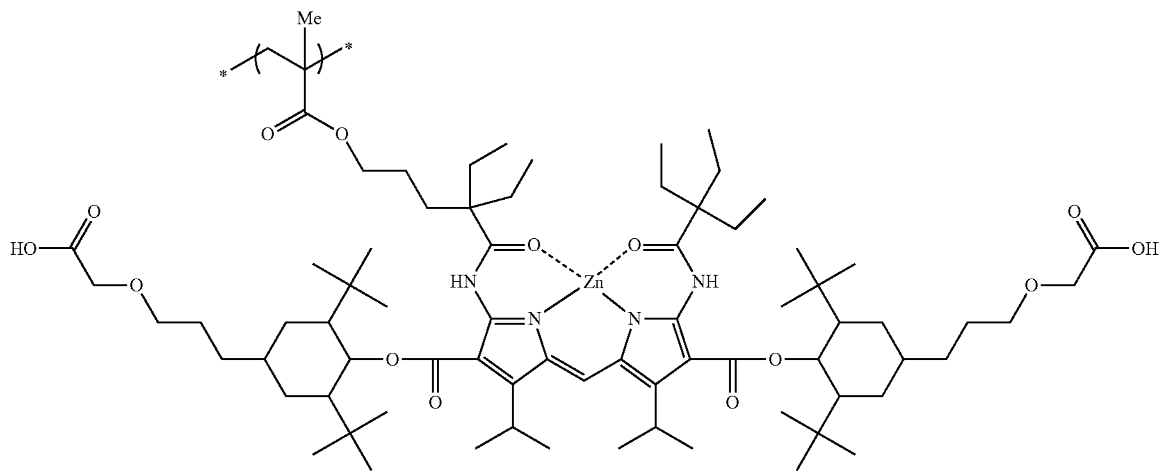
(A-43)
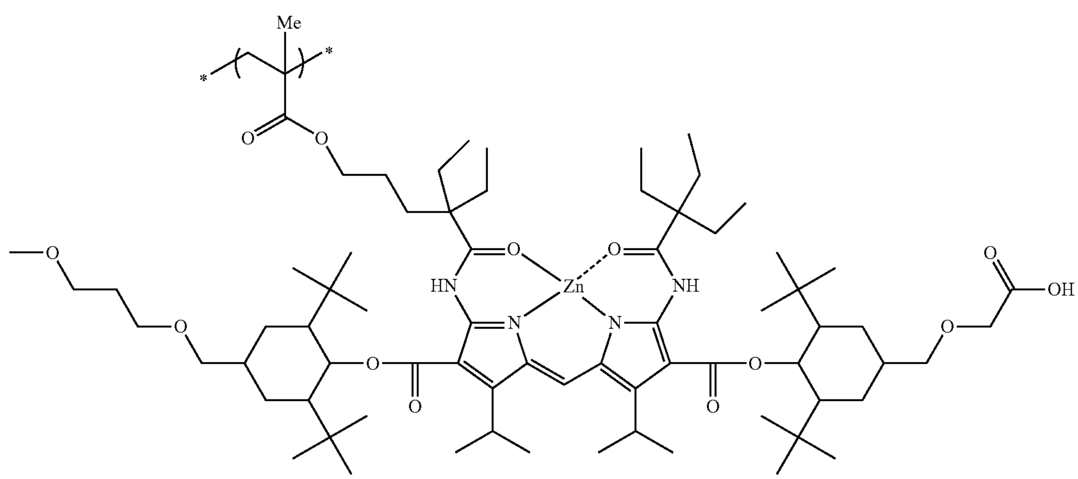

-continued
(A-44)
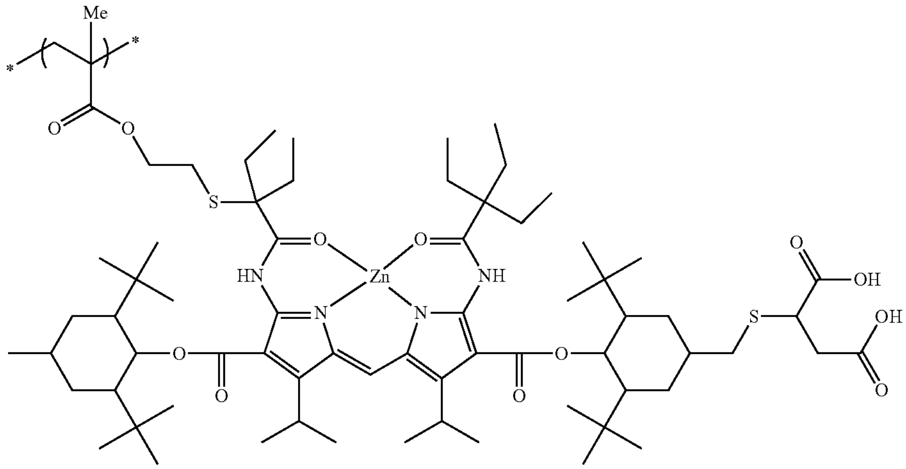
(A-45)
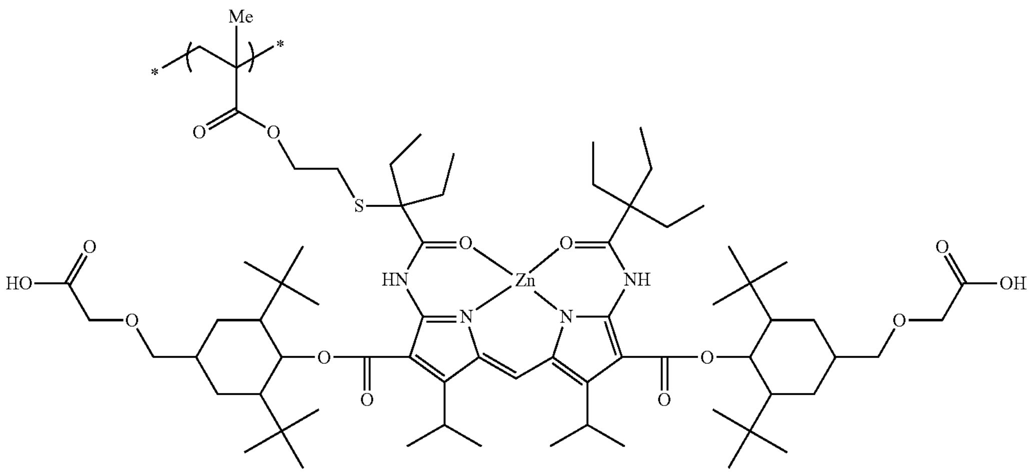
(A-46)
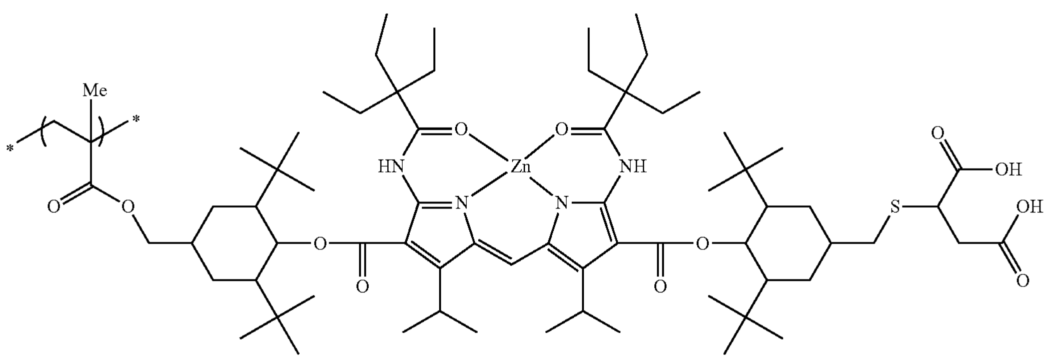
(A-47)
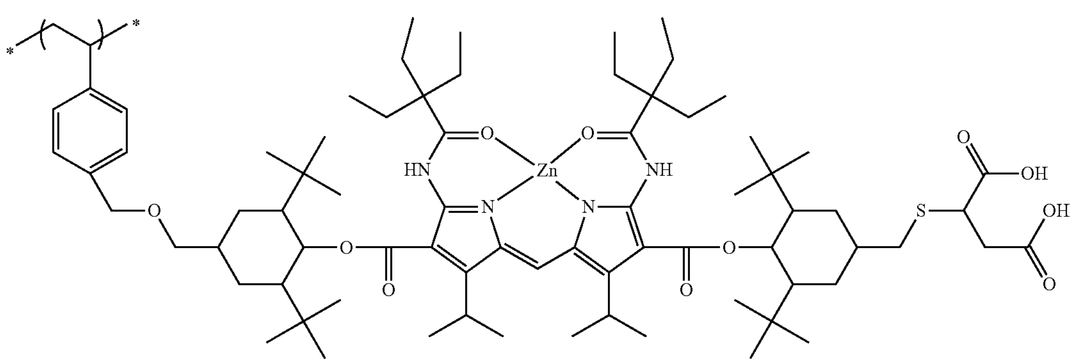

-continued (A-48)

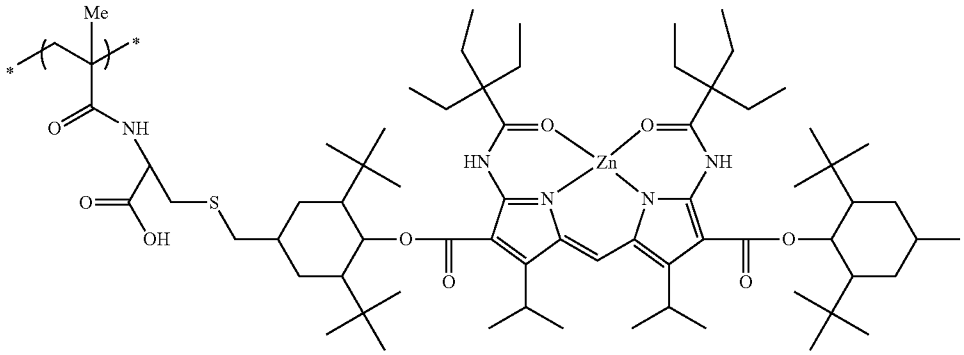

(A-49)

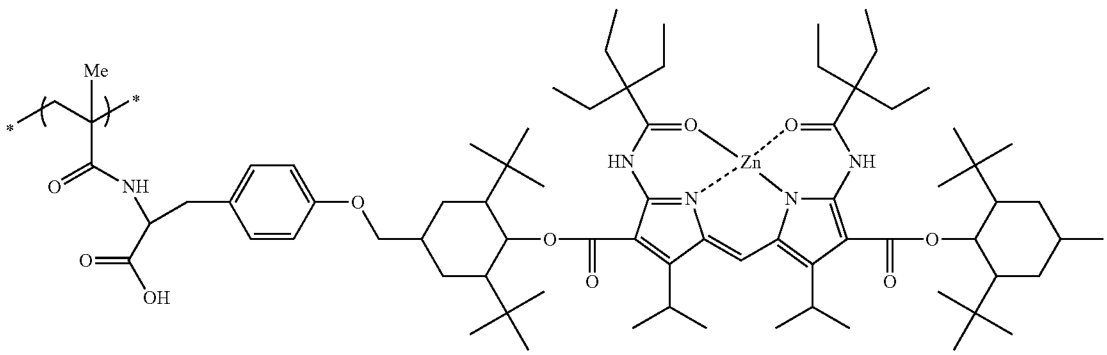

<Constitutional Unit Represented by General Formula (B)>

Next, the constitutional unit represented by the general formula (B) will be described in detail.

(B)

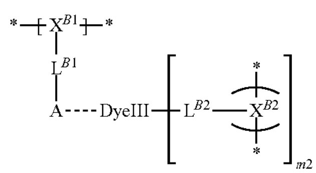

(in the general formula (B), $X^{B1}$ represents a linking group formed by polymerization; $L^{B1}$ represents a single bond or a divalent linking group; A represents a group which is capable of forming an ionic bond or a coordinate bond with DyeIII; DyeIII represents a color structure, and examples thereof include a colorant structure formed by removing any one to p hydrogen atoms from the dipyrromethene metal complex compound obtained from the dipyrromethene compound represented by the general formula (M) and a metal or a metal compound; p represents 1 or 2; $X^{B2}$ represents a linking group formed by polymerization; $L^{B2}$ represents a single bond or a divalent linking group; m2 represents an integer of 0 to 3, and when m2 is 2 or more, the structure in [ ] may be the same as or different from each other; and DyeIII and $L^{B2}$ may be linked to each other by a covalent bond, an ionic bond or a coordinate bond.)

In the general formula (B), $X^{B1}$ and $L^{B1}$ are the same groups as $X^{A1}$ and $L^{A1}$ in the general formula (A), respectively, and preferable ranges thereof are also the same.

The group represented by A in the general formula (B) is any group as long as the group can be bonded to the DyeIII group via an ionic bond or a coordinate bond. Examples of the group that can be bonded to the DyeIII group via an ionic bond may be an anionic group or a cationic group. Examples of the anionic group include an anionic group having a pKa of 12 or less, preferably a pKa of 7 or less, and more preferably a pKa of 5 or less, such as a carboxyl group, a phospho group, a sulfo group, an acyl sulfonamido group, a sulfonimido group, and the like. The anionic group may be linked with Ma or a heterocyclic group in the DyeIII via an ionic bond or a coordinate bond, and is preferably linked with Ma via an ionic bond.

Preferable specific examples of the anionic group are shown below, but the present invention is not particularly limited thereto. In the anionic groups shown below, R's each independently represent a hydrogen atom, an alkyl group, an aryl group, or a heterocyclic group.

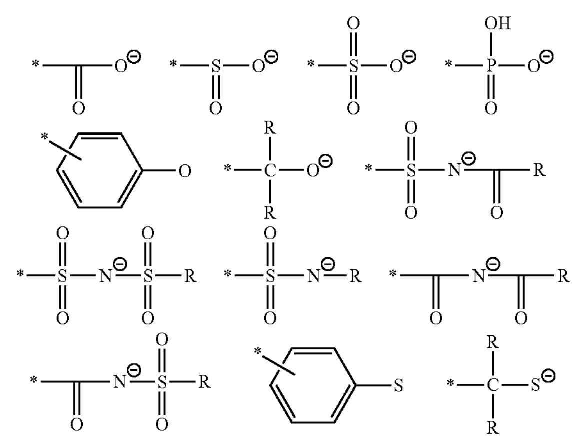

-continued

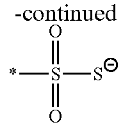

The cationic group represented by A in the general formula (B) is preferably a substituted or unsubstituted onium cation (such as a substituted or unsubstituted ammonium group, a substituted or unsubstituted pyridinium group, a substituted or unsubstituted imidazolium group, a substituted or unsubstituted sulfonium group, a substituted or unsubstituted phosphonium group, and the like), and particularly preferably a substituted ammonium group.

A can be bonded to an anion moiety (COO—, $SO_3$—, O—, or the like) or a cationic moiety (the onium cation, metal cation, and the like) included in DyeIII.

Among these, the colorant multimer having the constitutional unit represented by the general formula (B) in the present invention is preferably a radical polymer obtained by the radical polymerization using a colorant monomer having an ethylenically unsaturated bond from the viewpoint of heat resistance.

Specific examples of the constitutional unit represented by the general formula (B) are shown below, but the present invention is not limited thereto.

(B-1)

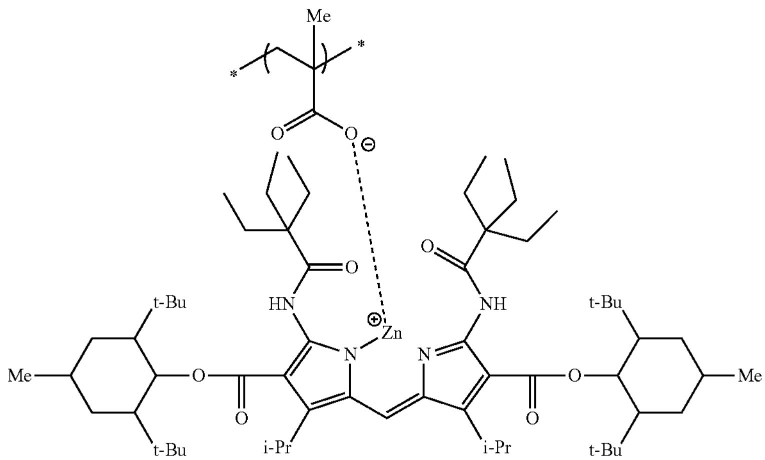

(B-2)

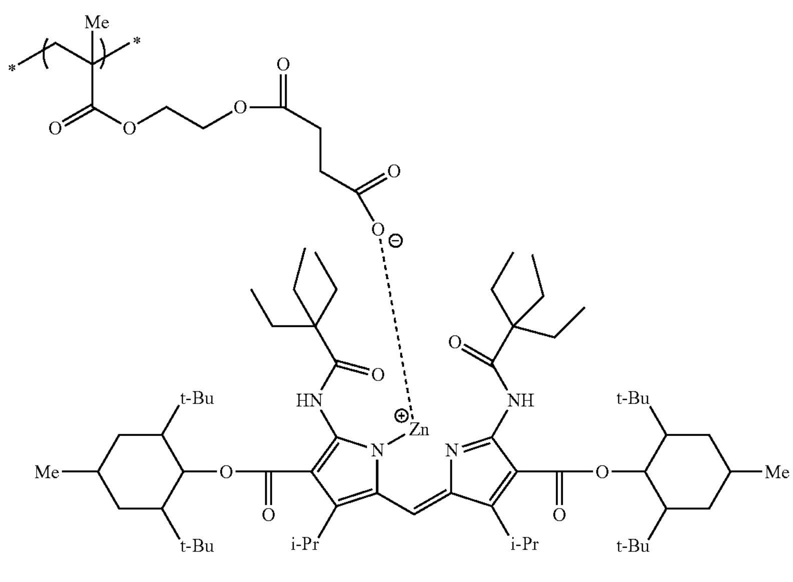

-continued
(B-3)
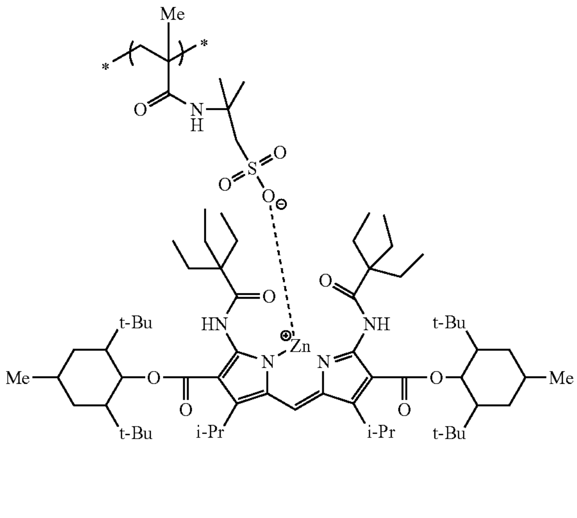
(B-4)
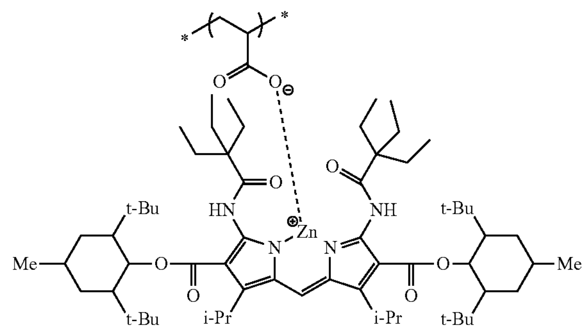
(B-5)
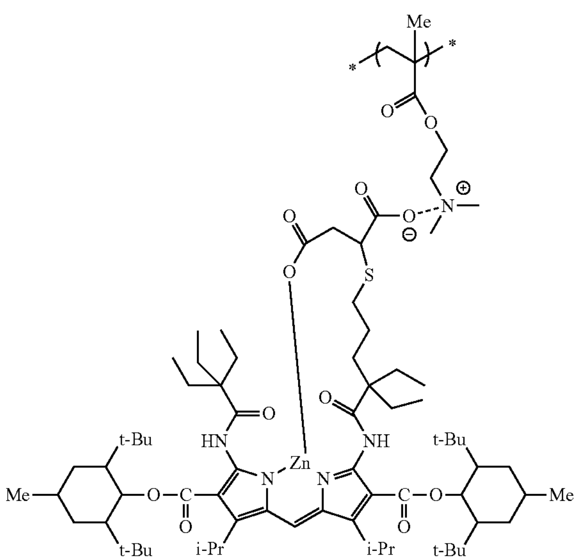
(B-6)
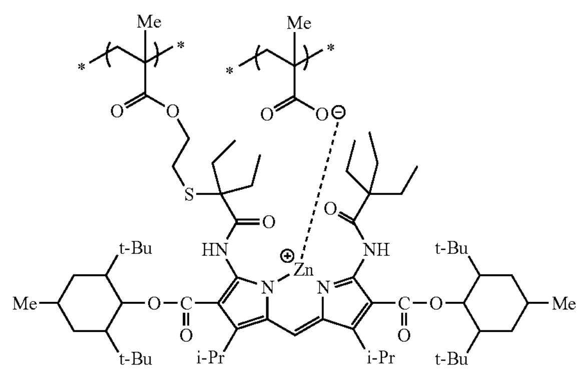
(B-7)
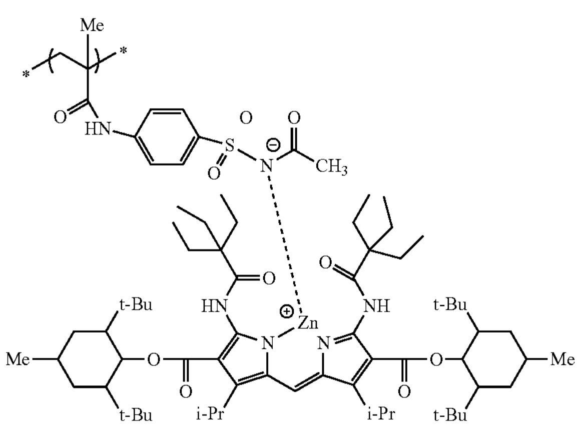
(B-8)
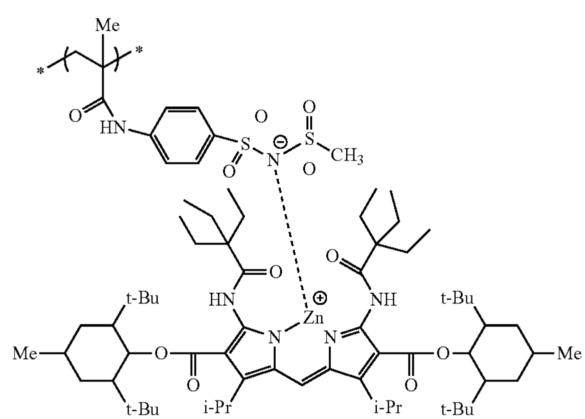

-continued (B-dp-1)

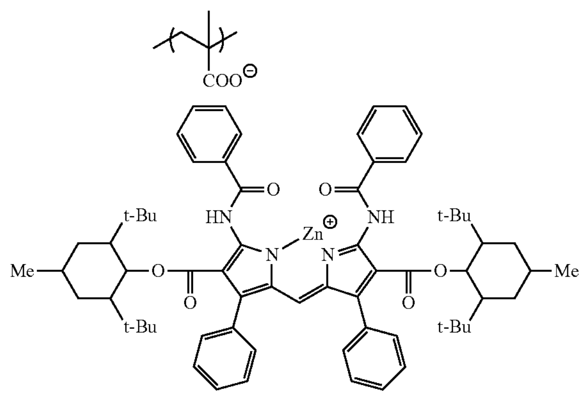

(B-tp-1)

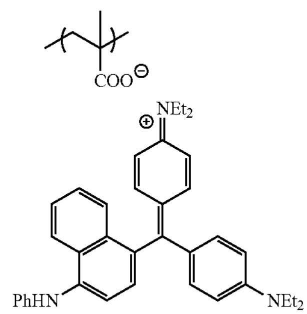

(B-tp-2)

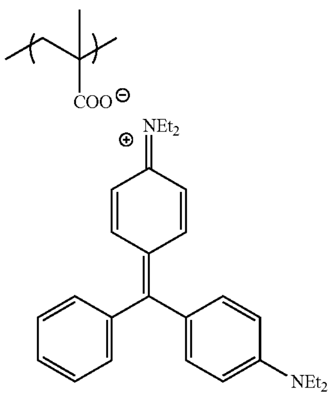

(B-pm-1)

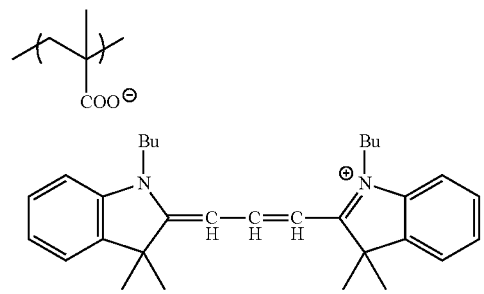

(B-sp-1)

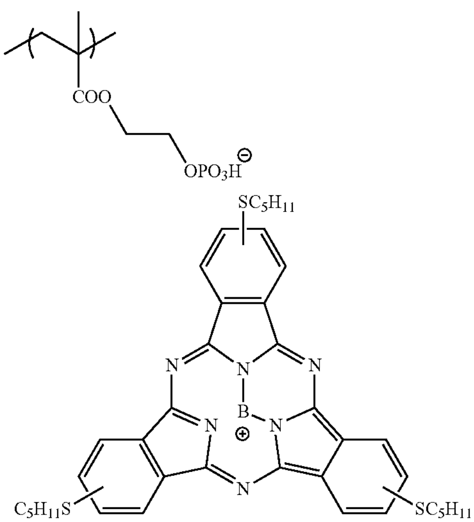

(B-pm-2)

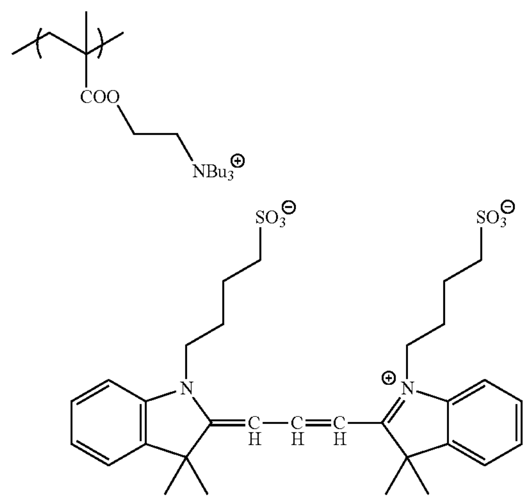

<Constitutional Unit Represented by General Formula (C)>

Next, the constitutional unit represented by the general formula (C) will be described in detail.

$$*-\!\!\left[\text{DyeIV}-(L^{C1})_{m3}\right]\!\!-* \qquad \text{(C)}$$

(in the general formula (C), $L^{C1}$ represents a single bond or a divalent linking group; DyeIV represents a colorant structure, and examples thereof include a colorant structure formed by removing any p hydrogen atoms from the dipyrromethene metal complex compound obtained from the dipyrromethene compound represented by the general formula (M) and a metal or a metal compound; p represents 1 or 2; and m3 represents an integer of 1 to 4, and when m3 is 2 or more, the $L^{C1}$ structures may be the same as or different from each other.)

In the general formula (C), preferable examples of the divalent linking group represented by $L^{C1}$ include substituted or unsubstituted linear alkylene groups having 1 to 30 carbon atoms (such as a methylene group, an ethylene group, a trimethylene group, a propylene group, a butylene group, and the like), substituted or unsubstituted allylene groups having 6 to 30 carbon atoms (such as a phenylene group, a naphthalene group, and the like), substituted or unsubstituted heterocyclic linking groups, —CH═CH—, —O—, —S—, —NR— (wherein R's each independently represent a hydrogen atom, an alkyl group, an aryl group, or a heterocyclic group), —C(═O)—, —SO—, —$SO_2$—, and a linking group formed by linking two or more of these groups.

Specific examples of ones that are preferably used as the divalent linking group represented by $L^{C1}$ in the general formula (C) are shown below, but the present invention is not limited thereto.

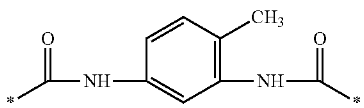

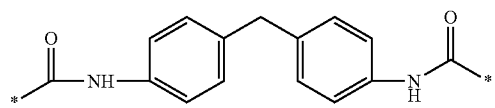

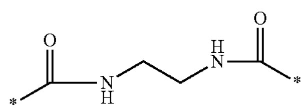

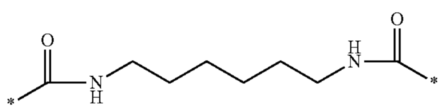

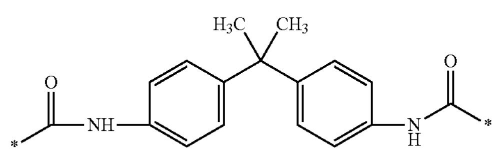

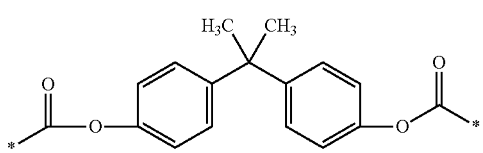

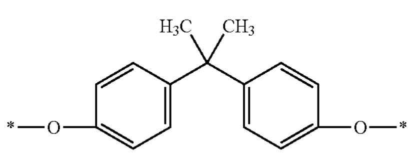

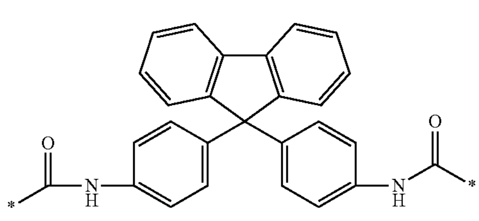

-continued

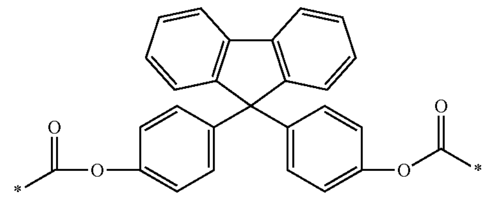

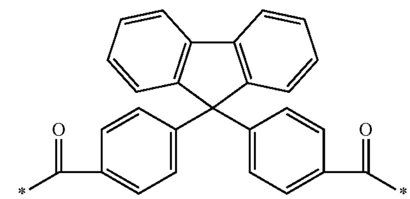

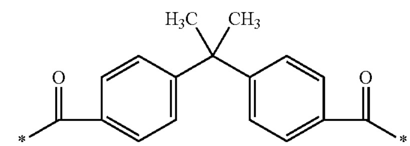

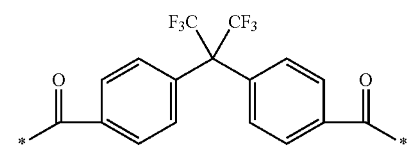

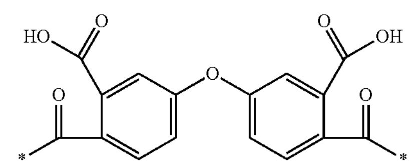

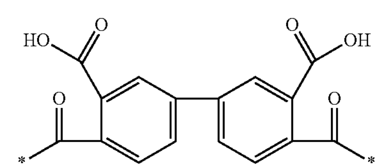

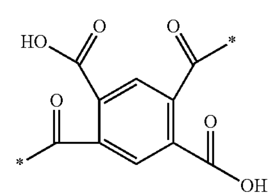

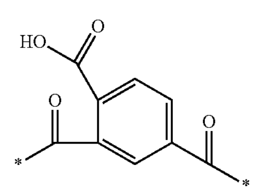

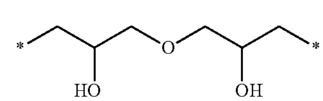

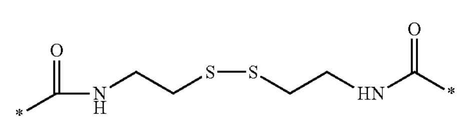

Specific examples of the constitutional unit represented by the general formula (C) are shown below, but the present invention is not limited thereto.

(C-1)
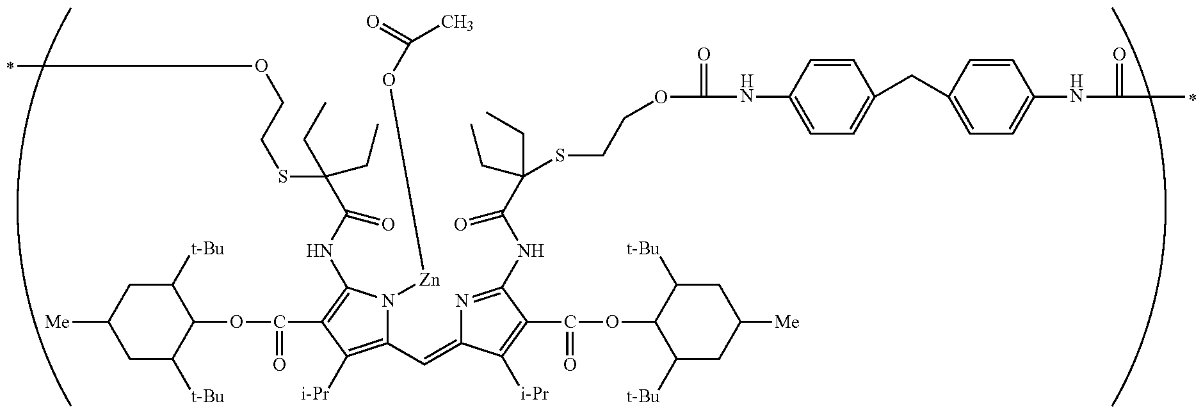
(C-2)
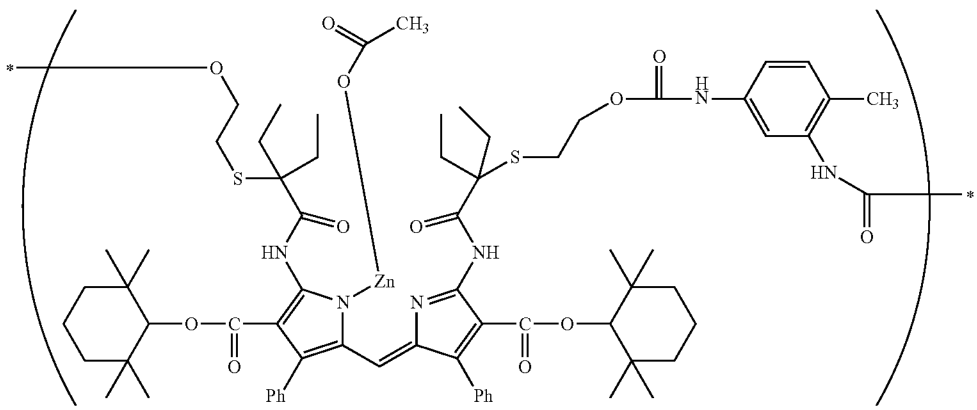
(C-3)
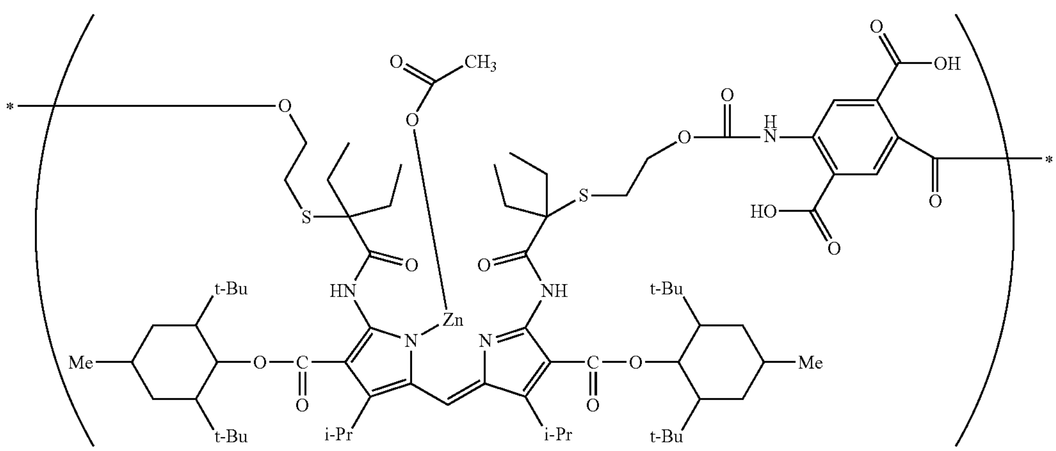

-continued
(C-4)
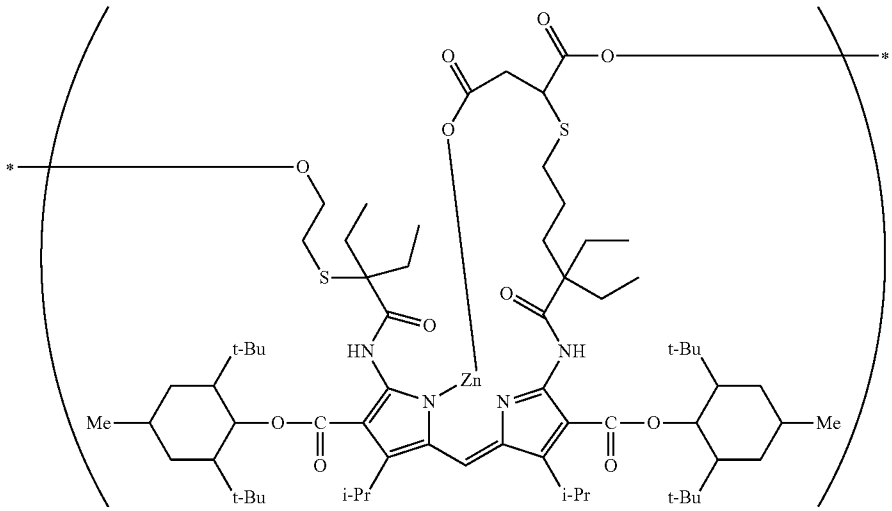
(C-5)
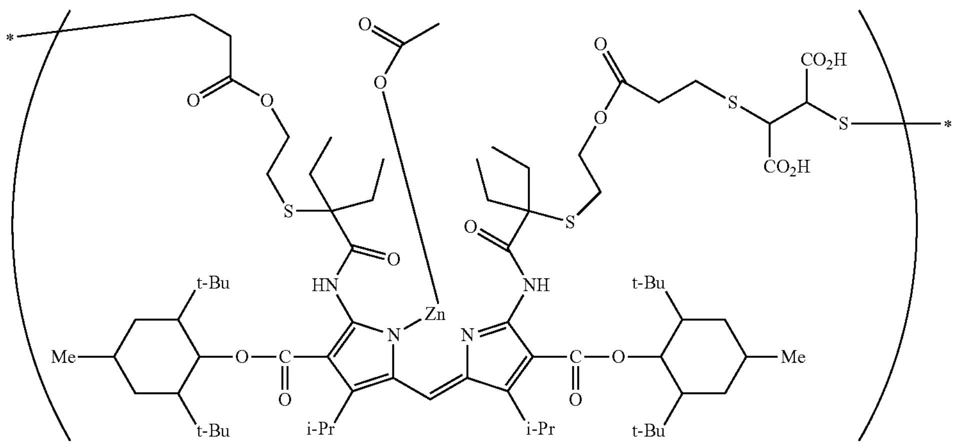
(C-az-1)
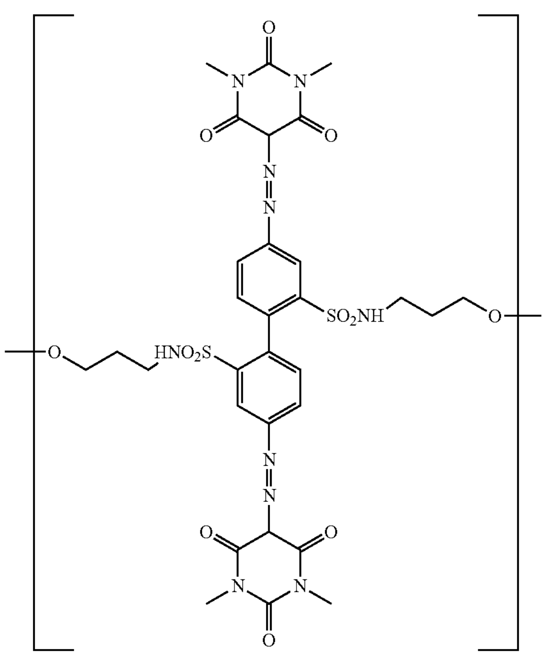
(C-pm-1)
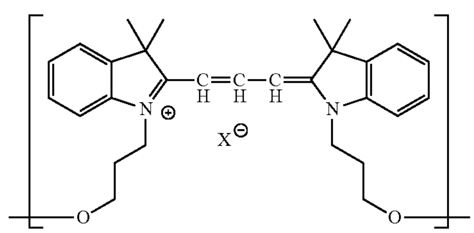

-continued (C-aq-1)

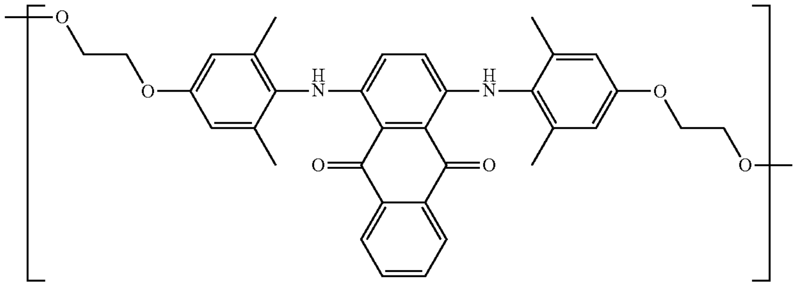

(C-sq-1)

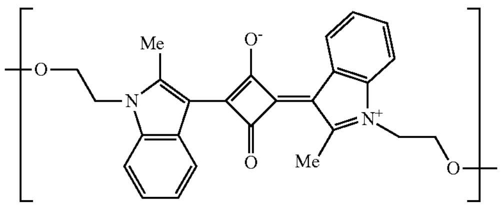

(C-az-2)

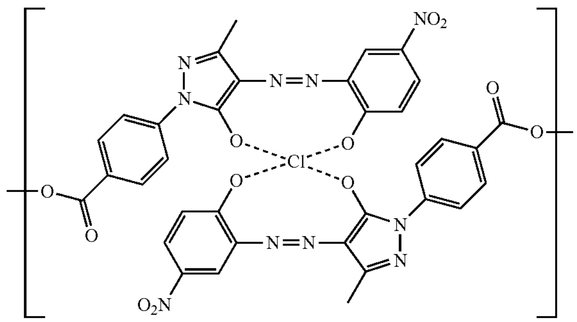

<Copolymerization Components>

The colorant multimer of the present invention may be formed from the constitutional units represented by the general formula (A), the general formula (B), and the general formula (C), but may be multimerized with other constitutional units. Preferable examples of such other constitutional units include constitutional units shown below and specific examples thereof are shown, but the present invention is not limited thereto.

(H-1)

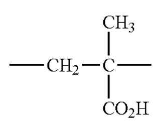

(H-2)

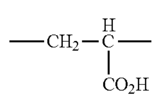

(H-3)

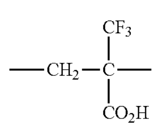

(H-4)

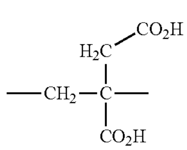

(H-5)

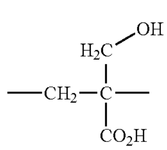

-continued (H-6)

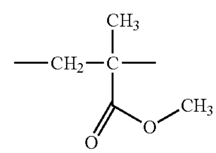

(H-7)

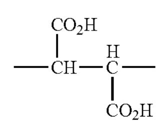

(H-8)

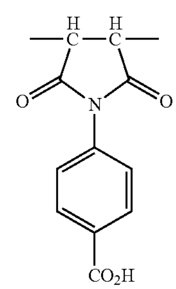

(H-9)

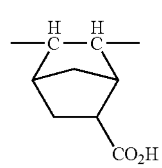

-continued
(H-10)
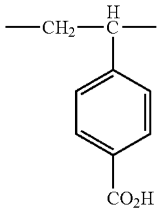
(H-11)
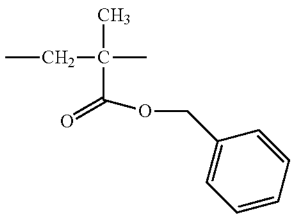
(H-12)
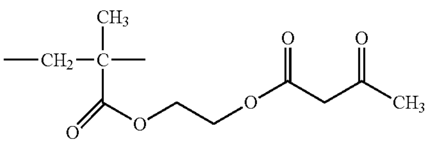
(H-13)
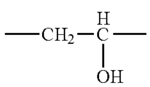
(H-14)
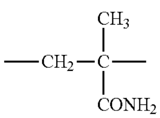
(H-15)
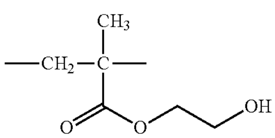
(H-16)
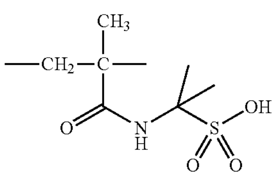
(H-17)
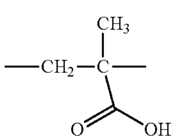
(H-18)
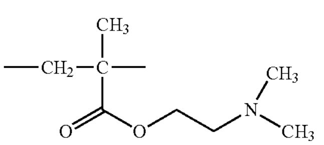
(H-19)
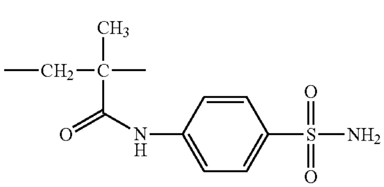
-continued
(H-20)
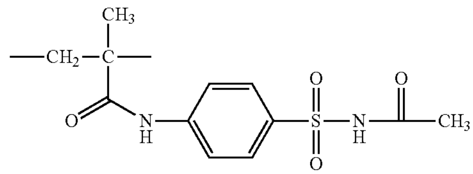
(H-21)
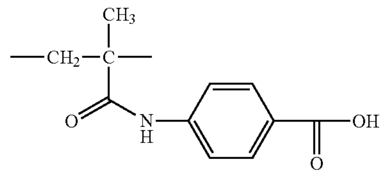
(H-22)
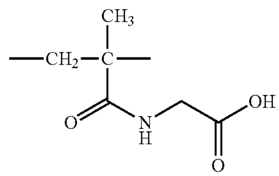
(H-23)
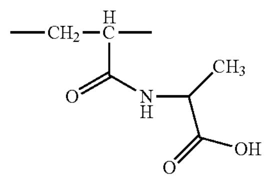
(H-24)
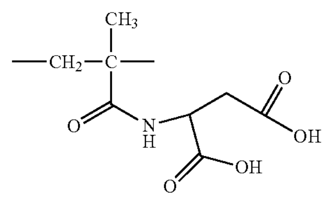
(H-25)
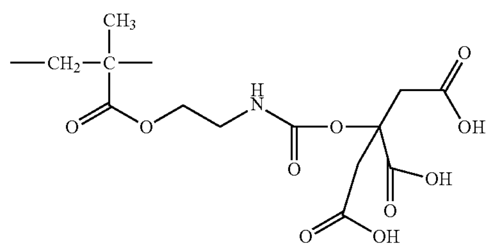
(H-26)
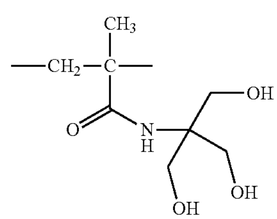
(H-27)
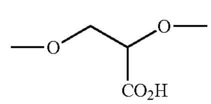
(H-28)
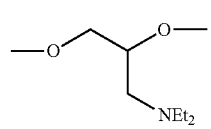

-continued (H-29)

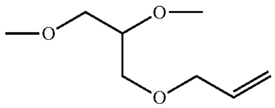

(H-30)

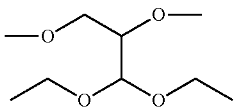

(H-31)

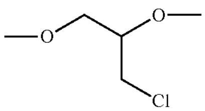

(H-32)

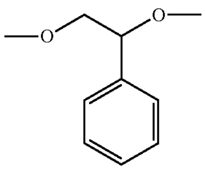

Furthermore, a constitutional unit having a polymerizable group may be included as the other constitutional unit. Examples of the constitutional unit having a polymerizable group include the following constitutional units.

That is, the constitutional unit having a polymerizable group is a constitutional unit formed by adding, to a constitutional unit derived from the above-described copolymerization component (such as methacrylic acid, acrylic acid, hydroxyethyl methacrylate, and the like), a polymerizable compound (such as glycidyl methacrylate, methacryloxyethyl isocyanate, and the like) having a group that reacts with the constitutional unit.

The polymerizable group included in the constitutional unit having a polymerizable group (which may be hereinafter referred to as a "polymerizable unit" in some cases) is not particularly limited, but examples thereof include ethylenically unsaturated groups (such as a methacryl group, an acryl group, a styryl group, and the like), cyclic ether groups (such as an epoxy group, an oxetanyl group, and the like), etc. Among these, an ethylenically unsaturated group is preferable in view of heat resistance and solvent resistance.

Specific examples of the constitutional unit having a polymerizable group are shown below, and the present invention is not limited thereto.

(G-1)

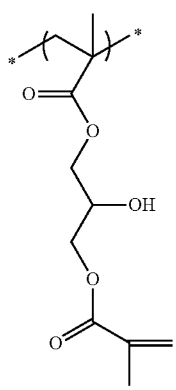

-continued (G-2)

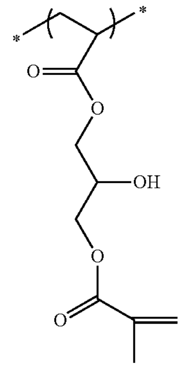

(G-3)

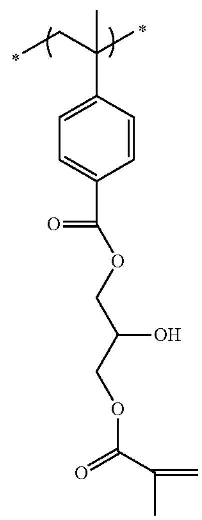

(G-4)

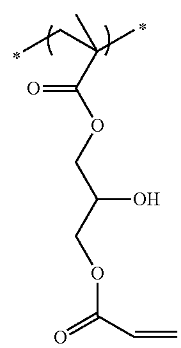

(G-5

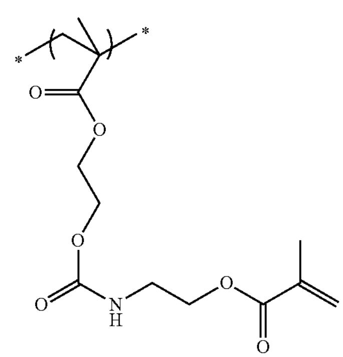

-continued
(G-6)
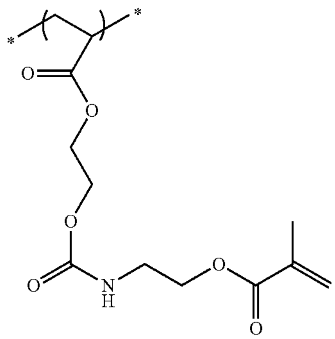
(G-7)
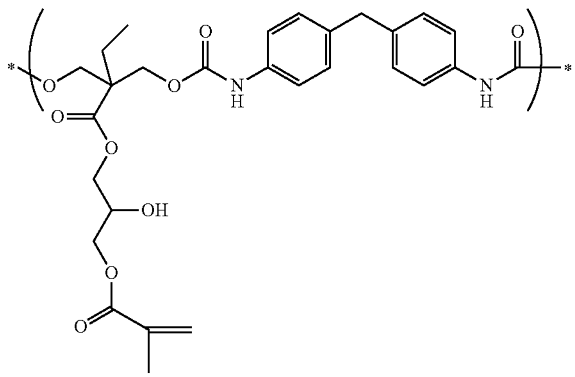
(G-8)
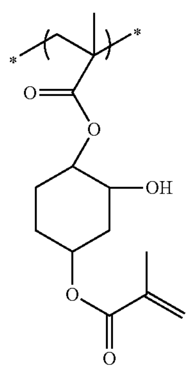
(G-9)
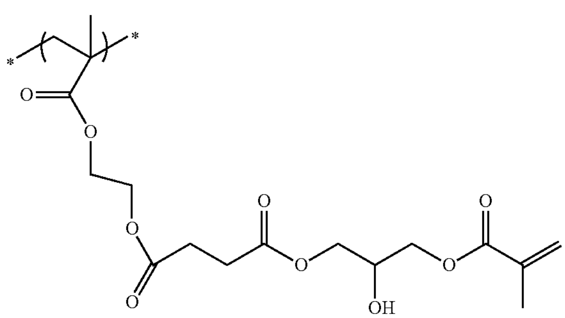
(G-10)
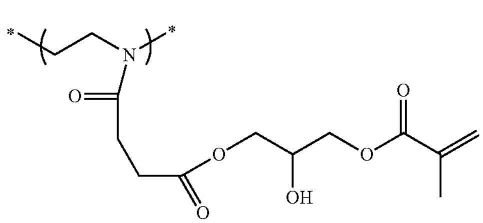
-continued
(G-11)
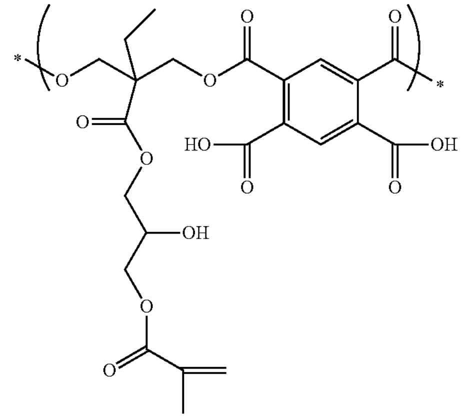
(G-12)
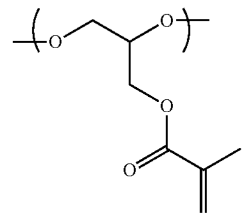
(G-13)
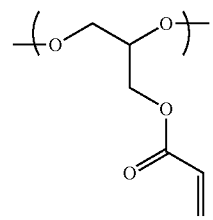
(G-14)
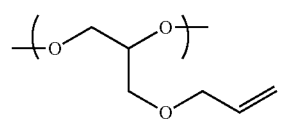
(G-15)
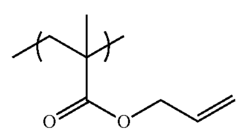
(G-16)
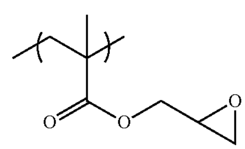
(G-17)
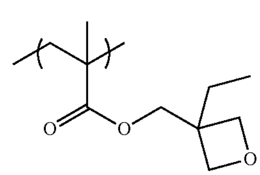
<Color Multimer Represented by General Formula (D)>
Next, the color multimer represented by the general formula (D) will be described in detail.

$$(L^{D1}) \!-\! (DyeV)_{m4} \quad (D)$$

(in the general formula (D), $L^{D1}$ represents a m4-valent linking group; m4 represents an integer of 2 to 100, and when m4 is 2 or more, the DyeV structures may be the same as or different from each other; DyeV represents a colorant structure, and examples thereof include a colorant structure formed by removing any p hydrogen atoms from the dipyrromethene metal complex compound obtained from the dipyrromethene compound represented by the general formula (M) and a metal or a metal compound; and p represents 1 or 2.)

In the general formula (D), m4 is preferably 2 to 80, more preferably 2 to 40, and particularly preferably 2 to 10.

In the general formula (D), when m4 is 2, examples of the divalent linking group represented by $L^{D1}$ include substituted or unsubstituted alkylene groups having 1 to 30 carbon atoms (such as a methylene group, an ethylene group, a trimethylene group, a propylene group, a butylene group, and the like), substituted or unsubstituted allylene groups having 6 to 30 carbon atoms (such as a phenylene group, a naphthalene group, and the like), substituted or unsubstituted heterocyclic linking groups, —CH═CH—, —O—, —S—, —NR— (wherein R's each independently represent a hydrogen atom, an alkyl group, an aryl group, or a heterocyclic group), —C(═O)—, —SO—, —$SO_2$—, and a linking group formed by linking two or more of these groups.

When m4 represents an integer of 3 or more, examples of the m4-valent linking group include substituted or unsubstituted arylene groups (such as a 1,3,5-phenylene group, a 1,2,4-phenylene group, a 1,4,5,8-naphthalene group, and the like), heterocyclic linking groups (such as a 1,3,5-triazine group and the like), and a linking group formed by the substitution of an alkylene linking group or the like as a mother skeleton by the divalent linking group described above.

Specific examples of L4 in the general formula (D) are shown below, but the present invention is not limited thereto.

(L4-1)

$$*—CH_2CH_2CH_2CH_2—*$$

(L4-2)

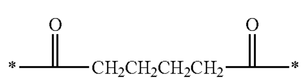

(L4-3)

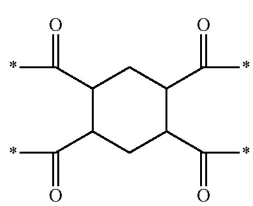

(L4-4)

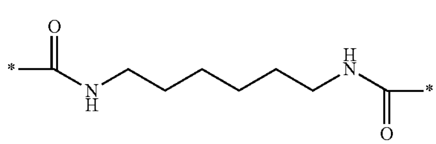

-continued (L4-5)

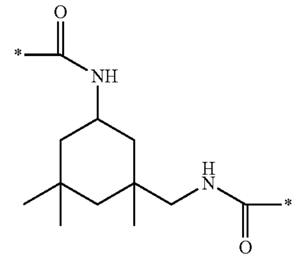

(L4-6)

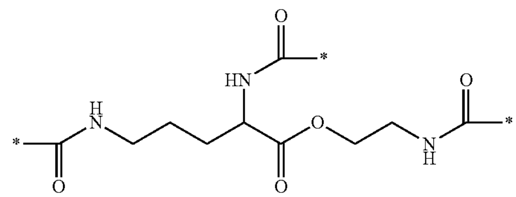

(L4-7)

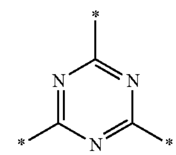

(L4-8)

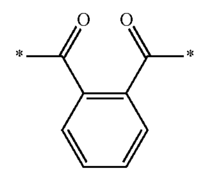

(L4-9)

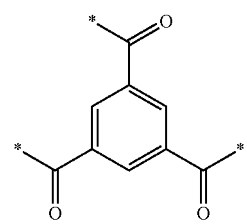

(L4-10)

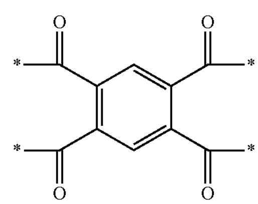

(L4-11)

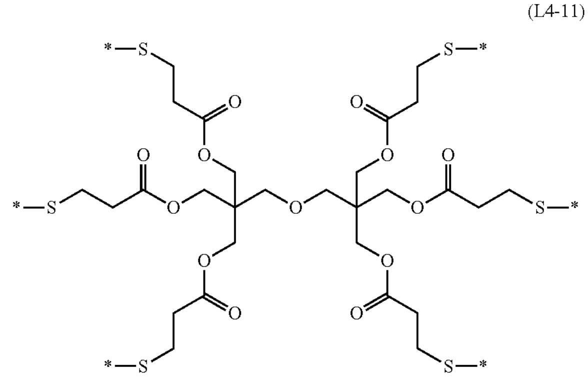

-continued
(L4-12)
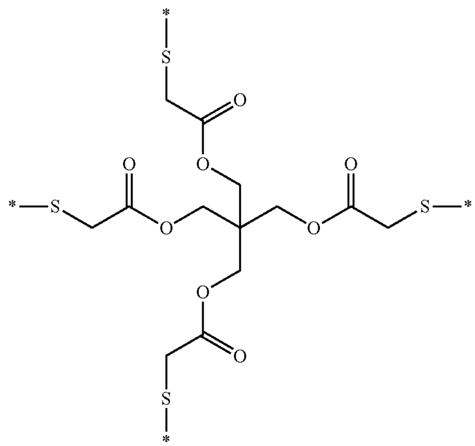
(L4-13)
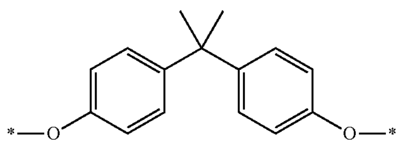
(L4-14)
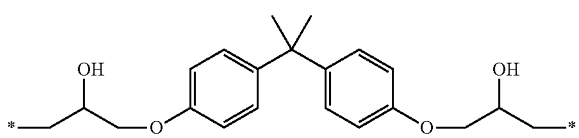
Specific examples of DyeIV in the general formula (D) are shown below, but the present invention is not limited thereto.
(D-sq-1)
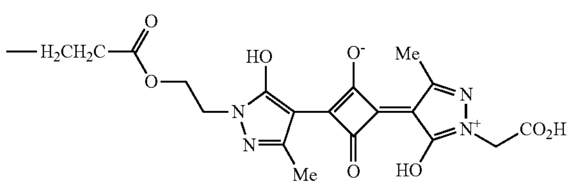
(D-az-1)
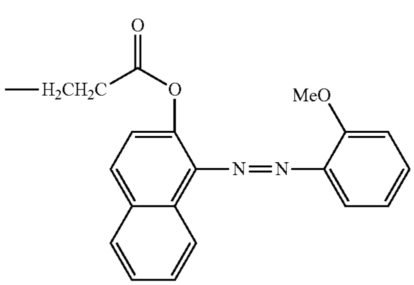
(D-az-2)
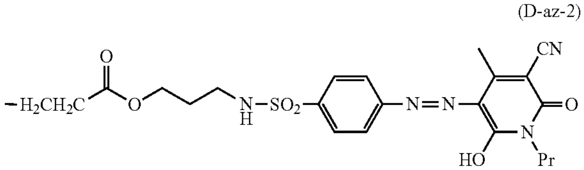
-continued
(D-sp-1)
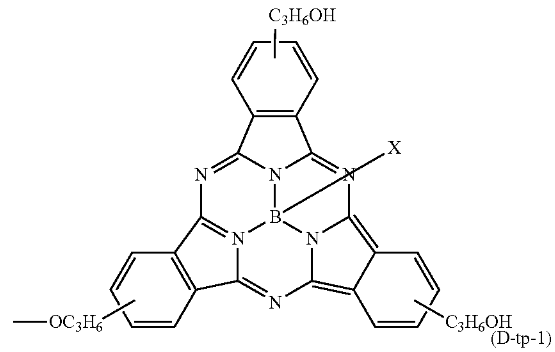
(D-tp-1)
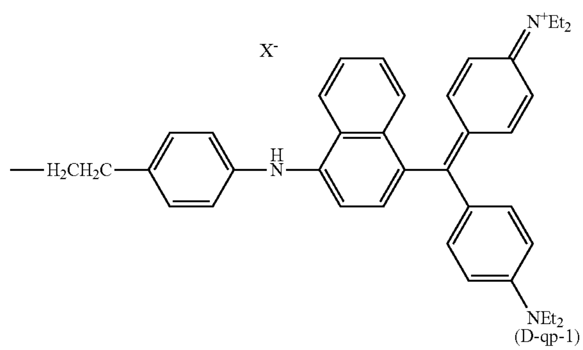
(D-qp-1)
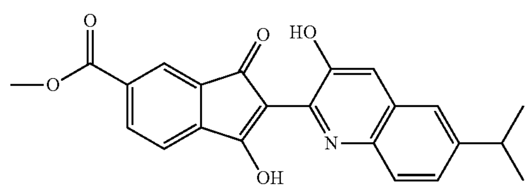
(D-xt-1)
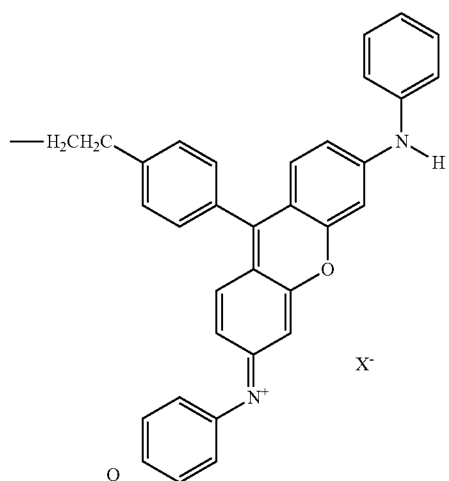
(D-az-3)
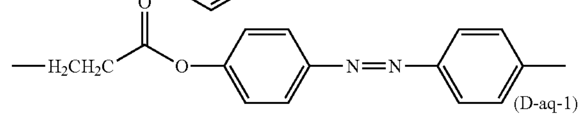
(D-aq-1)
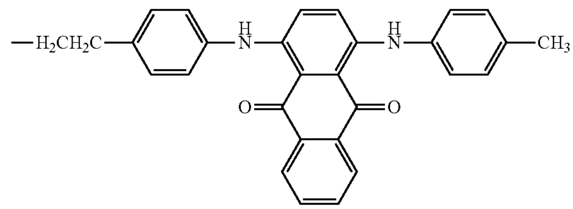

Specific examples of the colorant multimer represented by the general formula (D) are shown below, but the present invention is not limited thereto.
(D-1)
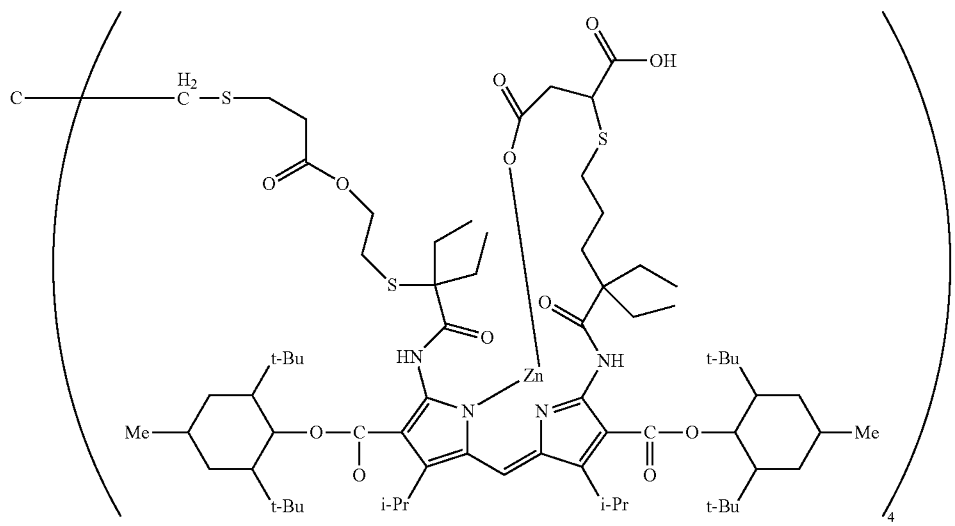
(D-2)
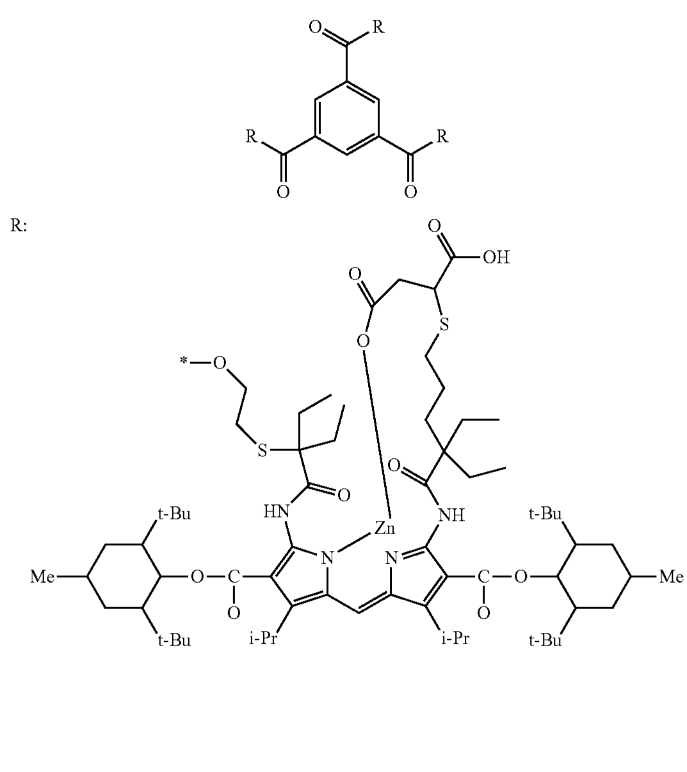

-continued
(D-3)
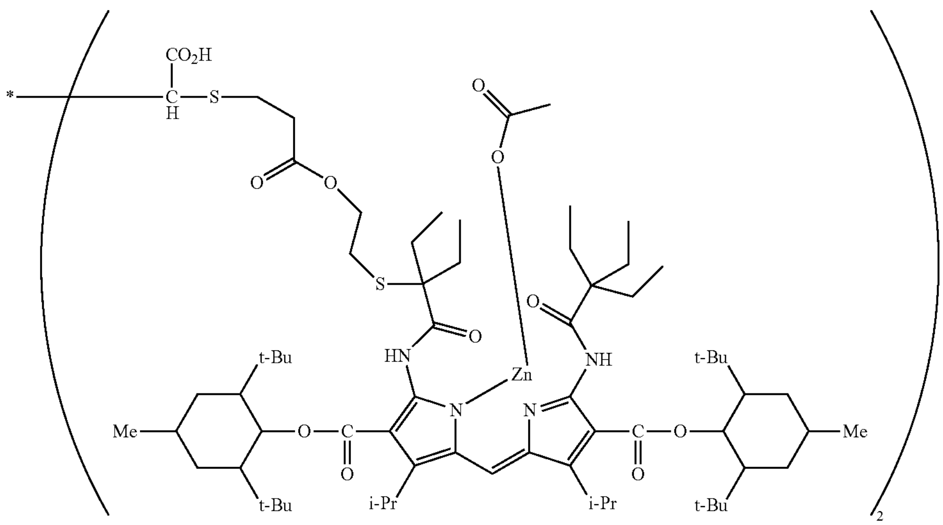
(D-4)
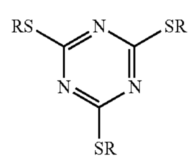
R:
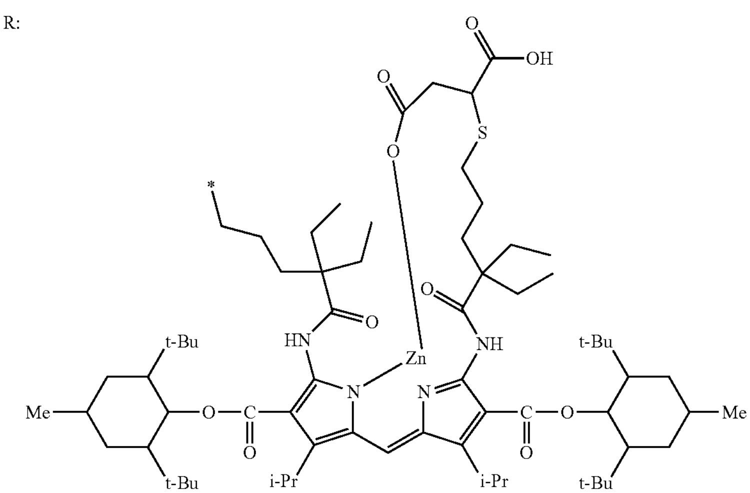

-continued
(D-5)
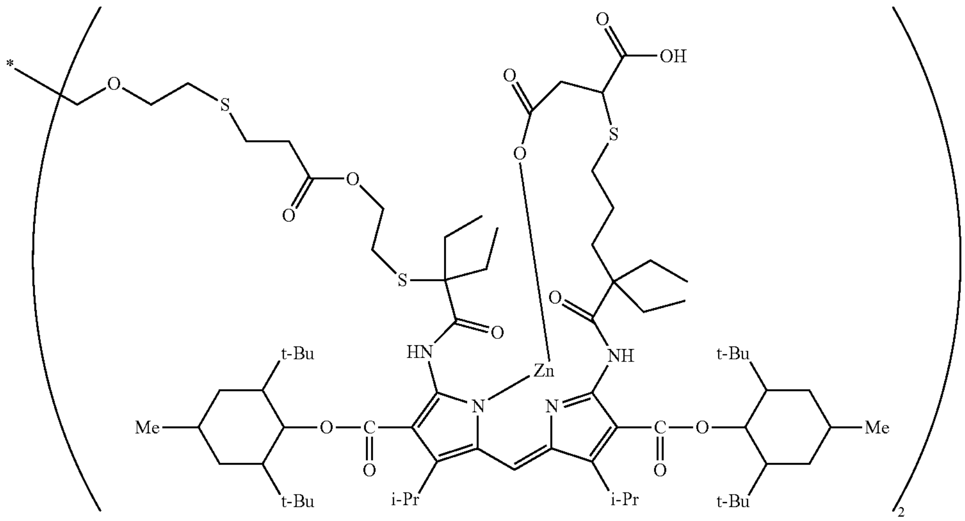
(D-6)
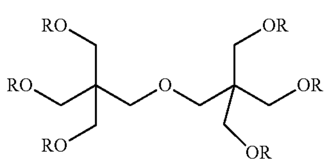
R:
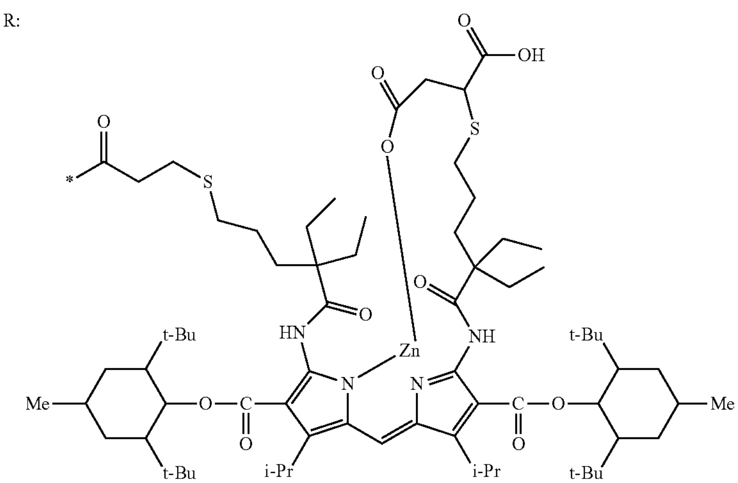

-continued (D-7)

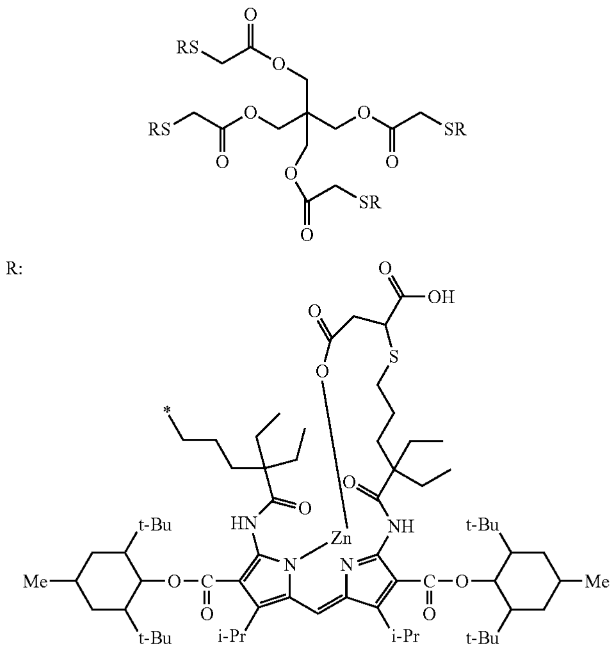

Preferable examples of the colorant multimer of the present invention are shown below, and the type and % by mass, and the weight average molecular weight and dispersity of the constitutional units (the constitutional units as described above) are denoted and shown in Tables 1 and 2 below.

TABLE 1

| Exemplary Compound | Constitutional unit 1 | | Constitutional unit 2 | | Constitutional unit 3 | | Molecular weight | Dispersity Mw/ |
|---|---|---|---|---|---|---|---|---|
| pound | Type | Mass | Type | Mass | Type | Mass | Mw | Mn |
| S-1 | A-1 | 88 | H-1 | 12 | — | | 8000 | 1.9 |
| S-2 | A-2 | 100 | — | | — | | 7200 | 2.3 |
| S-3 | A-2 | 88 | H-1 | 12 | — | | 9000 | 1.7 |
| S-4 | A-2 | 88 | H-1 | 12 | — | | 15000 | 1.8 |
| S-5 | A-2 | 82 | H-1 | 18 | — | | 5500 | 2.2 |
| S-6 | A-2 | 88 | H-1 | 6 | G-1 | 6 | 7800 | 1.8 |
| S-7 | A-2 | 88 | H-1 | 9 | G-1 | 3 | 8100 | 1.8 |
| S-8 | A-2 | 82 | H-1 | 12 | G-1 | 6 | 6400 | 2.6 |
| S-9 | A-2 | 82 | H-1 | 12 | H-3 | 6 | 7900 | 1.5 |
| S-10 | A-2 | 82 | H-1 | 12 | H-12 | 6 | 9100 | 1.8 |
| S-11 | A-2 | 82 | H-1 | 12 | H-20 | 6 | 10000 | 1.7 |
| S-12 | A-2 | 88 | H-3 | 12 | — | | 7400 | 2 |
| S-13 | A-2 | 88 | H-4 | 12 | — | | 6000 | 2.3 |
| S-14 | A-2 | 88 | H-12 | 12 | — | | 8500 | 1.8 |
| S-15 | A-2 | 88 | H-20 | 12 | — | | 8400 | 1.7 |
| S-16 | A-3 | 100 | — | | — | | 9600 | 1.9 |
| S-17 | A-3 | 88 | H-1 | 12 | — | | 5700 | 1.9 |
| S-18 | A-3 | 82 | H-1 | 18 | — | | 12000 | 2.1 |
| S-19 | A-3 | 88 | H-1 | 6 | G-1 | 6 | 9900 | 1.8 |
| S-20 | A-4 | 100 | — | | — | | 8700 | 2.3 |
| S-21 | A-4 | 88 | H-1 | 12 | — | | 7400 | 1.7 |
| S-22 | A-4 | 82 | H-1 | 18 | — | | 6300 | 2 |
| S-23 | A-4 | 88 | H-1 | 6 | G-1 | 6 | 7500 | 1.8 |
| S-24 | A-5 | 100 | — | | — | | 7600 | 1.8 |
| S-25 | A-5 | 88 | H-1 | 12 | — | | 14000 | 2 |
| S-26 | A-5 | 88 | H-1 | 6 | G-1 | 6 | 6900 | 2.4 |
| S-27 | A-5 | 88 | H-1 | 9 | G-1 | 3 | 8400 | 1.9 |
| S-28 | A-5 | 82 | H-1 | 12 | H-3 | 6 | 9600 | 1.7 |
| S-29 | A-5 | 82 | H-1 | 12 | H-20 | 6 | 9400 | 1.7 |
| S-30 | A-5 | 88 | H-3 | 12 | — | | 7600 | 2.1 |

TABLE 2

| Exemplary Compound | Constitutional unit 1 | | Constitutional unit 2 | | Constitutional unit 3 | | Molecular weight | Dispersity Mw/ |
|---|---|---|---|---|---|---|---|---|
| pound | Type | Mass | Type | Mass | Type | Mass | Mw | Mn |
| S-31 | A-5 | 88 | H-4 | 12 | — | | 8000 | 1.9 |
| S-32 | A-7 | 88 | H-1 | 12 | — | | 6000 | 1.9 |
| S-33 | A-8 | 88 | H-1 | 12 | — | | 9400 | 1.6 |
| S-34 | A-9 | 88 | H-1 | 12 | — | | 5900 | 2.1 |
| S-35 | A-10 | 88 | H-1 | 12 | — | | 8300 | 1.9 |
| S-36 | A-15 | 88 | H-1 | 12 | — | | 11000 | 1.7 |
| S-37 | A-19 | 88 | H-1 | 12 | — | | 8700 | 1.8 |
| S-38 | A-24 | 88 | H-1 | 12 | — | | 6600 | 2.2 |
| S-39 | A-26 | 88 | H-1 | 12 | — | | 6800 | 2.1 |
| S-40 | A-27 | 88 | H-1 | 12 | — | | 8800 | 1.8 |
| S-41 | A-37 | 88 | H-1 | 12 | — | | 7600 | 1.7 |
| S-42 | A-41 | 88 | H-1 | 12 | — | | 9400 | 2.3 |
| S-43 | A-44 | 88 | H-1 | 12 | — | | 7200 | 1.9 |
| S-44 | A-45 | 88 | H-11 | 12 | — | | 7500 | 1.9 |
| S-45 | A-46 | 88 | H-1 | 12 | — | | 9000 | 2.2 |
| S-46 | B-1 | 88 | H-1 | 12 | — | | 8600 | 2.2 |
| S-47 | B-1 | 82 | H-1 | 12 | H-6 | 6 | 7600 | 1.9 |
| S-48 | B-4 | 82 | H-1 | 12 | G-1 | 6 | 13200 | 1.8 |
| S-49 | B-5 | 82 | H-1 | 12 | H-18 | 6 | 9800 | 1.9 |
| S-50 | B-6 | 88 | H-1 | 12 | — | | 7600 | 2.3 |
| S-51 | B-6 | 82 | A-6 | 6 | H-1 | 12 | 7900 | 2.1 |
| S-52 | C-1 | 100 | — | | — | | 5400 | 1.2 |
| S-53 | C-5 | 100 | — | | — | | 5900 | 1.3 |
| S-54 | D-1 | 100 | — | | — | | 4800 | 1.2 |
| S-55 | D-2 | 100 | — | | — | | 3700 | 1.4 |
| S-56 | D-4 | 100 | — | | — | | 4400 | 1.3 |
| S-57 | D-6 | 100 | — | | — | | 4900 | 1.1 |
| S-58 | D-7 | 100 | — | | — | | 5900 | 1.2 |

Among the colorant multimers having constitutional unit(s) represented by the general formula (A), the general formula (B), and/or the general formula (C) and the constitutional unit represented by the general formula (D), the colorant multimers having constitutional units represented by the general formula (A) and the general formula (C), and the colorant multimer represented by the general formula (D) which has a partial structure derived from a colorant covalently bonded in the molecular structure, and therefore, enables the radiation-sensitive colored composition including the colorant multimer to have heat resistance. Accordingly, when the radiation-sensitive colored composition is employed in the pattern formation having a high-temperature process, an effect of suppression of color transfer to adjacent other colored patterns is obtained, which is thus preferable. Further, the colorant multimer of the present invention preferably includes a constitutional unit represented by the general formula (A), the general formula (B), or the general formula (C), and among these, the constitutional unit represented by the general formula (A) is preferably included from the viewpoint of easy control of the molecular weight of the colorant multimer. In addition, the constitutional unit represented by the general formula (A) is preferably formed using the colorant monomer represented by the following general formula (1) as a polymerization component.

The colorant monomer represented by the general formula (1) will be described in detail.

Colorant Monomer Represented by General Formula (1)>

The colorant monomer that is included in the colorant multimer of the present invention as a polymerization component will be described in detail.

The colorant monomer is a compound represented by the following general formula (1).

(1)

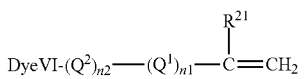

(in the general formula (1), $R^{21}$ represents a hydrogen atom, a halogen atom, an alkyl group, or an aryl group; $Q^1$ represents —N($R^2$)C(=O)—, —OC(=O)—, —C(=O)N($R^2$)—, —C(=O)O—, a group represented by the following general formula (2), a group represented by the following general formula (3), or a group represented by the following general formula (4); $Q^2$ represents a divalent linking group; n1 and n2 each independently represent 0 or 1; DyeIV represents a colorant structure, and examples thereof include a colorant structure formed by removing any p hydrogen atoms from the dipyrromethene metal complex compound obtained from the dipyrromethene compound represented by the general formula (7) or (8) and a metal or a metal compound; p represents 1 or 2; and $R^2$ in $Q^1$ represents a hydrogen atom, an alkyl group, an aryl group, or a heterocyclic group.)

(2)

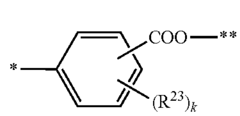

(3)

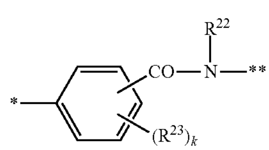

(4)

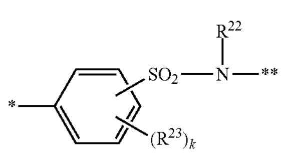

(in the general formulae (2) to (4), $R^{22}$ represents a hydrogen atom, an alkyl group, an aryl group, or a heterocyclic group; plural $R^{23}$'s each independently represent a hydrogen atom or a monovalent substituent; k represents an integer of 0 to 4 and when k is 2 or more, $R^{23}$'s may be the same as or different from each other; * represents a position to which the —C($R^{21}$)=$CH_2$ group in the general formula (1) is bonded; and ** represents a position to which $Q^2$ or DyeVI (in the case of n2=0) in the general formula (1) is bonded.)

(7)

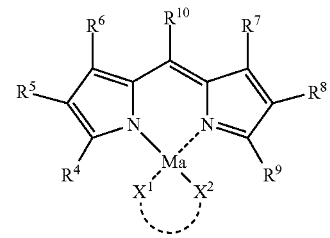

In the general formula (7), $R^4$ to $R^9$ each independently represent hydrogen atom or a monovalent substituent; $R^{10}$ represents a hydrogen atom, a halogen atom, an alkyl group, an aryl group, or a heterocyclic group; Ma represents a metal atom or metal compound; $X^1$ represents a group that can be bonded to Ma; $X^2$ represents a group that neutralizes the charge of Ma; and $X^1$ and $X^2$ may be bonded to each other to form a 5-, 6-, or 7-membered ring together with Ma, provided that $R^4$ and $R^9$ are not bonded to each other to form a ring.

Furthermore, examples of the dipyrromethene metal complex represented by the general formula (7) include tautomers thereof.

(8)

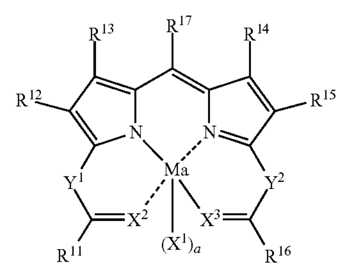

In the general formula (8), $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group; $R^{12}$ to $R^{15}$ each independently represent a hydrogen atom or a monovalent substituent; $R^{17}$ represents a hydrogen atom, a halogen atom, an alkyl group, an aryl group, or a heterocyclic group; Ma represents a metal atom or metal compound; $X^2$ and $X^3$ each independently represent NR (wherein R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom; $Y^1$ and $Y^2$ each independently represent $NR^c$ (wherein $R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom; $R^{11}$ and $Y^1$ may be bonded to each other to form a 5-, 6-, or 7-membered ring, and $R^{16}$ and $Y^2$ may be bonded to each other to form a 5-, 6-, or 7-membered ring; $X^1$ represents a group that can be bonded to Ma; and a represents 0, 1, or 2.

Furthermore, the dipyrromethene metal complex compound represented by the general formula (8) also includes a tautomer thereof.

That is, the colorant monomer represented by the general formula (1) is a compound in which a polymerizable group represented by $-(Q^2)n2-(Q^1)n1-C(R^{21})=CH_2$ in the general formula (1) is introduced into the dipyrromethene metal complex compound represented by the general formula (7) or the general formula (8).

Furthermore, when n1 and n2 are both 0, —C(R21)=CH2 group is directly introduced into the dipyrromethene metal complex compound. Herein, $Q^1$, $Q^2$, and $R^{21}$ each have the same definitions as $Q^1$, $Q^2$, and $R^{21}$ in the general formula (1).

In the dipyrromethene metal complex compound represented by the general formula (7), the position at which the polymerizable group is introduced is not particularly limited, but from the viewpoint of synthetic suitability, introduction of the polymerizable group at any one position of $R^4$ to $R^9$ is preferable, introduction of the polymerizable group at any one position of $R^4$, $R^6$, $R^7$, and $R^9$ is more preferable, and introduction of the polymerizable group at any one position of $R^4$ and $R^9$ is still more preferable.

In the dipyrromethene metal complex compound represented by the general formula (8), the position at which the polymerizable group is introduced is not particularly limited, but from the viewpoint of synthetic suitability, introduction at any one position of $R^4$ to $R^9$ is preferable, introduction at any one position of $R^4$ to $R^9$ is one position in any of $R^{11}$ to $R^{17}$, $X^1$, $Y^1$ to $Y^2$. Among these substituents, from the synthetic compatibility, introduction of the polymerizable group at any one position of $R^{11}$ to $R^{16}$ and $X^1$ is preferable, introduction of the polymerizable group at any one position of $R^{11}$, $R^{13}$, $R^{14}$, and $R^{16}$ is more preferable, and introduction of the polymerizable group at any one position of $R^{11}$ and $R^{16}$ is even still more preferable.

In the general formula (1), $R^{21}$ represents a hydrogen atom, a halogen atom, an alkyl group, or an aryl group. When $R^{21}$ is an alkyl group or an aryl group, it may be unsubstituted or substituted.

In the general formula (1), when $R^{21}$ is an alkyl group, it is preferably a substituted or unsubstituted alkyl group having 1 to 36 carbon atoms, and more preferably a substituted or unsubstituted alkyl group having 1 to 6 carbon atoms. Examples of the alkyl group include a methyl group, an ethyl group, a propyl group, a butyl group, an octyl group, an isopropyl group, a cyclohexyl group, and the like.

In the general formula (1), when $R^{21}$ is an aryl group, it is preferably a substituted or unsubstituted aryl group having 6 to 18, more preferably a substituted or unsubstituted aryl group having 6 to 14, and still more preferably a substituted or unsubstituted aryl group having 6 to 12 carbon atoms. Examples of the aryl group include a phenyl group, a naphthyl group, and the like.

In the general formula (1), when $R^{21}$ is a substituted alkyl group or a substituted aryl group, examples of the substituent include the substituents mentioned in the section of the substituent group A.

Among the substituents, a halogen atom, an alkyl group, an aryl group, a hydroxyl group, a sulfonic acid group, a phosphonic acid group, a carboxyl group, an alkoxy group, an aryloxy group, an alkoxycarbonyloxy group, a cycloalkylcarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, a carbonamide group, an imide group, a sulfonamide group, a sulfamoylamino group, and a sulfamoyl group are preferable; an alkyl group, an aryl group, a hydroxyl group, a sulfonic acid group, a phosphonic acid group, a carboxyl group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, a carbonamide group, a sulfonamide group, a sulfamoylamino group, and a sulfamoyl group are more preferable; a hydroxyl group, a sulfonic acid group, a phosphonic acid group, a carboxyl group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, and an aryloxycarbonyl group are still more preferable; and a hydroxyl group, a sulfonic acid group, a carboxyl group, an alkoxy group, an alkoxycarbonyloxy group, a carbamoyloxy group, a sulfamoyloxy group, an alkylsulfonyloxy group, an acyl group, and an alkoxycarbonyl group are particularly preferable.

Among the particularly preferable substituents, a sulfonic acid group, a carboxyl group, an alkoxy group, an alkoxycarbonyloxy group, an alkylsulfonyloxy group, and an alkoxycarbonyl group are even still more preferable; a sulfonic acid group, a carboxyl group, an alkoxy group, and an alkoxycarbonyl group are even still more preferable; and a sulfonic acid group, a carboxyl group, and an alkoxy group are particularly preferable.

In the general formula (1), as $R^{21}$, a hydrogen atom, an alkyl group, or an aryl group is preferable; and a hydrogen atom or an alkyl group is particularly preferable.

In the general formula (1), when the substituent of the substituted alkyl group and substituted aryl group of $R^{21}$ is a group which may further be substituted, the group may be substituted with any of the substituents mentioned above, and when the group has two or more substituents, the substituents may be the same as or different from each other.

In the general formula (1), $Q^1$ represents $—N(R^2)C(=O)—$, $—OC(=O)—$, $—C(=O)N(R^2)—$, $—C(=O)O—$, a group represented by the following general formula (2), a group represented by the following general formula (3), or a group represented by the following general formula (4), wherein $R^2$ in $Q^1$ represents a hydrogen atom, an alkyl group, an aryl group, or a heterocyclic group.

In the general formula (1), $R^2$ in $Q^1$ represents a hydrogen atom, an alkyl group, an aryl group, or a heterocyclic group, and examples of the alkyl group, the aryl group, and the heterocyclic group are the same as the alkyl groups and the aryl groups as mentioned for the substituents of the substituted alkyl group and the substituted aryl group in $R^{21}$, and a preferable embodiment thereof is also the same.

In the general formula. (1), the alkyl group, the aryl group, and the heterocyclic group as $R^2$ in $Q^1$ may be substituted with any of the substituents mentioned as $R^{21}$ above, and when they have two or more substituents, the substituents may be the same as or different from each other.

As $Q^1$ in the general formula (1), the group represented by the following general formula (2), the group represented by the following general formula (3), or the group represented by the following general formula (4) will be described below.

(2)

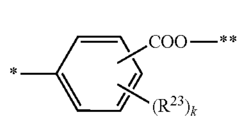

(3)

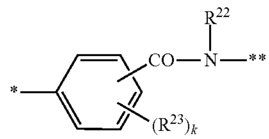

(4)

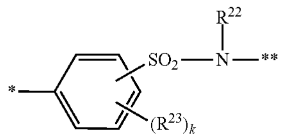

In the general formulae (2) to (4), $R^{22}$ represents a hydrogen atom, an alkyl group, an aryl group, or a heterocyclic group; $R^{23}$ represents a hydrogen atom or a monovalent substituent; k represents an integer of 0 to 4 and when k is 2 or more, $R^{23}$'s may be the same as or different from each other; * represents a position to which the —$C(R^{21})$═$CH_2$ group in the general formula (1) is bonded; and ** represents a position to which $Q^2$ or DyeVI (in the case of n2=0) in the general formula (1) is bonded)

$R^{22}$ in the general formulae (3) to (4) has the same definition as $R^{21}$ described in the general formula (1), and a preferable embodiment thereof is also the same.

$R^{23}$ in the general formulae (2) to (4) represents a hydrogen atom or a substituent, and examples of the substituent represented by $R^{23}$ include the substituents mentioned as the substituted alkyl group and substituted aryl group of $R^{21}$ in the general formula (1), and a preferable embodiment thereof is also the same. k represents an integer of 0 to 4 and when k is 2 or more, $R^{23}$'s may be the same as or different from each other.

When $R^{23}$ in the general formulae (2) to (4) represents a hydrogen atom or a substituent, and examples of the substituent represented by $R^{23}$ is a group which may further be substituted, it may be substituted with any of the substituents mentioned as $R^{21}$ in the general formula (1), and when they have two or more substituents, the substituents may be the same as or different from each other.

As $Q^1$ in the general formula (1), from the viewpoint of synthesis, —$N(R^2)C$(═O)—, —OC(═O)—, —C(═O)N($R^2$)—, and —C(═O)O— are preferable; —OC(═O)—, —C(═O)N($R^2$)—, and —C(═O)O— are more preferable; and —C(═O)N($R^2$)— and —C(═O)O— are still more preferable.

In the general formula (1), in the case of n1=0, $Q^2$ represents a divalent linking group that links a —$C(R^{21})$═$CH_2$ group with Dye.

Preferable examples of $Q^2$ include an alkylene group, an aralkylene group, an allylene group, —O—, —C(═O)—, —OC(═O)—, OC(═O)O—, —$OSO_2$—, —OC(═O)N($R^{50}$)—, —N($R^{50}$)—, —N($R^{50}$)C(═O)—, —N($R^{50}$)C(═O)O—, —N($R^{50}$)C(═O)N($R^{51}$)—, —N($R^{50}$)$SO_2$—, —N($R^{50}$)$SO_2$N($R^{51}$)—, —S—, —S—S—, —SO—, —$SO_2$—, —$SO_2NR^{50}$)—, —$SO_2O$—, and the like. Further, a plurality of the divalent linking groups may be bonded to form a new divalent linking group.

Herein, in $Q^2$ of the general formula (1), $R^{50}$ and $R^{51}$ each independently represent a hydrogen atom, an alkyl group, an aryl group, or a heterocyclic group. Examples of the alkyl group, the aryl group, and the heterocyclic group in $R^{50}$ and $R^{51}$ are the same as the alkyl group, the aryl group, and the heterocyclic group described as the substituent of $R^{21}$ in the general formula (1), and preferable embodiments thereof are also the same. The alkyl group, the aryl group, and the heterocyclic group in $R^{50}$ and $R^{51}$ may be substituted with any of the substituents described as the substituent of $R^{21}$ in the general formula (1), and when they have two or more substituents, the substituents may be the same as or different from each other.

When $Q^2$ in the general formula (1) is an alkylene group, an aralkylene group, or an allylene group, it may be unsubstituted or substituted. When it is substituted, it may be substituted with any of the substituents mentioned as substituent of $R^1$, and when they have two or more substituents, the substituents may be the same as or different from each other.

When $Q^2$ in the general formula (1) is an alkylene group, an aralkylene group, or an allylene group, an alkylene group having 1 to 12 carbon atoms, an aralkylene group having 6 to 18 carbon atoms, and an allylene group having 6 to 18 carbon atoms are preferable; an alkylene group having 1 to 8 carbon atoms, an aralkylene group having 6 to 16 carbon atoms, and an allylene group having 6 to 12 carbon atoms are more preferable; and an alkylene group having 1 to 6 carbon atoms and an aralkylene having 6 to 12 carbon atoms are still more preferable.

For the combinations of $Q^1$ and $Q^2$ in the general formula (1), in a preferable embodiment, $Q^1$ represents —$N(R^2)C$(═O)—, —OC(═O)—, —C(═O)N($R^2$)—, or —C(═O)O—, and $Q^2$ represents an alkylene group having 1 to 12 carbon atoms, an aralkylene group having 6 to 18 carbon atoms, an allylene group having 6 to 18 carbon atoms, an alkylthioether having 2 to 18 carbon atoms, an alkylcarbonamide group having 2 to 18 carbon atoms, or an alkylaminocarbonyl group having 2 to 18 carbon atoms. In a more preferable embodiment, $Q^1$ represents —OC(═O)—, —C(═O)N($R^2$)—, or —C(═O)O—, and $Q^2$ represents an alkylene group having 1 to 8 carbon atoms, an aralkylene group having 6 to 16 carbon atoms, an allylene group having 6 to 12 carbon atoms, an alkylthioether having 2 to 12 carbon atoms, an alkylcarbonamide group having 2 to 12 carbon atoms, or an alkylaminocarbonyl group having 2 to 12 carbon atoms, and in a still more preferable embodiment, $Q^1$ represents —C(═O)N($R^2$)— or —C(═O)O—, and $Q^2$ represents an alkylene group having 1 to 6 carbon atoms, an aralkylene group having 6 to 12 carbon atoms, an alkylthioether having 2 to 6 carbon atoms, an alkylcarbonamide group having 2 to 6 carbon atoms, or an alkylaminocarbonyl group having 2 to 6 carbon atoms.

Examples of the polymerizable group represented by -($Q^2$)n2-($Q^1$)n1-$C(R^{21})$═$CH_2$ in the general formula (1) are shown below, but the present invention is not limited thereto.

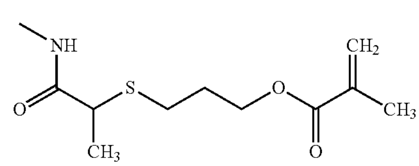

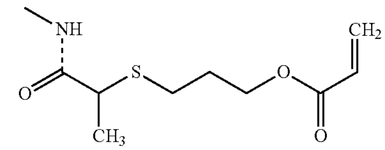

-continued

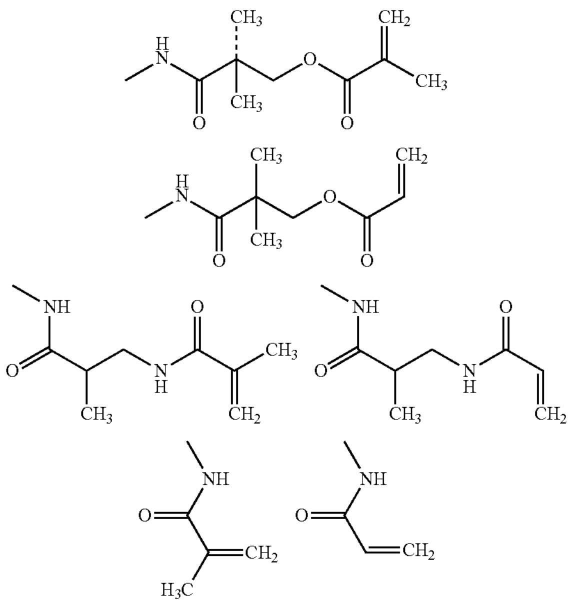

(Dipyrromethene Metal Complex Compound)

The colorant monomer represented by the general formula (1) has a colorant residue formed by removing any one hydrogen atom from the dipyrromethene metal complex compound represented by the general formula (7), or a colorant residue formed by removing any one hydrogen atom of any one substituent of $R^{11}$ to $R^{17}$, $X^1$, and $Y^1$ to $Y^2$ of the dipyrromethene metal complex compound represented by the general formula (8). In other words, the colorant monomer represented by the general formula (1) is a compound in which a polymerizable group represented by $-(Q^2)n2-(Q^1)n1-C(R^{21})=CH_2$ is introduced into the dipyrromethene metal complex compound represented by the general formula (7) or the general formula (8). Further, when n1 and n2 are both 0, a $-C(R^{21})=CH_2$ group is directly introduced into the dipyrromethene metal complex compound.

The dipyrromethene metal complex compound that is introduced to the general formula (1) is the dipyrromethene metal complex compound represented by the general formula (7) or the general formula (8), as described in detail above.

(Specific Examples of Colorant Structure)

Examples of the specific examples and synthesis methods of the colorant structure are shown below, but the present invention is not limited thereto.

The following Exemplary Compound M-53 is synthesized by the following formulation according to the following synthesis scheme.

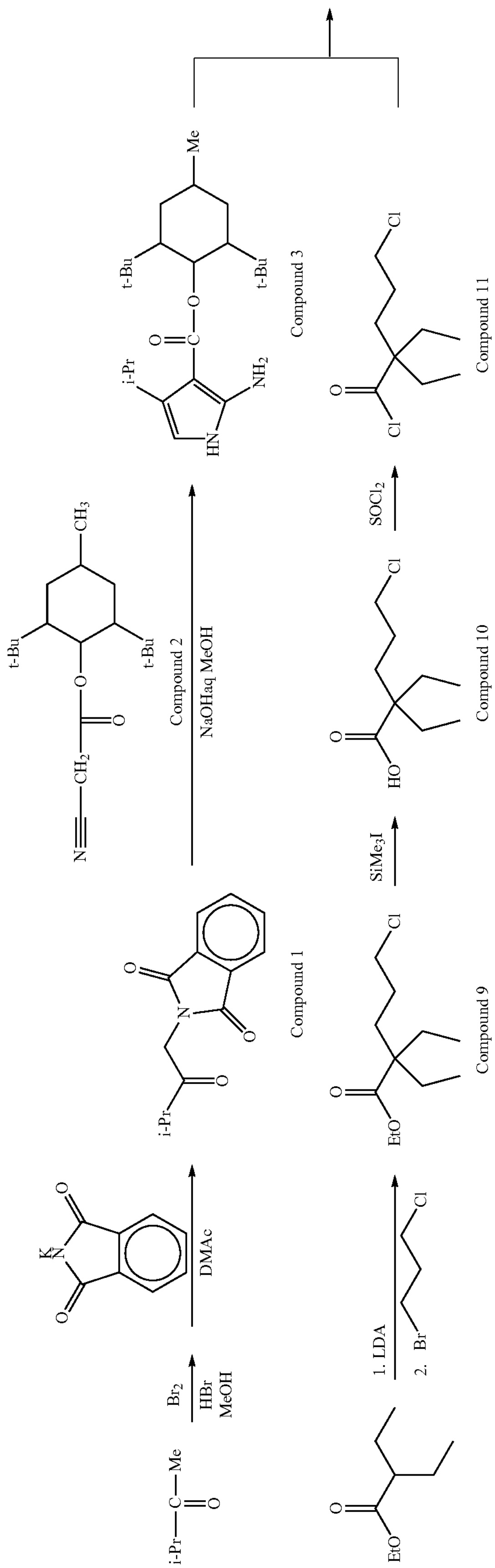
i-Pr—C—Me
Br2
HBr
MeOH
DMAc
i-Pr
Compound 1
Compound 2
NaOHaq MeOH
t-Bu
CH3
CH2
N
Compound 3
i-Pr
NH2
HN
Me
EtO
1. LDA
2. Br
Cl
Compound 9
SiMe3I
HO
Compound 10
SOCl2
Compound 11

-continued
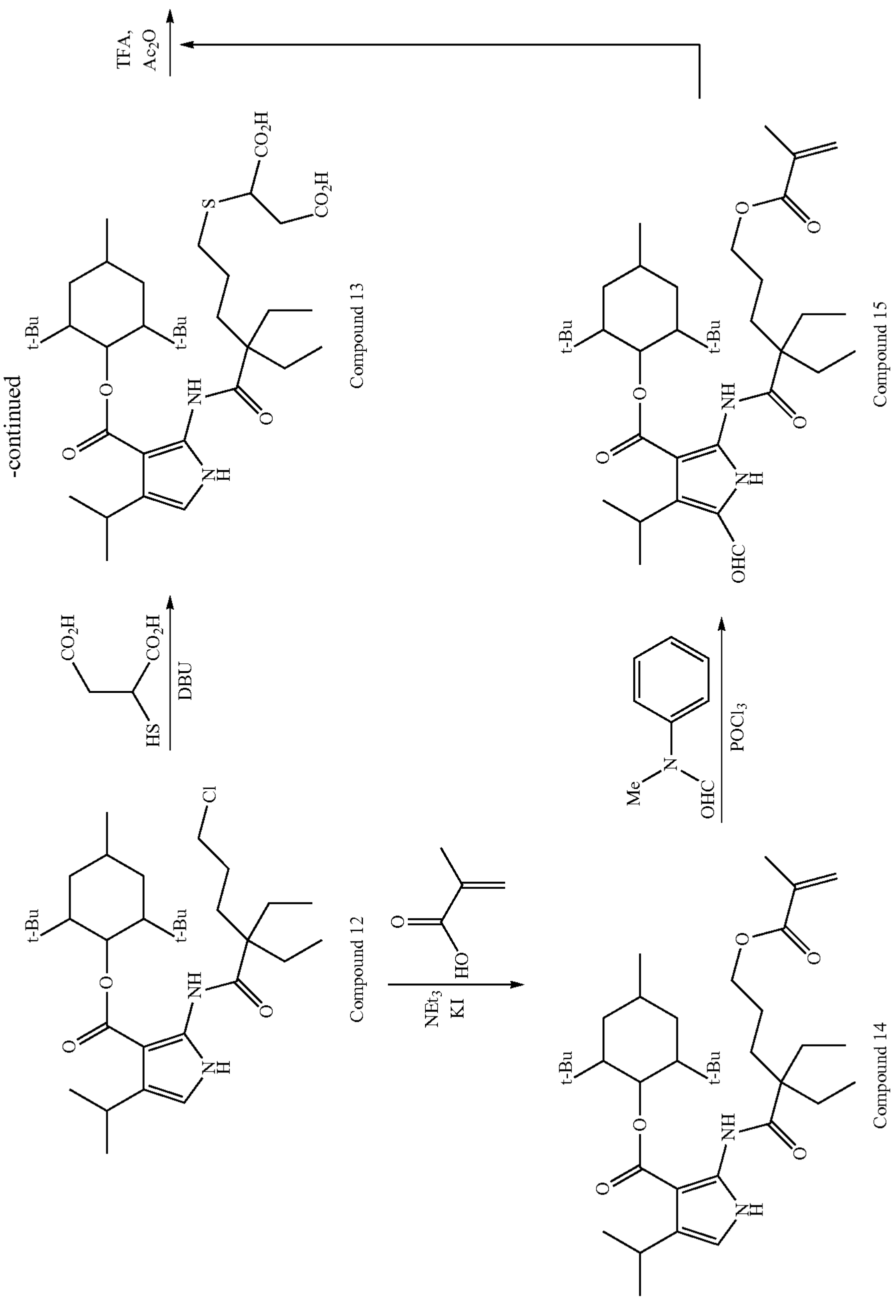
Compound 12
Compound 13
Compound 14
Compound 15

-continued
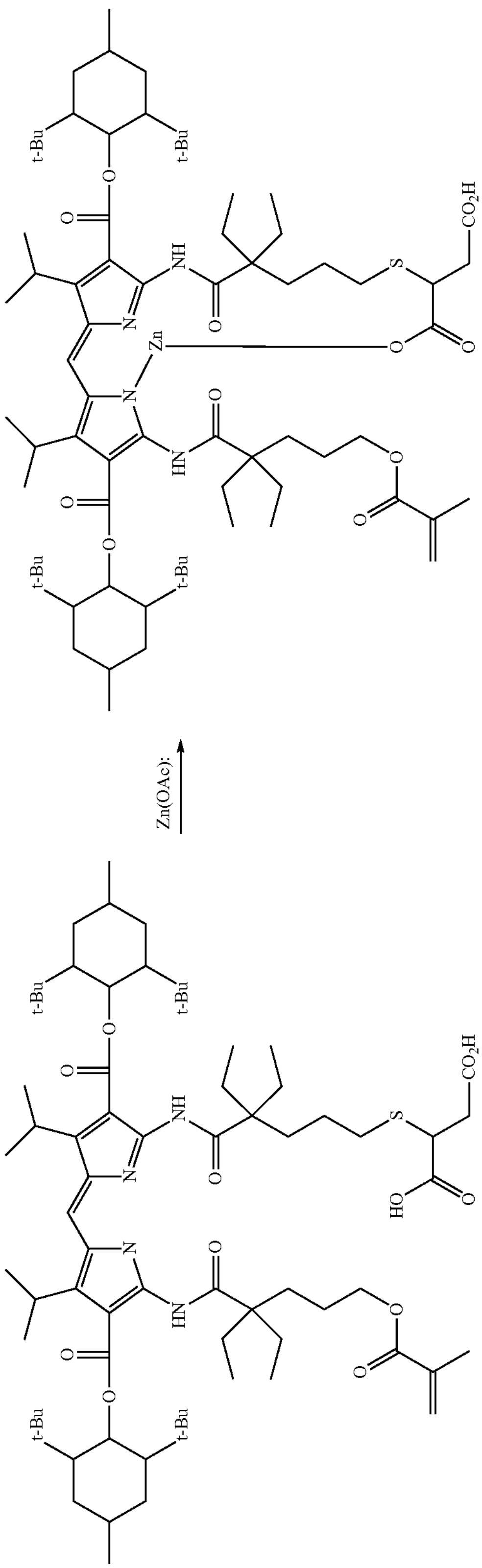
Compound M-151
Compound M-153

<Synthesis of Compound 1>

206.4 g of isopropyl methyl ketone was stirred in 1 L of methanol, and then 7 mL of hydrobromic acid (a 47 to 49% aqueous solution) was added thereto. Subsequently, bromine was added to the mixture dropwise under the conditions of 30 to 34° C. over 3 hours. Thereafter, the mixture was stirred at 30° C. for 30 minutes. The mixture was neutralized with an aqueous solution of 124 g of sodium hydrogen carbonate in 1.3 L of water. Then, an aqueous solution of 400 g of sodium chloride dissolved in 1.3 L of water was then added thereto to isolate a liquid reaction product by phase separation.

The isolated reaction product was added dropwise to a water-cooled solution, in which 222 g of potassium phthalimide was dissolved while stirring in 800 mL of dimethyl acetamide (DMAc), and the mixture was stirred at room temperature for 4 hours. Thereafter, 720 mL of water was added to the resultant mixture with water-cooling and the precipitated crystals were filtered and separated. The obtained crystals were suspended in 1.5 L of toluene, insoluble substances were filtered off, and the filtrate was concentrated, thereby obtaining Compound 1 (100 g).

Compound 1: $^1$H-NMR, 400 MHz, δ ($CDCl_3$) ppm: 1.21 to 1.23 (6H, d), 2.74 to 2.79 (1H, m), 4.56 (2H, s), 7.72 to 7.74 (2H, d), 7.85 to 7.87 (2H, d)

<Synthesis of Compound 2>

Compound 2 was synthesized by the method described in paragraph No. [0134] of JP2008-292970A.

<Synthesis of Compound 3>

Compound 2 (293 g) and Compound 1 (231 g) were stirred in 1.4 L of methanol under a nitrogen gas atmosphere. Thereafter, a solution of sodium hydroxide (88 g) in 400 mL of water was added dropwise thereto at room temperature. The reaction mixture was then refluxed for 8 hours, and cooled to room temperature. The precipitated crystals were filtered and separated, and washed with 100 mL of methanol, thereby obtaining Compound 9 (299 g).

Compound 3: $^1$H-NMR, 400 MHz, δ ($CDCl_3$) ppm: 0.88 to 0.95 (18H, s), 1.00 to 1.03 (3H, d), 1.17 to 1.19 (6H, d), 1.20 to 1.66 (7H, m), 3.38 to 3.43 (1H, m), 5.19 to 5.24 (2H, br), 5.95 (1H, br), 6.00 (1H, s), 7.39 to 7.45 (1H, br)

<Synthesis of Compound 9>

N,N-Diisopropylamine (30 g) was stirred in 200 mL of anhydrous tetrahydrofuran under a nitrogen atmosphere, and 1.6 mol/L of a butyllithium in hexane solution (186 mL) was added dropwise thereto at −60° C. over 20 minutes. After stirring at −40° C. for 30 minutes, ethyl 2-ethylbutyrate (39 g) was added dropwise thereto over 10 minutes. After stirring for 30 minutes, the mixture was cooled to −78° C., and 1-bromo-3-chloropropane (47 g) was added dropwise thereto over 15 minutes, and the mixture was slowly warming to room temperature over 4 hours. After completion of the reaction, a 1 M aqueous hydrochloric acid solution was added thereto, and the mixture was extracted with 400 ml of ethyl acetate and washed with 200 mL of a 1 M aqueous hydrochloric acid solution, 200 mL of water, and 200 mL of saturated brine. The organic layer was dried over 15 g of magnesium sulfate and then filtered, and subsequently, the filtrate was concentrated. The concentrate was purified by column chromatography and concentrated under reduced pressure to obtain a Compound 9 (45 g).

Compound 9: $^1$H-NMR, 300 MHz, δ ($CDCl_3$) ppm: 0.79 (6H, t), 1.25 (3H, t), 1.57 (4 H, q), 1.40-1.65 (4H, m), 3.52 (2H, t) 4.15 (2H, q)

<Synthesis of Compound 10>

Compound 9 (17.2 g) was dissolved in 80 mL of acetonitrile and trimethylsilyl iodide (47 g) was added dropwise thereto at room temperature over 10 minutes, and the mixture was stirred at 80° C. for 60 hours. Thereafter, 400 mL of water was added dropwise to the reaction solution over 30 minutes. The mixture was extracted with 500 ml of ethyl acetate, washed with 300 mL of an aqueous saturated sodium bicarbonate solution, water, and saturated brine, respectively, then dried over magnesium sulfate, and concentrated under reduced pressure. The concentrate was purified by column chromatography, and concentrated under reduced pressure to obtain Compound 10 (8.6 g).

Compound 10: $^1$H-NMR, 300 MHz, δ ($CDCl_3$) ppm: 0.80 (6H, t), 1.57-1.82 (8H, m), 3.52 (2H, t)

<Synthesis of Compound 11>

Compound 10 (5.8 g) was dissolved in 10 mL of dichloromethane, and then thionyl chloride (7.1 g) was added dropwise thereto over 10 minutes in an ice bath under a nitrogen atmosphere. After carrying out a reaction at room temperature for 2 hours, the reaction solution was distilled (11 mmHg, 80° C.) to obtain Compound 11 (5.7 g).

Compound 11: $^1$H-NMR, 300 MHz, δ ($CDCl_3$) ppm: 0.87 (6H, t), 1.62-1.83 (8H, m), 3.55 (2H, t)

<Synthesis of Compound 12>

Compound 3 (194 g) was dissolved in 1900 ml of acetonitrile under a nitrogen atmosphere, and then triethylamine (63 g) was added thereto and Compound 11 (120 g) was added dropwise thereto over 10 minutes while stirring at room temperature. Thereafter, the mixture was heated at 80° C. and stirred for 6 hours. After cooling to room temperature, 950 mL of water was poured into the reaction liquid, and the precipitated solid was filtered. Next, 950 mL of methanol was poured into the obtained solid, and heated and stirred at 70° C. to carry out suspension and washing. The mixture was cooled to room temperature and then filtered to obtain Compound 12 (260 g).

Compound 12: $^1$H-NMR, 300 MHz, δ ($CDCl_3$) ppm: 0.86 (6H, t), 0.90 (18H, s), 1.02 (3H, d), 1.21 (6H, d), 1.25-1.73 (15H, m), 3.45 (1H, quint), 6.02 (1H, s), 6.20 (1H, s), 10.52 (1H, s), 10.94 (1H, s)

<Synthesis of Compound 13>

Compound 12 (18.0 g) and thiomaleic acid (7.9 g) were added to 70 mL of dimethylacetamide, and the mixture was stirred at room temperature. Diazabicycloundecene (26.8 g) was added dropwise thereto over 30 minutes while maintaining the temperature at 30° C. or lower. After stirring at room temperature over 12 hours, the reaction solution was added dropwise to 400, mL of to 0.5 N HCl aq. The precipitated reaction solution was added dropwise thereto over 30 minutes. The precipitated solid was filtered and washed with water, and then the mixture was stirred in 400 mL of water again, and filtered. The obtained solid was dried in vacuo (45° C., 12 hours) to obtain a Compound 13 (18.4 g).

Compound 13: $^1$H-NMR, 300 MHz, δ ($CDCl_3$) ppm: 0.86 (6H, t), 0.89 (18H, s), 1.02 (3H, d), 1.18-1.80 (21H, m), 2.61-2.80 (3H, m), 2.98 (1H, td), 3.46 (1H, quint), 3.64 (1H, dd), 6.01 (1H, s), 6.23 (1H, s), 10.61 (1H, s), 10.94 (1H, s)

<Synthesis of Compound 14>

The Compound 12 (22.0 g), methacrylic acid (6.9 g), potassium iodide (6.6 g), and paramethoxyphenol (11.5 mg) were added to 50 mL of dimethylacetamide, and the mixture was stirred at room temperature. Triethylamine (10.1 g) was added thereto, heated until the internal temperature became 85° C., and stirred for 4 hours. After completion of the reaction, 75 mL of ethyl acetate was added thereto, and the mixture was washed with 50 mL of 1 N HCl aq., water, and an aqueous saturated sodium bicarbonate solution, respectively, and concentrated under reduced pressure. The obtained solid was recrystallized from 100 mL of acetonitrile to obtain a Compound 14 (16.5 g).

Compound 14: $^1$H-NMR, 300 MHz, δ ($CDCl_3$) ppm: 0.86 (6H, t), 0.89 (18H, s), 1.02 (3H, d), 1.27 (6H, d), 1.36 (4H, q), 1.73-1.93 (11H, m), 1.94 (3H, s), 3.46 (1H, quint), 4.14 (2H, t), 5.54 (1H, s), 6.02 (1H, s), 6.09 (1H, s), 6.22 (1H, s), 10.54 (1H, s), 10.94 (1H, s)

<Synthesis of Compound 15>

While stirring N-methyl formanilide (4.3 g) in 25 mL of acetonitrile at 5° C., phosphorous oxychloride (4.9 g) was added dropwise and the mixture was stirred for 1 hour. Then, the compound 15 (16.0 g) and 10 mL of acetonitrile were added thereto, and the mixture was stirred at room temperature for 30 minutes and then stirred at 40° C. for 5 hours. The reaction liquid was poured into 300 mL of water, and the mixture was stirred for 1 hour. The precipitated solid was collected and recrystallized from acetone to obtain a Compound 15 (10.3 g).

Compound 15: $^1$H-NMR, 300 MHz, δ ($CDCl_3$) ppm: 0.86 (6H, t), 0.89 (18H, s), 1.03 (3H, d), 1.26 (4H, q), 1.42 (6H, d), 1.57-1.94 (11H, m), 1.93 (3H, s), 4.11 (1H, quint), 4.14 (2H, t), 5.55 (1H, s), 6.04 (1H, s), 6.10 (1H, s), 9.87 (1H, s), 11.01 (1H, s), 11.16 (1H, s)

<Synthesis of Compound M-151>

The Compound 13 (10.7 g), the Compound 15 (10.1 g), and 100 ml of anhydrous acetic acid were stirred at room temperature, and 8.6 g of trifluoroacetic acid was added dropwise thereto. After stirring at room temperature for 4 hours, 700 mL of water and 170 g of sodium hydrogen carbonate were stirred at room temperature, and the reaction liquid was slowly poured theretinto to carry out the neutralization. After stirring for 1 hour, the precipitated crystals were filtered and washed with 300 mL of water. The obtained solid was dissolved in 50 mL of tetrahydrofuran again, and 50 mL of water and (10.5 g) of triethylamine were added thereto to adjust the system to be uniform. Then, the mixture was stirred at room temperature for 10 minutes. To the reaction solution was added 400 mL of ethyl acetate, and the mixture was washed twice with each of 400 mL of 1 N HCl aq.×2, and 400 mL of water, and concentrated under reduced pressure. The obtained solid was dried by blowing air at 40° C. for 12 hours to obtain a Compound M-151 (19.5 g). The maximum absorption wavelength of M-151 in the absorption spectrum in ethyl acetate was 519 nm and the molar extinction coefficient was 44000.

Compound M-151: $^1$H-NMR, 300 MHz, δ ($CDCl_3$) ppm: 0.79-0.94 (48H, m), 1.02 (6 H, d), 1.21-1.77 (22H, m), 1.42 (12H, d), 1.93 (3H, s), 2.59-2.78 (3H, m), 2.95 (1H, dd), 3.66 (1H, dd), 4.02-4.15 (4H, m), 5.54 (1H, s), 6.03 (2H, s), 6.11 (1H, s), 7.58 (1H, s), 10.75 (1H, s), 10.78 (1H, s)

<Synthesis of Exemplary Compound M-53>

The Compound M-151 (19.0 g) was dissolved in 90 ml of tetrahydrofuran (THF) under stirring. The mixture was stirred and dissolved at room temperature and then 90 mL of methanol was added thereto. Zinc acetate dihydrate (3.3 g) was added thereto, and a solution as dissolved in 90 mL of methanol was added thereto over 10 minutes. The mixture was stirred for 1 hour. Thereafter, the mixture was subjected to pressure reduction with an evaporator at 30° C. and 1000 Torr for 10 minutes. 90 mL of the solvent was evaporated from the reaction solution. The residual solution was added dropwise to 500 ml of water, and precipitated crystals were filtered and dried to obtain an Exemplary Compound M-53 (19.0 g). The maximum absorption wavelength of M-53 in the absorption spectrum in ethyl acetate was 545 nm and the molar extinction coefficient was 130000.

Exemplary Compound M-53: $^1$H-NMR, 300 MHz, δ ($CDCl_3$) ppm: 0.81-0.99 (48H, m), 1.02 (6H, d), 1.15-1.90 (34H, m), 1.94 (3H, s), 2.58-2.80 (3H, m), 3.00 (1H, d), 3.46 (1 H, br), 4.14-4.30 (4H, m), 5.53 (1H, s), 6.04 (1H, s), 6.06 (1H, s), 6.11 (1H, s), 7.80 (1H, s), 11.29 (1H, s), 11.45 (1H, s)

The content of the inorganic metal salt in the colorant monomer represented by the general formula (1) included in the colorant multimer in the present invention is preferably 0.1% by mass or less, and more preferably 0.01% by mass or less, relative to the dye solid.

Furthermore, the lower limit of the content of the inorganic metal salt in the present invention is preferably 0, and it is substantially any one in the range from 0.0001% by mass to 0.1% by mass, and preferably from 0.0001% by mass to 0.01% by mass.

Examples of the method for adjusting the content of the inorganic metal salt in the colorant monomer of the present invention to the above-described ranges include a method in which an excess metal salt (such as zinc acetate and the like) is not used as a raw material during the synthesis of the colorant monomer, and a method in which purification is enhanced. Examples of the enhancement of the purification include removal of calcium salts or sodium salts by enhancing the washing, and the like.

The colorant monomer represented by the general formula (1) in the colorant multimer in the present invention may be one kind or a combination of two or more kinds thereof.

Furthermore, the colorant multimer in the present invention has a structure different from that of the colorant monomer represented by the general formula (1), or may include a monomer having a terminal ethylenically unsaturated bond as a copolymerization component. In this case, it may include one kind or two or more kinds of the monomers. Further, additional monomers may further be included, as desired, as a copolymerization component, and in the case where the additional monomers are included as the copolymerization component, one kind or two or more kinds thereof may be included.

The additional monomers have a structure different from that of the colorant monomer represented by the general formula (1), and the monomer having a terminal ethylenically unsaturated bond will be described hereinbelow.

The colorant multimer in the present invention includes the colorant monomer represented by the general formula (1) which is a preferable monomer capable of forming the constitutional units represented by the general formula (A), the general formula (B), and the general formula (C), or the structural unit represented by the general formula (A), in the amount of 100% by mass in terms of mass ratio (% by mass), that is, it may be a multimer formed by the polymerization of only the constitutional units represented by the general formula (A), the general formula (B), and the general formula (C).

From the viewpoints of the coloring power, the colorant multimer preferably includes the constitutional units represented by the general formula (A), the general formula (B), and the general formula (C) in an amount of 10% by mass to 100% by mass, more preferably 20% by mass to 100% by mass, and still more preferably 30% by mass to 100% by mass, in terms of mass ratio (% by mass).

<Monomer Having Structure Different from that of Colorant Monomer Represented by General Formula (1) and Having Terminal Ethylenically Unsaturated Bond>

The colorant multimer in the present invention may include, as a polymerization component, the constitutional units represented by the general formula (A), the general formula (B), and the general formula (C), and in a preferable embodiment, the colorant monomer represented by the general formula (1), and further, a monomer, as a copolymerization component, having a structure different from that of the colorant monomer represented by the general formula (1) and a terminal ethylenically unsaturated bond (which is hereinafter appropriately referred to as the "additional monomers having ethylenically unsaturated bonds"). Further, it may further include monomers having structures different from those of the additional monomers having ethylenically unsaturated bonds as the copolymerization components.

That is, the colorant multimer in the present invention may be a copolymer including a colorant monomer capable of forming the constitutional units represented by the general formula (A), the general formula (B), and the general formula (C), the colorant monomer represented by the general formula (1), and the additional monomers having ethylenically unsaturated bonds. Herein, the copolymer may include one kind or two or More kinds of the specific monomers according to the present invention, and may include one kind or two or more kinds of the additional monomers having ethylenically unsaturated bonds.

The additional monomers having ethylenically unsaturated bonds are not particularly limited as long as they are compounds having at least ethylenically unsaturated bonds at the terminals, and are the monomers having structures different from those of the colorant monomers capable of forming the constitutional units represented by the general formula (A), the general formula (B), and the general formula (C), and the colorant monomer represented by the general formula (1).

The radiation-sensitive colored composition of the present invention is preferably a monomer in which the additional monomers having ethylenically unsaturated bonds which the colorant structure may further have alkali-soluble groups in addition to the terminal ethylenically unsaturated bond, from the viewpoint of improving the formability of the color pattern.

Examples of the additional monomer having an alkali-soluble group together with an ethylenically unsaturated bond include a vinyl monomer having a carboxyl group, a vinyl monomer having a sulfonic acid group, a monomer having a phosphoric acid group, and the like.

Examples of the vinyl monomer having a carboxy group include (meth)acrylic acid, vinyl benzoic acid, maleic acid, monoalkyl maleate, fumaric acid, itaconic acid, crotonic acid, cinnamic acid, an acrylic acid dimer, and the like. Examples further include a vinyl monomer having a phosphoric acid group, an addition reaction products of a monomer having a hydroxyl group such as 2-hydroxyethyl(meth)acrylate and the like with a cyclic anhydride such as maleic anhydride, phthalic anhydride or cyclohexane dicarboxylic anhydride; and co-carboxy-polycaprolactone mono(meth)acrylate. As a precursor of a carboxy group, an anhydride-containing monomer such as maleic anhydride, itaconic acid anhydride, citraconic anhydride, and the like may be used. Among these, a (meth)acrylic acid is preferable from the viewpoint of copolymerization property, cost, solubility, and the like.

Examples of the vinyl monomer having a sulfonic acid group include 2-acrylamide-2-methylpropanesulfonic acid and the like. Examples of the vinyl monomer having a phosphoric acid group include mono(2-acryloyloxyethyl)phosphate, mono(1-methyl-2-acryloyloxyethyl)phosphate and the like.

The colorant multimer in the present invention preferably includes the repeating unit derived from the vinyl monomer having alkali-soluble group as described above. When including the repeating unit, the colored radiation-sensitive composition of the present invention has excellent removability of a non-exposed area.

In the colorant multimer in the present invention, the content of the repeating unit derived from the vinyl monomer having an alkali-soluble group is preferably 50 mg KOH/g or more, and particularly preferably from 50 mg KOH/g to 200 mg KOH/g. Within these range, the generation of the precipitates in the developing liquid is suppressed.

Furthermore, when the acid value is within the above-described ranges and a radiation-sensitive colored composition is formed using both of the colorant multimer of the present invention and a pigment, the formation of aggregates of the primary particles of the pigment, that is, secondary aggregates can be effectively suppressed, or the cohesive force of the secondary aggregates can be effectively weakened.

The vinyl monomer that can be used for the copolymerization with the colorant monomer in the present invention is not particularly limited, but preferable examples thereof include (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes and (meth)acrylonitriles. Specific examples of the vinyl monomer include the following compounds. Further, in the present specification, the "(meth)acryl" may be defined in some cases to represent any one or both of "acryl and methacryl".

Examples of the (meth)acrylic acid esters include methyl (meth)acrylate, ethyl (meth)acrylate, n-propyl(meth)acrylate, isopropyl(meth)acrylate, n-butyl(meth)acrylate, isobutyl(meth)acrylate, t-butyl(meth)acrylate, n-hexyl(meth) acrylate, cyclohexyl (meth)acrylate, t-butyl cyclohexyl (meth)acrylate, 2-ethylhexyl(meth)acrylate, t-octyl (meth) acrylate, dodecyl(meth)acrylate, octadecyl(meth)acrylate, acetoxyethyl(meth)acrylate, phenyl(meth)acrylate, 2-hydroxyethyl(meth)acrylate, 2-methoxyethyl(meth)acrylate, 2-ethoxyethyl(meth)acrylate, 2-(2-methoxyethoxy)ethyl (meth)acrylate, 3-phenoxy-2-hydroxypropyl(meth)acrylate, benzyl(meth)acrylate, diethylene glycol monomethyl ether (meth)acrylate, diethylene glycol monoethyl ether (meth) acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl(meth)acrylate, nonylphenoxypolyethylene glycol (meth)acrylate, dicyclopentenyl(meth)acrylate, dicyclopentenyloxyethyl(meth)acrylate, trifluoroethyl(meth) acrylate, octafluoropentyl (meth)acrylate, perfluorooctylethyl(meth)acrylate, dicyclopentenyl(meth)acrylate, tribromophenyl(meth)acrylate, tribromophenyloxyethyl (meth)acrylate, and the like.

Examples of the crotonic acid esters include butyl crotonate, hexyl crotonate, and the like.

Examples of the vinyl esters include vinyl acetate, vinyl propionate, vinyl butyrate, vinyl methoxy acetate, vinyl benzoate, and the like.

Examples of the maleic acid diesters include dimethyl maleate, diethyl maleate, dibutyl maleate, and the like.

Examples of the fumaric acid diesters include dimethyl fumarate, diethyl fumarate, dibutyl fumarate, and the like.

Examples of the itaconic acid diesters include dimethyl itaconate, diethyl itaconate, dibutyl itaconate, and the like.

Examples of the (meth)acrylamide include (meth)acrylamide, N-methyl (meth)acrylamide, N-ethyl(meth)acrylamide, N-propyl(meth)acrylamide, N-isopropyl (meth)acrylamide, N-n-butyl(meth)acrylamide, N-t-butyl(meth) acrylamide, N-cyclohexyl (meth)acrylamide, N-(2-methoxyethyl) (meth)acrylamide, N,N-dimethyl(meth) acrylamide, N,N-diethyl(meth)acrylamide, N-phenyl(meth) acrylamide, N-benzyl(meth)acrylamide, (meth)acryloyl morpholine, diacetone acrylamide, and the like.

Examples of the vinyl ethers include methyl vinyl ether, butyl vinyl ether, hexyl vinyl ether and methoxyethyl vinyl ether.

Examples of the styrenes include styrene, methylstyrene, dimethylstyrene, trimethyl styrene, ethyl styrene, isopropyl styrene, butyl styrene, hydroxystyrene, methoxystyrene, butoxystyrene, acetoxystyrene, chlorostyrene, dichlorostyrene, bromostyrene, chloromethylstyrene, hydroxystyrene protected by a group deprotectable with an acidic substance (such as t-Boc and the like), methyl vinyl benzoate, α-methylstyrene, and the like.

Specific examples of the other monomer having an ethylenically unsaturated bond that can be used in the present invention are shown below, but the present invention is not limited thereto.

(b-1)

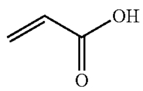

(b-2)

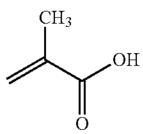

(b-3)

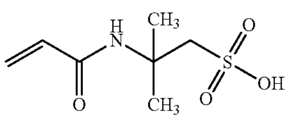

(b-4)

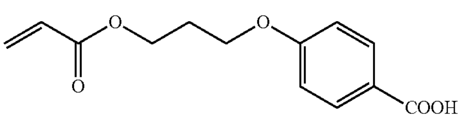

(b-5)

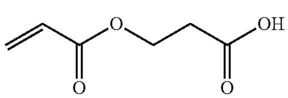

(b-6)

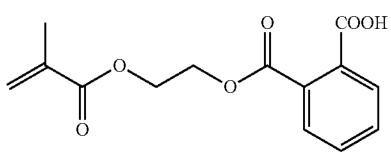

(b-7)

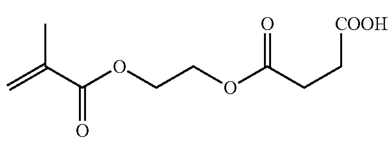

(b-8)

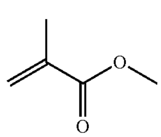

(b-9)

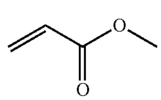

-continued (b-10)

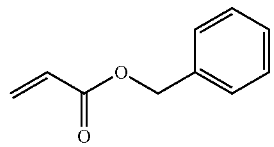

(b-11)

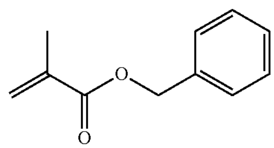

(b-12)

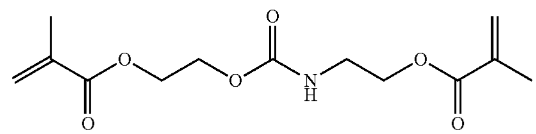

(b-13)

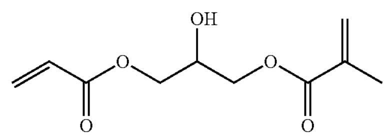

(b-14)

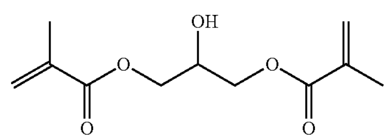

(Specific Examples of Colorant Multimer)

Specific examples and synthesis methods of the colorant multimer in the present invention are shown below, but the present invention is not limited thereto. Further, in Tables, the number of the monomer corresponds to that of the specific examples of the above-described colorant monomers, and the number of the monomer b corresponds to that of the specific examples of the above-described monomer having an ethylenically unsaturated bond.

TABLE 3

| Exemplary | Monomer a | | Monomer b | | Molecular weight | |
|---|---|---|---|---|---|---|
| Compound | Type | Mass | Type | Mass | (Mw) | Mw/Mn |
| P46 | M-53 | 100 | — | 0 | 9000 | 1.8 |
| P47 | M-53 | 100 | — | 0 | 11000 | 2.2 |
| P48 | M-53 | 100 | — | 0 | 7000 | 2.2 |
| P49 | M-53 | 100 | — | 0 | 8000 | 2.1 |
| P50 | M-53 | 94 | b-2 | 6 | 10000 | 1.9 |
| P51 | M-53 | 94 | b-2 | 6 | 7000 | 1.7 |
| P52 | M-53 | 94 | b-2 | 6 | 8000 | 1.8 |
| P53 | M-53 | 94 | b-2 | 6 | 12000 | 2.8 |
| P54 | M-53 | 88.6 | b-2 | 11.4 | 8000 | 2.4 |
| P55 | M-53 | 88.6 | b-2 | 11.4 | 15000 | 2.7 |
| P56 | M-53 | 88.6 | b-2 | 11.4 | 11000 | 1.6 |
| P57 | M-53 | 88.6 | b-2 | 11.4 | 9000 | 1.7 |
| P58 | M-53 | 83.8 | b-2 | 16.2 | 12000 | 2 |
| P59 | M-53 | 83.8 | b-2 | 16.2 | 7000 | 1.9 |
| P60 | M-53 | 83.8 | b-2 | 16.2 | 8000 | 2.4 |

TABLE 4

| Exemplary Compound | Monomer a Type | Monomer a % by mass | Monomer b Type | Monomer b % by mass | Molecular weight (Mw) | Mw/Mn |
|---|---|---|---|---|---|---|
| P61 | M-53 | 83.8 | b-2 | 16.2 | 10000 | 2.4 |
| P62 | M-53 | 79.5 | b-2 | 20.5 | 7000 | 2.1 |
| P63 | M-53 | 79.5 | b-2 | 20.5 | 8000 | 2.5 |
| P64 | M-53 | 79.5 | b-2 | 20.5 | 9000 | 1.5 |
| P65 | M-53 | 79.5 | b-2 | 20.5 | 7000 | 1.9 |
| P66 | M-53 | 75.7 | b-2 | 24.3 | 7000 | 1.7 |
| P67 | M-53 | 75.7 | b-2 | 24.3 | 20000 | 2 |
| P68 | M-53 | 75.7 | b-2 | 24.3 | 18000 | 2.4 |
| P69 | M-53 | 75.7 | b-2 | 24.3 | 9000 | 2.5 |
| P70 | M-53 | 94 | b-1 | 6 | 7000 | 2.3 |
| P71 | M-53 | 88.6 | b-1 | 11.4 | 17000 | 1.9 |
| P72 | M-53 | 83.8 | b-1 | 16.2 | 9000 | 2.7 |
| P73 | M-53 | 79.5 | b-1 | 20.5 | 8000 | 1.9 |
| P74 | M-53 | 75.7 | b-1 | 24.3 | 10000 | 1.5 |
| P75 | M-53 | 88.6 | b-3 | 11.4 | 8000 | 1.3 |
| P76 | M-53 | 83.8 | b-4 | 16.2 | 7000 | 1.2 |
| P77 | M-53 | 94 | b-5 | 6 | 12000 | 1.9 |
| P78 | M-53 | 75.7 | b-6 | 24.3 | 9000 | 2.7 |
| P79 | M-53 | 88.6 | b-7 | 11.4 | 9000 | 1.7 |
| P80 | M-53 | 75.7 | b-8 | 24.3 | 7000 | 1.9 |
| P81 | M-53 | 83.8 | b-9 | 16.2 | 10000 | 1.5 |
| P82 | M-53 | 94 | b-10 | 6 | 8000 | 1.7 |
| P83 | M-53 | 79.5 | b-11 | 20.5 | 13000 | 1.8 |
| P84 | M-53 | 83.8 | b-12 | 16.2 | 11000 | 1.9 |
| P85 | M-53 | 75.7 | b-13 | 24.3 | 9000 | 1.8 |
| P86 | M-53 | 79.5 | b-14 | 20.5 | 8000 | 2.1 |
| P87 | M-53 | 94 | b-15 | 6 | 7000 | 2.3 |
| P88 | M-53 | 79.5 | b-16 | 20.5 | 11000 | 1.8 |
| P89 | M-53 | 75.7 | b-17 | 24.3 | 8000 | 2 |
| P90 | M-53 | 88.6 | b-18 | 11.4 | 9000 | 1.9 |

Furthermore, specific examples of the colorant multimer include Compound P91 formed by adding glycidyl methacrylate to Exemplary Compound P51. For the Exemplary Compound P91, mention is made to the section of synthesis of the Exemplary Compound P91.

<Synthesis of Exemplary Compound P51>

To 5.21 g of propylene glycol monomethyl ether acetate (which is hereinafter referred to as PGMEA) was added dropwise a solution in which Exemplary Compound M-53 (7.0 g), methacrylic acid (0.45 g), dodecane thiol (0.17 g), and dimethyl 2,2'-azobis(2-methylpropionate) (0.096 g) were dissolved in 12.2 g of PGMEA over 4 hours while stirring at 80° C. At 2 hours after completion of dropwise addition, a solution in which dimethyl 2,2'-azobis(2-methylpropionate) (0.029 g) and dodecane thiol (0.051 g) were dissolved in 0.35 g of PGMEA was added, and the solution was stirred at 80° C. over 2 hours. To the reaction solution were added 175 ml of PGMEA and 200 ml of methanol. Further, the reaction solution was added to 800 ml of acetonitrile dropwise while stirring. The precipitated crystals were filtered, and the obtained crystals were dried under reduced pressure to obtain 3.99 g of Exemplary Compound P51. The weight average molecular weight (Mw) and the acid value of the obtained Exemplary Compound P51 were 7000 and 185 mgKOH/g, respectively.

<Synthesis of Exemplary Compound P54>

Exemplary Compound M-53 (1.67 g), methacrylic acid (0.21 g), and dodecane thiol (0.076 g) were dissolved in 10.7 g of PGMEA, and a solution in which Exemplary Compound M-53 (3.33 g), methacrylic acid (0.43 g), dodecane thiol (0.15 g), and dimethyl 2,2'-azobis(2-methylpropionate) (0.52 g) were dissolved in 21.3 g of PGMEA was added dropwise over 3 hours while stirring at 85° C. At 4 hours after the initiation of addition dropwise, dimethyl 2,2'-azobis(2-methylpropionate) (0.047 g) was added thereto, and the mixture was stirred at 85° C. for 2 hours. To the reaction solution were added 115 ml of PGMEA and 153 ml of methanol. Further, the reaction liquid was added to 614 ml of acetonitrile dropwise while stirring. The precipitated crystals were filtered and the obtained crystals were dried under reduced pressure to obtain 1.75 g of Exemplary Compound P54. The weight average molecular weight (Mw) and the acid value of the obtained Exemplary Compound P54 were 8000 and 112 mgKOH/g, respectively.

<Synthesis of Exemplary Compound P91>

A solution in which Exemplary Compound P51 (5.0 g), glycidyl methacrylate (0.47 g), and p-methoxyphenol (5.5 mg) were dissolved in 31.0 g of PGMEA was heated and stirred at 100° C. for 5 hours. Next, the obtained reaction liquid was added dropwise to 350 ml of acetonitrile while stirring. The precipitated crystals were filtered and the obtained crystals were dried under reduced pressure to obtain 3.59 g of Exemplary Compound P91. The weight average molecular weight (Mw) and the acid value of the obtained Exemplary. Compound P91 were 8000 and 110 mgKOH/g, respectively.

The structure of the Exemplary Compound P91 was confirmed by $^1$H-NMR, and by the loss of the epoxy moiety of glycidyl methacrylate and the reduction in the glycidyl methacrylate portion obtained from the measurement of acid values.

P-91

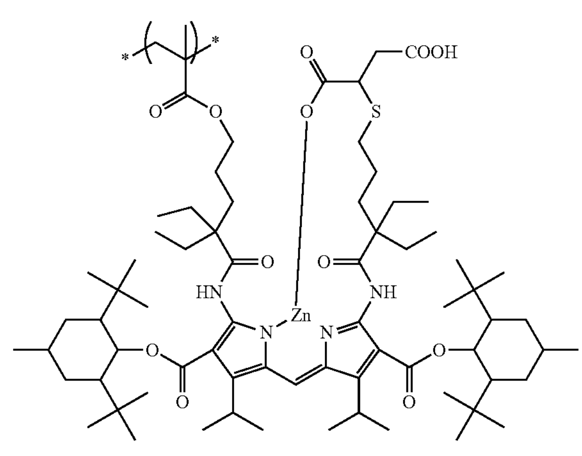

-continued
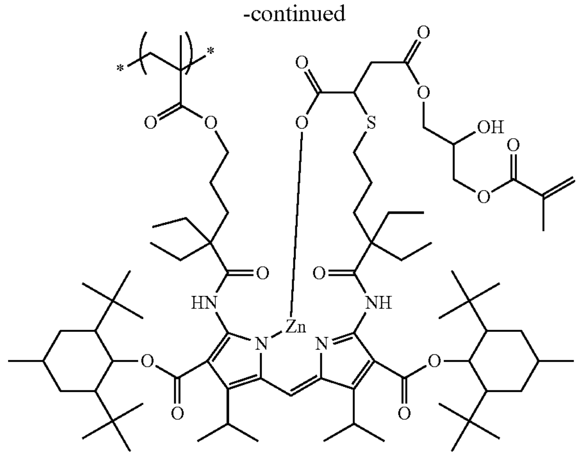
-continued
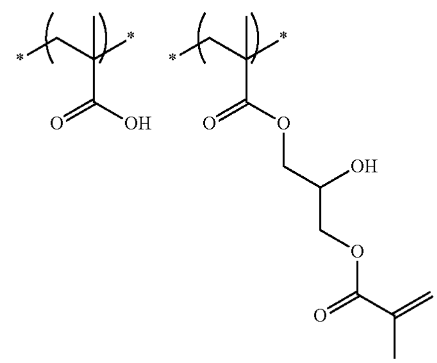
<Synthesis of Q-3 from Exemplary Compound Q-1>
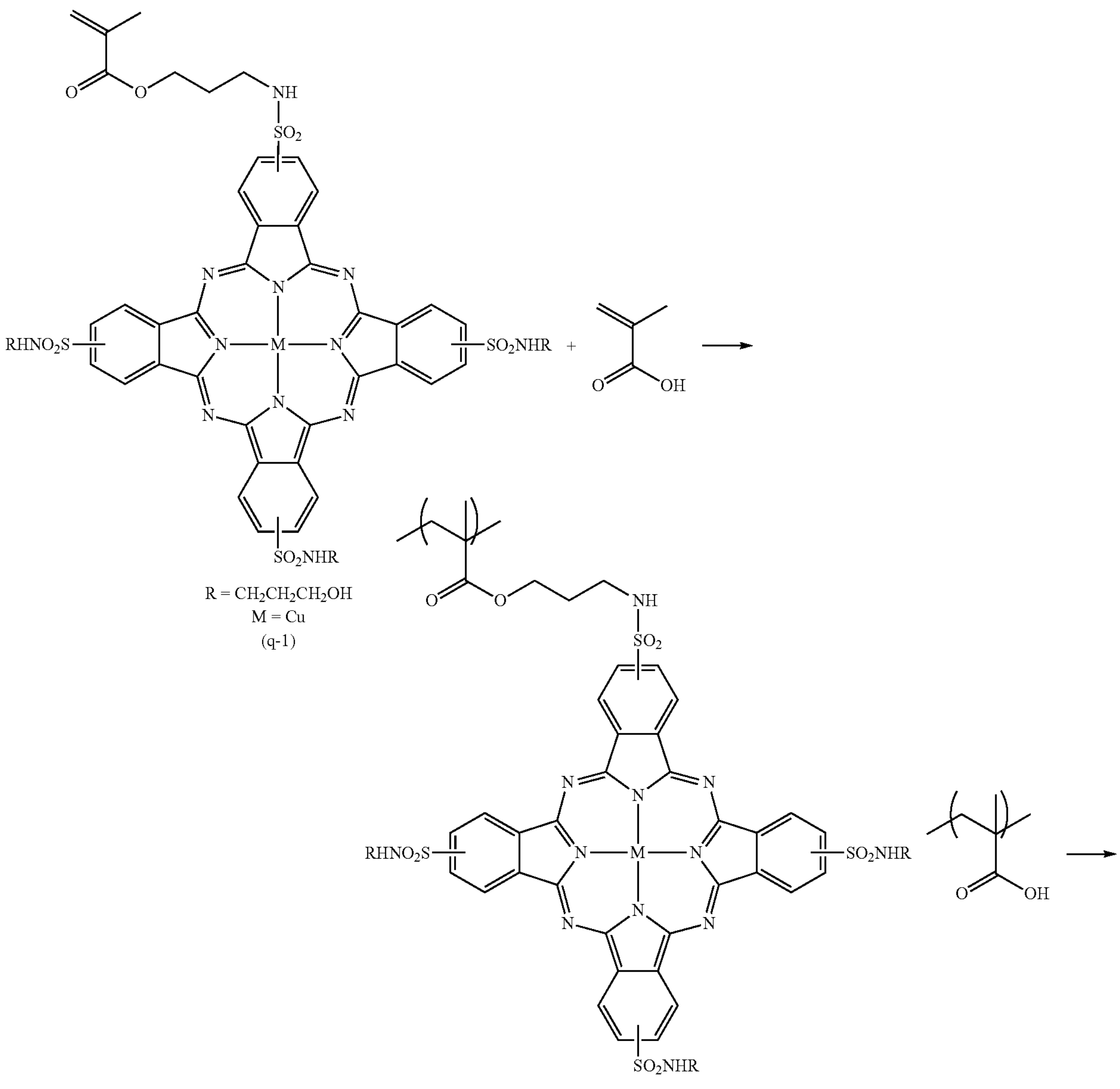
R = $CH_2CH_2CH_2OH$
M = Cu
(q-1)
R = $CH_2CH_2CH_2OH$
M = Cu
(Q'-1)

-continued

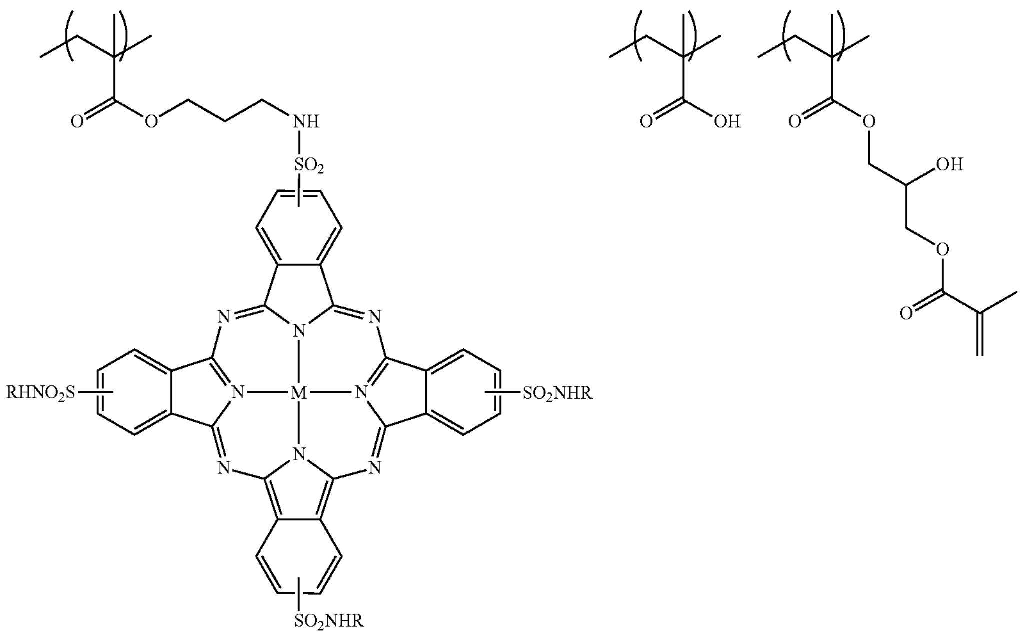

R = $CH_2CH_2CH_2OH$
M = Cu
(Q-1)

Into a 100-mL three-necked flask, a monomer. (q-1) (15.5 g), methacrylic acid (2.61 g), dodecyl mercaptan (0.51 g), and propylene glycol 1-monomethyl ether 2-acetate (which will be hereinafter also referred to as “PGMEA”) (46.6 g) were added, and the mixture was heated at 80° C. under a nitrogen atmosphere. To this solution was added dropwise a mixed solution of a monomer (q-1) (15.5 g), methacrylic acid (2.61 g), dodecyl mercaptan (0.51 g), dimethyl 2,2'-azobis(isobutyrate) [trade name: V601, manufactured by Wako Pure Chemical Industries, Ltd.] (0.58 g), and PGMEA (46.6 g) over 2 hours. Thereafter, after stirring for 3 hours, the mixture was warmed to 90° C., heated under stirring for 2 hours, and left to be cooled to obtain a solution of (Q'-1) in PGMEA. Next, glycidyl methacrylate (1.85 g), tetrabutylammonium bromide (80 mg), and p-methoxyphenol (20 mg) were added thereto, and the mixture was heated at 100° C. for 15 hours under an air atmosphere to confirm the loss of glycidyl methacrylate. After cooling, the mixture was added dropwise to a mixed solvent of methanol/ion-exchanged water=100 mL/10 mL and reprecipitated to form 37.8 g of a colorant multimer (Q-1).

The weight average molecular weight (Mw) of the colorant multimer (Q-1) as measured by GPC was 6,000, and the ratio of the weight average molecular weight/number average molecular weight (Mw/Mn) was 1.9.

Furthermore, the acid value by means of titration using a 0.1 N aqueous sodium hydroxide solution was 0.90 mmol/g and the amount of the polymerizable group as measured by NMR was confirmed to be 0.60 mmol for 1 g of the colorant multimer (Q-1).

The resin (Q-2) and the resin (Q-3) were synthesized in the same manner except that the resins were changed to a resin (Q-2) (resin (Q-1) with M=Zn) and the resin (Q-3) (the resin (Q-1) with M=Mg) and the amount of the monomers charged was changed to one described in Table 5.

<Synthesis of Exemplary Compounds Q-4 and Q-5>

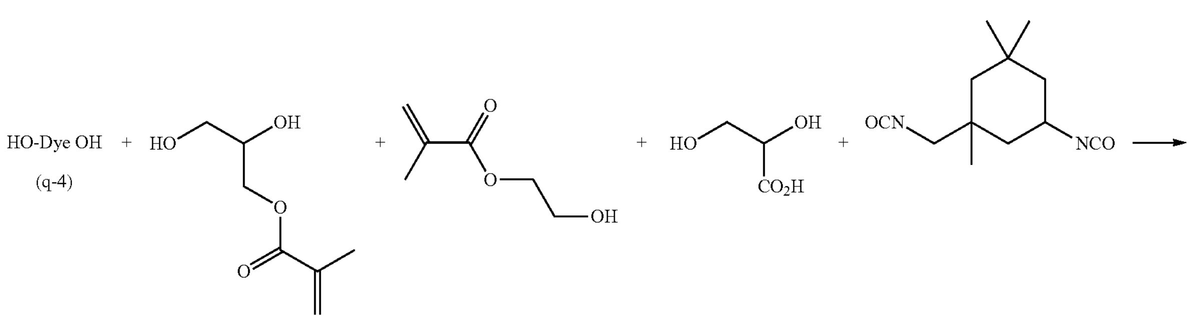

-continued

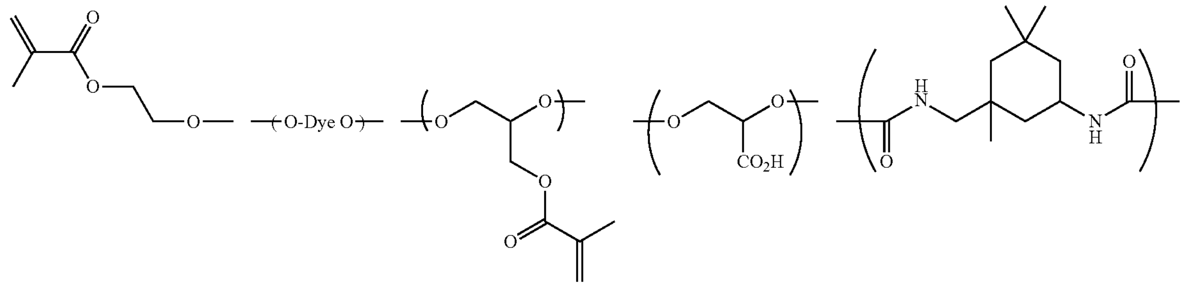

(Q-4)

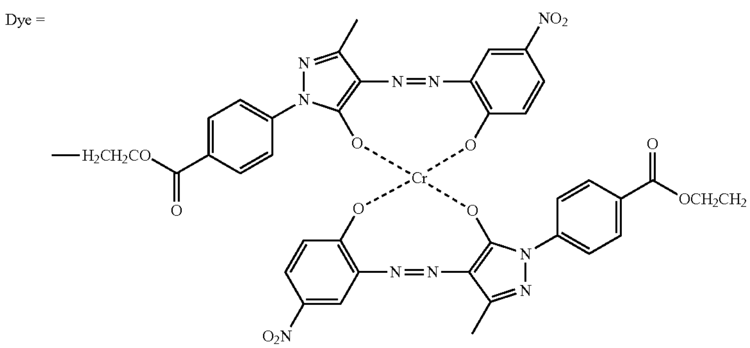

2-Hydroxyethyl methacrylate (1.29 g), a monomer (q-4) (9.40 g), 2,3-dihydroxyethyl methacrylate (0.53 g), 1,2-dihydroxypropionic acid (1.41 g), and isophoronic acid diisocyanate (7.37 g) were added to PGMEA (46.7 g), and the mixture was heated at 80° C. under a nitrogen atmosphere. Next, NEOSTANN U-600 (manufactured by Nitto Kasei Co., Ltd.) (20 mg) was added thereto, and the mixture was heated for 10 hours and cooled to obtain a 30%-by-mass solution of the colorant multimer (Q-4) in PGMEA.

The weight average molecular weight (Mw) of the colorant multimer (Q-4) as measured by GPC was 7,500, and the ratio of the weight average molecular weight/number average molecular weight (Mw/Mn) was 2.9.

Furthermore, the acid value by means of titration using a 0.1 N aqueous sodium hydroxide solution was 0.58 mmol/g and the amount of the polymerizable group as measured by NMR was confirmed to be 0.35 mmol for 1 g of the colorant multimer (Q-4). In the same manner as for the Exemplary Compound Q-4, an Exemplary Compound Q-5 was obtained.

TABLE 5

| Resin | M | a (mol %) | b (mol %) | c (mol %) | Acid value (m/ mol %) | Mw | Metal ion amount (%) |
|---|---|---|---|---|---|---|---|
| Q-1 | Cu | 30 | 40 | 30 | 0.90 | 6000 | 0.08 |
| Q-2 | Zn | 30 | 40 | 30 | 0.91 | 6200 | 0.07 |
| Q-3 | Mg | 30 | 40 | 30 | 0.93 | 6100 | 0.08 |

TABLE 5-continued

| Resin | M | a (mol %) | b (mol %) | c (mol %) | Acid value (m/ mol %) | Mw | Metal ion amount (%) |
|---|---|---|---|---|---|---|---|
| Q-4 | — | — | — | — | 0.58 | 7500 | 0.08 |
| Q-5 | — | — | — | — | 0.62 | 7400 | 0.06 |

a:

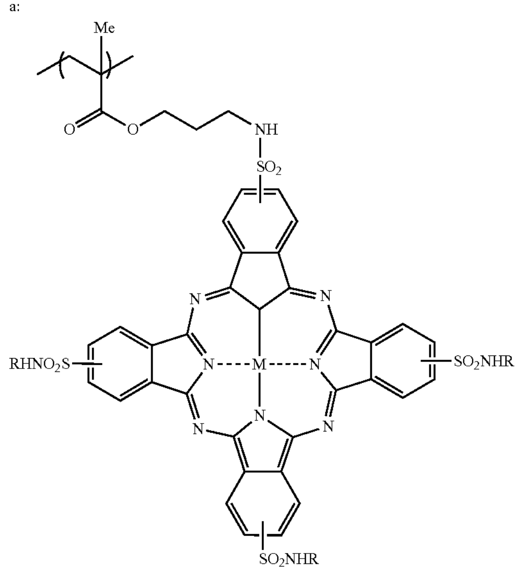

R = $CH_2CH_2CH_2OH$

TABLE 5-continued

| Resin | M | a (mol %) | b (mol %) | c (mol %) | Acid value (m/ mol %) | Mw | Metal ion amount (%) |
|---|---|---|---|---|---|---|---|

b:

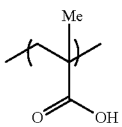

c:

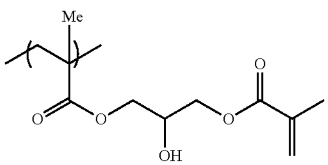

With regard to the molecular weight of the colorant multimer in the present invention, it is preferable that the weight average molecular weight (Mw) be in the range of 3000 to 30000 and the number average molecular weight (Mn) be in the range of 2000 to 20000, and it is more preferable that the weight average molecular weight (Mw) be in the range of 4000 to 25000 and the number average molecular weight (Mn) be in the range of 2500 to 17000. It is particularly preferable that the weight average molecular weight (Mw) be in the range of 5000 to 20000 and the number average molecular weight (Mn) be in the range of 3000 to 15000.

For the colorant multimer used for the colored radiation-sensitive composition of the present invention, the weight average molecular weight (Mw) is preferably 20000 or less from the viewpoint of developability during the production of the color filter.

<Halogen Ion>

Examples of the halogen ion in the present invention include a fluoride ion, a chloride ion, a bromide ion, and an iodide ion, and preferably a chloride ion and a bromide ion, and more preferably a bromide ion.

The content of halogen ions in the dye is 10 ppm to 1000 ppm, and preferably 10 ppm to 800 ppm.

While the smaller the content of halogen ions the more preferable, the dye having the content of halogen ions of less than 10 ppm in the dye is sometimes difficult to synthesize. In addition, if the content of halogen ions is more than 1000 ppm, the contamination of the device is caused at the time of the manufacturing of a color filter, thereby being undesirable.

The content of halogen ions can be measured by a known method, for example, by ion chromatography, and the like.

In addition, in the present invention, the halogen ions in the radiation-sensitive colored composition are basically those derived from the halogen ions in the dye, and the content of halogen ions contained in the dye can also be measured by analysis using ion chromatography, and the like.

Examples of a method of setting the halogen ion content of the dye to 10 ppm to 1000 ppm include the removal of the halogen ions by reprecipitation.

Specific examples thereof include a method of dissolving the dye completely or partially in a good solvent and adding the solution dropwise to a poor solvent, and a method of dissolving the dye by heating and then cooling the solution to precipitate crystals, and the like.

The preferred examples thereof includes a method of dissolving the dye in a good solvent, and then adding the solution dropwise to a poor solvent.

Depending on the type of dye, it is preferable that the aforementioned operations be repeated one or two or more times and the reprecipitation be carried out until the desired halogen ion content is reached.

The method of dissolving the dye completely or partially in a good solvent and adding the solution dropwise to a poor solvent includes a method of producing (A) a dye containing of from 10 ppm to 1000 ppm of a halogen ion, including a dissolution process of dissolving the dye in a good solvent, and a reprecipitation process of adding a solution of the dye dropwise to a poor solvent to reprecipitate the dye, can be mentioned.

In the present specification, the term "good solvent" means a solvent showing a solubility of the dye of 90% by mass or more in a solvent at 25° C., and the term "poor solvent" means a solvent showing a solubility of the dye of 50% by mass or less in a solvent at 25° C.

While a good solvent varies depending on the type of dyes, examples thereof include, as esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, alkyl oxyacetate (e.g.: methyl oxyacetate, ethyl oxyacetate, butyl oxyacetate (more specifically, methyl methoxyacetae, ethyl methoxyacetate, butyl methoxyacetate, methyl ethoxyacetate, ethyl ethoxyacetate, and the like)), 3-oxyalkyl propionate esters (e.g.: 3-oxymethyl propionate, 3-oxyethyl propionate, and the like (more specifically, 3-methoxymethyl propionate, 3-methoxy ethyl propionate, 3-ethoxymethyl propionate, 3-ethoxyethyl propionate, and the like)), 2-oxyalkyl propionate esters (e.g.: 2-oxymethyl propionate, 2-oxyethyl propionate, 2-oxypropyl propionate, and the like (more specifically, 2-methoxymethyl propionate, 2-methoxyethyl propionate, 2-methoxypropyl propionate, 2-ethoxymethyl propionate, 2-ethoxyethyl propionate, and the like)), methyl 2-oxy-2-methylpropionate and ethyl 2-oxy-2-methylethyl propionate (more specifically, methyl 2-methoxy-2-methylpropionate, ethyl 2-ethoxy-2-methylpropionate, and the like), methyl pyruvate, ethyl pyruvate, propyl pyruvate, methyl acetoacetate, ethyl acetoacetate, 2-oxomethyl butanoate, and 2-oxoethyl butanoate; as ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, diethylene glycol monobutyl ether acetate, and the like; as ketones, for example, methyl ethyl ketone, cyclohexanone, 2-heptanone, 3-heptanone, and the like; as alcohols, for example, methanol, ethanol, propanol, isopropyl alcohol, n-butanol, isobutanol, t-butanol, and the like; as aromatic hydrocarbons, for example, toluene, xylene, and the like. In a case of using the dipyrromethene compound as a dye, ethyl acetate, butyl acetate, tetrahydrofuran, propylene glycol monomethyl ether acetate, propylene glycol monomethyl ether acetate, methyl ethyl ketone, cyclohexanone, methanol, ethanol, isopropyl alcohol, toluene, xylene, acetonitrile and the like can be mentioned.

While a poor solvent varies depending on the type of dyes, examples thereof include acetonitrile and water. In a case of using the dipyrromethene compound as a dye, acetonitrile and water are preferable.

In addition, the method of dissolving the dye by heating and then cooling the solution to precipitate crystals, in detail, includes a method of producing (A) a dye containing of from 10 ppm to 1000 ppm of a halogen ion, which includes a dissolution process of dissolving the dye in a heated solvent, and a reprecipitation process of cooling a solution of the dye to reprecipitate the dye.

In the dissolution process described above, while a solvent varies depending on the type of dyes, examples thereof include, as esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, alkyl oxyacetate (e.g.: methyl oxyacetate, ethyl oxyacetate, butyl oxyacetate (more specifically, methyl methoxyacetae, ethyl methoxyacetate, butyl methoxyacetate, methyl ethoxyacetate, ethyl ethoxyacetate, and the like)), 3-oxyalkyl propionate esters (e.g.: 3-oxymethyl propionate, 3-oxyethyl propionate, and the like (more specifically, 3-methoxymethyl propionate, 3-methoxyethyl propionate, 3-ethoxymethyl propionate, 3-ethoxyethyl propionate, and the like)), 2-oxyalkyl propionate esters (e.g.: 2-oxymethyl propionate, 2-oxyethyl propionate, 2-oxypropyl propionate, and the like (more specifically, 2-methoxymethyl propionate, 2-methoxyethyl propionate, 2-methoxypropyl propionate, 2-ethoxymethyl propionate, 2-ethoxyethyl propionate, and the like)), methyl 2-oxy-2-methylpropionate and ethyl 2-oxy-2-methylethyl propionate, (more specifically, methyl 2-methoxy-2-methylpropionate, ethyl 2-ethoxy-2-methylpropionate, and the like), methyl pyruvate, ethyl pyruvate, propyl pyruvate, methyl acetoacetate, ethyl acetoacetate, 2-oxomethyl butanoate, and 2-oxoethyl butanoate; as ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, diethylene glycol monobutyl ether acetate, and the like; as ketones, for example, methyl ethyl ketone, cyclohexanone, 2-heptanone, 3-heptanone, and the like; as alcohols, for example, methanol, ethanol, propanol, isopropyl alcohol, n-butanol, isobutanol, t-butanol, and the like; as aromatic hydrocarbons, for example, toluene, xylene, and the like. In a case of using the dipyrromethene compound as a dye, ethyl acetate, butyl acetate, tetrahydrofuran, propylene glycol monomethyl ether acetate, propylene glycol monomethyl ether acetate, methyl ethyl ketone, cyclohexanone, methanol, ethanol, isopropyl alcohol, toluene, xylene, acetonitrile, and the like are preferable.

In the dissolution process described above, the term heating indicates that the temperature of the solvent is preferably 40° C. or higher, more preferably 60° C. or above. Furthermore, the upper limit of the temperature of the solvent is preferably 120° C. or below, and more preferably below the boiling point of the solvent. There is a concern that at a temperature below 60° C., the solubility of the dye is often insufficient and that at a temperature above 120° C. the degradation of the dye proceeds.

In the reprecipitation process described above, the term cooling indicates that the temperature of the solvent is preferably below 40° C., and more preferably 0° C. or above to below 40° C.

After the reprecipitation process, the precipitate is filtered off by a conventional method, washed with an ion-exchanged water, and dried by blast drying followed by vacuum drying, which enables a dye containing of from 10 ppm to 1000 ppm of a halogen ion to be obtained.

(Pigment)

While the radiation-sensitive colored composition of the present invention uses, as a coloring material, said specific dye, pigments other than the aforementioned dye may be combined therewith for the purpose of hue adjustment.

While the pigment is not particularly limited, various conventionally known inorganic pigments or organic pigments can be used.

Examples of the inorganic pigments can include metal oxides, and metal compounds represented by metal complexes, and specific examples thereof can include the oxides of metals such as iron, cobalt, aluminum, cadmium, lead, copper, titanium, magnesium, chromium, zinc or antimony, and the complex oxides of the aforementioned metals.

Examples of the organic pigments can include

C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 171, 175, 176, 177, 209, 220, 224, 242, 254, 255, 264, 270;

C.I. Pigment Violet 19, 23, 32, 39;

C.I. Pigment Blue 1, 2, 15, 15:1, 15:3, 15:6, 16, 22, 60, 66;

C.I. Pigment Green 7, 36, 37;

C.I. Pigment Brown 25, 28; and the like.

The radiation-sensitive colored composition may contain at least one pigment selected from C.I. Pigment Red Violet 23, and C.I. Pigment Blue 15:3, 15:6, and thereby the transmission spectrum as the blue radiation-sensitive colored composition can be easily optimized, and a chemical resistance thereof is improved, and thus is preferred.

As a red radiation-sensitive colored composition, C.I. Pigment Yellow 138, 139, 150, and C.I. Red Pigment 177, 209, 242, 254 are preferable; and C.I. Pigment Red 177, 242, 254 are more preferable. As a green radiation-sensitive colored compositions, C.I. Pigment Yellow 138, 139, 150, and C.I. Pigment Green 7, 36, 58 are preferable; and C.I. Pigment Yellow 150, and C.I. Pigment Green 36, 58 are more preferable.

These pigments may be used alone, or may be used in a combination of two or more thereof.

The content of the pigments is 20% by mass to 90% by mass, preferably 30% by mass to 80% by mass, and more preferably 40% by mass to 75% by mass, relative to a total amount of the composition.

The content ratio of the dipyrromethene compound to the pigments (mass ratio) is appropriately 10:90 to 90:10, preferably 20:80 to 80:20, more preferably 25:75 to 75:25.

When this ratio is used, the optimization of the transmission spectrum is facilitated, and high contrast and high brightness can be obtained. Further, heat resistance and chemical resistance are improved.

Particularly the mass ratio of C.I. Pigment Blue 15:3 to the dipyrromethene compound is preferably 10:80 to 60:40, and more preferably 15:85 to 50:50.

In addition, the mass ratio of C.I. Pigment Blue 15:6 to the dipyrromethene compound is preferably 5:95 to 25:75, more preferably 10:90 to 25:75, and still more preferably 15:85 to 20:80.

Further, as a red radiation-sensitive colored compositions, it is preferable that the mass ratio of at least one compound selected from a group consisting of C.I. Pigment Red 177, 242 and 254 to the dipyrromethene compound be 10:90 to 90:10.

As for organic pigments, as necessary, the treatment such as rosin treatment, surface treatment by using pigment derivatives, and the like to which acidic or basic groups have been introduced, graft treatment by polymer compounds, and the like to the pigment surface, atomization treatment by a sulfuric acid atomization method, cleaning treatment with organic solvents and water, and the like to remove impurities, or treatment of removal of ionic impurities by an ion exchange method, and the like, may be carried out.

(Dispersing Agent)

In the case where the radiation-sensitive colored composition of the present invention contains pigments, it can contain a pigment dispersing agent.

Examples of the pigment dispersing agent which may be used in the present invention can include a polymer dispersing agent (for example, polyamide amines and salts thereof, polycarboxylic acids and salts thereof, esters, modified polyurethane, modified polyesters, modified poly(meth)acrylates, (meth)acrylic copolymers, naphthalenesulfonic acid formalin condensate), polyoxyethylene alkyl phosphate, polyoxyethylene alkylamine, alkanolamine, and pigment derivatives, and the like.

The polymer dispersing agent can further be classed as a linear polymer, a terminal-modified type polymer, a graft-type polymer, and a block-type polymer by the structure thereof.

The polymer dispersing agent is adsorbed on the surface of the pigment, which acts so as to prevent re-agglomeration. Therefore, examples of the preferred structures can include terminal-modified type polymers, graft-type polymers and block-type polymers, having an anchoring site to the pigment surface.

On the other hand, pigment derivatives modify the pigment surface, and have the effect of promoting the adsorption of the polymer dispersing agent.

Examples of terminal-modified type polymers having an anchoring site to the pigment surface include a polymer having a terminal phosphoric acid group described in JP1991-112992A (JP-H3-112992A), JP2003-533455A, and the like, a polymer having a terminal sulfonic acid group described in JP2002-273191A, and the like, a polymer having partial skeletons of organic dyes and a heterocycle described in JP1997-77994A (JP-H9-77994A), and the like, and a polymer produced by the modification with an oligomer or a polymer having a hydroxyl group or an amino group at one terminal of the polymer and with an acid anhydride described in JP2008-29901A, and the like. In addition, a polymer where at least two anchoring sites (such as acid groups, basic groups, partial skeletons of organic dyes or a heterocycle) to a pigment surface are introduced to the terminal of the polymer, described in JP2007-277514A is excellent in dispersion stability, and thus is preferable.

Examples of the graft-type polymers having an anchoring site to the pigment surface include a reaction product of poly(lower alkylene imine) with polyester described in JP1972-37082A (JP-S54-37082A), JP1996-507960A (JP-H8-507960A), JP2009-258668A, and the like, a reaction product of polyally amine with polyester described in JP1997-169821A (JP-H9-169821A), and the like, an amphoteric dispersed resin having a basic group and an acid group described in JP2009-203462A, a copolymer of a macromonomer with a nitrogen monomer disclosed in JP2008-339949A (JP-H10-339949A), JP2004-37986A, and the like, the graft-type polymers having a partial skeleton of organic dyes or a heterocycle described in JP2003-238837A, JP2008-9426A, and JP2008-81732A, and the like, a copolymer of a macromonomer with an acid group-containing monomer described in JP 2010-106268A, and the like. In particular, an amphoteric dispersed resin having a basic group and an acid group described in JP2009-203462A is particularly preferable, from the viewpoint of the pigment dispersity, dispersion stability, and the developing property which the radiation-sensitive colored composition using the pigments shows.

As a macromonomer used in the production of the graft-type polymer having an anchoring site to the pigment surface by radical polymerization, known macromonomers can be used, and examples thereof include macromonomer AA-6 (polymethyl methacrylate having a methacryloyl terminal group), AS-6 (polystyrene having a methacryloyl terminal group), AN-6S (styrene-acrylonitrile copolymer having a methacryloyl terminal group), AB-6 (polybutyl acrylate having a methacryloyl terminal group), manufactured by Toagosei Co., Ltd.; PLACCEL FM5 (addition product of 2-hydroxyethyl methacrylate and 5 molar equivalents of ϵ-caprolactone), FA10L (addition product of 2-hydroxyethyl acrylate and 10 molar equivalents of ϵ-caprolactone), manufactured by Daicel Chemical Industries Ltd.); and polyester-based macromonomers described in JP1990-272009A (JP-H2-272009A), and the like. Among these, polyester-based macromonomers having excellent flexibility and solvent affinity are particularly preferable, from the viewpoint of pigment dispersity, dispersion stability, and the developing property which the radiation-sensitive colored composition using the pigments shows, and further, polyester-based macromonomers represented by a polyester-based macromonomer described in JP1990-272009A (JP-H2-272009A) are most preferable.

As the block-type polymers having an anchoring site to the pigment surface, the block-type polymers described in JP2003-49110A, and JP2009-52010A are preferable.

The pigment dispersing agent which can be used in the present invention is also available as a commercial product, and specific examples thereof include "Disperbyk-101 (a polyamidoamine phosphate), 107 (carboxylic acid ester), 110 (an acid group-containing copolymer), 130 (a polyamide), 161, 162, 163, 164, 165, 166, 170 (high molecular weight copolymers), BYK-P104, P105 (a high molecular weight unsaturated polycarboxylic acid)", manufactured by BYK Chemie; "EFKA4047, 4050 to 4010 to 4165 (polyurethanes), EFKA4330 to 4340 (block copolymers), 4400 to 4402 (modified polyacrylates), 5010 (a polyester amide), 5765 (a high molecular weight polycarboxylic acid salt), 6220 (a fatty acid polyester), 6745 (a phthalocyanine derivative), 6750 (an azo pigment derivative)", manufactured by EFKA; "AJISPER PB821, PB822, PB880, PB881", manufactured by Ajinomoto Fine-Techno Co., Inc.; FLOWLEN TG-710 (an urethane oligomer) POLYFLOW No. 50E, No. 300 (acrylic copolymers) manufactured by "Kyoeisha Chemical Co."; DISPARLON KS-860, 873SN, 874, #2150 (an aliphatic polyvalent carboxylic acid), #7004 (polyether ester), DA-703-50, DA-705, DA-725", manufactured by Kusumoto Chemicals; DEMOL RN, N (naphthalene sulfonic acid formalin polycondensation product), MS, C, SN-B (aromatic sulfonic acid formalin polycondensation product), Homogenol L-18 (a polycarboxylic acid type polymer), Emulgen 920, 930, 935, 985 (polyoxyethylene nonylphenyl ethers), ACETAMIN 86 (stearylamine acetate)", manufactured by Kao Corporation; "SOLSPERSE 5000 (a phthalocyanine derivative), 22000 (an azo pigment derivative), 13240 (a polyester amine), 3000, 17000, 27000 (polymers having a functional unit in the terminal unit), 24000, 28000, 32000, 38500 (graft-type polymers)", manufactured by Avecia; "NIKKOL T106 (polyoxyethylene sorbitan monooleate), MYS-IEX (polyoxyethylene monostearate)," manufactured by Nikko Chemicals; "HINOACT T-8000E" manufactured by Kawaken Fine Chemicals Co., Ltd., and the like.

These pigment dispersing agents may be used alone, or may be used in a combination of two or more thereof. In the present invention, in particular, it is preferable to use a combination of a polymer dispersing agent with a pigment derivative. In addition, the pigment dispersing agent of the present invention, along with the terminal-modified type polymers, the graft-type polymers and the block polymers, having an anchoring site to the pigment surface, may be used in combination with an alkali-soluble resin. While examples of the alkali-soluble resins include (meth)acrylic acid copolymers, itaconic acid copolymers, crotonic acid copolymers, maleic acid copolymers, partially-esterified maleic acid copolymers, and the like, acidic cellulose derivatives having a carboxylic acid on the side chain, resins where a polymer having a hydroxyl group is modified by an acid anhydride, in particular, (meth)acrylic acid copolymers are preferable. In addition, alkaline soluble resins which contain N-substituted maleimide monomer copolymer described in JP1998-300922A (JP-H10-300922A), ether dimer copolymer described in JP2004-300204A, and a polymerizable group described in JP1995-319161A (JP-H7-319161A), are also preferable.

From the viewpoint of dispersity, developing property, and sedimentation, preferably, the following resins described in JP2010-106268A are preferable. In particular, from the viewpoint of dispersity, a polymer dispersing agent having a polyester chain on the side chain is preferable, and also, from the viewpoint of the dispersity and the resolution of the pattern formed by photolithography, a resin having an acid group and a polyester chain is preferable. As a preferable acid group in the pigment dispersing agent, from the viewpoint of adsorption, an acid group having a pKa of preferably 6 or less is preferable, and carboxylic acids, sulfonic acids, and phosphoric acid are particularly preferable. From the viewpoint of the solubility to the dispersing solution, dispersity, and developing property, the polyester chain being a polycaprolactone side chain is most preferred, and the resin having carboxylic acid is preferable.

Hereinafter, the dispersing agents described in JP2010-106268A, which is preferably used in the present invention, will be described.

As the preferable dispersing agent, it is preferable that the dispersing agent have, in the molecule, a number of atoms excluding the hydrogen atoms in a range of from 40 to 10,000, and be a graft copolymer having a graft chain selected from a polyester structure, a polyether structure, and a polyacrylate structure, and contain a structural unit represented by any one of at least the following formula (1) to the formula (4), and it is more preferable that the dispersing agent have a structural unit represented by any one of at least the following formula (IA), the following formula (2A), the following formula (3A), the following formula (3B), and the following formula (4).

(1)

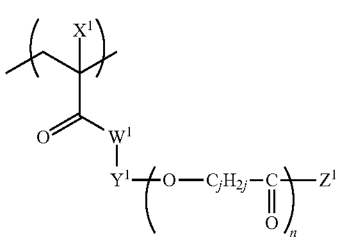

-continued (2)

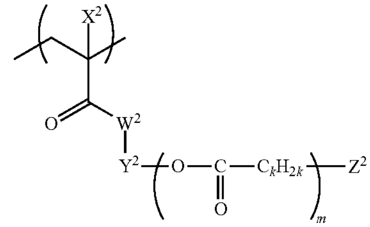

(3)

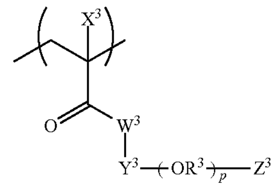

(4)

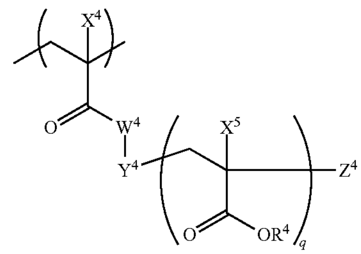

In the formulae (1) to (4), $W^1$, $W^2$, $W^3$ and $W^4$ each independently represent an oxygen atom or NH, and particularly an oxygen atom is preferable.

In the formulae (1) to (4), $X^1$, $X^2$, $X^3$, $X^4$ and $X^5$ each independently represent a hydrogen atom, or a monovalent organic group. As $X^1$, $X^2$, $X^3$, $X^4$ and $X^5$, from the viewpoint of constraints on the synthesis, a hydrogen atom, or an alkyl group having 1 to 12 carbon atoms is preferable, and a hydrogen atom, or a methyl group is more preferable, and a methyl group is particularly preferable.

In the formulae (1) to (4), $Y^1$, $Y^2$, $Y^3$ and $Y^4$ are each independently a divalent linking group, and the structure is not particularly constrained. Specific examples of the divalent linking groups represented by $Y^1$, $Y^2$, $Y^3$ and $Y^4$, include the linking groups of the following (Y-1) to (Y-21), and the like. A and B in the following structures each mean the linkage with the left terminal group and the right terminal group in the formulae (1) to (4): Among the structures shown below, in view of the simplicity of the synthesis, (Y-2) and (Y-13) are more preferable.

(Y-1)

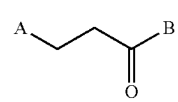

(Y-2)

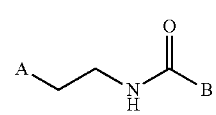

(Y-3)

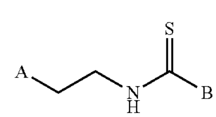

-continued (Y-4)

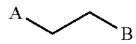

(Y-5)

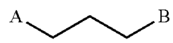

(Y-6)

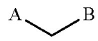

(Y-7)

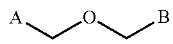

(Y-8)

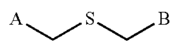

(Y-9)

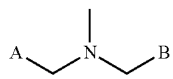

(Y-10)

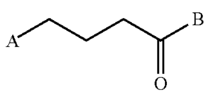

(Y-11)

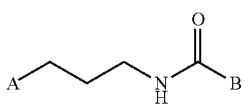

(Y-12)

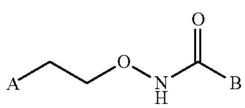

(Y-13)

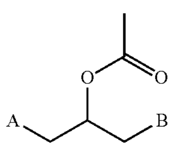

(Y-14)

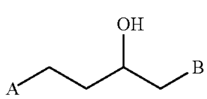

(Y-15)

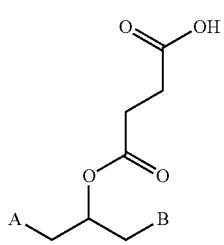

(Y-16)

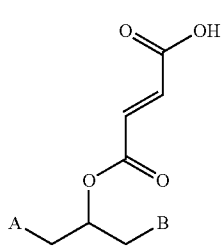

-continued (Y-17)

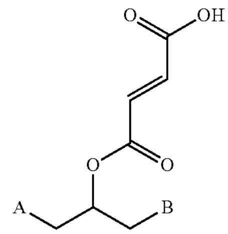

(Y-18)

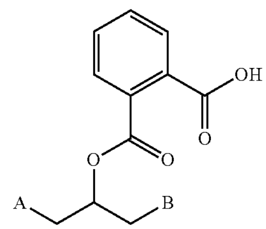

(Y-19)

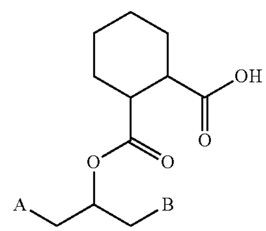

(Y-20)

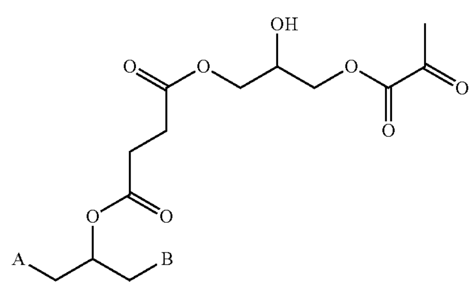

(Y-21)

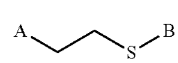

In formulae (1) to (4), $Z^1$, $Z^2$, $Z^3$ and $Z^4$ are each independently a monovalent organic group, and in particular, while the structure is not limited, specific examples thereof include an alkyl group, a hydroxyl group, an alkoxy group, an aryloxy group, a heteroaryloxy group, an alkylthio ether group, an arylthio ether group, a heteroarylthio ether group, an amino group, and the like. Among them, as a monovalent organic group represented by $Z^1$, $Z^2$, $Z^3$ and $Z^4$, from the viewpoint of improving dispersity particularly, it is preferable to have the effect of steric repulsion, and as an organic group represented by $Z^1$ to $Z^3$, each independently, an alkyl group having 5 to 24 carbon atoms or an alkoxy group having 5 to 24 carbon atoms is preferable, and among them, particularly, each independently, an alkoxy group having a branched alkyl group having 5 to 24 carbon atoms or an alkoxy group having a cyclic alkyl group having 5 to 24 carbon atoms is preferable. As the organic group represented by $Z^4$, each independently, an alkyl group having 5 to 24 carbon atoms is preferable, and among them, each independently, a branched alkyl group having 5 to 24 carbon atoms or a cyclic alkyl group having 5 to 24 carbons is preferable.

In the formulae (1) to (4), n, m, p and q are an integer of from 1 to 500, respectively.

In the formulae (1) and (2), j and k are each independently an integer of from 2 to 8. In the formulae (1) and (2), j and k are, from the viewpoint of dispersion stability and a developing property, preferably an integer of from 4 to 6, and most preferably 5.

$R^3$ in the formula (3) represents a branched or linear alkylene group. $R^3$ in the formula (3) is preferably an alkylene group having 1 to 10 carbon atoms, and more preferably an alkylene group having 2 or 3 carbon atoms.

$R^4$ in the formula (4) represents a hydrogen atom or an organic group, and the structure of the monovalent organic group is not particularly limited. As $R^4$ in the formula (4), preferably a hydrogen atom, an alkyl group, an aryl group, and a heteroaryl group can be mentioned, and a hydrogen atom or an alkyl group is more preferable. When $R^4$ in the formula (4) is an alkyl group, as the alkyl groups, a linear alkyl group having 1 to 20 carbon atoms, a branched alkyl group having 3 to 20 carbon atoms, or a cyclic alkyl group having 5 to 20 carbon atoms is preferable, and a linear alkyl group having 1 to 20 carbon atoms is more preferable, and a linear alkyl group of 1 to 6 carbon atoms is particularly preferable. In addition, $R^4$ in the formula (4) may be used in a combination of two or more $R^4$ having a different structure in the graft copolymer.

In the graft copolymer, the structural units represented by the formulae (1) to (4) are preferably contained in a range of from 10% to 90%, and more preferably contained in a range of 30% to 70%, relative to the total mass of the graft copolymer, in terms of mass. When the structural units represented by the formulae (1) to (4) are contained in this range, the dispersity of the pigment is high, and the developing property in a case of forming a light-shielding film is good.

In addition, the graft copolymer can contain two or more graft copolymers having different structures.

As a structural unit represented by the formula (1), from the viewpoint of dispersion stability and developing property, a structural unit represented by the following formula (1A) is more preferable.

In addition, as a structural unit represented by the formula (2), from the viewpoint of dispersion stability and developing property, a structural unit represented by the following formula (2A) is more preferable.

(1A)

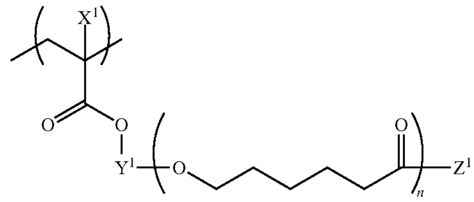

(2A)

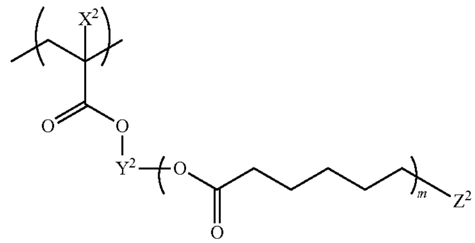

In the formula (1A), $X^1$, $Y^1$, $Z^1$ and n are have the same definitions as $X^1$, $Y^1$, $Z^1$ and n in the formula (1), and the preferred ranges thereof are also the same.

In the formula (2A), $X^2$, $Y^2$, $Z^2$ and m are have the same definitions as $X^2$, $Y^2$, $Z^2$ and m in the formula (2), and the preferred ranges thereof are also the same.

In addition, as a structural unit represented by the formula (3), from the viewpoint of dispersion stability and developing property, a structural unit represented by the following formula (3A) or the following formula (3B) is more preferable.

(3A)

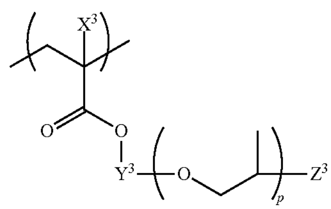

(3B)

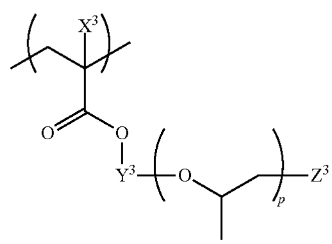

In the formula (3A) or (3B), $X^3$, $Y^3$, $Z^3$ and p are have the same definitions as $X^3$, $Y^3$, $Z^3$ and p in the formula (3), and the preferred ranges thereof are also the same.

The graft copolymer more preferably has the structural unit represented by the formula (1A).

Specific examples of the graft copolymer include the following compounds. In addition, in the following exemplary compounds, a number that is also shown in each structural unit represents a content of the relevant structural unit [% by mass: as appropriate, described as (wt %)].

(Exemplary Compound 1)
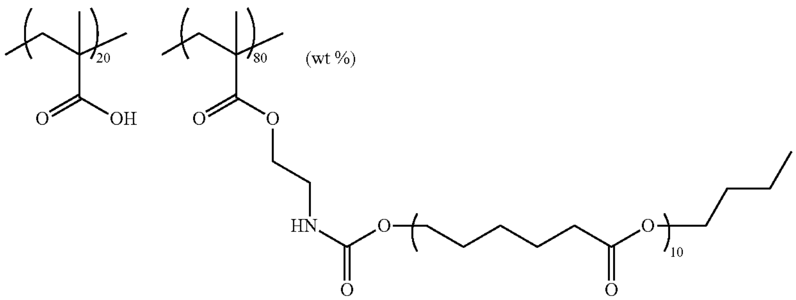
(Exemplary Compound 2)
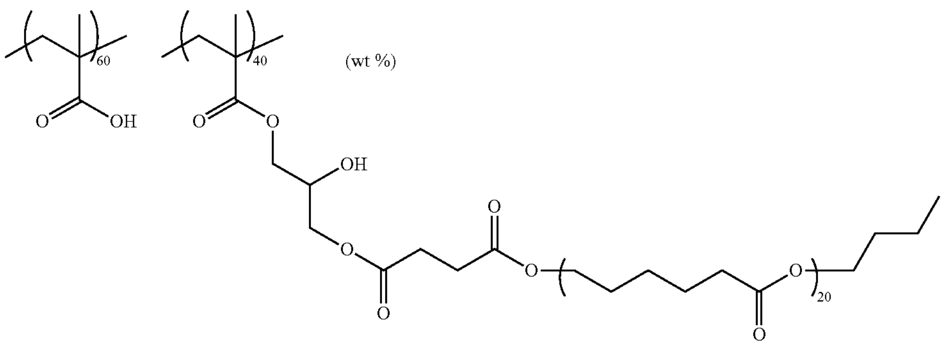
(Exemplary Compound 3)
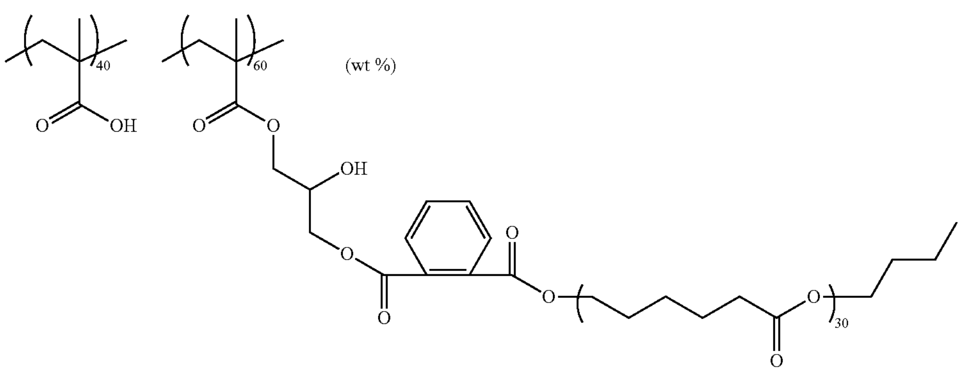
(Exemplary Compound 4)
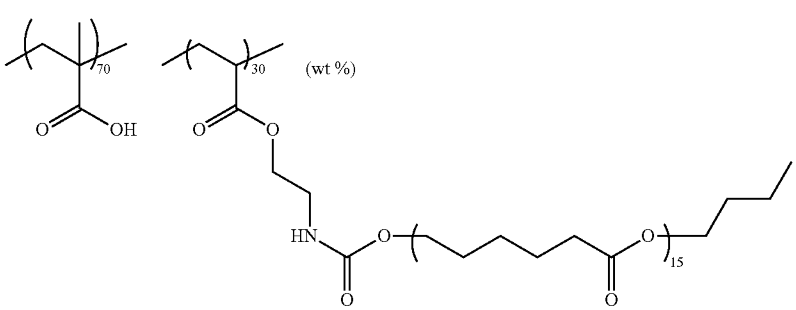

-continued
(Exemplary Compound 5)
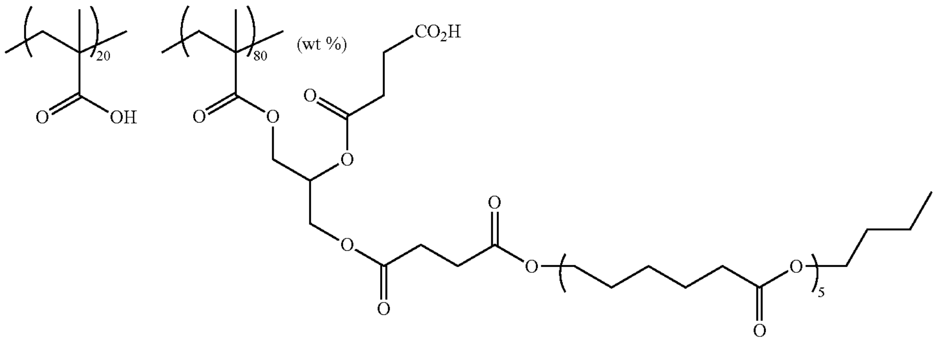
(Exemplary Compound 6)
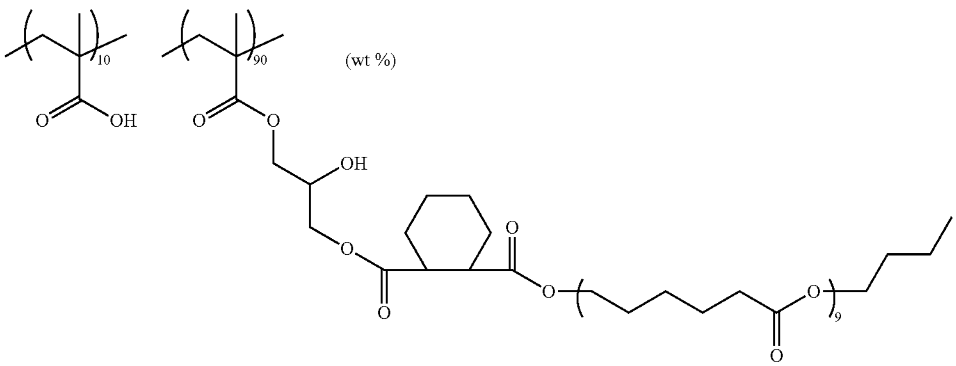
(Exemplary Compound 7)
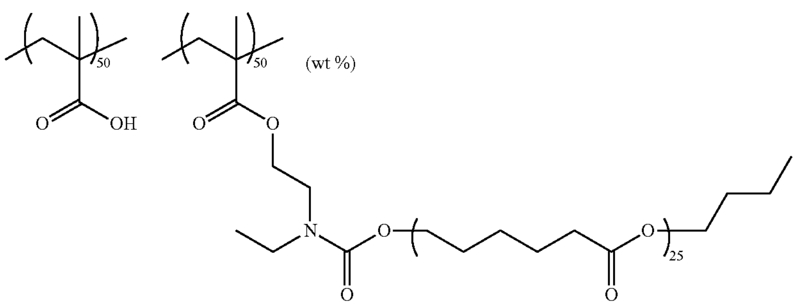
(Exemplary Compound 8)
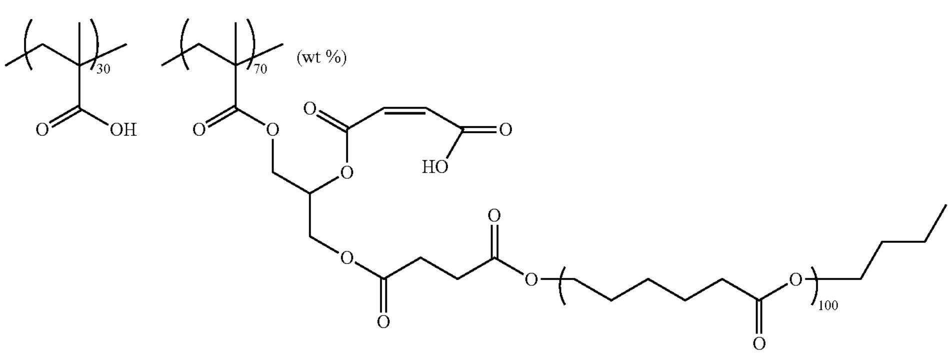

-continued
(Exemplary Compound 9)
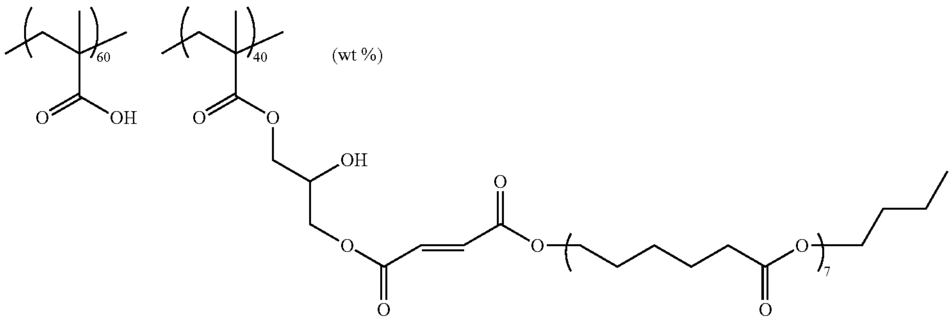
(Exemplary Compound 10)
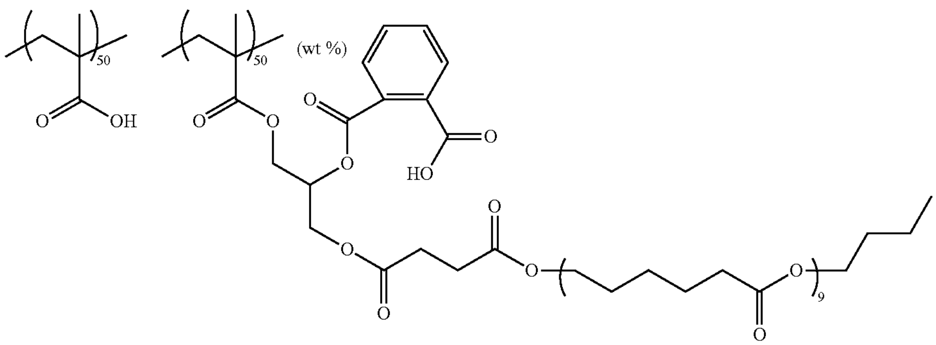
(Exemplary Compound 11)
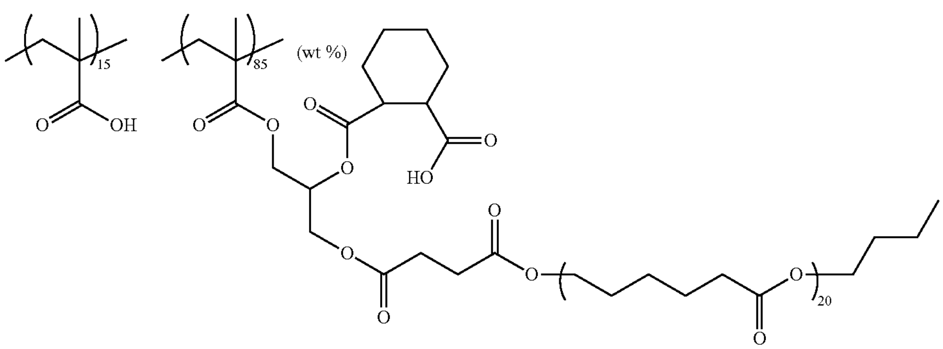
(Exemplary Compound 12)
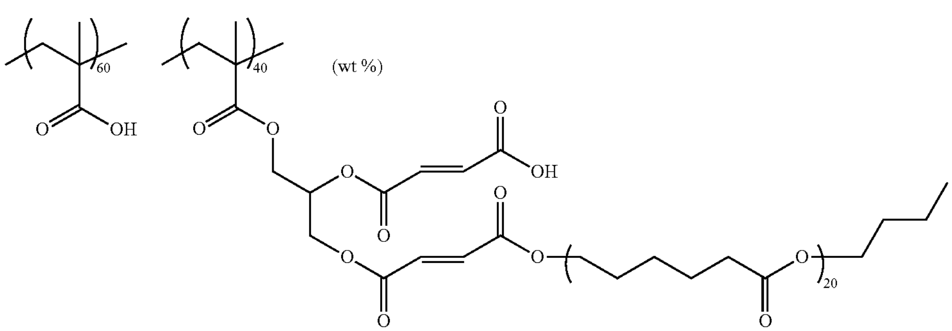

-continued
(Exemplary Compound 13)
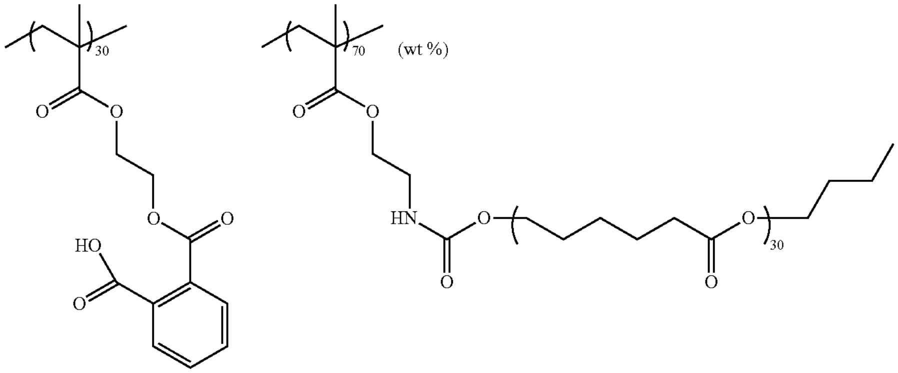
(Exemplary Compound 14)
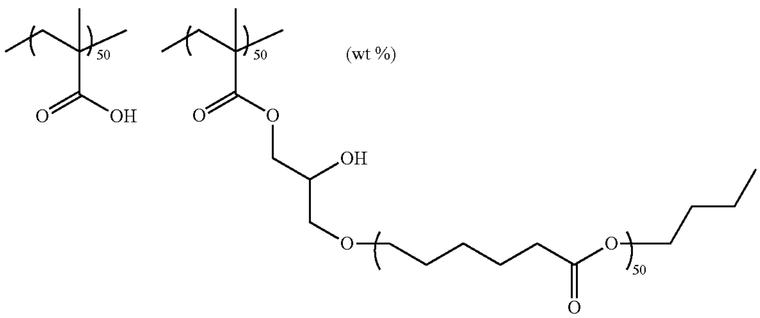
(Exemplary Compound 15)
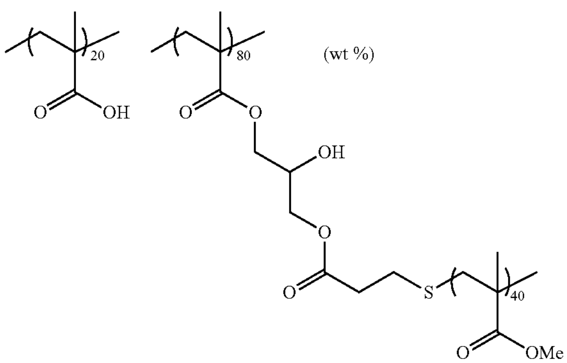
(Exemplary Compound 16)
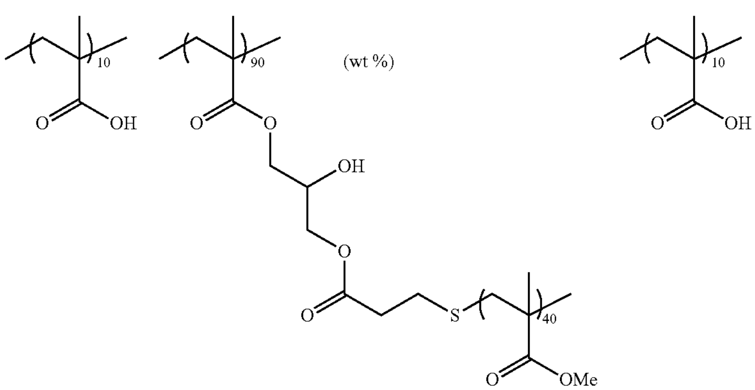

-continued
(Exemplary Compound 20)
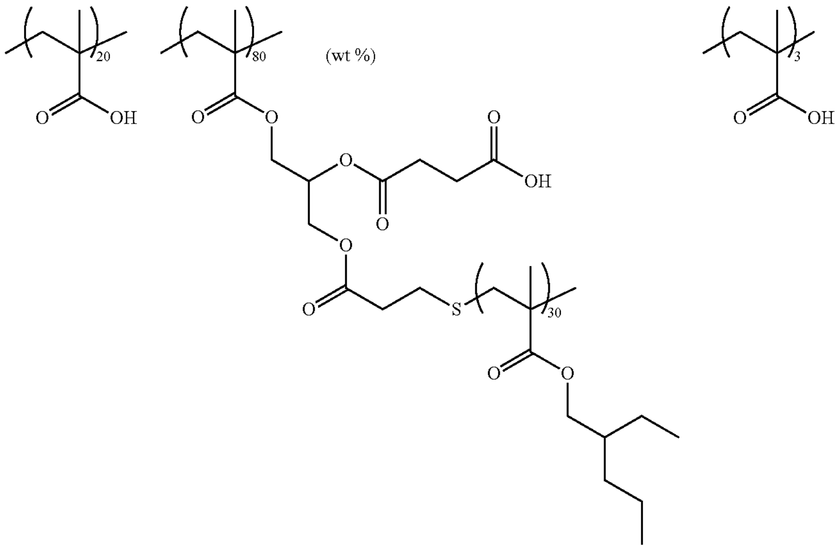
(Exemplary Compound 21)
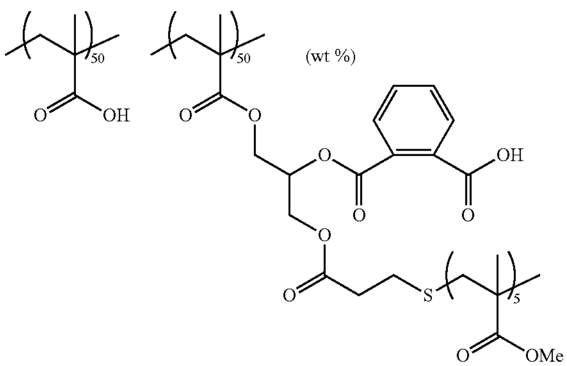
(Exemplary Compound 22)
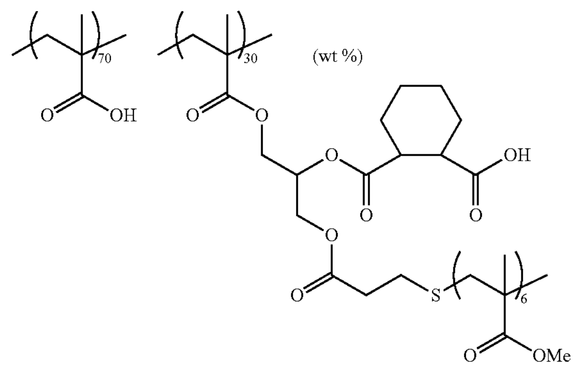
(Exemplary Compound 23)
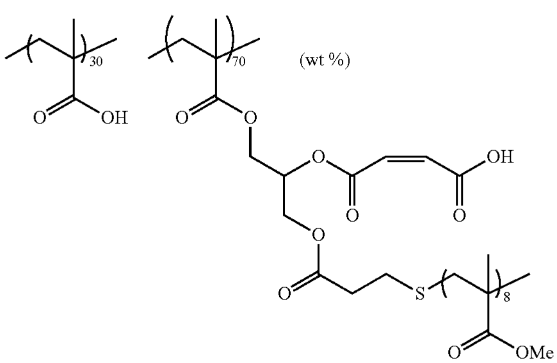
(Exemplary Compound 24)
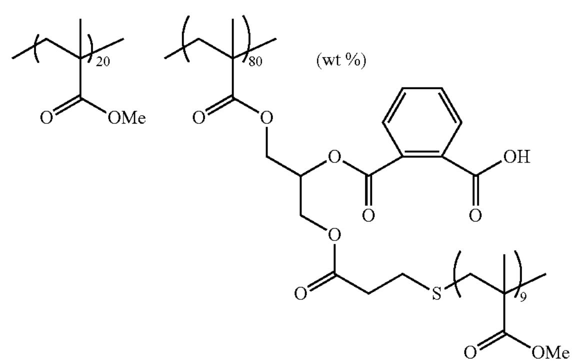
(Exemplary Compound 25)
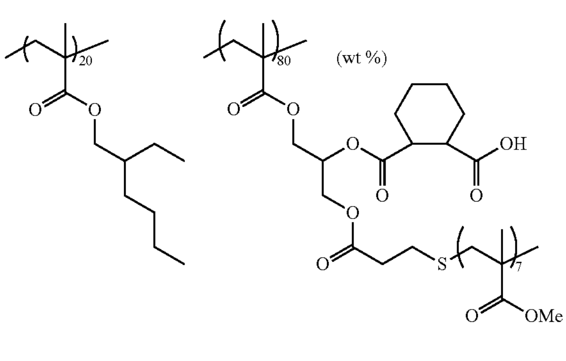
(Exemplary Compound 26)
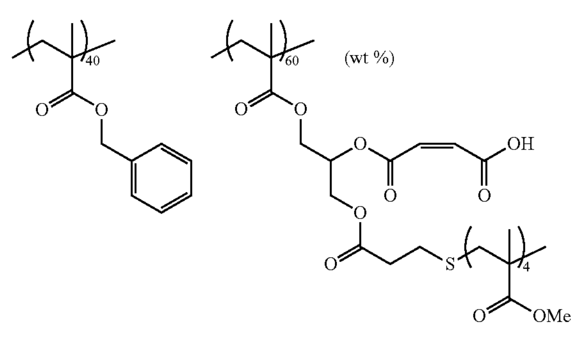

-continued
(Exemplary Compound 27)
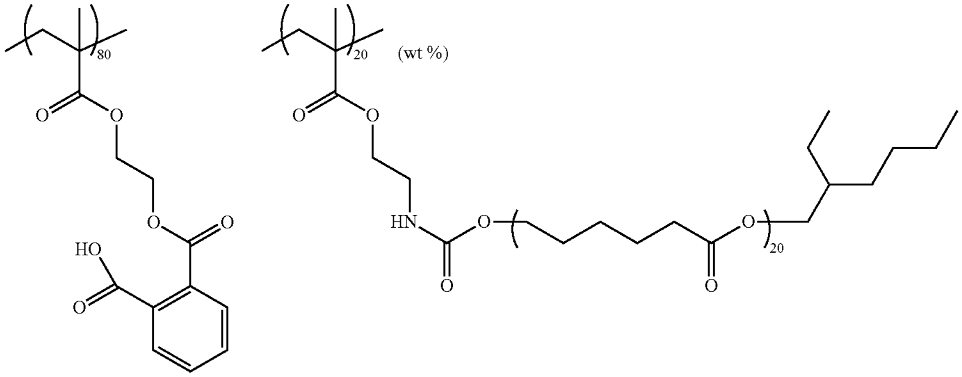
(Exemplary Compound 28)
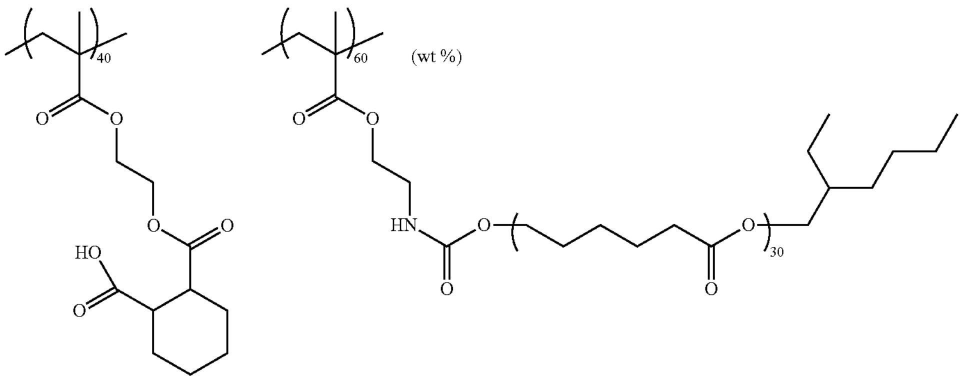
(Exemplary Compound 29)
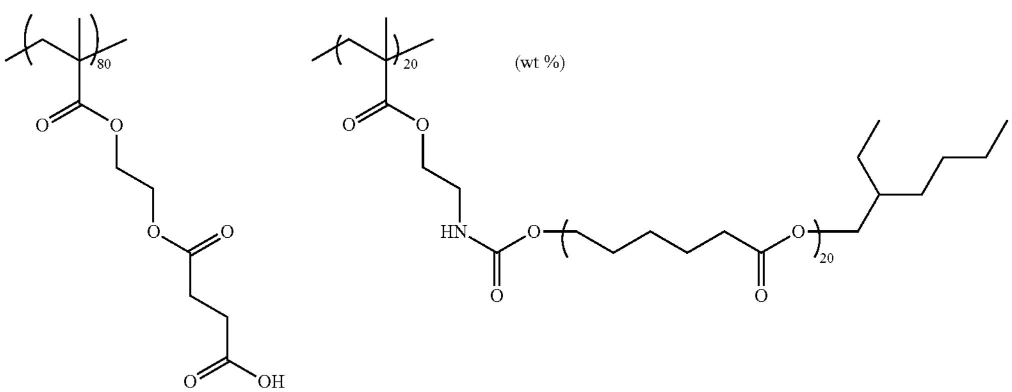
(Exemplary Compound 30)
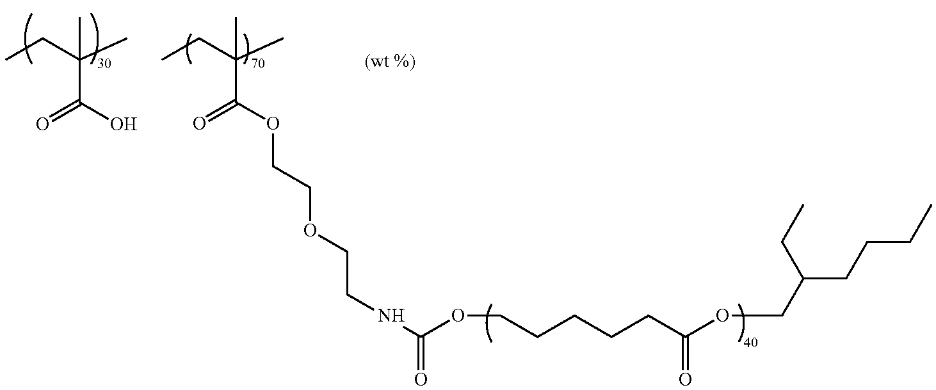

-continued
(Exemplary Compound 31)
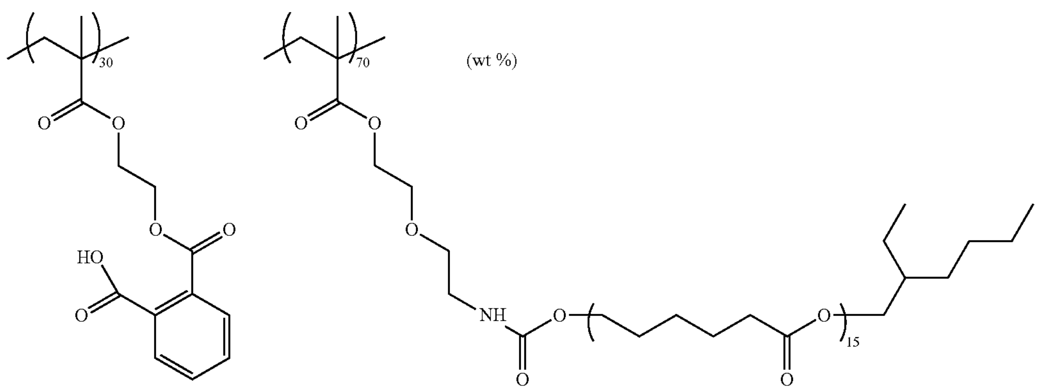
(Exemplary Compound 32)
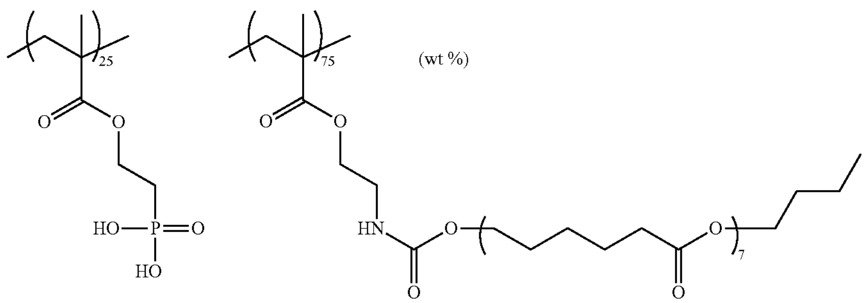
(Exemplary Compound 33)
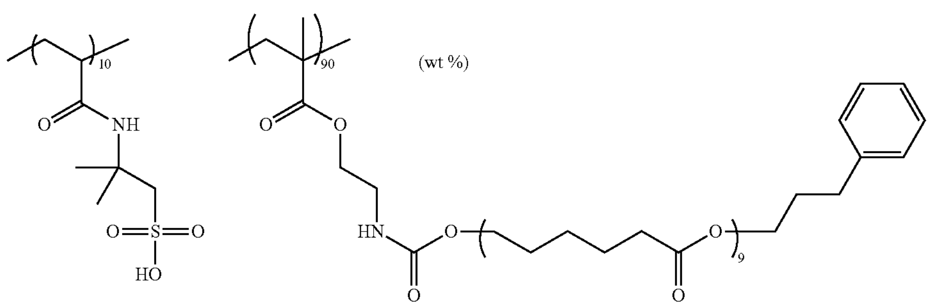
(Exemplary Compound 34)
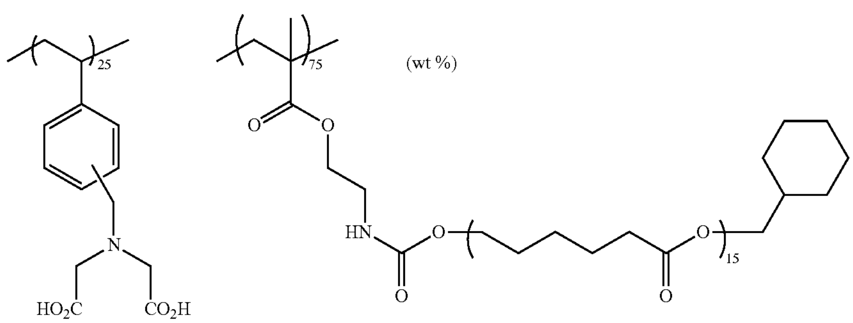
(Exemplary Compound 35)
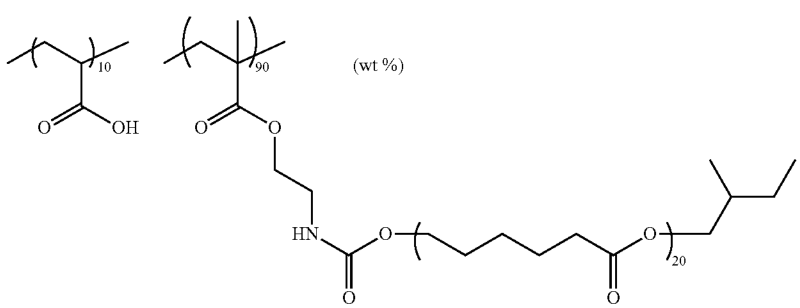

-continued
(Exemplary Compound 36)
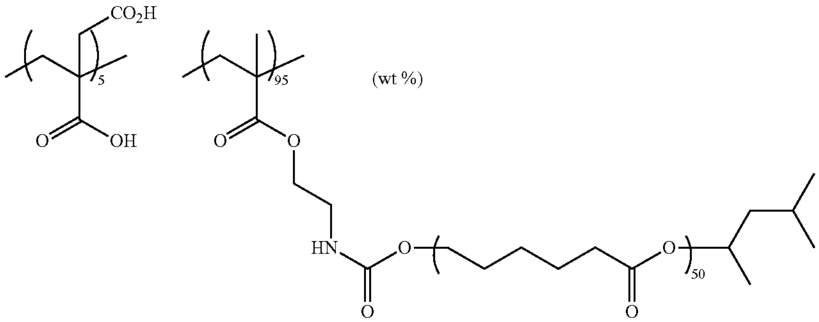
(Exemplary Compound 37)
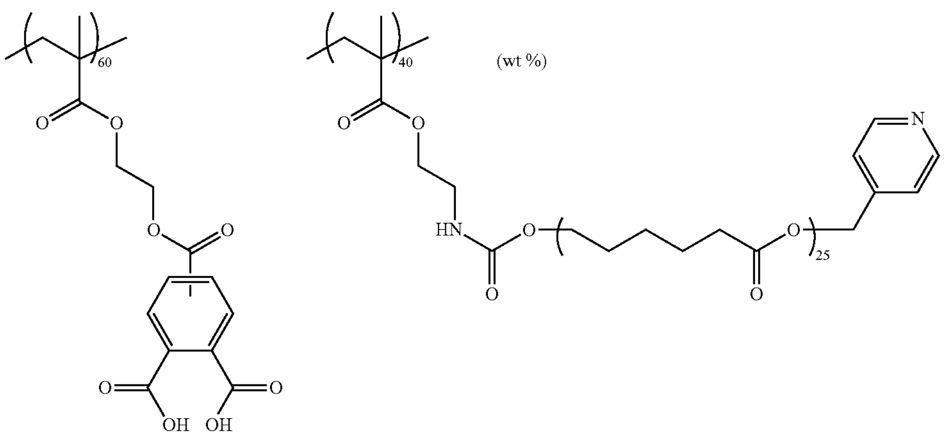
(Exemplary Compound 38)
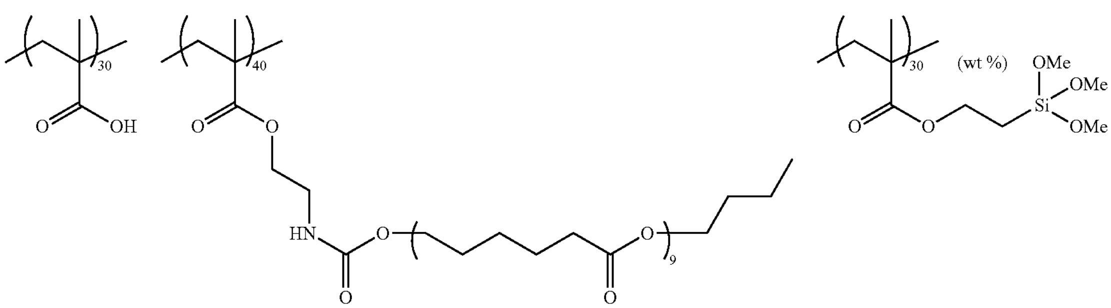
(Exemplary Compound 39)
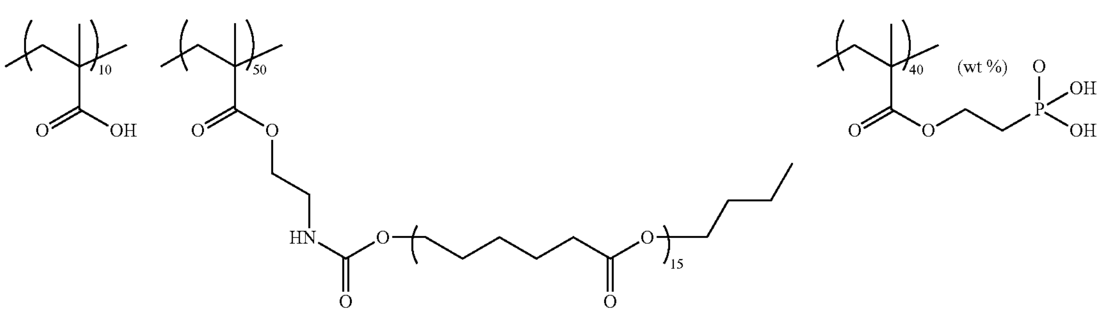

-continued
(Exemplary Compound 40)
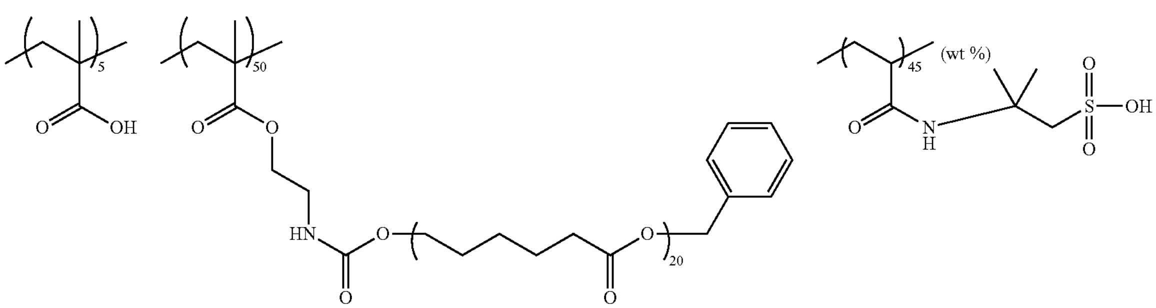
(Exemplary Compound 41)
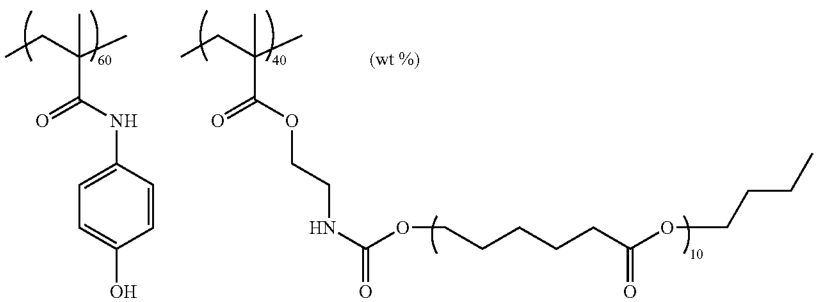
(Exemplary Compound 42)
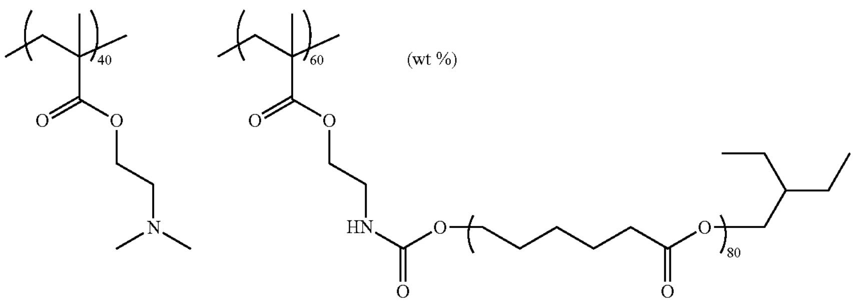
(Exemplary Compound 43)
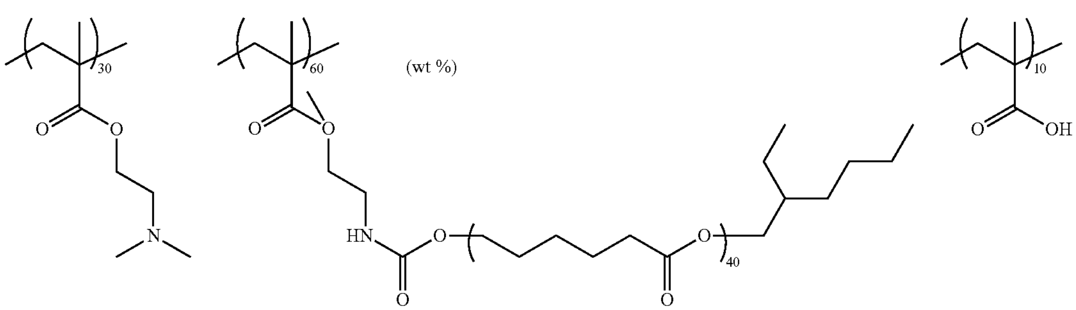
(Exemplary Compound 44)
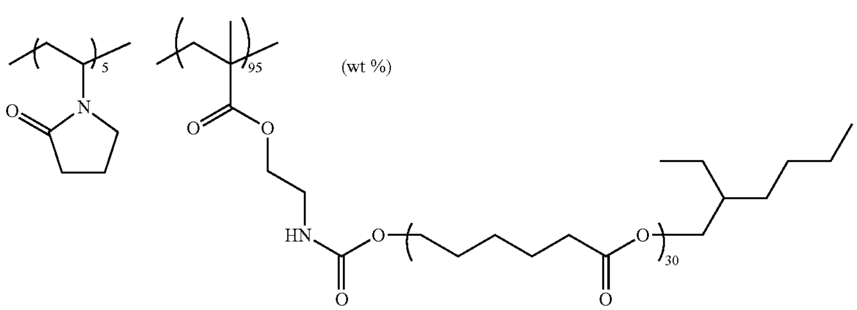

-continued
(Exemplary Compound 45)
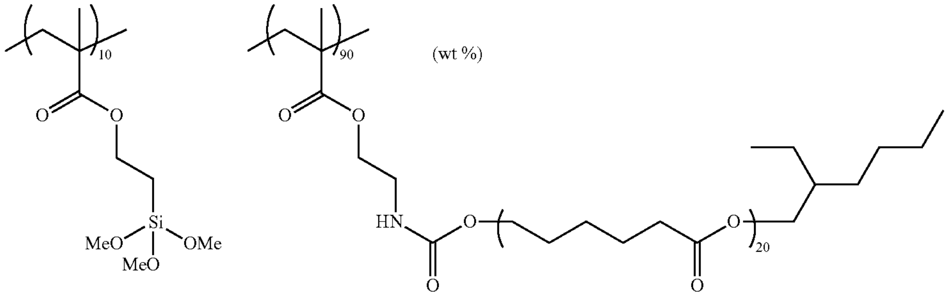
(Exemplary Compound 46)
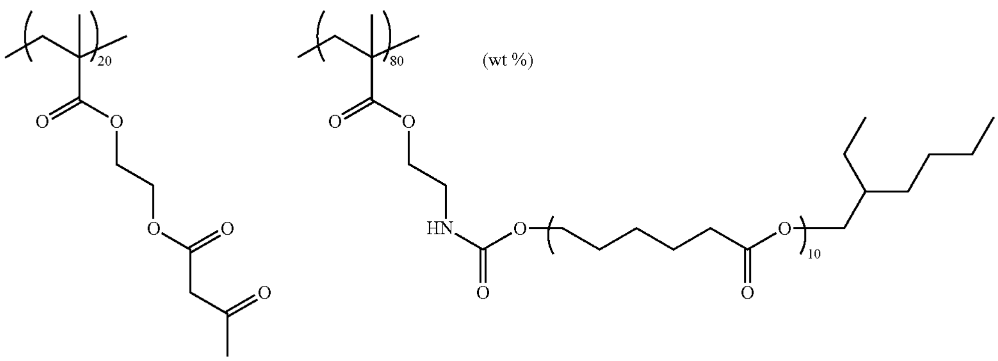
(Exemplary Compound 47)
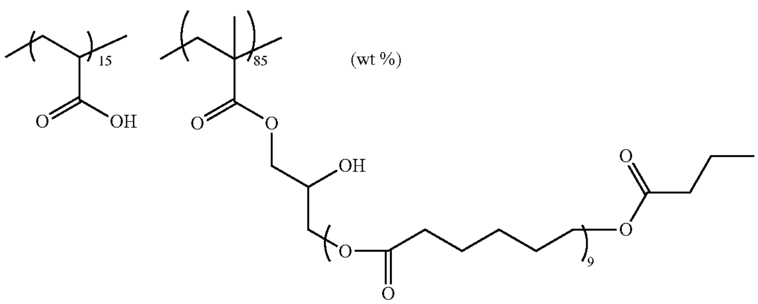
(Exemplary Compound 48)
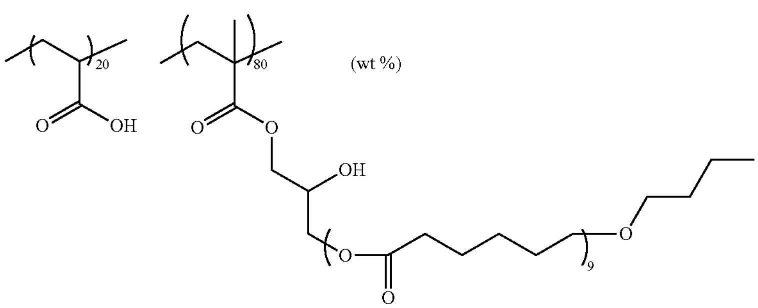
(Exemplary Compound 49)
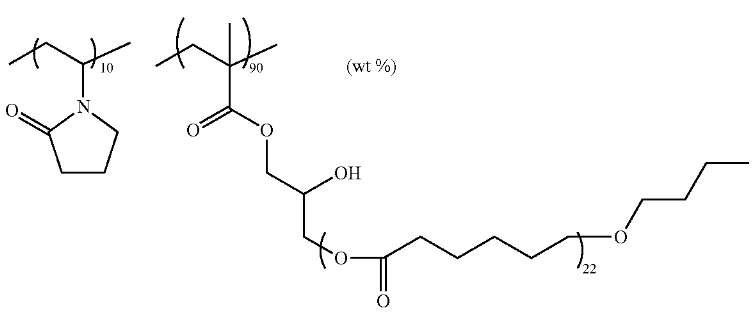

-continued
(Exemplary Compound 50)
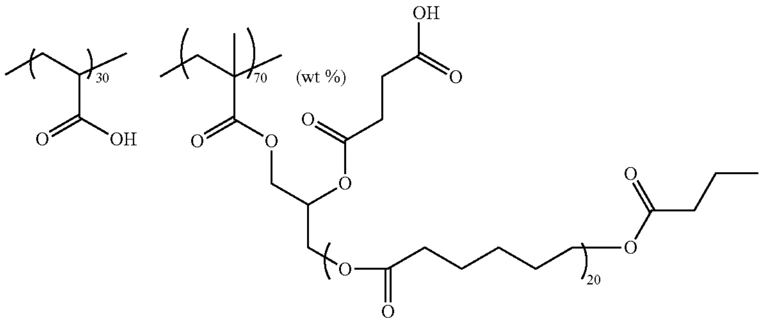
(Exemplary Compound 51)
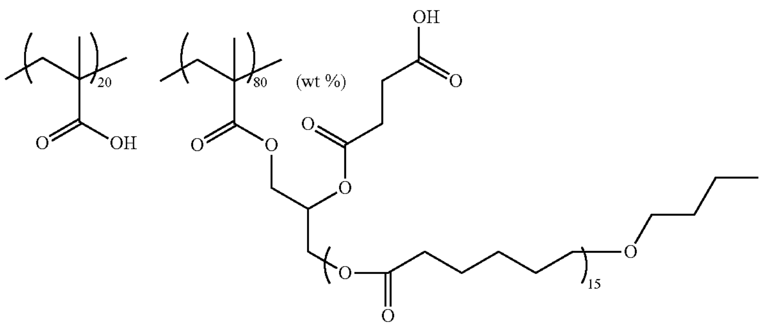
(Exemplary Compound 52)
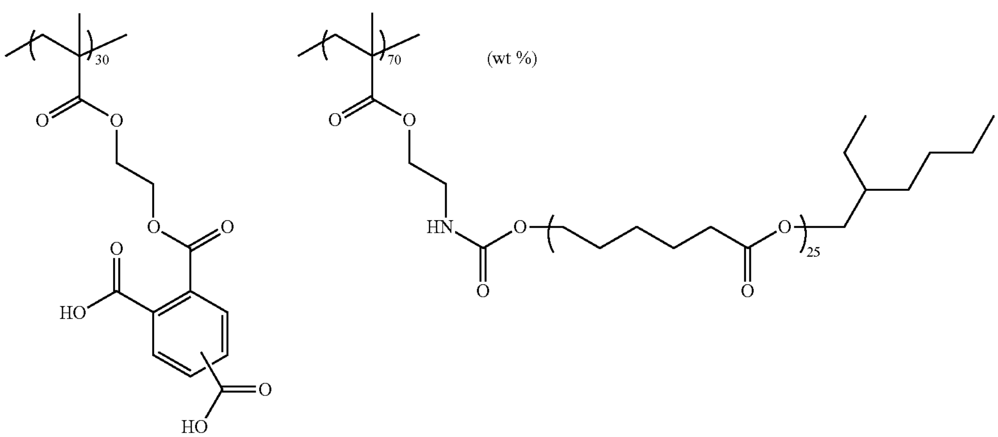
(Exemplary Compound 53)
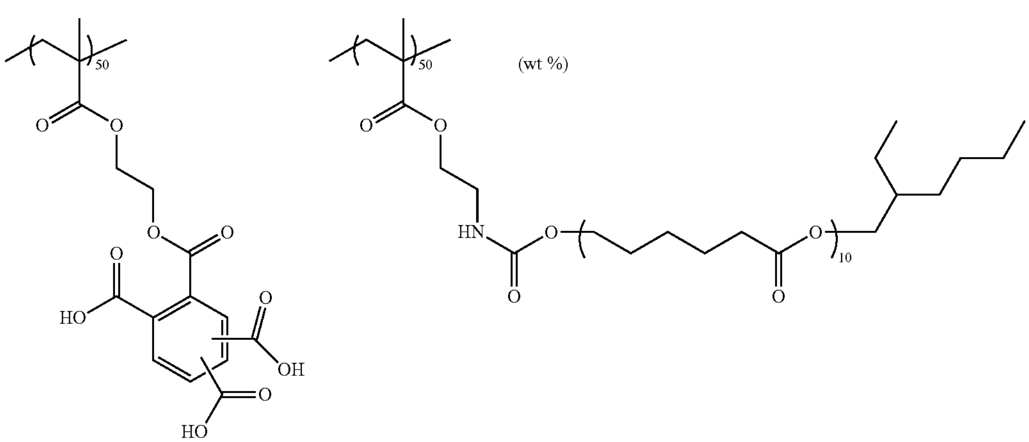

-continued
(Exemplary Compound 54)
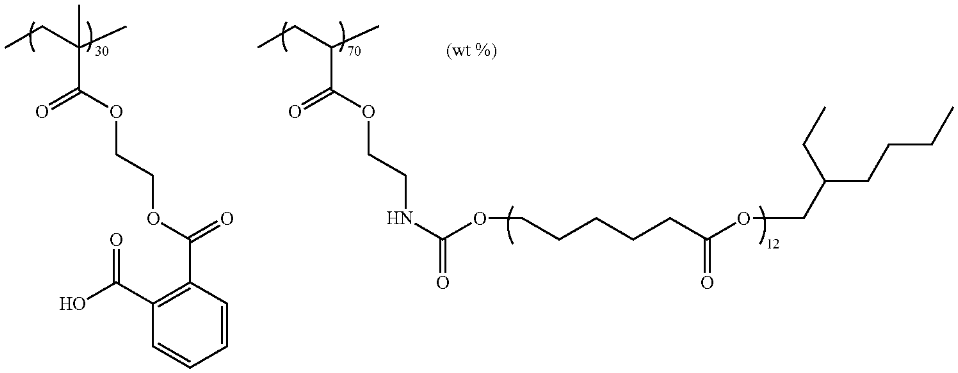
(Exemplary Compound 55)
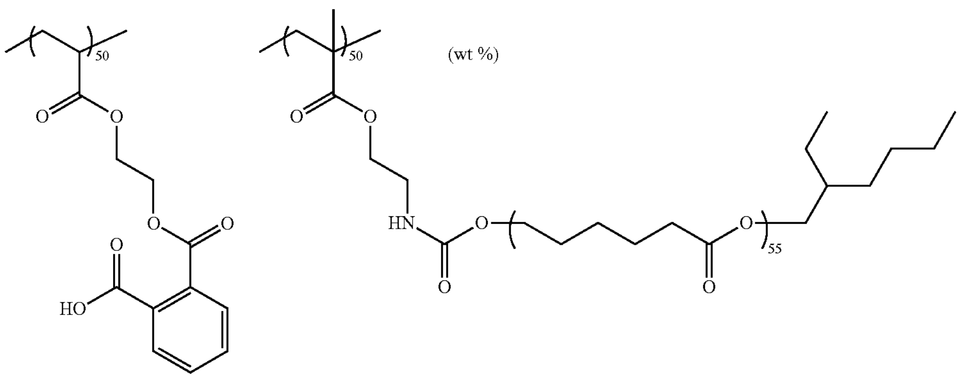
(Exemplary Compound 56)
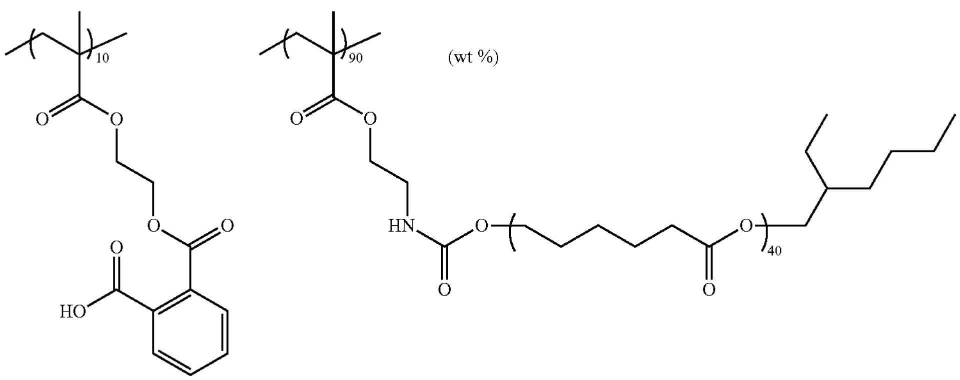
(Exemplary Compound 57)
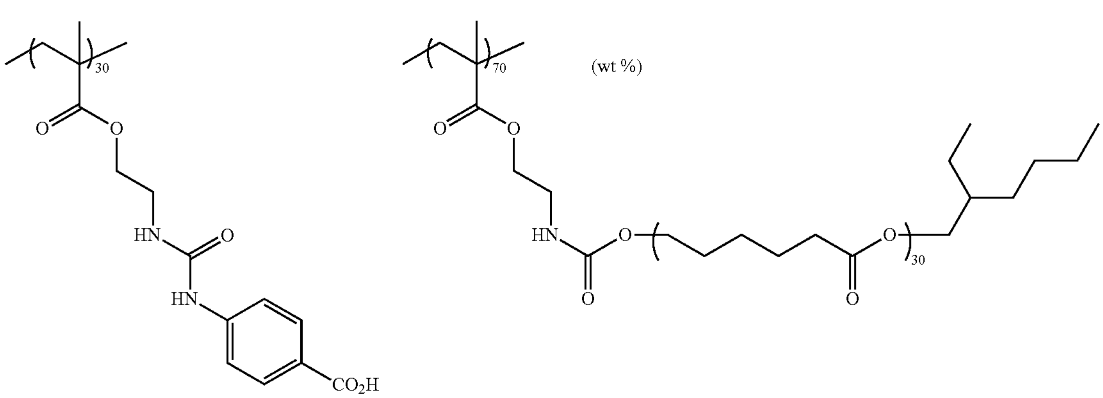

-continued
(Exemplary Compound 58)
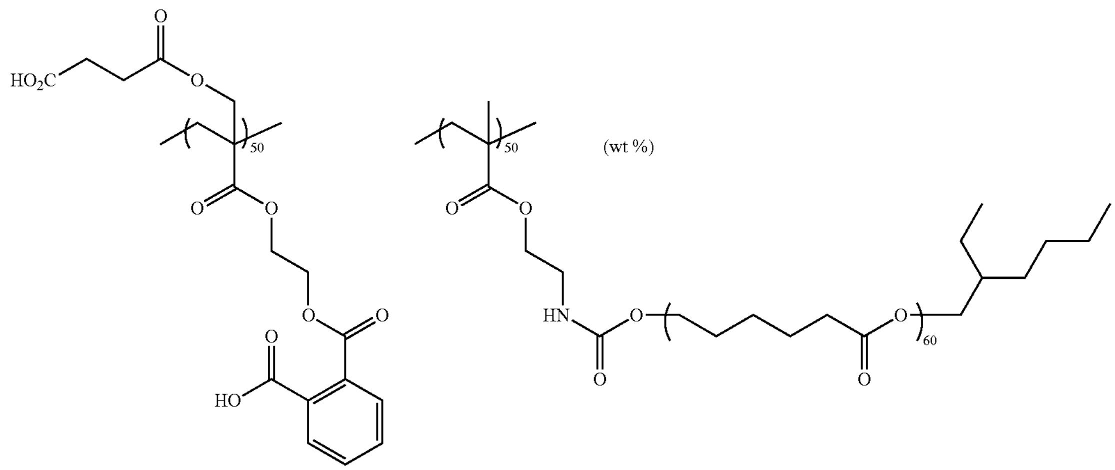
(Exemplary Compound 59)
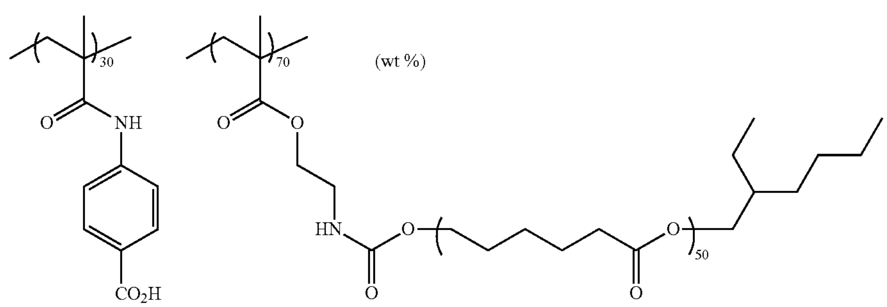
(Exemplary Compound 60)
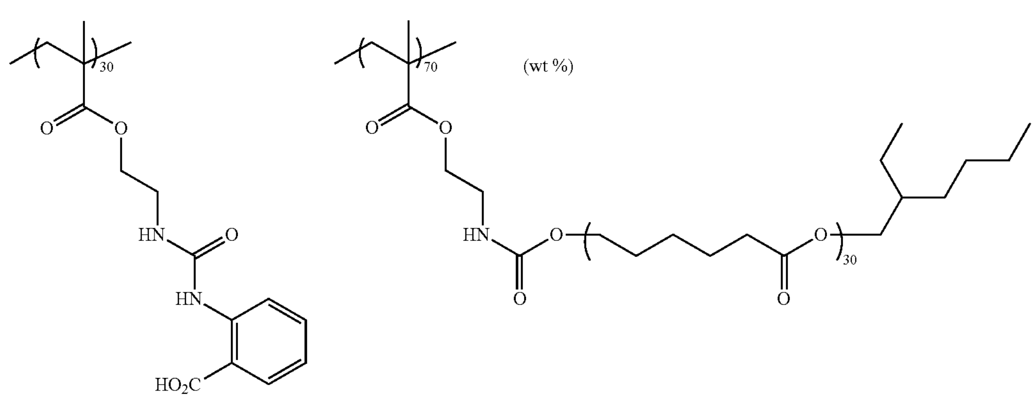

-continued
(Exemplary Compound 61)
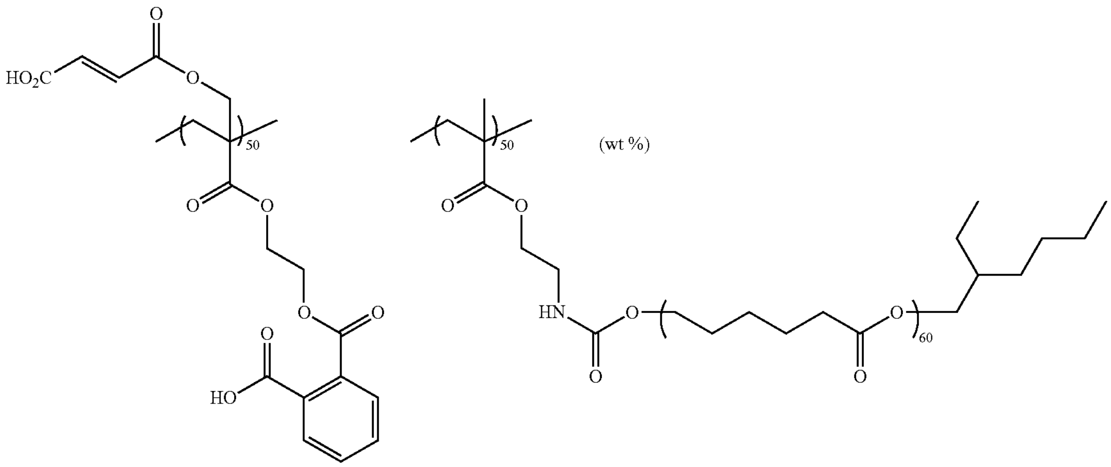
(Exemplary Compound 62)
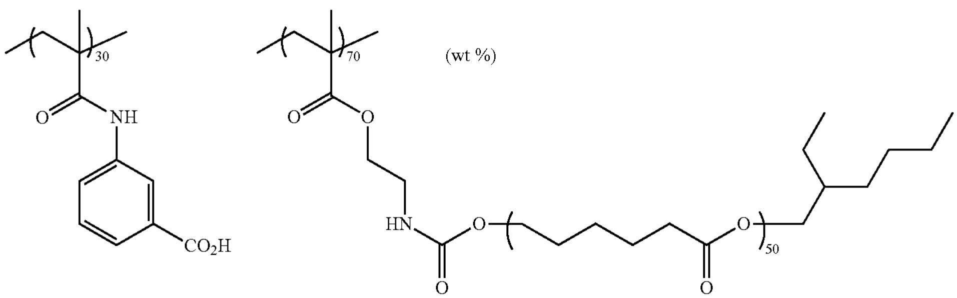
(Exemplary Compound 63)
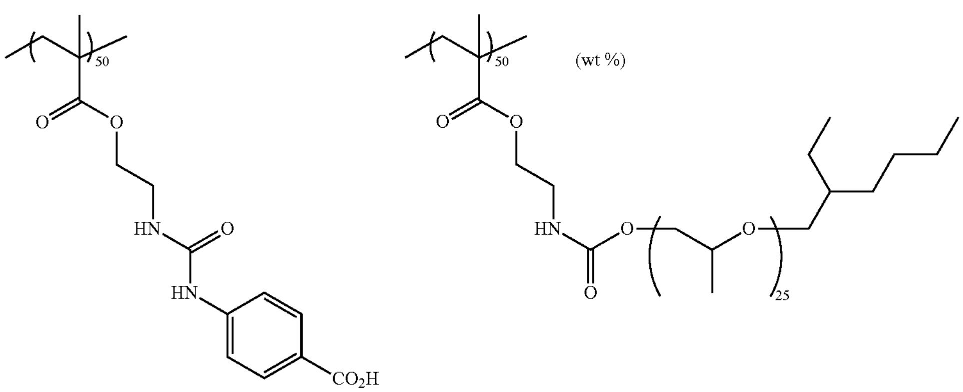
(Exemplary Compound 64)
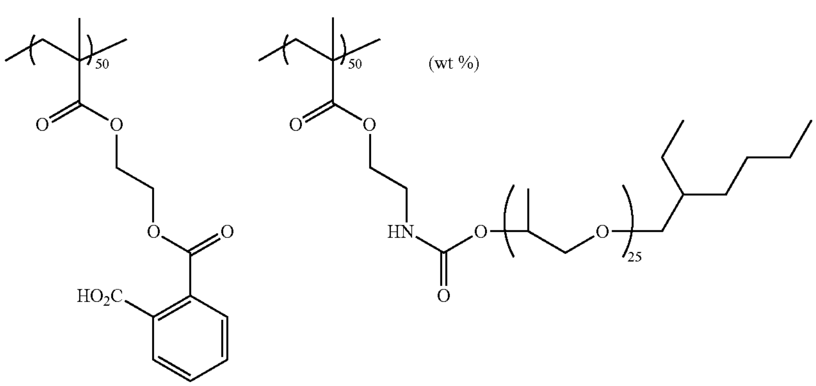

-continued
(Exemplary Compound 65)
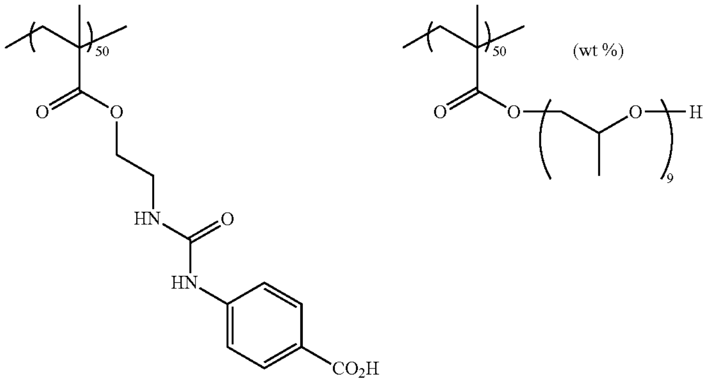
(Exemplary Compound 66)
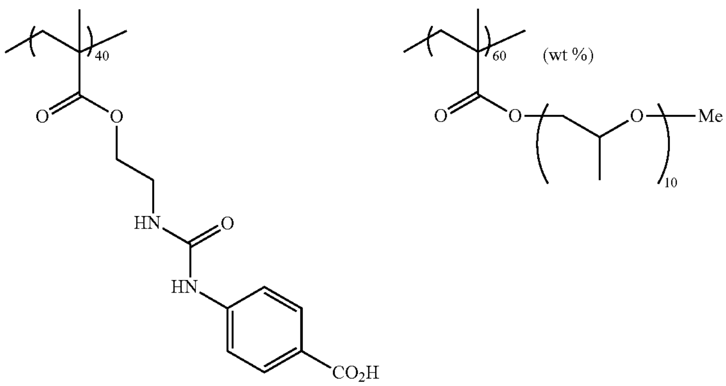
(Exemplary Compound 67)
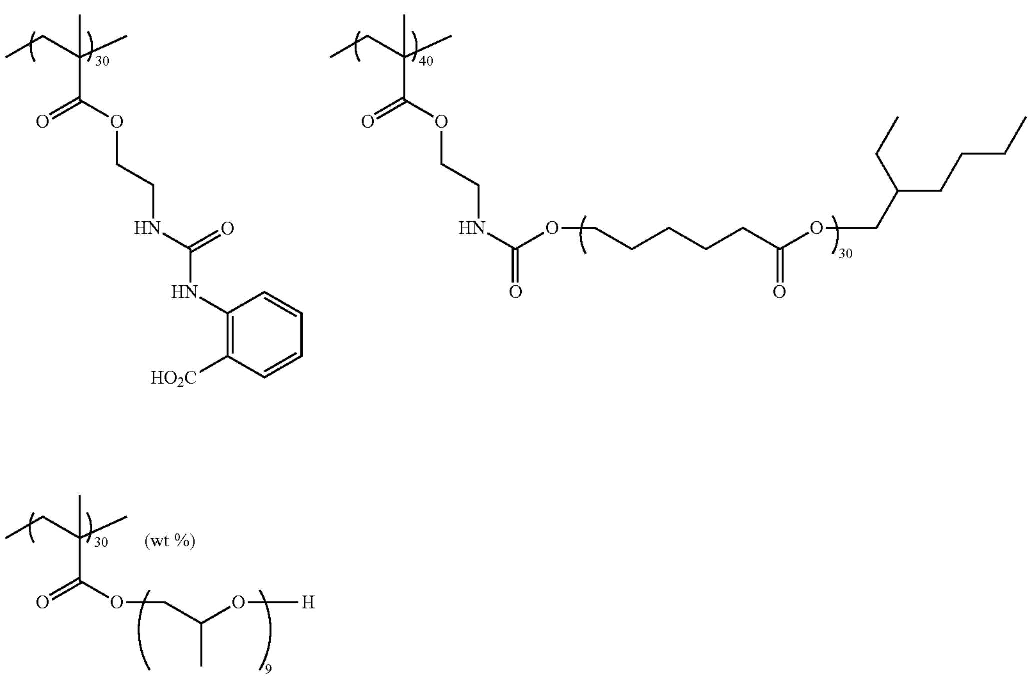

-continued
(Exemplary Compound 68)
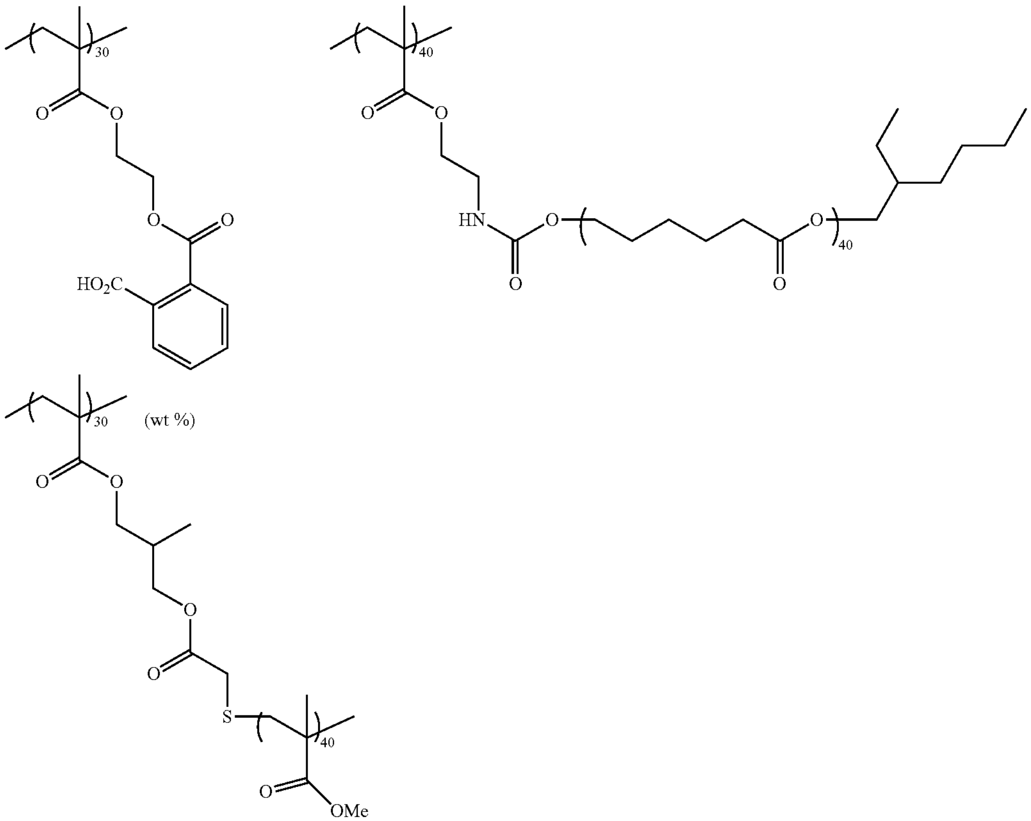
(Exemplary Compound 69)
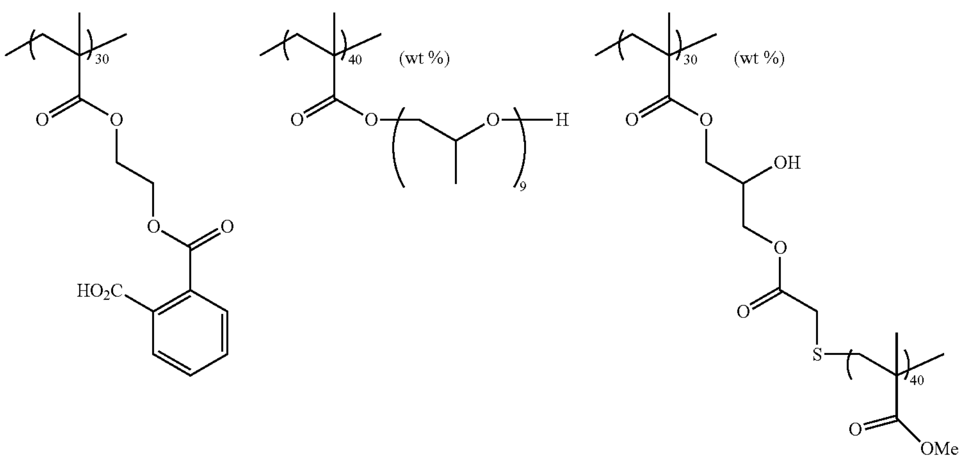
(Exemplary Compound 70)
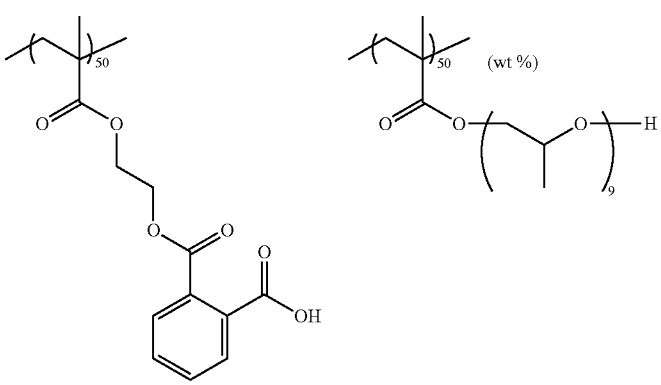

-continued (Exemplary Compound 71)

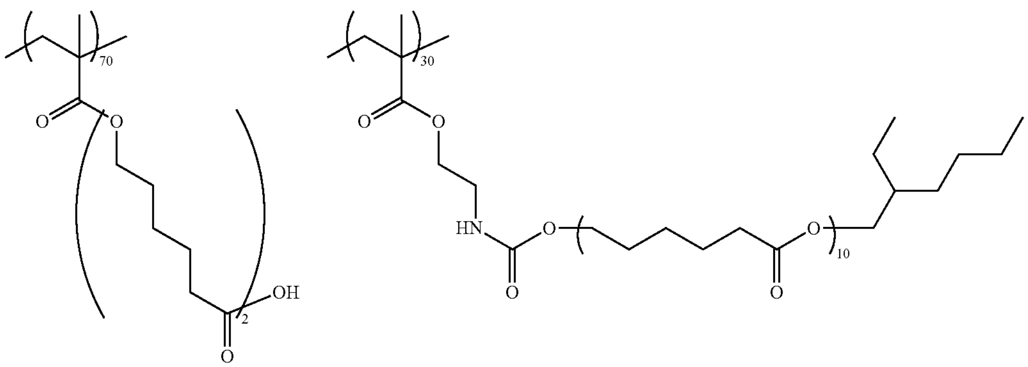

(Exemplary Compound 72)

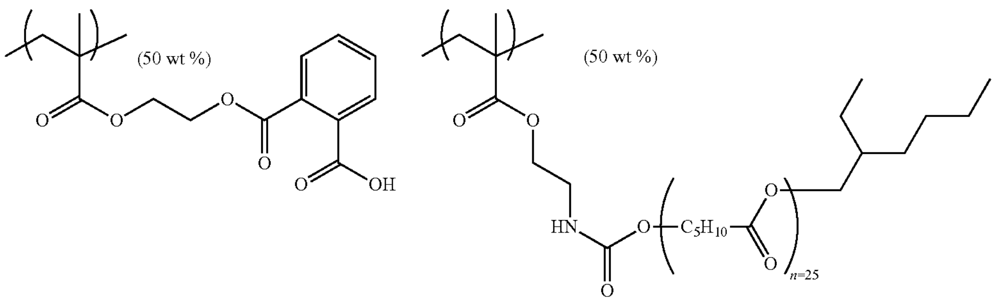

(Exemplary Compound 73)

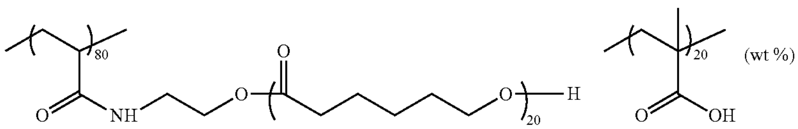

The dispersing agent of the present invention is preferably a compound having a polyester chain, as in exemplified compound 72.

The content of the pigment dispersing agent in the radiation-sensitive colored composition is preferably 1 part by mass to 80 parts by mass, more preferably 5 parts by mass to 70 parts by mass, and still more preferably 10 parts by mass to 60 parts by mass, relative to 100 parts by mass of the pigment, which is a colorant.

Specifically, in a case using a polymer dispersing agent, the amount used is preferably in the range of from 5 parts to 100 parts, and more preferably in the range of from 10 parts to 80 parts, relative to 100 parts by mass of the pigment, in terms of mass.

In addition, when used together with a pigment derivative, the amount of the pigment derivative used is preferably in the range of from 1 part to 30 parts, more preferably in the range of from 3 parts to 20 parts, and particularly preferably in the range of from 5 parts to 15 parts, relative to 100 parts by mass of the pigment, in terms of mass.

In the radiation-sensitive colored composition, in a case of using a pigment as a colorant and further using a pigment dispersing agent; from the viewpoint of curing sensitivity and color density, the sum of the contents of the colorant and the dispersing agent is preferably from 30% by mass to 90% by weight, more preferably from 40% by mass to 85% by mass, and still more preferably from 50% by mass to 80% by mass, relative to a total solid content constituting the radiation-sensitive colored composition.

Furthermore, the term total solid content in the present specification indicates the total amount of all ingredients excluding the solvent in the radiation-sensitive colored composition.

<(B) Polymerizable Compound>

The radiation-sensitive colored composition of the present invention contains at least one polymerizable compound.

The aforementioned polymerizable compounds are, specifically, selected from the compounds having at least one, preferably at least two, terminal ethylenically unsaturated bonds. These compound groups are widely known in the relevant industrial field, and in the present invention they can be used without particular limitation. These may have any chemical form of, for example, a monomer, a prepolymer, that is to say, a dimer, a trimer and an oligomer, or a mixture thereof, and a (co)polymer thereof. The polymerizable compound of the present invention may be used alone, or may be a combination of two or more thereof.

More specifically, examples of the monomer and the prepolymer thereof can include unsaturated carboxylic acids (for example, an acrylic acid, a methacrylic acid, an itaconic acid, a crotonic acid, an isocrotonic acid, a maleic acid, and the like) and esters and amides thereof, and (co)polymers thereof. The preferred examples thereof include esters of an unsaturated carboxylic acid with an aliphatic polyvalent alcohol compound and amides of an unsaturated carboxylic acid with an aliphatic polyvalent amine compound, and (co)polymers thereof. In addition, an adduct of unsaturated carboxylic acid esters or amides having a nucleophilic substituent such as a hydroxyl group, an amino group or a mercapto group with monofunctional or multifunctional isocyanates or epoxies, a dehydration condensation product with a monofunctional or multifunctional carboxylic acid, and the like are also suitably used. In addition, an adduct of unsaturated carboxylic acid esters or amides having an electrophilic substituent such as an isocyanate group or an epoxy group with monofunctional or multifunctional alcohols, amines or thiols, and a substitution reaction product of unsaturated carboxylic acid esters or amides having a detachable substituent such as a halogen group or a tosyloxy group with monofunctional or multifunctional alcohols, amines or thiols are also suitable. In addition, as another example, compound groups in which the unsaturated carboxylic acid is replaced with an unsaturated phosphonic acid, vinyl benzene derivatives such as styrene, vinyl ether, allyl ethers, and the like can also be suitably used.

As these specific compounds, the compounds described in paragraph Nos. [0095] to [0575] of JP2009-288705A can be suitably used in the present invention.

In addition, as the polymerizable compound, a compound which has, as the polymerizable monomer, an ethylenic unsaturated group having at least one addition-polymerizable ethylene group and having a boiling point of 100° C. or more under normal pressure, is also preferable. Examples thereof can include monofunctional acrylates and methacrylates such as polyethylene glycol mono(meth)acrylate, polypropylene glycol mono(meth)acrylate or phenoxyethyl(meth)acrylate; multifunctional acrylates and methacrylates such as polyethylene glycol di(meth)acrylates, trimethylol ethane tri(meth) acrylates, neopentyl glycol di(meth)acrylates, pentaerythritol tri(meth)acrylates, pentaerythritol tetra(meth)acrylates, dipentaerythritol penta(meth)acrylates, dipentaerythritol hexa(meth)acrylates, hexanediol (meth)acrylates, trimethylol propane tri(acryloyloxypropyl)ether, tri(acryloyloxyethyl)isocyanurate, compounds obtained by adding ethylene oxides or propylene oxides to multifunctional alcohols, such as glycerin or trimethylol ethane, and then (meth)acrylating, urethane (meth)acrylates such as those disclosed in JP1973-41708B (JP-S48-41708B) and JP1975-6034B (JP-S50-6034B) and JP1976-37193A (JP-S51-37193A), polyester acrylates such as those disclosed in JP1973-64183A (JP-S48-64183A), JP1974-43191B (JP-S49-43191B) and JP1977-30490B (JP-S52-30490B), or epoxy acrylates which are reaction products of epoxy resins and (meth)acrylic acids; and mixtures thereof.

Multifunctional (meth)acrylates, and the like, which are obtained by reacting multifunctional carboxylic acids with a compound having a cyclic ether group such as glycidyl (meth)acrylate and an ethylenically unsaturated group, can also be included.

In addition, as other preferred polymerizable compounds, compounds having a fluorene ring and having two or more functional ethylenically polymerizable groups, cardo resins, which are described in JP2010-160418A, JP2010-129825A, JP4364216B, and the like, can also be used.

In addition, as the compounds having at least one addition-polymerizable ethylenically unsaturated group and having a boiling point of 100° C. or more under normal pressure, the compounds described in paragraph Nos. [0254] to [0257] of JP2008-292970A are also suitable.

Besides the above, the radical polymerizable monomers represented by the following general formulae (MO-1) to (MO-5) can also be suitably used. Furthermore, in the formulae, in a case where T is an oxyalkylene group, the terminal carbon atom is linked to R.

(M0-1)

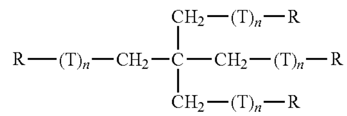

(M0-2)

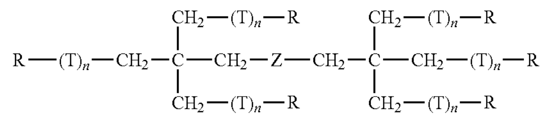

(M0-3)

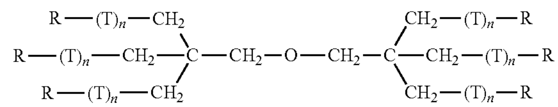

(M0-4)

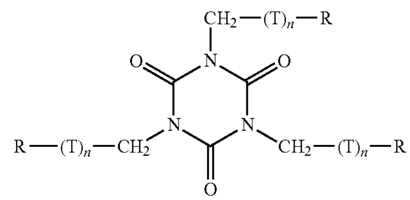

(M0-5)

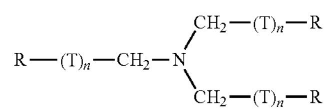

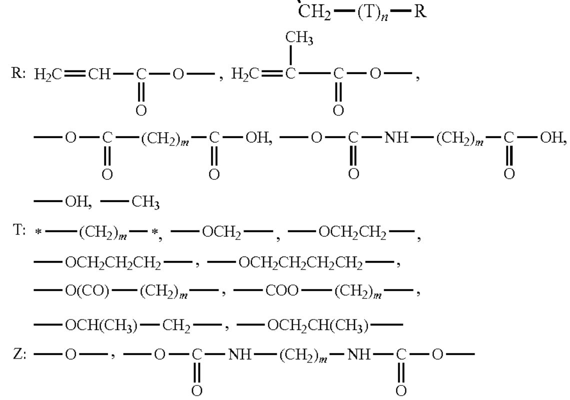

In the above general formulae, n is from 0 to 14, and m is from 1 to 8. Each of plural Rs and Ts which are present in one molecule may be the same as or different from each other.

In each of the radical polymerizable monomers represented by the general formulae (MO-1) to (MO-5), at least one of the plural Rs represents a group represented by —OC(═O)CH═CH$_2$, or —OC(═O)C(CH$_3$)═CH$_2$.

Specific examples of the radical polymerizable monomers represented by the general formulae (MO-1) to (MO-5) include the compounds described in paragraph Nos. [0248] to [0584] of JP2007-269779A.

In addition, the aforementioned compounds obtained by adding ethylene oxides or propylene oxides, and the like to the multifunctional alcohols, such as glycerin or trimethylol ethane, and then by (meth)acrylating, which are described as the formulae (1) and (2), together with specific examples thereof, in JP1998-62986A (JP-H10-62986A) can also be used as the polymerizable compound.

Among them, the polymerizable compound is preferably dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth) acrylate (as a commercially available product, KAYARAD D-310; manufactured by Nippon Kayaku Co., Ltd.), dipentaerythritol hexa(meth)acrylate (as a commercially available product, KAYARAD DPHA; manufactured by Nippon Kayaku Co., Ltd.), and a structure where the (meth)acryloyl groups thereof are lined via ethylene glycol or a propylene glycol residue. Oligomer types thereof can also be used.

The polymerizable compound is a polyfunctional monomer, and may have an acid group such as a carboxyl group, a sulfonic acid group or a phosphoric acid group. Therefore, if the ethylenic compound has an unreacted carboxyl group as in a case of being the mixture as described above, the compound may be used as it is, but, as necessary, an acid group may be introduced thereto by reacting the hydroxyl group of the ethylenic compound with a non-aromatic carboxylic acid anhydride group. In this case, specific examples of non-aromatic carboxylic acid anhydride used include tetrahydrophthalic anhydride, alkylated tetrahydrophthalic anhydride, hexahydrophthalic anhydride, alkylated hexahydrophthalic anhydride, succinic anhydride, maleic anhydride, and the like.

In the present invention, a monomer having an acid group is an ester of an aliphatic polyhydroxy compound with an unsaturated carboxylic acid, and preferably the polyfunctional monomer which has gained an acid group by reacting the unreacted hydroxyl group of the aliphatic polyhydroxy compound with a non-aromatic carboxylic acid anhydride, and it is particularly preferable that in this ester, the aliphatic polyhydroxy compound be pentaerythritol and/or dipentaerythritol. Examples of the commercially available products include for example, M-510, M-520, and the like, as polybasic acid-modified acrylic oligomers, manufactured by Toagosei Co., Ltd.

While these monomers may be used alone, since, in view of the production, using a single compound is difficult, they may be used in a combination of two or more thereof. In addition, as necessary, a polyfunctional monomer having, no acid group may be used together with a polyfunctional monomer having an acid group. The acid value of the polyfunctional monomer having an acid group is preferably 0.1 to 40 mg-KOH/g, more preferably 5 to 30 mg-KOH/g. In a case where the acid value of the polyfunctional monomer is too low, the solubility development property decreases, and in a case where the value is too high, the production and the handling of the composition become difficult, and thus photopolymerization performance decreases, and curability such as the surface smoothness of the pixel becomes poor. Therefore, in a case of using two or more polyfunctional monomers having a different acid group in a combination, or in a case of using a polyfunctional monomer having no acid group in a combination, the acid value of the entire polyfunctional monomer is required to be adjusted to be within the aforementioned range.

In addition, it is also preferable that the specific monomers in the present invention be at least one selected from the group consisting of the compounds represented by the following general formula (i) or (ii).

(i)

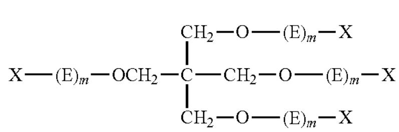

-continued (ii)

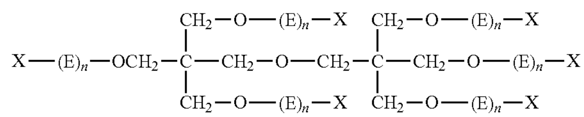

In the general formulae (i) and (ii), each E independently represents —$((CH_2)_yCH_2O)$—, or —$((CH_2)_yCH(CH_3)O)$—, each y independently represents an integer of from 0 to 10, and each X independently represents an acryloyl group, a methacryloyl group, a hydrogen atom, or a carboxyl group.

In the general formula (i), the total number of acryloyl groups and methacryloyl groups is 3 or 4, m each independently represents an integer of from 0 to 10, and the total number represented by each m is an integer of from 0 to 40, with the proviso that when the total number represented by each m is 0, one of Xs is a carboxyl group.

In the general formula (ii), the total number of acryloyl groups and methacryloyl groups is 5 or 6, n each independently represents an integer of from 0 to 10, and the total number represented by each n is an integer of from 0 to 60, with the proviso that when the total number represented by each n is 0, one of Xs is a carboxyl group.

In the general formula (i), m is preferably an integer of from 0 to 6, more preferably an integer of from 0 to 4. In addition, the total number represented by each m is preferably an integer of from 2 to 40, more preferably an integer of from 2 to 16, and particularly preferably an integer of from 4 to 8.

In the general formula (ii), n is preferably an integer of from 0 to 6, more preferably an integer of from 0 to 4. In addition, the total number represented by each n is preferably an integer of from 3 to 60, more preferably an integer of from 3 to 24, and particularly preferably an integer of from 6 to 12.

In addition, in —$((CH_2)_yCH_2O)$— or —$((CH_2)_yCH(CH_3)O)$— in the general formulae (i) and (ii), it is preferable that the terminal oxygen atom be linked to X.

The compound represented by the general formula (i) or (ii) may be used alone, or may be in a combination of two or more thereof. Particularly, in the formula (ii), it is preferable that all of six Xs be an acryloyl group.

In addition, the total content of a specific monomer of the compound represented by the general formulae (i) or (ii) is preferably 20% by mass or more, and more preferably 50% by mass or more.

The compound represented by the general formula (i) or (ii) can be synthesized from a conventionally known process, i.e., a process of linking pentaerythritol or dipentaerythritol to the ring-open skeleton by the ring-open addition reaction of ethylene oxide or propylene oxide, and a process of introducing a (meth)acryloyl group to the terminal hydroxyl group of the ring-open skeleton, for example by reacting with (meth) acrylorl chloride. Each process is a well-known process, and a person skilled in the art can easily synthesize the compounds represented by the general formula (i) or (ii).

Among the compounds represented by the general formula (i) or (ii), pentaerythritol derivatives and/or or dipentaerythritol derivatives are more preferable.

Specifically, the compounds represented by the following formulae (a) to (f) (hereinafter, also referred to as the "Exemplary compounds (a) to (f)") can be included, and among others, Exemplary compounds (a), (b), (e) and (f) are preferred.

(a)
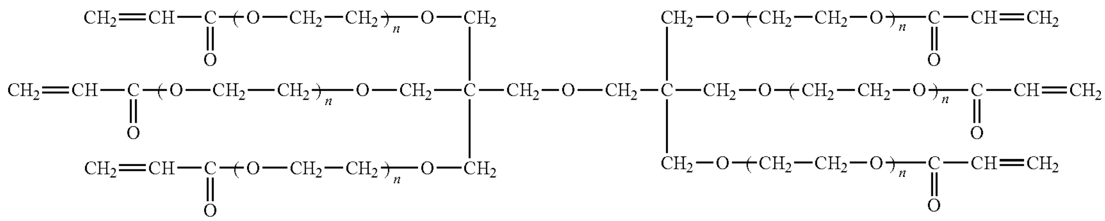
(The total number represented by each n is 6)
(b)
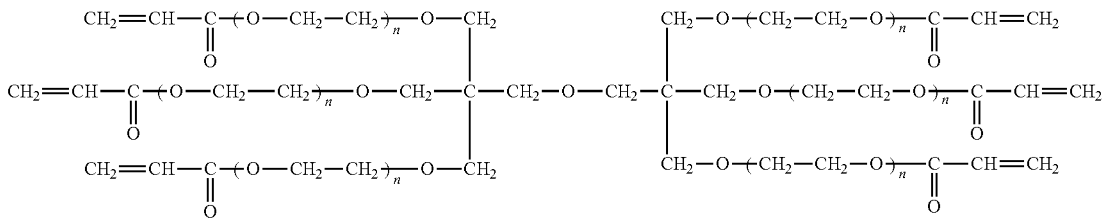
(The total number represented by each n is 12)
(c)
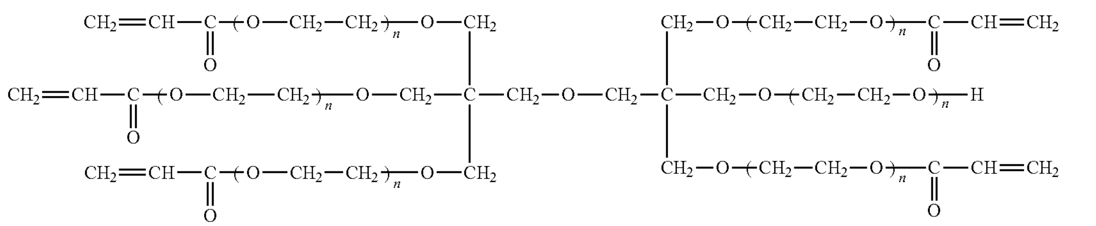
(The total number represented by each n is 12)
(d)
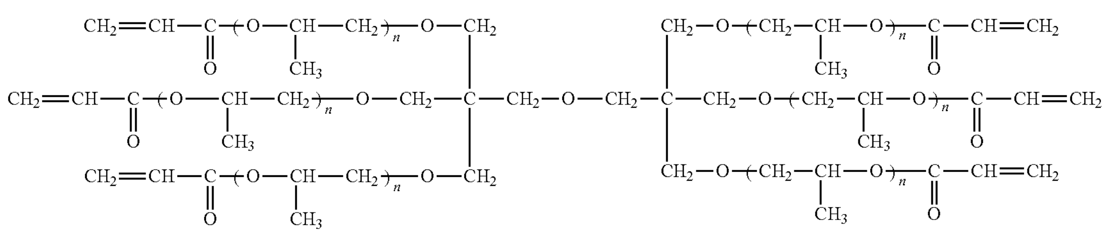
(The total number represented by each n is 6)
(e)
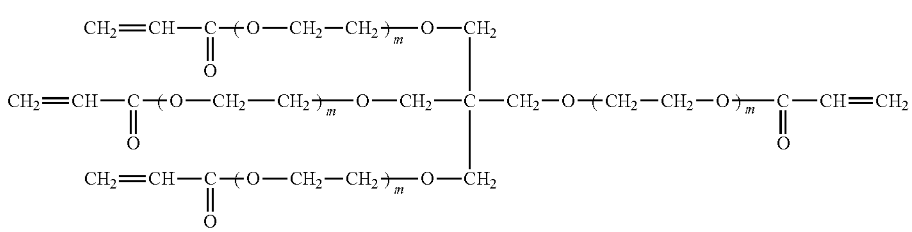
(The total number represented by each n is 4)
(f)
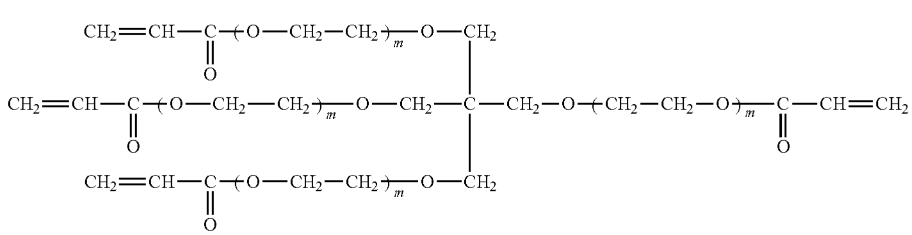
(The total number represented by each n is 12)

Examples of commercially available products of the specific monomers represented by the general formulae (i) and (ii) include SR-494 which is a tetrafunctional acrylate having four ethyleneoxy chains, manufactured by Sartomer Co., Ltd., DPCA-60 which is a hexafunctional acrylate having six pentyleneoxy chains and TPA-330 which is a trifunctional acrylate having three isobutylene oxide chains, manufactured by Nippon Kayaku Co., Ltd.

In addition, as the polymerizable compound, urethane acrylates such as those described in JP1973-41708B (JP-S48-41708B), JP1976-37193A (JP-S51-37193A), JP1990-32293B (JP-1-12-32293B), and JP1990-16765B (JP-H2-16765B); or the urethane compounds having an ethylene oxide-based skeleton described in JP1983-49860B (JP-S58-49860B), 1P1981-17654B (JP-S56-17654B), JP1987-39417B (JP-S62-39417B), and JP1987-39418B (JP-S62-39418B), are also suitable. Furthermore, if the addition polymerizable compounds having an amino structure or a sulfide structure in the molecule, as described in JP1987-277653A (JP-S63-277653A), JP1987-260909A (JP-S63-260909A) and JP1989-105238A (JP-H1-105238A), are used as the polymerizable compound, a radiation-sensitive colored composition that is superior in photosensitive speed can be obtained.

Examples of commercially available products of the polymerizable compounds include urethane oligomer-UAS-10, UAB-140 (manufactured by Sanyo Kokusaku Pulp Co., Ltd.), UA-7200 (manufactured by Shin-Nakamura Chemical Co., Ltd.), DPHA-40H (manufactured by Nihon Kayaku Co., Ltd.), and UA-306H, UA-306T, UA-306I, AH-600, T-600, AI-600 (trade names, manufactured by Kyoeisha Chemical Co., Ltd.), and the like.

For these polymerizable compounds, the details of the method of use such as the structure thereof, whether a single use or a combination use, or the amount to be added, may be arbitrarily set according to the ultimate performance design of the radiation-sensitive colored composition. For example, in view of sensitivity, a structure including many unsaturated groups per one molecule is preferable, and a bi- or more functional structure is preferable in many cases. In addition, in view of enhancing the strength of the colored cured film, a tri- or more functional compound is preferable, and further, a method of adjusting both sensitivity and strength by using compounds having different numbers of functional groups and different polymerizable groups (for example, acrylic acid esters, methacrylic acid esters, styrene-based compounds, and vinyl ether-based compounds) in combination is also effective. Furthermore, using tri- or more functional polymerizable compounds with a different ethylene oxide chain length in combination is preferable in view of the fact that the developing property of the radiation-sensitive colored composition can be adjusted and an excellent pattern formability can be obtained. In addition, the selection and the using method of the polymerizable compounds are also important factors for compatibility with other components (for example, a polymerization initiator, a colorant (pigment), and a binder polymer, and the like) included in the radiation-sensitive colored composition, and for dispersity. For example, the compatibility may be improved by using a compound having low purity or using two or more kinds of compounds in combination. Further, a specific structure may be selected in view of improving the adhesion with the hard surfaces such as a support.

The content of the polymerizable compound in the radiation-sensitive colored composition of the present invention is preferably 0.1% by mass to 90% by mass, more preferably 1.0% by mass to 80% by mass, and particularly preferably 2.0% by mass to 70% by mass, relative to a total solid content of the radiation-sensitive colored composition.

In the radiation-sensitive colored composition of the present invention, the content mass ratio of a specific colorant and a polymerizable monomer (a compound represented by the general formula (1): the polymerizable monomer) is, from the viewpoint of film thinning, preferably from 1:2 to 20:1, and more preferably from 1:1 to 10:1.

<(C) Solvent>

The radiation-sensitive colored composition of the present invention contains a solvent. Examples of the solvent include a liquid selected from the organic solvents as shown below. The organic solvent is, basically, not particularly limited so long as it may satisfy the solubility of each components and the coating property of the radiation-sensitive colored composition, and is preferably selected, particularly taking into account of an ultraviolet absorbing agent, solubility of the binder, a coating property and safety. In addition, when the radiation-sensitive colored composition of the present invention is prepared, it is preferable that it contain at least two kinds of organic solvents.

The suitable examples of the organic solvent include, as esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (e.g.: methyl oxyacetate, ethyl oxyacetate, butyl oxyacetate (more specifically, methyl methoxyacetae, ethyl methoxyacetate, butyl methoxyacetate, methyl ethoxyacetate, ethyl ethoxyacetate, and the like)), 3-oxyalkyl propionate esters (e.g.: 3-oxymethyl propionate, 3-oxyethyl propionate, and the like (more specifically, 3-methoxymethyl propionate, 3-methoxyethyl propionate, 3-ethoxymethyl propionate, 3-ethoxyethyl propionate, and the like)), 2-oxyalkyl propionate esters (e.g.: 2-oxymethyl propionate, 2-oxyethyl propionate, 2-oxypropyl propionate, and the like (more specifically, 2-methoxymethyl propionate, 2-methoxyethyl propionate, 2-methoxypropyl propionate, 2-ethoxymethyl propionate, 2-ethoxyethyl propionate, and the like)), methyl 2-oxy-2-methylpropionate and ethyl 2-oxy-2-methylethyl propionate (more specifically, methyl 2-methoxy-2-methyl propionate, ethyl 2-ethoxy-2-methylpropionate, and the like), methyl pyruvate, ethyl pyruvate, propyl pyruvate, methyl acetoacetate, ethyl acetoacetate, 2-oxomethyl butanoate, and 2-oxoethyl butanoate; as ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, diethylene glycol monobutyl ether acetate, and the like; as ketones, for example, methyl ethyl ketone, cyclohexanone, 2-heptanone, 3-heptanone, and the like; aromatic hydrocarbons, for example, toluene, xylene, and the like.

These organic solvents, from the viewpoint of an ultraviolet absorbing agent and the solubility of an alkali-soluble resin, and the improvement of smooth coating profile, also may be preferably used in a combination in two or more thereof. In this case, particularly preferred is a mixed solution consisting of at least two selected from methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether and propylene glycol methyl ether acetate (PGMEA).

The content of the solvent in the radiation-sensitive colored composition of the present invention is, from the viewpoint of coating property, an amount so as to have a total solid concentration of the composition of preferably 5% by mass to 80% by mass, more preferably 5% by mass to 60% by mass, and particularly preferably 10% by mass to 50% by mass.

<(D) Polymerization Initiator>

It is preferable that the radiation-sensitive colored composition of the present invention further contain (D) a polymerization initiator, from the viewpoint of further improving sensitivity.

The polymerization initiator is not particularly limited, so long as it has an ability to initiate the polymerization of the aforementioned polymerizable compound, and can be appropriately selected from known polymerization initiators. For example, it is preferable to be photosensitive to lights from the ultraviolet region to visible light. In addition, it may be an active agent which causes some effects with a photoexcited sensitizer and generates an active radical, or may be an initiator, such as those which initiate a cationic polymerization according to the type of monomers.

In addition, it is preferable that the polymerization initiator contain at least one compound which has a molecular extinction coefficient of at least approximately 50 in the range of from approximately 300 nm to 800 nm (more preferably from 330 nm to 500 nm).

In addition, the polymerization initiator can be used alone or in a combination of two or more thereof.

Examples of the polymerization initiator include, for example, halogenated hydrocarbon derivatives (for example, those having a triazine skeleton, those having an oxadiazole skeleton, and the like), acyl phosphine compounds such as acyl phosphine oxide, oxime compounds such as hexaarylbiimidazole and oxime derivatives, organic peroxides, thio compounds, ketone compounds, aromatic onium salts, ketoxime ethers, aminoacetophenone compounds, hydroxyacetophenone, ketal compounds, benzoin compounds, acridine compounds, azo compounds, coumarin compound, azide compounds, metallocene compounds, organic boric acid compounds, disulfonic acid compounds, alkylamino compounds, and the like.

Examples of the halogenated hydrocarbon compounds having the triazine skeleton include, for example, compounds described in Wakabayashi et al., Bull. Chem. Soc. Japan, 42, 2924 (1969), compounds described in GB1388492B, compounds described in JP1978-133428A (JP-S-53-133428A), compounds described in DE3337024B, compounds described in F. C. Schaefer, et al., Org. Chem.; 29, 1527 (1964), compounds described in JP1987-58241A (JP-S62-58241A), compounds described in JP1994-281728A (JP-H5-281728A), compounds described in JP1994-34920A (JP-H5-34920A), compounds described in U.S. Pat. No. 4,212,976A, and the like.

Examples of the compounds described in U.S. Pat. No. 4,212,976A include, for example, compounds having an oxadiazole skeleton (specifically, 2-tri chloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazol-2-tribromomethyl-5-(2-naphthyl)-1,3,4-oxadiazol e, 2-trichloromethyl-5-styryl-1,3,4-oxadiazole, 2-trichloromethyl-5-(4-chlorstyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, 2-tribromomethyl-5-styryl-1,3,4-oxadiazole, and the like), and the like. Examples of the commercially available products include, for example, halomethyl-s-triazine compounds and the like, such as 4-benzoxolane-2,6-bis(trichloromethyl)-s-triazine (TAZ-107 manufactured by Midori Kagaku Co., Ltd.).

In addition, examples of the polymerization initiators other than the above include, for example, acridine derivatives (for example, 9-phenylacridine, 1,7-bis(9,9'-acridinyl)heptane, and the like), N-phenylglycine, and the like, polyhalogenated compounds (for example, carbon tetrabromide, phenyl tribromomethyl sulfone and phenyl trichloromethyl ketone, and the like), coumarins (for example, 3-(2-benzofuranoyl)-7-diethylaminocoumarin, 3-(2-benzofuroyl)-7-(1-pyrrolidinyl) coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonyl bis(5,7-di-n-propoxycoumarin), 3,3'-carbonyl bis (7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-di-propoxycoumarin, 7-benzotrizole-2-yl coumarin, and also coumarin compounds described in JP1994-19475A (JP-H5-19475A), JP1996-271028A (JP-H7-271028A), JP2002-363206A, JP2002-363207A, JP2002-363208A, JP2002-363209A, and the like), acyl phosphine oxides (for example, bis(2,4,6-trimethylbenzoyl)-phenyl phosphine oxide, bis(2,6-dimethoxybenzoyl)-2,4,4-trimethyl-pentylphenyl phosphine oxide and Lucirin TPO, and the like), metallocenes (for example, bis (η5-2,4-cyclopentadiene-1-yl)-bis(2,6-dichloro-3-(1H-pyrrol-1-yl)-phenyl) titanium, η5-cyclopentadienyl-η6-cumenyl-iron(1+)-hexafluoro phosphate (1−), and the like), and compounds described in JP1978-133428A (JP-S53-133428A), JP1982-1819B (JP-S57-1819B), JP1982-6096B (JP-S57-6096B), and U.S. Pat. No. 3,615,455A, and the like.

Examples of the ketone compounds includes, for example, benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or its tetramethyl ester, 4,4'-bis(dialkylamino)benzophenones (specifically, 4,4'-bis(dimethylamino)benzophenone, 4,4'-bis (dicyclohexylamino)benzophenone, 4,4'-bis(diethylamino) benzophenone, 4,4'-bis(dihydroxyethylamino)benzophenone), 4-methoxy-4'-dimethylaminobenzophenone, 4,4'-dimethoxybenzophenone, 4-dimethylaminobenzophenone, 4-dimethylaminoacetophenone, benzil, anthraquinone, 2-t-butyl anthraquinone, 2-methylanthraquinone, phenanthraquinone, xanthone, thioxanthone, 2-chloro-thioxanthone, 2,4-diethyl thioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, benzyl dimethyl ketal), acridone, chloroacridone, N-methyl acridone, N-butyl acridone, N-butyl-chloroacridone, and the like.

As the polymerization initiator, hydroxyacetophenone compounds, aminoacetophenone compounds, and acylphosphine compounds can also be suitably used. More specifically, for example, the aminoacetophenone-based initiators described in JP1999-291969A (JP-H10-291969A), and the acyl phosphine oxide-based initiators described in JP4225898B can also be used.

As the hydroxyacetophenone-based initiator, IRGACURE-184, DAROCUR-1173, IRGACURE-500, IRGACURE-2959, or IRGACURE-127 (all trade names: manufactured by BASF) can be used. As the aminoacetophenone-based initiator, commercially available products IRGACURE-907, IRGACURE-369, or IRGACURE-379 (all trade names: manufactured by BASF) can be used. As the aminoacetophenone-based initiator, the compounds described in JP2009-191179A in which the absorption wavelength matches a longer wavelength light source such as 365 nm or 405 nm, can also be used. In addition, as the acyl phosphine-based initiator, commercially available products IRGACURE-819 or DAROCUR-TPO (both trade names, manufactured by BASF) can be used.

As the polymerization initiator, more preferred examples include oxime-based compounds. As specific examples of oxime-based initiators, the compounds described in JP2001-233842A, the compounds described in JP2000-80068A, and the compounds described in JP2006-342166A can be used.

Examples of the oxime compounds such as oxime derivatives which are suitably used as a polymerization initiator in the present invention include, for example, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluensulfonylfoxy)iminobutan-2-one, and 2-ethoxycarbonyloxylimino-1-phenylpropan-1-one, and the like.

Examples of the oxime ester compounds include the compounds described in J.C.S. Perkin II (1979), pp. 1653-1660), J.C.S. Perkin II (1979), pp. 156-162, Journal of Photopolymer Science and Technology (1995), pp. 202-232, and JP2000-66385A, and the compounds described in JP2000-80068A, JP2004-534797A, and JP2006-342166A, respectively.

Among commercial products, IRGACURE-OXE01 (manufactured by BASF), and IRGACURE-OXE02 (manufactured by BASF) are also suitably used.

In addition, as oxime ester compounds other than those listed above, the compounds described in JP2009-519904A in which the oxime is linked to a carbazole N position, compounds described in U.S. Pat. No. 7,626,957B in which a hetero substituent has been introduced to a benzophenone site, the compounds described in JP2010-15025A and US2009-292039A, in which a nitro group has been introduced to a dye site, the ketoxime-based compounds described in WO 2009/131189A, the compounds described in U.S. Pat. No. 7,556,910A which contain a triazine skeleton and an oxime skeleton in one molecule, and the compounds described JP2009-221114A which have a good sensitivity to a g-ray light source having a maximum absorption at 405 nm, and the like, may also be used.

Further, the cyclic oxime compounds described in JP 2007-231000A and JP2007-322744A can also be suitably used. Among the cyclic oxime compounds, particularly a cyclic oxime compound fused with a carbazole dye described in JP2010-32985A and JP2010-185072A has a high light-absorbing property and attains high sensitivity, and thus is preferable.

In addition, the compounds described in JP2009-242469A which has an unsaturated bond on the specific sites of oxime compounds can also be suitably used, since high, sensitivity can be achieved by regenerating an active radical from a polymerization-inactive radical.

Most preferable examples thereof include the oxime compounds having a specific substituent shown in JP2007-269779A and the oxime compounds having a thioaryl group shown in JP2009-191061A.

Specifically, as an oxime-based polymerization initiator, the compound represented by the following formula (OX-1) is preferable. In addition, an N—O bond of the oxime may be an (E)-isomer of the oxime compound, or may be a (Z)-isomer of the oxime compound, or a mixture of the (E)-isomer and the (Z)-isomer.

(0X-1)

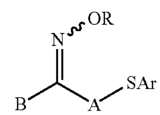

wherein, R and B each independently represent a monovalent substituent, A represents a divalent organic group, and Ar is an aryl group.

In the formula (OX-1), as the monovalent substituent represented by R, a monovalent nonmetallic atomic group is preferable.

Examples of the monovalent nonmetallic atomic group include an alkyl group, an aryl group, an acyl group, an alkoxycarbonyl group, an aryloxycarbonyl group, a heterocyclic group, an alkylthiocarbonyl group, an arylenethiocarbonyl group, and the like. In addition, these groups may have one or more substituents. In addition, the aforementioned substituents may be further substituted with other substituents.

Examples of the substituent include a halogen atom, an aryloxy group, an alkoxycarbonyl group, an aryloxycarbonyl group, an acyloxy group, an acyl group, an alkyl group, an aryl group, and the like.

The alkyl group which may have a substituent is preferably an alkyl group having 1 to 30 carbon atoms, and specifically, examples thereof can include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having 6 to 30 carbon atoms, and specifically, examples thereof can include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarterphenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, a ternaphthalenyl group, a tetranaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a tetraanthracenyl group, an anthraquinonyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having 2 to 20 carbon atoms, and specifically, examples thereof can include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having 2 to 20 carbon atoms, and specifically, examples thereof can include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent can include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or an aliphatic heterocycle containing a nitrogen atom, an oxygen atom, a sulfur atom, or a phosphorus atom.

Specific examples thereof can include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acrindinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Specific examples of the alkylthiocarbonyl group which may have a substituent can include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylhiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

In the formula (OX-1), examples of the monovalent substituent represented by B include an aryl group, a heterocyclic group, an arylcarbonyl group, and a heterocyclic carbonyl group. In addition, these groups may have one or more substituents. Examples of the substituents can include the aforementioned substituents. In addition, the aforementioned substituents may be further substituted by other substituents.

Among them, particularly preferred is the one having the following structures.

In the following structures, Y, X and n, respectively, have the same definitions as those of Y, X and n in the formula (OX-2), which will be explained below, and preferred examples thereof are also the same.

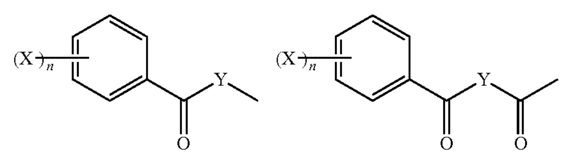

In the formula (OX-1), examples of the divalent organic group represented by A include an alkylene group having 1 to 12 carbon atoms, a cycloalkylene group, and an alkynylene group. In addition, these groups may have one or more substituents. Examples of the substituents can include the aforementioned substituents. In addition, the aforementioned substituents may be further substituted by other substituents.

Among them, as A in the formula (OX-1), from the viewpoint of improving sensitivity and inhibiting coloration by heating over time, an unsubstituted alkylene group, an alkylene group substituted by an alkyl group (for example, a methyl group, an ethyl group, a tert-butyl group, a dodecyl group), an alkylene group substituted by an alkenyl group (for example, a vinyl group, an allyl group), and an alkylene group substituted by an aryl group (for example, a phenyl group, a p-tolyl group, a xylyl group, a cumenyl group, a naphthyl group, an anthryl group, a phenanthryl group, a styryl group) are preferred.

In the formula (OX-1), the aryl group represented by Ar is preferably an aryl group having 6 to 30 carbon atoms, and also may have a substituent. Examples of the substituent can include the same substituents as those introduced to the substituted aryl group which is included as the specific examples of the aryl group which may have a substituent as described above.

Among them, from the viewpoint of improving sensitivity and inhibiting coloration by heating over time, a substituted or unsubstituted phenyl group is preferred.

In formula (OX-1), the "SAr" structure composed of the substituent Ar and the adjacent S in the formula (OX-1) is preferably any of the structures shown below, in view of sensitivity. In addition, Me represents a methyl group, and Et represents an ethyl group.

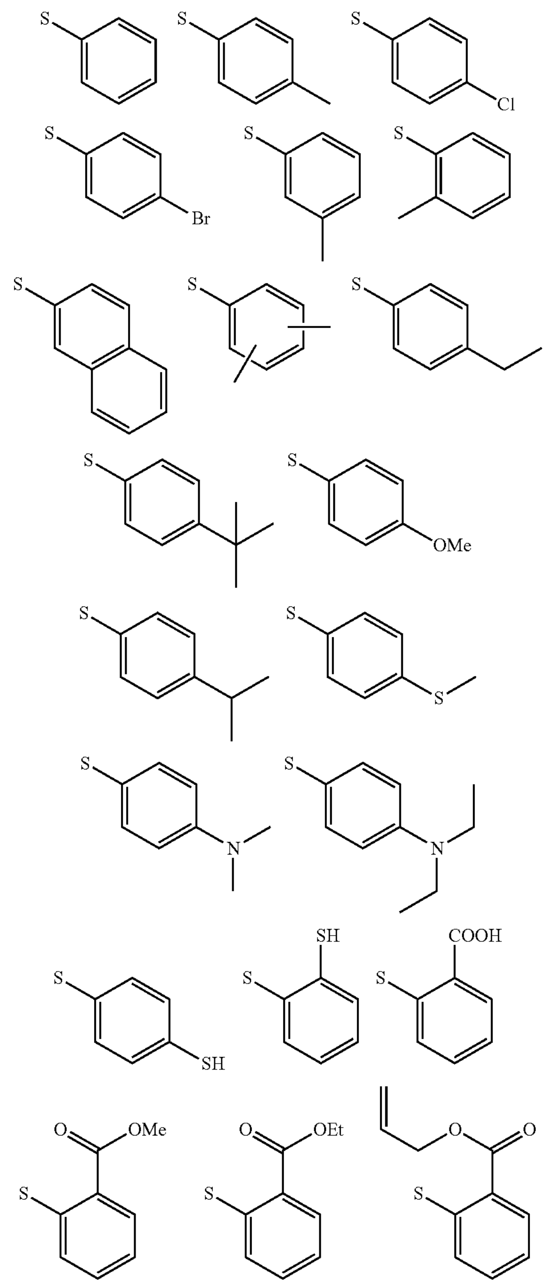

The oxime compound of the present invention is preferably a compound represented by the following formula (OX-2).

(0X-2)

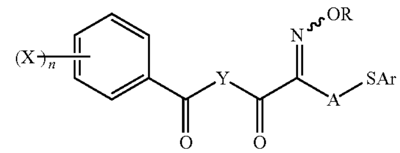

wherein, R and X each independently represent a monovalent, substituent, A and Y each independently represent a divalent organic group, Ar represents an aryl group, and n represents an integer of from 0 to 5.

In the formula (OX-2), R, A and Ar respectively have the same definitions as those of R, A and Ar the formula (OX-1), and preferred examples are also the same.

In the formula (OX-2), examples of the monovalent substituent represented by X include an alky group, an aryl group, an alkoxy group, an aryloxy group, an acyloxy group, an acyl group, an alkoxycarbonyl group, an amino group, a heterocyclic group, and a halogen atom. In addition, these groups may have one or more substituents. Examples of the substituents can include the aforementioned substituents. In addition, the aforementioned substituents may be further substituted by other substituents.

Among these, X in the formula (OX-2) is preferably an alkyl group, from the viewpoint of improving a solubility in solvents and an absorption efficiency in a longer wavelength region.

In addition, in the formula (OX-2), n represents an integer of from 0 to 5, preferably of from 0 to 2.

In the formula (OX-2), examples of the divalent organic group represented by Y include the structures shown below. In addition, in the groups shown below, the marks * indicate the positions of the bonds to the carbon atoms adjacent to Yin the formula (OX-2).

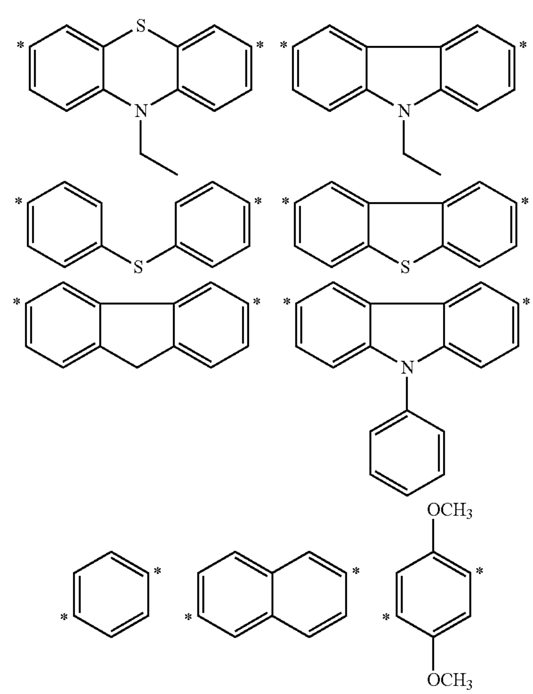

-continued

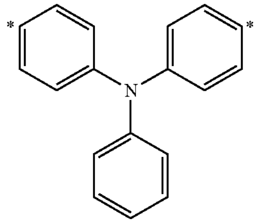

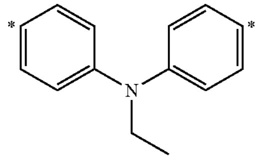

Among them, from the viewpoint of increasing sensitivity, the structures shown below are particularly preferred.

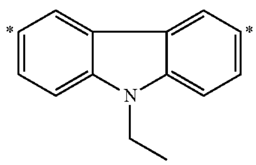

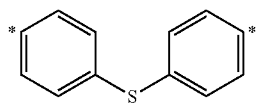

Hereinafter, while specific examples of the oxime compound which is suitably used will be described, the present invention is not limited to these examples.

(C-4)

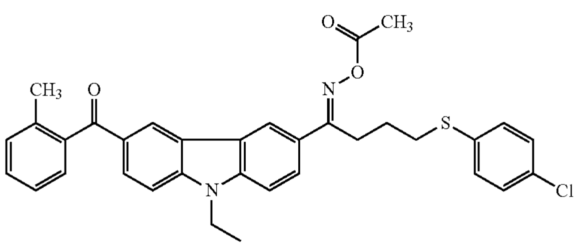

(C-5)

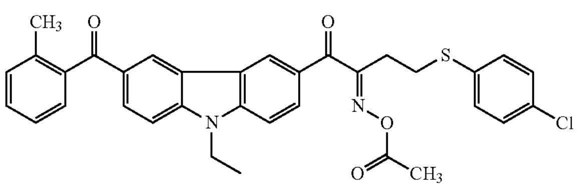

(C-6)

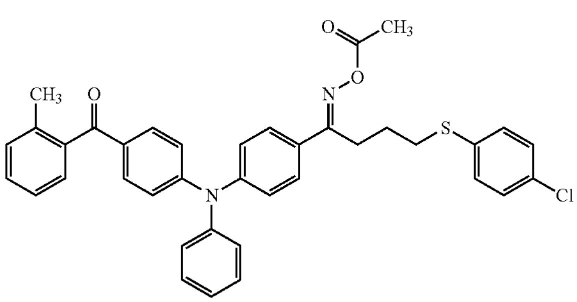

-continued (C-7)

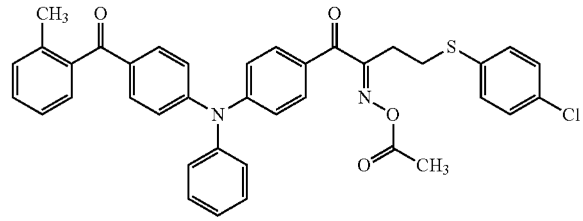

(C-8)

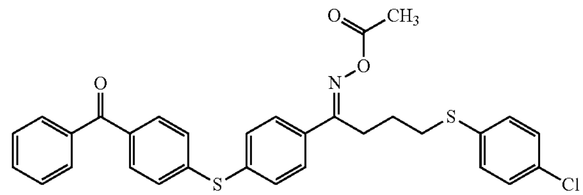

(C-9)

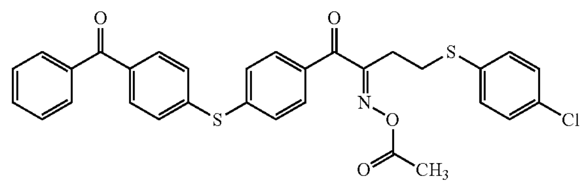

(C-10)

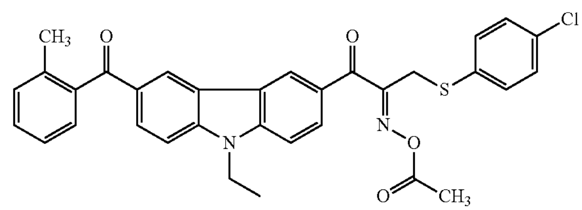

(C-11)

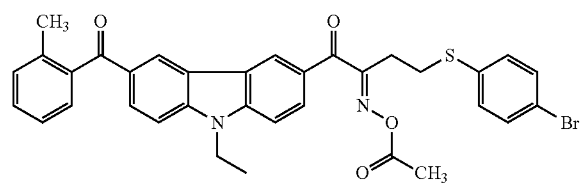

(C-12)

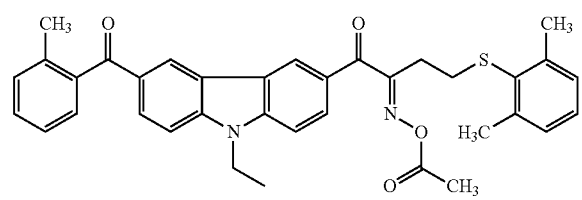

(C-13)

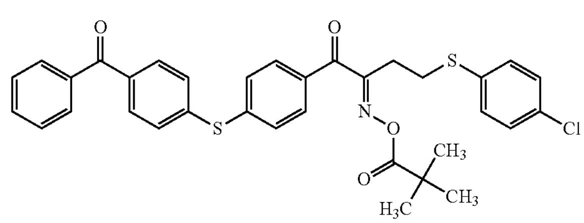

The oxime compound of the present invention has a maximum absorption wavelength in the wavelength range of from 350 nm to 500 nm, preferably has a maximum absorption wavelength in the wavelength range of from 360 nm to 480 nm, and particularly preferably has a high absorption at 365 nm and 455 nm.

The oxime compound of the present invention at 365 nm or 405 nm preferably has a molar extinction coefficient of 1,000 to 300,000, more preferably of 2,000 to 300,000, and particularly preferably of 5,000 to 200,000, from the viewpoint of sensitivity.

While the molar extinction coefficient of the compound can be measured using known methods, specifically, for example, it is preferably measured at a concentration of 0.01 g/L in a solvent of ethyl acetate with a UV-visible spectrophotometer (trade name: Carry-5 Spectrophotometer, manufactured by Varian Inc.).

The polymerization initiator used in the present invention may be used in a combination of two or more as necessary.

The polymerization initiator (D) used in the radiation-sensitive colored composition of the present invention is, from the viewpoint of exposure sensitivity, preferably a compound selected from the group consisting of trihalomethyl triazine compounds, benzyl dimethyl ketal compounds, α-hydroxyketone compounds, α-aminoketone compound, acyl phosphine compounds, phosphine oxide compounds, metallocene compounds, oxime compounds, triallyl imidazole dimer, onium compounds, benzothiazole compound, benzophenone compounds, acetophenone compounds and derivatives thereof, cyclopentadiene-benzene-iron complexes and salts thereof, halomethyl oxadiazole compounds, and 3-aryl-substituted coumarin compounds.

More preferred are trihalomethyl triazine compounds, α-aminoketone compound, acyl phosphine compounds, phosphine oxide compounds, oxime compounds, triallyl imidazole dimer, onium compounds, benzophenone compounds, and acetophenone compounds, and most preferred are at least one compound selected from the group consisting of trihalomethyl triazine compounds, α-aminoketone compounds, oxime compounds, triallyl imidazole dimer, and benzophenone compounds.

In particular, in a case of using the radiation-sensitive colored composition of the present invention in the production of color filters for a solid-state imaging device, since it is required to form a fine pattern with a sharp shape, it is important that there is development without residues on the unexposed portion, together with curability. From this viewpoint, as the polymerization initiator, it is particularly preferable to use oxime compounds. In particular, in a case of forming a fine pattern in the solid-state imaging device, although stepper exposure is used for the exposure for curing, this exposure device may be damaged by halogens, and it is required to keep the addition amount of a polymerization initiator low. Considering these, as the polymerization initiator (D) for forming a fine pattern such as a solid-state imaging device, it is most preferable to use oxime compounds.

The content of the photopolymerization initiator (D) contained in the radiation-sensitive colored composition of the present invention is preferably from 0.1% by mass to 50% by mass, more preferably from 0.5% by mass to 30% by mass, and still more preferably from 1% by mass to 20% by mass, relative to the total solid content of the radiation-sensitive colored composition. Within this range, suitable sensitivity and pattern formability are attained.

<Polymerization Inhibitor>

In the radiation-sensitive colored composition of the present invention, it is preferable that a small amount of a polymerization inhibitor be added in order to prevent an unnecessary thermal polymerization of the polymerizable compound during the manufacture or storage of a radiation-sensitive colored composition.

Examples of the polymerization inhibitor that can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a primary cerium salt of N-nitrosophenylhydroxyamine, and the like.

The addition amount of the polymerization inhibitor is preferably from approximately 0.01% by mass % to approximately 5% by mass, relative to the mass of the entire composition.

<Surfactant>

The radiation-sensitive colored composition of the present invention may contain various surfactants from the viewpoint of improving the coating property. As the surfactants, various surfactants such as a fluorine-containing surfactant, a nonionic surfactant, a cationic surfactant, an anionic surfactant, and a silicone-based surfactant can be used.

In particular, when the radiation-sensitive colored composition of the present invention contains a fluorine-containing surfactant, the liquid properties (in particular, fluidity) in a case of being prepared as a coating liquid is improved, thereby enabling further improvement in the uniformity of the coating thickness and the solvent sparing property.

That is to say, in a case of forming a film by using a coating liquid to which a radiation-sensitive colored composition containing a fluorine-containing surfactant is applied, due to decrease in the surface tension between the surface to be coated and the coating liquid, the wettability on the surface to be coated is improved, and the coating property on the surface to be coated is improved. For this reason, it is effective that, even when a thin film such as that of several micrometers has been formed with a small amount of the liquid, the formation of a film having uniform thickness with substantially only a little film unevenness can be more suitably performed.

The fluorine content in the fluorine-containing surfactant is preferably 3% by mass to 40% by mass, more preferably 5% by mass to 30% by mass, and particularly preferably 7% by mass to 25% by mass. A fluorine-containing surfactant having the fluorine content in this range is effective in the uniformity of the coating film thickness and the solvent sparing property, and has also a good solubility in the radiation-sensitive colored composition.

Examples of the fluorine-containing surfactant include MEGAFAC F171, F172, F173, F176, F177, F141, F142, F143, F144, R30, F437, F475, F479, F482, F554, F780 and F781 (the above are manufactured by DIC Corporation), FLUORAD FC430, FC431 and FC171 (the above are manufactured by Sumitomo 3M Limited), and SURFLON S-382, SC-101, SC-103, SC-104, SC-105, SC1068, SC-381, SC-383, 5393, and KH-40 (the above are manufactured by Asahi Glass Co., Ltd.), and the like.

—Specific examples of the nonionic surfactant include glycerol, trimethylolpropane, trimethylolethane, and ethoxylates and propoxylates thereof (for example, glycerol propoxylate, glycerol ethoxylate, and the like), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester (PLURONIC L10, L31, L61, L62, 10R5, 17R2 and 25R2, and TETRONIC 304, 701, 704, 901, 904 and 150R1, manufactured by BASF and SOLSPERSE 20000 manufacture by Lubrizol Japan Ltd.), and the like.

Specific examples of the cationic surfactant include a phthalocyanine derivative (trade name: EFKA-745, manufactured by Morishita & Co., Ltd.), an organosiloxane polymer KP341 (manufactured by Shin-Etsu Chemical Co., Ltd.), a (meth)acrylic acid-based (co)polymer POLYFLOW No. 75, No. 90, and No. 95 (manufactured by Kyoeisha Chemical Co., Ltd.), and W001 (manufactured by Yusho Co., Ltd.), and the like.

Specific examples of the anionic surfactant include W004, W005, W017 (manufactured by Yusho Co., Ltd.), and the like.

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA" and "TORAY SILICONE SH8400" (manufactured by Dow Corning Toray Co., Ltd.), "TSF-4440", "TSF-4300", "TSF-4445", "TSF-4460" and "TSF-4452" (manufactured by Momentive Performance Materials Inc.), "KP341", "KF6001", "KF6002" (manufactured by Shin-Etsu Silicone Co., Ltd.), and "BYK307", "BYK323" and "BYK330" (manufactured by BYK Chemie).

Only one surfactant may be used, or two or more surfactants may be used in combination.

The addition an amount of the surfactant is preferably from 0.001% by mass to 2.0% by mass, more preferably from 0.005% by mass to 1.0% by mass, relative to the total solid content of the radiation-sensitive colored composition.

<Alkali-Soluble Resin>

As the alkali-soluble resin, a linear organic high-molecular-weight polymer can be suitably selected from alkali-soluble resins having at least one group which promotes alkali-solubility in a molecule (preferably a molecule having an acryl-based copolymer or a styrene-based copolymer as a main chain). From the viewpoint of heat resistance, a polyhydroxy styrene-based resin, a polysiloxane-based resin, an acryl-based resin, an acrylamide-based resin, and an acryl/acrylamide copolymer resin are preferable, and from the viewpoint of the control of the developability, an acryl-based resin, an acrylamide-based resin, and an acryl/acrylamide copolymer resin are preferable.

Examples of the group which promotes alkali-solubility (which will be hereinafter also referred to as an acid group) include a carboxyl group, a phosphoric acid group, a sulfonic acid group, a phenolic hydroxyl group, and the like, but those having developability with an aqueous weakly alkaline solution that is soluble in an organic solvent are preferable, and (meth)acrylic acid is particularly preferable. These acid groups may be used singly or in combination of two or more kinds thereof.

Examples of the monomer that can provide an acid group after polymerization include a monomer having a hydroxyl group, such as 2-hydroxyethyl(meth)acrylate, a monomer having an epoxy group such as glycidyl(meth)acrylate, and a monomer having an isocyanate group such as a 2-isocyanatoethyl(meth)acrylate. The monomer for introducing the acid group may be used singly or in combination of two or more kinds thereof. In order to introduce the acid group into the alkali-soluble resins, for example, a monomer having an acid group and/or a monomer that can provide an acid group after polymerization (which may be hereinafter referred to as a "monomer for introducing an acid group" in some cases) as a monomer component can be polymerized.

Furthermore, when the monomer that can provide an acid group after polymerization is used as the monomer component to introduce the acid group, for example, the following treatment is required after polymerization to provide an acid group.

For the production of the alkali-soluble resin, for example, a method according to a known radical polymerization method may be employed. The polymerization conditions for the production of an alkali-soluble resin by a radical polymerization method, such as the temperature, the pressure, the kind and amount of the radical initiator, the kind of the solvent, and the like may be easily set by a person skilled in the art, and the conditions may also be experimentally determined.

As the linear organic high-molecular-weight polymer that is used as the alkali-soluble resin, a polymer having a carboxylic acid group in a side chain is preferable, and examples thereof include alkali-soluble phenol resins such as a methacrylic acid copolymer, an acrylic acid copolymer, an itaconic acid copolymer, a crotonic acid copolymer, a maleic acid copolymer, a partially esterified maleic acid copolymer, a novolac resin, and the like; an acidic cellulose derivative having a carboxylic acid group in a side chain; and a polymer obtained by adding an acid anhydride to a polymer having a hydroxyl group. A copolymer of (meth)acrylic acid and another monomer copolymerizable with (meth)acrylic acid is particularly preferable as the alkali-soluble resin. Examples of another monomer copolymerizable with (meth)acrylic acid include an alkyl(meth)acrylate, an aryl (meth)acrylate, a vinyl compound, and the like. Examples of the alkyl(meth)acrylate and the aryl(meth)acrylate include methyl(meth)acrylate, ethyl(meth)acrylate, propyl(meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl(meth)acrylate, naphthyl(meth)acrylate, cyclohexyl(meth)acrylate, and the like; and examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, and the like, and further include, as N-position substituted maleimide monomers described in JP1998-300922A (JP-H10-300922A), N-phenylmaleimide, N-cyclohexylmaleimide, and the like. In addition, other monomers capable of copolymerizing with the (meth)acrylic acid may be used singly or in combination of two or more kinds thereof.

The alkali-soluble resin also preferably includes a polymer (a) formed by polymerization of a monomer component necessarily having a compound represented by the following general formula (ED) (which may be hereinafter referred to as an "ether dimer" in some cases) as a polymer component (A) which is an essential component.

General Formula (ED)

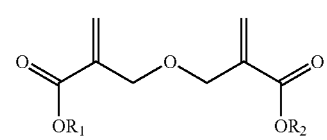

(in the formula (ED), $R^1$ and $R^2$ each independently represent a hydrogen atom or a hydrocarbon group having 1 to 25 carbon atoms, which may have a substituent.)

By including the polymer (a), the radiation-sensitive colored composition of the present invention can form a cured coating film having excellent heat resistance and transparency. In the general formula (ED) representing the ether dimer, a hydrocarbon group having 1 to 25 carbon atoms which may have a substituent, represented by $R^1$ and $R^2$, is not particularly limited, but examples thereof include linear or branched alkyl groups such as a methyl group, an ethyl group, a n-propyl group, an isopropyl group, a n-butyl group, an isobutyl group, a t-butyl group, a t-amyl group, a stearyl group, a lauryl group, or a 2-ethylhexyl group; aryl groups such as a phenyl group and the like; alicyclic groups such as a cyclohexyl group, a t-butyl cyclohexyl group, a dicyclopentadienyl group, a tricyclodecanyl group, an isobornyl group, an adamantyl group, or a 2-methyl-2-adamantyl group, alkoxy-substituted alkyl groups such as a 1-methoxyethyl group, or a 1-ethoxyethyl group, aryl group-substituted alkyl groups such as a benzyl group; and the like. Among these, a primary or secondary hydrocarbon group which is resistant to elimination by acid or heat, such as a methyl group, an ethyl group, a cyclohexyl group, or a benzyl group, is particularly preferable. [0699] Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methyl ene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methyl ene)]bis-2-propenoate, di(lauryl)-2,2'-[oxybis(methyl ene)]bis-2-propenoate, di(2-ethylhexyl)-2,2'-[oxybis(methylene)]bis-2-propenoate, di(1-methoxy ethyl)-2,2'-[oxybis(methylene)]bis-2-propenoate, di(1-ethoxy ethyl)-2,2'-[oxybis(methylene)]bis-2-propenoate, dibenzyl-2,2'-[oxybis(methyl ene)]bis-2-propenoate, di phenyl-2,2'-[oxybis(methylene)]bis-2-propenoate, dicyclohexyl-2,2'-[oxybis(methylene)]bis-2-propenoate, di(t-butyl cyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl 2,2'-[oxybis(methylene)]bis-2-propenoate, di(2-methyl-2-adamantyl)-2,2'-[oxybis (methylene)]bis-2-propenoate, and the like. Among these, dimethyl-2,2'-[oxybis(methylene)]bis-2-propenoate, di ethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used singly or in combination of two or more kinds thereof. For a structure derived from a compound represented by the general formula (ED), other monomers may also be copolymerized.

Furthermore, an alkali-soluble resin having a polymerizable group may be used in order to improve the crosslinking efficiency of the radiation-sensitive colored composition of the present invention. As an example of the alkali-soluble resin having a polymerizable group, alkali-soluble resins such as a polymer having an allyl group, a (meth)acryl group, an allyloxyalkyl group, or the like at a side chain thereof are useful. Examples of the polymer having a polymerizable group described above include commercial products including Dianal NR series (manufactured by Mitsubishi Rayon Co., Ltd.), PHOTOMER 6173 (polyurethane acrylic oligomer containing a COOH group, manufactured by Diamond Shamrock Co., Ltd.), VISCOAT R-264 and KS RESIST-106 (both manufactured by Osaka Organic Chemistry Industry, Ltd.), CYCLOMER P series and PLACCEL CF200 series (both manufactured by Daicel Chemical Industries, Ltd.), EBECRYL 1380 (manufactured by Daicel-Cytec Co., Ltd.) and the like. Preferable examples of the alkali-soluble resin having a polymerizable group include an urethane-modified and polymerizable double bond-containing acryl resin obtained by the reaction of a carboxyl group-containing acryl resin and a (meth)acryloyl group-containing compound in which one unreacted isocyanate group has been left by the preliminary reaction of the isocyanate groups and OH groups, an unsaturated group-containing acryl resin obtained by the reaction of a carboxyl group-containing acryl resin and a compound containing an epoxy group and a polymerizable double bond in the molecule, an acid pendant type epoxy acrylate resin, a polymerizable double bond-containing acryl resin obtained by the reaction of an OH group-containing acryl resin and a dibasic acid anhydride having a polymerizable double bond, a resin obtained by the reaction of an OH group-containing acryl resin and a compound having an isocyanate group and a polymerizable group, and a resin obtained by a basic treatment of a resin having in a side chain thereof an ester group having at the α- or β-position thereof an elimination group such as a halogen atom or a sulfonate group as described in JP2002-229207A and JP2003-335814A, and the like.

As the alkali-soluble resin, a benzyl(meth)acrylate/(meth) acrylic acid copolymer and a multi-component copolymer of benzyl(meth)acrylate/(meth)acrylic acid/another monomer are particularly preferable. Other examples include a copolymer of 2-hydroxyethyl methacrylate, and copolymers described in JP1995-140654A (JP-H07-140654A), such as a 2-hydroxy propyl (meth)acrylate/polystyrene macromonomer/benzyl methacrylate/methacrylic acid copolymer, a 2-hydroxy-3-phenoxy propyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like, and particularly preferably a methacrylic acid benzyl/methacrylic acid copolymer, and the like.

Specific examples that are preferably used in the present invention are shown below.

(J1)

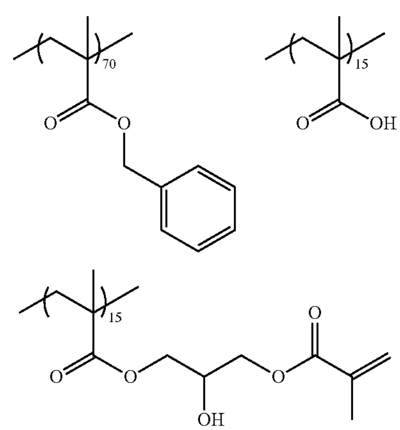

Mw 15,000

-continued (J2)

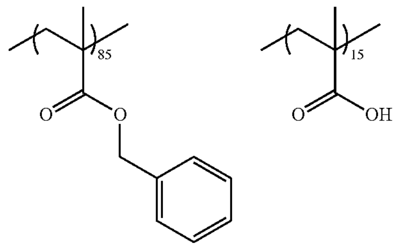

Mw 15,000

(J3)

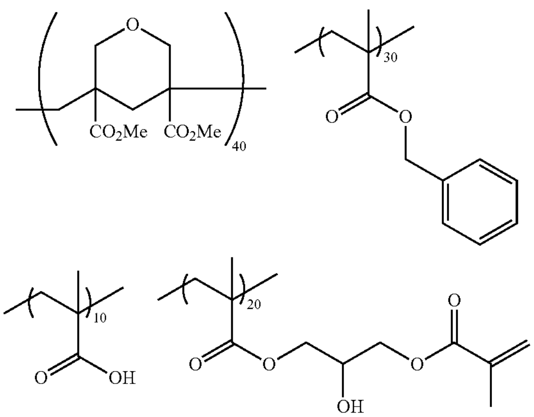

Mw 10,000

(J4)

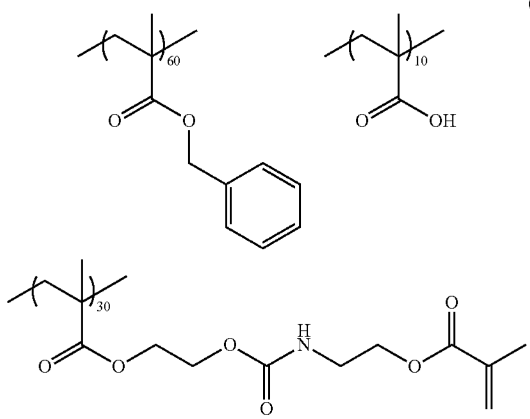

Mw 8,000

(J5)

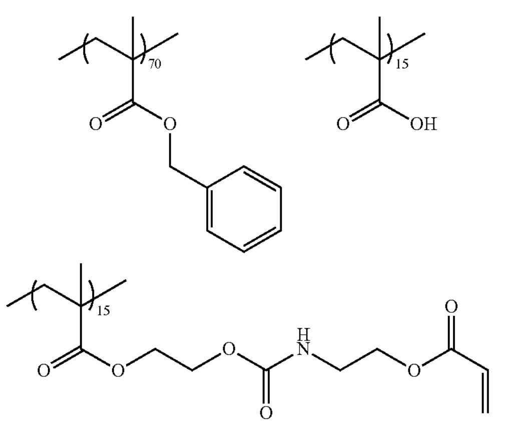

Mw 20,000

-continued (J6)

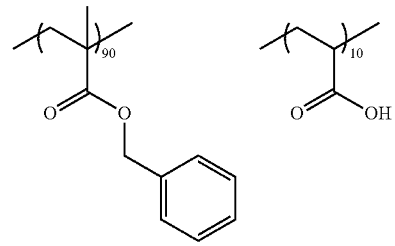

Mw 10,000

(J7)

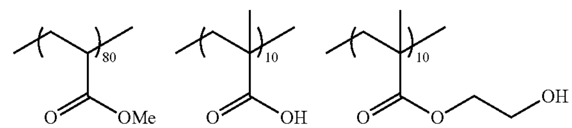

Mw 8,000

(J8)

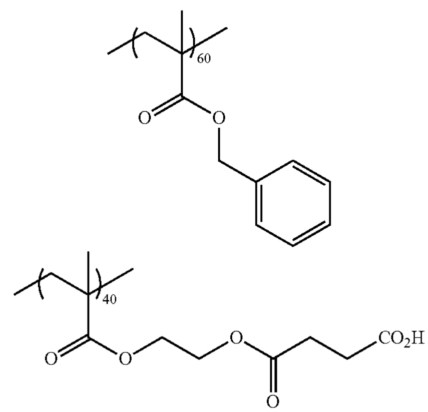

Mw 12,000

(J9)

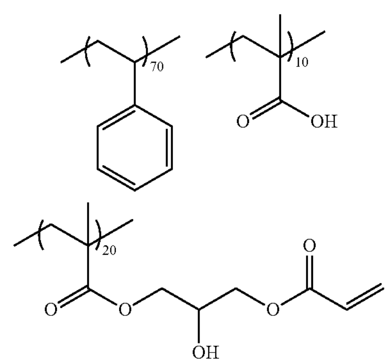

Mw 10,000

Among the specific examples above, (J1), (J3), (J4), (J5), and (J9) are preferable, and (J1), (J3), and (J4) are more preferable, from the viewpoints of heat resistance, solvent resistance, color transfer, and color unevenness.

The acid value of the alkali-soluble resin is preferably from 30 mg KOH/g to 200 mg KOH/g, more preferably from 50 mg KOH/g to 150 mg KOH/g, and most preferably from 70 mg KOH/g to 120 mg KOH/g.

Furthermore, the weight average molecular weight (Mw) of the alkali-soluble resin is preferably from 2,000 to 50,000, more preferably from 5,000 to 30,000, and most preferably from 7,000 to 20,000.

The content of the alkali-soluble resin in the radiation-sensitive colored composition is preferably from 1% by mass to 15% by mass, more preferably from 2 to 12% by mass, and particularly preferably from 3% by mass to 10% by mass, relative to the total solid content of the radiation-sensitive colored composition.

<Other Components>

Further, in the present invention, to improve the physical properties of the cured film, inorganic fillers, plasticizers, an adhesion promoter capable of enhancing the adhesion of the film to a substrate, may be incorporated into the composition. In addition, needless to say, the ratio of the contents of each component relative to the total solid content in the composition does not exceed 100% by mass.

As the plasticizers, for example, dioctyl phthalate, didodecyl phthalate, triethylene glycol dicaprylate, dimethyl glycol phthalate, tricresyl phosphate, dioctyl adipate, dibutyl sebacate, or triacetyl glycerin can be used.

While as an adhesion promoter, known materials can be used, it is preferable to use especially silane-based coupling agents, titanate-based coupling agents, and aluminum-based coupling agents.

<<Color Filter and Method of Producing the Same>>

Next, the color filter and the method of producing the same will be explained.

The color filter of the present invention is characterized by having a patternwise colored cured film formed by using the radiation-sensitive colored composition of the present invention, on a substrate thereof.

Furthermore, during the preparation of the radiation-sensitive colored composition according to the present invention, for the purpose of removing foreign materials or reducing defects, it is preferable to mix of each of the components and then to filter the same through a filter. The filter may be used without particular limitation as long as it has been conventionally used for filtering applications or the like. Specific examples of the filter include fluorine resins such as using PTFE (polytetrafluoroethylene), polyamide-based resins such as nylon-6, and nylon-6,6, and the like, polyolefin resins such as polyethylene, polypropylene (PP), (having high-density and ultra-high-molecular-weight), or the like. Among these filter materials, polypropylene (including high-density polypropylene), and polyamide-based resins such as nylon-6, and nylon-6,6, are preferable.

The pore diameter of the filter is preferably about 0.01 μm to 7.0 μm, preferably about 0.01 μm to 2.5 μm, and more preferably about 0.01 μm to 2.0 μm. Within these ranges, fine foreign material which interferes with the preparation of the uniform radiation-sensitive colored composition in later steps, can be clearly removed, and also the formation of a uniform and smooth radiation-sensitive colored composition can be attained.

When using the filter, another filter may be used in combination therewith. Herein, the filtering using a first filter may be carried out only once or twice or more times. Furthermore, a first filter having a different pore diameter from those within the above-described ranges may be combined, thereby the first filter is taken as one consisting of plural filters, which may be used as the first filtration. Herein, as the pore diameter, it is possible to apply nominal values of filter manufacturers. As a commercially available filter, it is possible to select one from various filters provided by Nihon Pall Ltd., Advantec Toyo Kaisha, Ltd., Nihon Entegris K. K. (former Nihon Mykrolis K. K), Kitz Microfilter Corporation, and the like.

A second filter which is formed of the same materials as the first filter may be used.

Furthermore, for example, filtration with the first filter may be carried out only for pigment dispersed material, or the second filtration may be carried out after mixing the pigment dispersed material with other components to form the radiation-sensitive colored composition.

Hereinafter, with respect to the color filter of the present invention, a method of producing the same will be described.

The method for producing the color filter of the present invention includes: applying the colored curable composition of the present invention onto a support to form a colored layer including the radiation-sensitive colored composition; exposing the thus-formed colored layer via a mask; and developing the exposed colored layer to form a patternwise colored cured film.

Hereinafter, each process in the production method of the present invention will be explained.

<Colored Layer Forming Process>

In the colored layer forming process, the colored curable composition of the present invention is applied onto a support to form a colored layer including the radiation-sensitive colored composition.

Examples of the support used for the present process include, alkali-free glass, soda glass, PYREX (Registered trademark) glass, and quartz glass, which are used for liquid crystal display apparatus, and those glass materials on which a transparent electroconductive film has been adhered, and photoelectric conversion device substrates (for example, silicon substrates, and the like) used for solid-state imaging devices (CCD or CMOS), and the like, and Complementary Metal-Oxide Semiconductor (CMOS), and the like. Black stripes for separating each pixel may be formed on these substrates.

In addition, a primer layer may be placed on these substrates, as necessary, in order to improve adherence to the upper layer, prevent diffusion of the materials, or planarize the substrate surface.

As the method of applying the radiation-sensitive colored composition of the present invention onto a support, various coating processes, such as slit coating, ink jet method, spin coating, casting coating, roll coating or a screen printing method, to form a colored curable composition layer, can be applied.

The film thickness immediately after the coating of the radiation-sensitive colored composition is determined from the viewpoint of uniformity of the film thickness of the coated film, ease of drying of the coating solvent, and the film thickness after drying, and it is preferable that according to this, the coating method be adjusted.

The drying of the radiation-sensitive colored composition coated on the substrate (pre-baking) can performed on a hot plate or in an oven, and the like at 50° C. to 140° C. for 10 to 300 seconds.

<Exposure Process>

In the exposure process, a colored layer formed in said colored layer forming process is exposed via a mask having a predetermined mask pattern.

In the exposure of this process, the exposing of the pattern of the colored layer can be performed by exposing the layer via a predetermined pattern, and by curing only the light-irradiated portion of the colored layer. As a radiation that can be used in this exposure, in particular, ultraviolet rays such as g-rays, h-rays or i-rays are preferably used. An irradiation dose is preferably 5 mJ/cm$^2$ to 1500 mJ/cm$^2$, more preferably 10 mJ/cm$^2$ to 1000 mJ/cm$^2$, and most preferably 10 mJ/cm$^2$ to 500 mJ/cm$^2$.

<Development Process>

Subsequently, by performing an alkaline developing treatment (development process), an unexposed portion is eluted by an alkaline aqueous solution and only photocured portions remain. Production of the color filter can be performed by developing with a developer to form a patternwise colored cured film including pixels of each color (3 colors or 4 colors or more). As the developer, while an organic alkaline developer which does not cause damage to the underlying circuit is preferable, an inorganic alkali developer can also be used. The developing temperature is normally from 20° C. to 40° C., and the developing time is from 20 seconds to 90 seconds.

Examples of the alkaline agent used for the developer include organic alkaline compounds such as aqueous ammonium, ethylamine, diethylamine, dimethylethanolamine, tetramethylammonium hydroxide, tetraethyl ammonium hydroxide, choline, pyrrole, piperidine, or 1,8-diazabicyclo-[5.4.0]-7-undecene, and inorganic compounds, and the like, such as sodium hydroxide, potassium hydroxide, sodium hydrogen carbonate, or potassium sodium hydrogen carbonate, and an aqueous alkaline solution wherein these alkaline agents have been diluted with pure water so as to have the concentration of 0.001% by mass to 10% by mass, preferably 0.01% by mass to 1% by mass, is preferably used as a developer. In addition, in a case of using a developer consisting of such alkaline aqueous solution, generally, washing with pure water (rinsing) is performed after development. Then, drying is performed.

Furthermore, in the production method of the present invention, after a colored layer forming process, an exposure process, and a development process, as described above, are performed, if necessary, a curing process of curing the formed colored cured film by heating (post baking) and by curing by exposure, may be included.

The post baking is a heat treatment after development, for accomplishing complete curing, and thermal curing treatment is typically performed at 100° C. to 240° C. In a case where the substrate is a glass or a silicon substrate, within the above temperature range, the range of from 200° C. to 240° C. is preferable.

The post baking treatment can take place by treating the coated film after the development continuously or batchwise using heating tools such as a hot plate or a convection oven (heat air circulation drier), or a high frequency heater, so as to have the above conditions.

The colored layer forming process, the exposure process, and the development process (further, the curing process) described above are repeated as many times as the number of the desired hues, and the color filter composed of the desired hue is produced.

[Color Filter for Solid-State Imaging Device and the Method of Producing the Same]

The production method of a color filter for a solid-state imaging device of the present invention includes a process of imparting the aforementioned radiation-sensitive colored composition of the present invention onto a substrate for forming a radiation-sensitive colored composition layer (hereinafter, also referred to as the "radiation-sensitive colored composition layer forming process"), a process of exposing the radiation-sensitive colored composition layer above via a mask (hereinafter, also referred to "exposure process"), a process of developing the radiation-sensitive colored composition layer after the exposure to form a patternwise colored cured film (hereinafter, also referred to as "colored pixel") (hereinafter, also referred to as "development process").

In addition, the color filters for the solid-state imaging device of the present invention are those prepared by the method of producing a color filter for the solid-state imaging device of the present invention.

The color filter for the solid-state imaging device of the present invention may have at least the patternwise blue cured film (blue pixel) prepared by the method of production for the solid-state imaging device of the present invention. As the specific forms of the color filter for the solid-state imaging device of the present invention, for example, the form of a multichromic color filer in which the patternwise blue cured film is combined with other patternwise blue cured film (for example, three or more-color filter having at least the blue cured film, a patternwise red cured film and a patternwise green cured film) are suitable.

Hereinafter, the color filter for the solid-state imaging device is sometimes simply referred to as "color filters".

<Radiation-Sensitive Colored Composition Layer Forming Process>

In the radiation-sensitive colored composition layer forming process, a radiation-sensitive colored composition layer is formed by imparting the color radiation-sensitive colored composition of the present invention onto a support.

As a support which may be used for this process, for example, a substrate (for example, silicon substrate) for a solid-state imaging device wherein an imaging device (light-receiving element) such as a CCD (Charge Coupled Device) or a CMOS (Complementary Metal-Oxide Semiconductor) is placed on a substrate can be used.

The patternwise colored cured film of the present invention (hereinafter, also referred to as "colored pattern") may be formed on the side of the imaging device forming surface of the substrate for solid-state imaging (front surface), or may be formed on the side of the imaging device non-forming surface (back surface).

Between each imaging device on the substrate for the solid-state imaging device, or on the back surface of the substrate for the solid-state imaging device, a light-shielding film may be placed.

In addition, a primer layer may be placed on the substrate, as necessary, in order to improve adhesiveness to the upper layer, prevent diffusion of the materials, or planarize the substrate surface.

As the method of imparting the radiation-sensitive colored composition of the present invention onto a support, various coating processes, such as slit coating, ink jet method, spin coating, casting coating, roll coating or screen printing method, to form a colored curable composition layer, can be applied.

The thickness of the radiation-sensitive colored composition layer is preferably 0.1 μm to 10 μm, more preferably 0.2 μm to 5 μm, and still more preferably 0.2 μm to 3 μm.

The drying of the radiation-sensitive colored composition coated on the substrate (pre-baking) can performed on a hot plate or in an oven, and the like at 50° C. to 140° C. for 10 to 300 seconds.

<Exposure Process>

In the exposure process, the radiation-sensitive colored composition layer formed in the radiation-sensitive colored composition layer forming process is, for example, patternwise exposed via a mask having a predetermined mask pattern, using an exposure apparatus such as stepper.

As the radiation (light) that can be used in the exposure, in particular, ultraviolet rays such as g-rays or i-rays is preferably (particularly preferably i-rays) used. An irradiation dose (exposure dose) is preferably 30 mJ/cm$^2$ to 1500 mJ/cm$^2$, more preferably 50 mJ/cm$^2$ to 1000 mJ/cm$^2$, and most preferably 80 mJ/cm$^2$ to 500 mJ/cm$^2$.

<Development Process>

Subsequently, by performing alkaline developing treatment, the radiation-sensitive colored composition layer of the unexposed portion in the exposure process is eluted in an alkaline aqueous solution and only photocured portions remain.

As the developer, an organic alkaline developer which does not cause damage to the underlying imaging device or circuit is preferable. The developing temperature is normally from 20° C. to 30° C., and the developing time is from 20 seconds to 90 seconds. To remove the residue therefrom, it may be conducted for from 120 seconds to 180 seconds. Further, there is also a case where a process of shaking off the developer every 60 seconds and further supplying a new developer is repeated several times.

Examples of the alkaline agent used for the developer include organic alkaline compounds such as aqueous ammonia, ethylamine, diethylamine, dimethylethanolamine, tetramethylammonium hydroxide, tetraethylammonium hydroxide, choline, pyrrole, piperidine, or 1,8-diazabicyclo-[5.4.0]-7-undecene, and an aqueous alkaline solution wherein these alkaline agents have been diluted with pure water so as to have the concentration of 0.001% by mass to 10% by mass, preferably 0.01% by mass to 1% by mass, is preferably used as a developer.

Furthermore, for the developer, inorganic alkali compounds may be used, and as the inorganic alkali, sodium hydroxide, potassium hydroxide, sodium carbonate, sodium hydrogen carbonate, sodium silicate, sodium metasilicate, and the like are preferable.

Furthermore, a case of using a developer consisting of such an alkaline aqueous solution, and generally, washing with pure water (rinsing) is performed after development.

Then, after performing drying, heat treatment (post baking) is preferably performed. If a colored pattern with multicolor is intended to be formed, a cured film can be produced by repeating said process for each color sequentially. According to this, a color filter is obtained.

Post baking is a heat treatment after development for accomplishing complete curing, and a thermal curing treatment is typically performed at 100° C. to 240° C., preferably 200° C. to 240° C.

The post baking treatment can take place by treating the coating film after the development continuously or batchwise using heating tools such as a hot plate or convection oven (heat air circulation drier) or a high frequency heater, so as to have the above conditions.

In addition, the production method of the present invention, if necessary, as a process other than the above, may have a process known as a method of producing a color filter for a solid-state imaging device. For example, after the radiation-sensitive colored layer forming process, the exposure process, and the development process, as described above, are performed, if necessary, a curing process of curing the formed colored pattern by heating and by curing by exposure, may be included.

In addition, in a case of using the radiation-sensitive colored composition according to the present invention, for example, the clogging of the nozzle of the discharge unit or the pipe unit, in a coating applicator, or the adhesion or the sedimentation of the radiation-sensitive colored composition or pigment into the coater, contamination from drying, and the like, sometimes may occur. Thus, in order to efficiently wash contamination caused by the radiation-sensitive colored composition of the present invention, the aforementioned solvents involved in the present invention are preferably used as a cleaning liquid. In addition, cleaning liquids described in JP1995-128867A (JP-H7-128867A), JP1995-146562A (JP-H7-146562A), JP1996-278637A (JP-H8-278637A), JP2000-273370A, JP2006-85140A, JP2006-291191A, JP2007-2101A, JP2007-2102A, and JP2007-281523A, and the like, can also be suitably used for washing off the radiation-sensitive colored composition according to the present invention.

Of the above, alkylene glycol monoalkyl ether carboxylate and alkylene glycol monoalkyl ether are preferable.

These solvents may be used alone or in a mixture of two or more thereof. In a case of mixing two or more thereof, it is preferably to mix a solvent having a hydroxyl group with a solvent having no hydroxyl group. The mass ratio of the solvent having a hydroxyl group and the solvent having no hydroxyl group is 1/99 to 99/1, preferably 10/90 to 90/10, and more preferably 20/80 to 80/20. In the mixed solvent of propylene glycol monomethyl ether acetate (PGMEA) and propylene glycol monomethyl ether (PGME), the ratio is particularly preferably 60/40. Furthermore, in order to improve the permeability of the cleaning liquid to the contaminant, the aforementioned surfactants which can be used in the present invention may be added to the cleaning liquid may be used in the foreground.

The color filter for solid-state imaging device of the present invention uses the radiation-sensitive colored composition of the present invention, and therefore, has fewer peeling defects and residue defects, and also has an excellent heat resistance of the colored pattern.

The color filter for solid-state imaging device of the present invention can be suitably used for solid-state imaging devices such as a CCD and a CMOS, and is particularly suitably used for a CCD or a CMOS, and the like having high resolutions exceeding one million pixels. The color filter for solid-state imaging device of the present invention can be used, for example as the color filter which is disposed between the light-receiving area of each pixel constituting the CCD or CMOS, and the microlens for light collecting.

The thickness of the colored pattern (colored pixel) in the color filter for solid-state imaging device of the present invention is preferably 2.0 μM or less, and more preferably 1.0 μm or less.

In addition, the size (the wide of pattern) of the colored pattern (colored pixel) is preferably 2.5 μm or less, more preferably 2.0 μm or less, and particularly preferably 1:7 μm or less.

[Solid-State Imaging Device]

The solid-state imaging device of the present invention includes the color filter for solid-state imaging device of the present invention. The configuration of the solid-state imaging device of the present invention is not specifically limited so long as it is a configuration that includes the color filter for solid-state imaging device of the present invention and acts as a solid-state imaging device, but examples may include the following configuration.

That is to say, the solid-state imaging device has a constitution that has, on a support, plural photodiodes that constitute a light-receiving area of a solid-state imaging device (a CCD image sensor, a CMOS image sensor, and the like), and a transport electrode composed of polysilicone, and the like; a light-shielding film which is formed on the photodiodes and the transport electrode, and which is composed of tungsten or the like, and which has an aperture only on the light-receiving area of the photodiodes; a device protective film which is composed of silicon nitride, and the like and is formed on the light-shielding film so as to cover the entire surface of the light-shielding film and the photodiode detecting area; and the color filter for solid-state imaging device of the present invention on the device protective film.

Further, a configuration which has a light collecting element (for example, a microlens, and the like, which has this meaning in the description below) on the device protective layer and under the color filter (i.e., at a side close to the support), or a configuration has a light collecting element on the color filter, and the like, may also be employed.

Liquid Crystal Display Apparatus>>

The color filter of the present invention can be used for not only the aforementioned solid-state imaging device but also a liquid crystal display apparatus, and is particularly suitable for a liquid crystal display apparatus. In a case where it is used in a liquid crystal display apparatus, even while containing the metal complex dye as a colorant excellent in heat resistance and spectroscopic properties, it has less poor alignment of liquid crystal molecules due to the decrease in resistivity, and has a good tint of the display image and is excellent in display properties.

For this reason, the liquid crystal display apparatus including a color filter of the present invention can display high quality images with a good hue of the display image and excellent display properties.

The definition of a display apparatus and the explanation of each display apparatus are described, for example, in "Electronic Display apparatus (Akio SASAKI, Kogyo Chosakai Co., Ltd., published in 1990", "Display apparatus (Sumiaki IBUKI, Sangyo Tosho Co., Ltd., published in 1989)", and the like. In addition, liquid crystal display apparatus are described, for example, in "Next Generation Liquid Crystal Display Techniques" (edited by Tatsuo UCHIDA, Kogyo Chosakai Co., Ltd., published in 1994). The liquid crystal display apparatus to which the invention may be applied is not specifically limited, and the invention may be applied to various liquid crystal display apparatus described, for example, in the above "Next Generation Liquid Crystal Display Techniques".

The color filter of the invention may be used for a color TFT-type liquid crystal display apparatus. Color TFT-type liquid crystal display apparatus are described, for example, in "Color TFT Liquid Crystal Display" (Kyoritsu Shuppan Co., Ltd., published in 1996). Further, the invention may also be applied to a liquid crystal display apparatus with a wider view angle, such as a horizontal electric field driving system such as IPS, or a pixel splitting system such as MVA, or STN, TN, VA, OCS, FFS, R—OCB and the like.

In addition, the color filter of the present invention may also be provided for a COA (Color-filter On Array) type, which has high brightness and high definition. In the COA-type liquid crystal display apparatus, the color filter layer should satisfy, in addition to normal requirements as mentioned above, requirements for an interlayer dielectric film, that is to say, low dielectric constant and resistance to a releasing solution. In the color filter of the present invention, by using a dye excellent in tint, it has a good color purity, light permeability, and the like, and is excellent in the tint of color pattern (pixel), and thereby can provide a COA-type liquid crystal display apparatus which has high resolution and is excellent in long term durability. Furthermore, in order to satisfy the requirement of low dielectric constant, a resin coating may be placed on the color filter layer.

These image display types are described, for example, on page 43 of "EL, PDP, LCD Display-Latest Current of Technique and Market (Research Study Division of Toray Research Center, Inc., published in 2001)", and the like.

The liquid crystal display apparatus including the color filter of the present invention is composed of not only the color filter of the present invention but also various members such as an electrode substrate, a polarization film, a phase difference film, a back light, a spacer, and a view angle compensation film. The color filter of the present invention may be applied to a liquid crystal display apparatus including these various known members. These members are described, for example, in "'94 Market of Liquid Crystal Display Related Materials And Chemicals (Kentaro SHIMA, CMC CO., LTD., published in 1994)" and "2003 Current State And Perspective Of Liquid Crystal Related Market (Volume Two) (Ryokichi OMOTE, Fuji Chimera Research Institute, Inc., published in 2003)".

Back lights are described, for example, in SID meeting Digest 1380 (2005) (A. Konno et. al) and Monthly Display, 2005 December, pages 18 to 24 (Hiroyasu SHIMA) and pages 25-30 (Takaaki YAGI), and the like.

When the color filter of the present invention is used for a liquid crystal display apparatus, a high contrast can be realized in a case of combining with a conventionally known three-wavelength cold-cathode tube, and further by using red, green and blue LED light sources (RGB-LED) as a back light, a liquid crystal display apparatus having a high brightness, a high color purity, and a good color reproducibility can be provided.

As described above, according to the invention, there is obtained a red to purple dye for color compensation, containing a dye multimer including, as a partial structure of a dye site, a dipyrromethene metal complex compound and a tautomer thereof obtained from a dipyrromethene compound and a metal or a metal compound, which are excellent in spectroscopic properties and heat resistance. Further, there is obtained a radiation-sensitive colored composition, from which the cured colored film formed has a resistance, to the mixed color in the production color filter fabrication process, that is to say, an excellent solvent resistance and an excellent resistance to color transfer in a thermal curing process. For this reason, the problems which could not be achieved with the color resists using conventional dyes for color compensation have been solved, and the composition is particularly useful for the color filter which is used for a solid-state imaging device and a display apparatus (for example, liquid crystal display apparatuses and organic EL display apparatuses, and the like).

EXAMPLE

Hereinafter, while the present invention will be described in more detail with the examples, the present invention is not intended to be limited these examples. Furthermore, unless otherwise specified, "parts" are based on mass.

Synthesis Example 1

According to the method as described in paragraph Nos. [0186] to [0213] of JP2010-85758A, Dye a described in the following scheme was obtained. More specifically, it is described as follows.

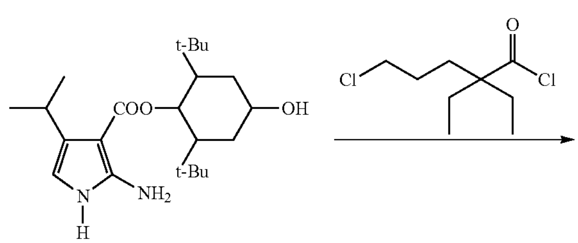

Intermediate 1

-continued
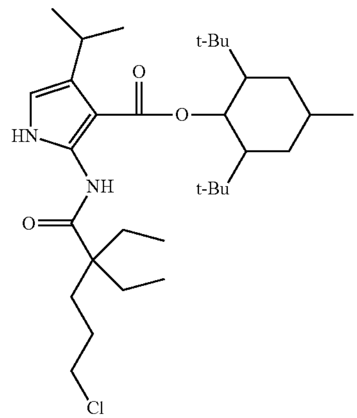
Intermediate 2
Intermediate 2 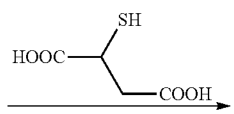
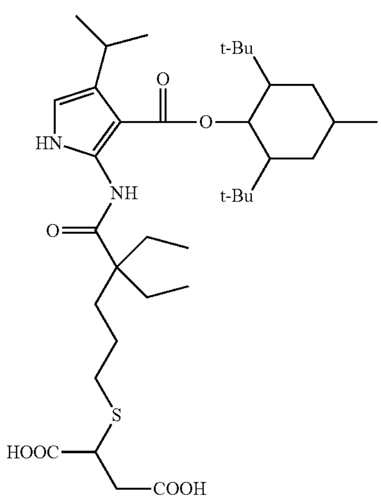
Intermediate 3
Intermediate 2 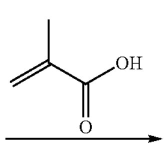
-continued
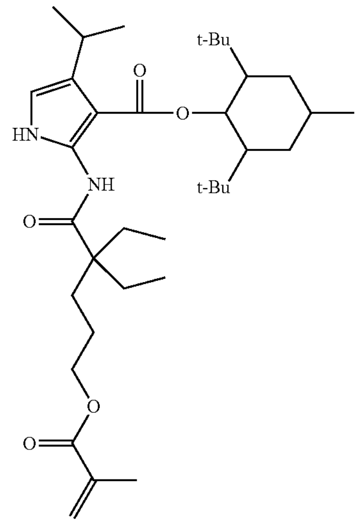
Intermediate 4
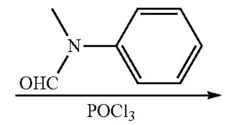
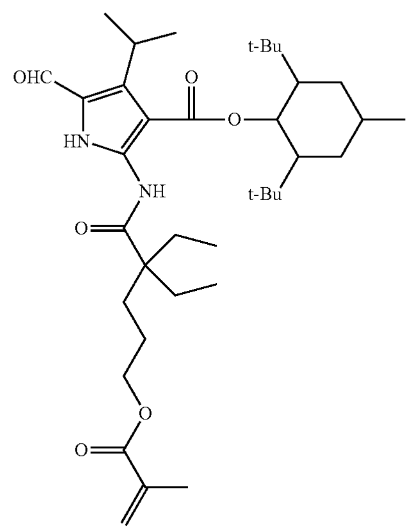
Intermediate 5
Intermediate 3 + Intermediate 5 $\xrightarrow{CH(OC_2H_5)_3}$
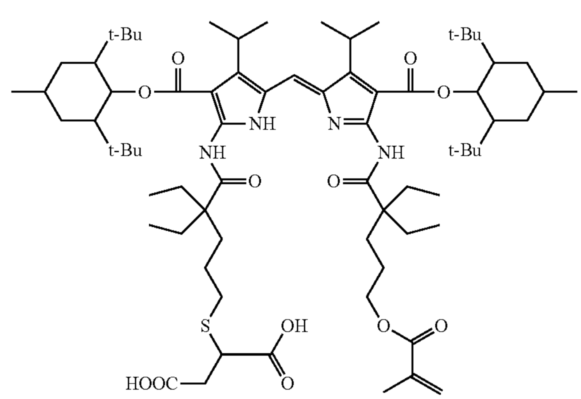
Intermediate 6
Intermediate 6 $\xrightarrow{(CH_3COO)_2Zn}$ -continued

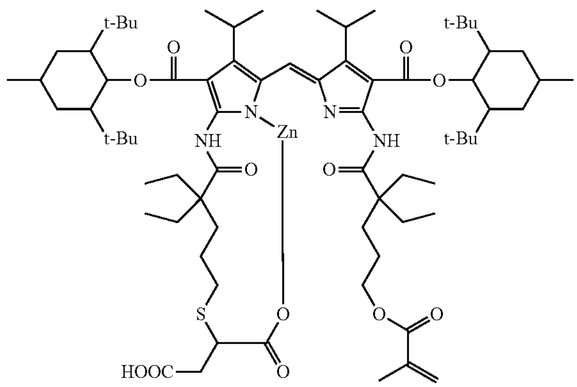

Dye a (Synthesis of Intermediate 2)

To 10 g (42.7 mmol) of Intermediate 1 obtained by the method described in US2008/0076044A, 40 ml of acetonitrile was added, and the mixture was stirred under ice-cooling. To this solution, a solution in which 10.81 g (51.2 mmol) of 2,2-diethyl-5-chloro-valeric acid chloride had been dissolved in 10 ml of acetonitrile, was added dropwise. Thereafter, 5.11 g of pyridine (64.7 mmol) was added dropwise thereto, and the mixture was stirred for one hour at room temperature, and the resulting crystals were filtrated, washed with acetonitrile and dried. Thus, 19.5 g of Intermediate 2 (yield: 83%) was obtained.

(Synthesis of Intermediate 3)

Intermediate 2 (18.0 g, 32.7 mmol), and thiomalic acid (7.9 g, 52.6 mmol) were added to 70 mL of dimethylacetamide, and the mixture was stirred at room temperature, and diazbicycloundecene (26.8 g) was added dropwise thereto over 30 minutes while being maintaining at 30° C. or below. After stirring for 12 hours at room temperature, the reaction solution was added dropwise over 30 minutes to 400 mL of 0.5N HCl (aq) in an ice bath. The precipitated solid was filtered, and was washed by pouring water thereon, and then again stirred in 400 mL of water, and filtered. The resulting solid was dried under vacuum (45° C., 12 hrs) to obtain Intermediate 3 (18.4 g, 27.7 mmol, 85% yield):

(Synthesis of Intermediate 4)

Intermediate 2 (22.0 g, 39.9 mmol), methacrylic acid (6.9 g, 80.1 mmol), potassium iodide (6.6 g), and p-methoxyphenol (11.5 mg) were added to 50 mL of dimethylacetamide, and the mixture was stirred at room temperature. Triethylamine (10.1 g) was added thereto, and then heated until the internal temperature reached 85° C., and the mixture was stirred at that temperature for 4 hours. After the completion of reaction, 75 mL of ethyl acetate was added thereto, and washed with each of 50 mL of 1N HCl aq, water, and saturated sodium bicarbonate, and then concentrated under reduced pressure. The resulting solid was recrystallized from 100 mL of acetonitrile to obtain Intermediate 4 (16.5 g, 27.5 mmol, 69% yield).

(Synthesis of Intermediate 5)

While N-methylformanilide (4.3 g, 31.8 mmol) was being stirred into 25 mL of acetonitrile at 5° C., phosphorus oxychloride (4.9 g, 32.0 mmol) was added dropwise thereto, and after stirring for one hour, Intermediate 4 (16.0 g, 26.6 mmol) and 10 mL of acetonitrile were added thereto, and the mixture was stirred at room temperature for 30 minutes, and then was stirred for 5 hours at 40° C. The reaction solution was poured into 300 mL of water, and the mixture was stirred for 1 hour. The precipitated solid was taken out and was recrystallized from acetone to obtain Intermediate 5 (10.3 g, 16.8 mmol, 63% yield).

(Synthesis of Intermediate 6)

Intermediate 3 (10.7 g, 16.1 mmol) and Intermediate 5 (10.1 g, 16.1 mmol) and 100 ml of acetic anhydride were stirred at room temperature, and 8.6 g of trifluoroacetic acid was added dropwise thereto to obtain a reaction solution. After stirring the reaction solution for 4 hours at room temperature, the resulting reaction solution was poured slowly into an aqueous solution formed by stirring 700 mL of water and 170 g of sodium bicarbonate at room temperature to perform the neutralization. After stirring the resulting solution for 1 hour, the precipitated crystals were filtered, and washed by pouring 300 mL of water thereon. The resulting solid was dissolved again in 50 mL of tetrahydrofuran, and 50 mL of water and triethylamine (10.5 g) were added thereto to form a homogeneous system, and then, the mixture was stirred at room temperature for 10 minutes. 400 mL of ethyl acetate was added to the reaction solution, and the operation of washing the resulting solution with 1N HCl aq, and with 400 mL of water, respectively, was performed twice, and then concentrated under reduced pressure. The resulting solid was dried by blow drying at 40° C. for 12 hours to obtain intermediate 6 (19.5 g, 15.3 mmol, 95% yield).

(Synthesis of Dye a (Colorant Monomer M1))

Intermediate 6 (19.0 g, 14.9 mmol) was dissolved in 90 ml of tetrahydrofuran (THF) under stirring at room temperature, and then 90 mL of methanol was added thereto. A solution of zinc acetate dihydrate (3.3 g) dissolved in 90 mL of methanol was added dropwise thereto over 10 minutes and stirred for 1 hour. Thereafter, 90 mL of solvent was removed by evaporating from the reaction solution on an evaporator at 30° C., 1000 Torr, for 10 minutes under reduced pressure. The remaining solution was added dropwise to 500 ml of water, and the precipitated crystals were filtered, and dried to obtain Dye a (19.0 g, 14.2 mmol, 95% yield). The halogen ion content of Dye a, obtained by ion chromatography was 10000 ppm.

(Dye b)

30 g of the thus-synthesized Dye a was introduced to 200 mL of acetonitrile, and the solution was heated to 60° C. and dissolved. Then, the solution was cooled to 30° C., reprecipitated, filtered, and then washed with ion-exchanged water, and dried to obtain 20 g of Dye b. The halogen ion content of Dye b, obtained by ion chromatography was 400 ppm.

Synthesis Example 2

A mixed solution of 35 g of Dye a, 3.27 g of methacrylic acid, 1.30 g of dodecanethiol, 2.95 g of a polymerization initiator (V-601, manufactured by Wako Pure Chemical), and 86.4 g of propylene glycol methyl ether acetate was prepared. Separately, 129.6 g of propylene glycol methyl ether acetate was introduced to the reaction vessel under a nitrogen flow, and was stirred while being maintaining at 85° C. The prepared mixed solution was added dropwise thereto over 3 hours, and stirred for 1 hour, and then 0.88 g of the polymerization initiator (V-601, manufactured by Wako Pure Chemical) was added, and reacted for a further 2 hours to stop the reaction. After cooling the resulting solution to room temperature, a mixture of the resulting solution, 778 mL of propylene glycol methyl ether acetate and 1038 mL of methanol was added dropwise to 4150 mL of acetonitrileover 20 minutes, and the mixture was stirred for 10 minutes. The resulting precipitate was filtered, then dried to obtain 17 g of Dye c. The halogen ion content of Dye c which is a colorant multimer, obtained by ion chromatography was 100 ppm.

Synthesis Example 3

14 g of Dye c, 1.31 g of glycidyl methacrylate, 0.239 g of tetrabutylammonium bromide, and 0.0153 g of p-methoxyphenol was added to 86.53 g of propylene glycol methyl ether acetate, and was heated and stirred at 100° C. for 8 hours to obtain a solution of Dye d which is a colorant multimer. The resulting Dye solution d was added dropwise to 1021 mL of acetonitrile, filtered and dried to obtain 13 g of Dye e which is a colorant multimer. The halogen ion content of the Dye e was 500 ppm.

Example 1

Preparation of Radiation-Sensitive Colored Composition

Each component having the following composition was mixed and dissolved to prepared a radiation-sensitive colored composition.

| | |
|---|---|
| (C) Solvent: propylene glycol methyl ether acetate | 57.8 parts |
| (B) Polymerizable Compound: KAYARAD DPHA (manufactured by Nippon Kayaku) | 10.1 parts |
| p-Methoxyphenol | 0.006 parts |
| Surfactants; F-475 (manufactured by DIC Chemical Industry | 0.80 parts |
| (D) Polymerization Initiator; Exemplary Compound (C-9) | 0.58 parts |
| (A) Dye b | 0.35 parts |

<Coating, Exposure and Development Processes>

The radiation-sensitive colored composition prepared above was applied onto a glass substrate using a spin coater, so as to have the dried film thickness of 0.6 μm, and was pre-baked for 120 seconds at 100° C.

Then, through a mask having a line width of 2 μm, the coated film was irradiated with an exposure dose of 200 mJ/cm$^2$ at a wavelength of 365 nm.

After the exposure, it was developed using a developer CD-2000 (manufactured FUJIFILM Electronic Materials Co., Ltd.) under the conditions of 40 seconds at 25° C.

After that, after rinsing with running water for 30 seconds, spray-drying was performed. After that, post-baking was performed for 15 minutes at 200° C.

As describes above, a patternwise cured colored film constituting the color filter was obtained.

<Performance Evaluation>

Device Contamination

After pattern forming, the presence and absence of corrosion in the discharge unit and pipe unit of the coating applicator was checked.

A: Corrosion was not observed.

X: Marked corrosion was confirmed.

Residue

The portion other than the above colored pattern forming portion (unexposed portion) was observed with a Scanning Electron Microscope (SEM) (at a magnification of 10000 times), and the development residue was evaluated, in accordance with the following evaluation criteria.

—Evaluation Criteria for Development Residue—

A: In the portion other than the colored pattern forming portion (unexposed portion), the residue was not observed at all.

B: In the portion other than the colored pattern forming portion (unexposed portion), the slight residue was observed, but was such a degree that is acceptable in practical use.

C: In the portion other than the colored pattern forming portion (unexposed portion), the marked residue was observed.

Examples 2 and 3, and Comparative Examples 1 and 2

Except that the dye in Example 1 was altered as shown in Table 1, in the same manner as in Example 1, radiation-sensitive colored compositions were prepared, and evaluated in the same manner as in Example 1.

The results shown in Table 1.

TABLE 1

| | Dye | Structure | Halogen Ion Content (ppm) | Device Contamination | Residue |
|---|---|---|---|---|---|
| Example 1 | Dye b | Colorant Monomer M1 | 400 | A | A |
| Example 2 | Dye c | Formula (101) | 100 | A | A |
| Example 3 | Dye e | Formula (102) | 500 | A | A |
| Comparative Example 1 | Dye a | Colorant Monomer M1 | 10000 | X | C |
| Comparative Example 2 | Dye d | Formula (102) | 40000 | X | C |

From the results in Table 1, it is clear that by suppressing the halogen ion content, the device contamination can be prevented. In addition, the content of halogen ions also has a remarkable influence on the residue. It is believed that by containing a certain amount of halogen ions or more, ligand exchange of the dye occurs and the dye becomes hydrophobic, and thereby residues increase.

That is to say, it was clearly proved that a certain range of halogen ion content leads to the avoidance of device contamination and the decrease of residues.

The structure of Dye a•b (Colorant Monomer MI), the structure of Dye c (Formula (101)), and the structure of Dye d•e (Formula (102)), are shown below.

(101)
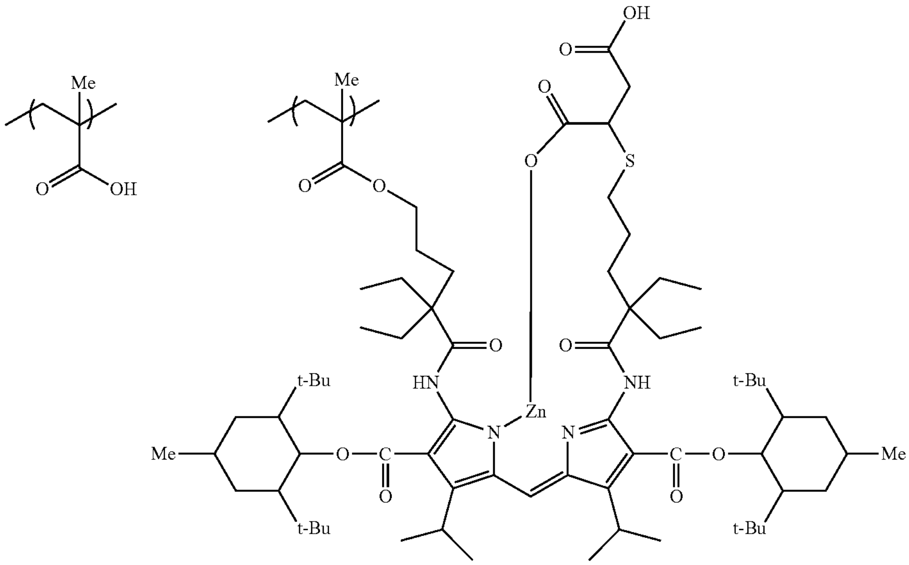
(102)
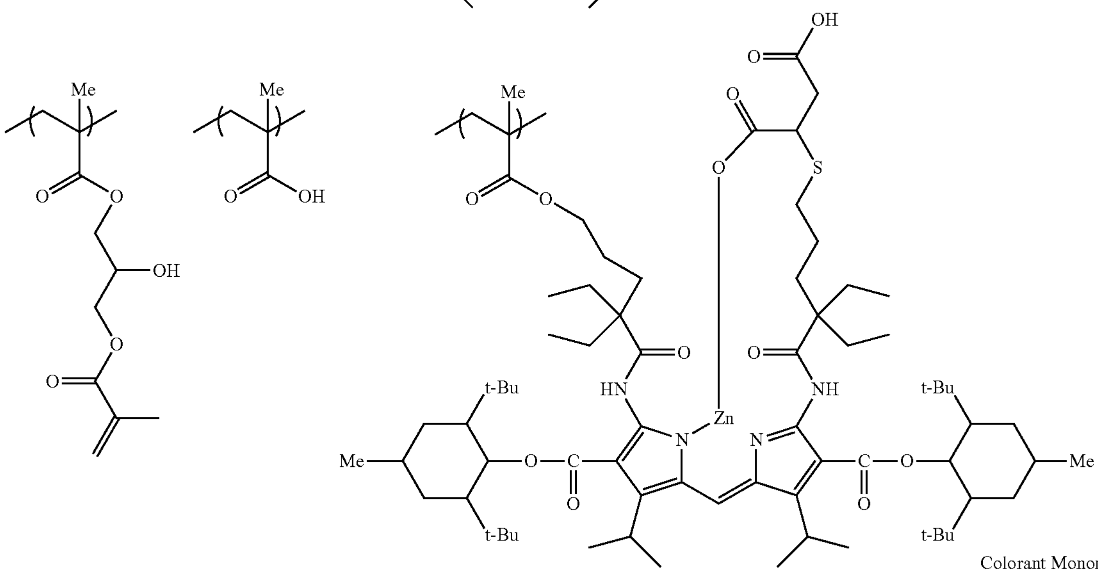
Colorant Monomer M1
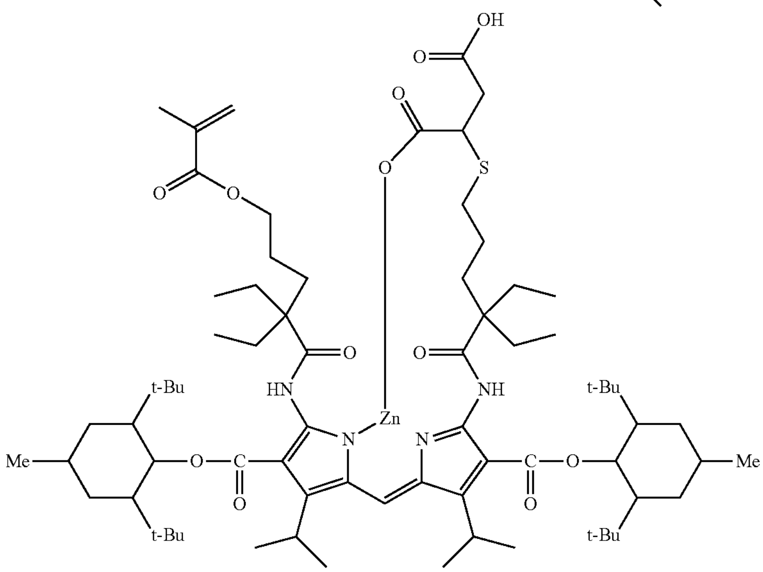

From the above, it was clearly proved that the radiation-sensitive colored composition of the present invention enables the contamination of the device to be decreased and to suppress the generation of residues, at the time of forming a patternwise colored cured film.

(Synthesis Dye f•g•h)

Using Colorant Monomer M2 which is a triphenylmethane colorant as a colorant, Dye f which is a colorant multimer of a structure represented by the following Formula (103) was synthesized. In addition, the obtained. Dye f was subjected to after-treatment to synthesize Dye g•h. Hereinafter, the detailed operation will be described.

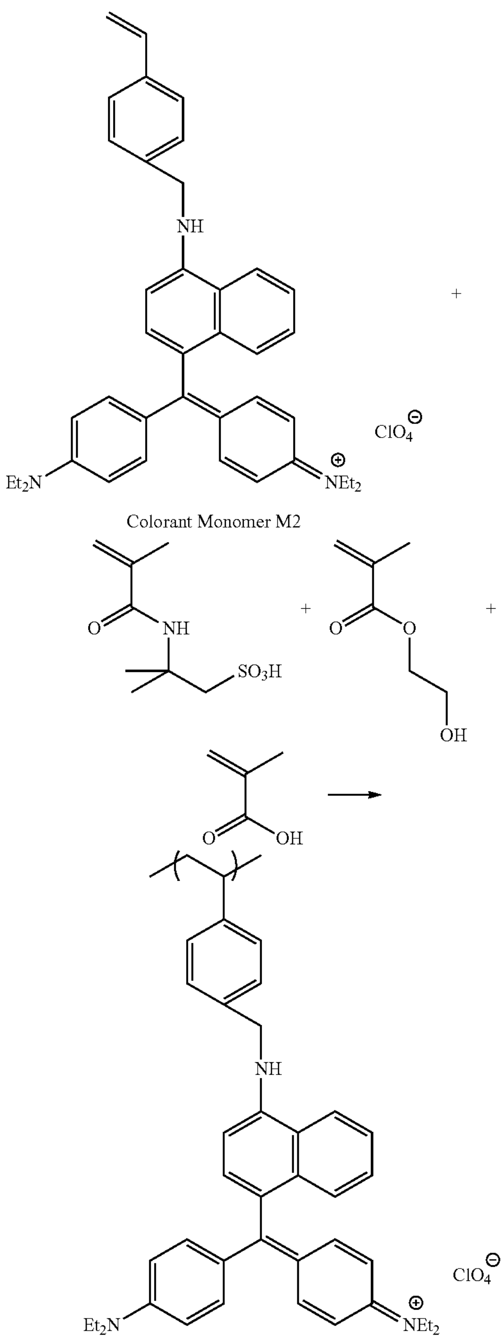

Formula (103)

-continued

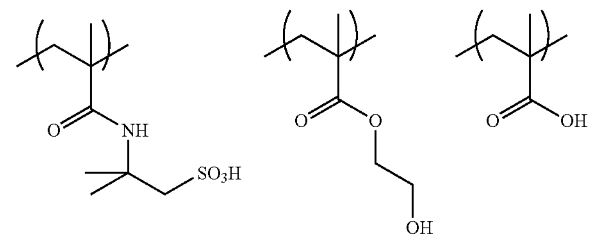

Colorant Monomer M2 (15 g) synthesized by a method described in JP2000-162429A, 2-acrylamide-2-methylpropanesulfonic acid (6.5 g), and hydroxylethyl methacrylate (23 g), methacrylic acid (5.5 g), 28% by weight of ammonia water (2 g), and azobisisobutyronitrile (5 g) were added to N-ethyl pyrrolidone (70 g), and were dissolved by stirring at room temperature for 30 minutes (polymerization solution for dropwise-addition).

Separately, Colorant Monomer M2 (15 g), 2-acrylamide-2-methylpropanesulfonic acid (6.5 g), and hydroxylethyl methacrylate (23 g), methacrylic acid (5.5 g), and 28% by weight of ammonia water (2 g), were dissolved in N-ethyl pyrrolidone (70 g), and was stirred at 95° C. The solvent was removed by filtration therefrom, and the weight average molecular weight (Mw) and the acid value of the copolymer thus obtained were 28000 and 190 mg KOH/g, respectively. In addition, the halogen ion content of Dye f, obtained by ion chromatography was 10000 ppm.

(Synthesis of Dye g)

5 g of Dye f was introduced to 100 mL of isopropyl alcohol, and the solution was heated to 110° C. and dissolved. Then, the solution was cooled to 30° C., reprecipitated, filtered, and then washed with ion-exchanged water, and dried to obtain 4 g of Dye g. The halogen ion content of Dye g, obtained by ion chromatography was 40 ppm.

(Synthesis of Dye h)

15 g of Dye h was introduced to 15 mL of THF to dissolve the same. Then, the dye solution was added dropwise to a mixed solution of 30 mL of water and 3 mL of acetonitrile to reprecipitate the dye. The same was filtered, and then washed with ion-exchanged water, and dried to obtain 4.6 g of Dye h. The halogen ion content of Dye h, obtained by ion chromatography was 400 ppm.

(Synthesis of Dye i)

Using Colorant Monomer M3 which is an anthraquinone colorant as a colorant, Dye i of a structure represented by the following. Formula (104) was synthesized as described below.

Colorant Monomer M3 Formula (104)

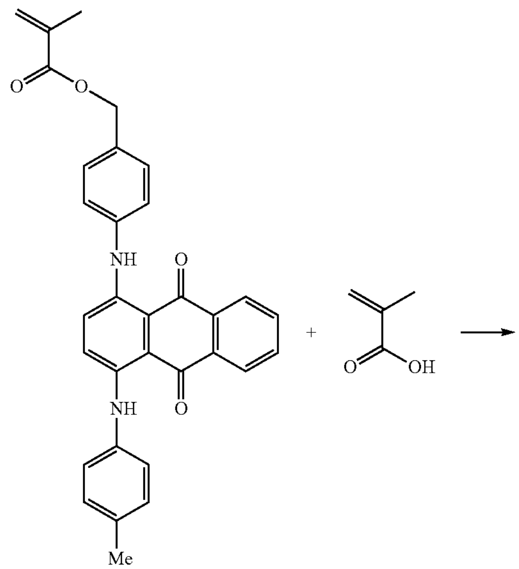

Colorant Monomer M3

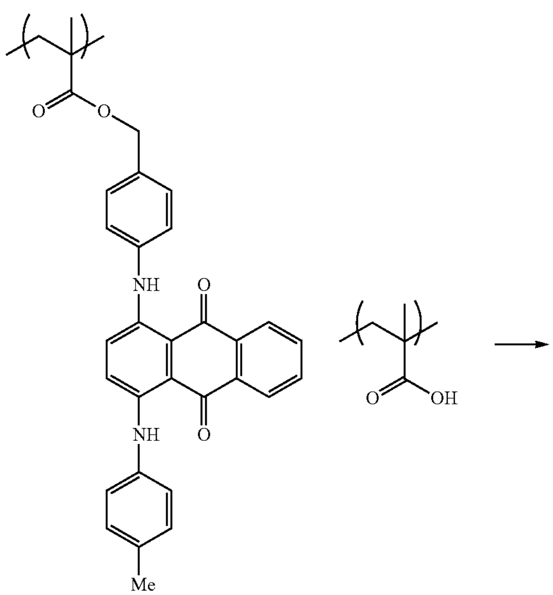

(MD-1)

-continued

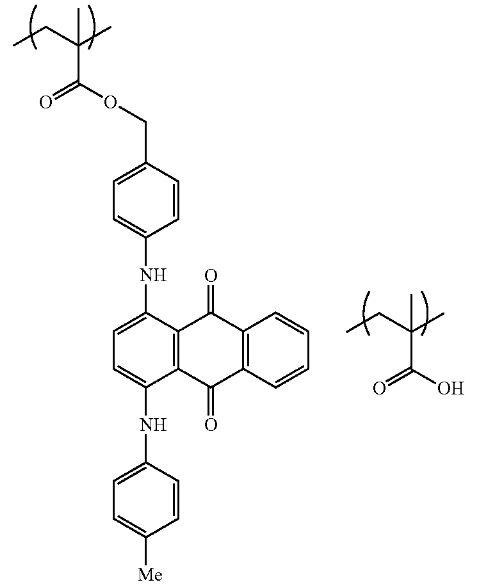

Formula (104)

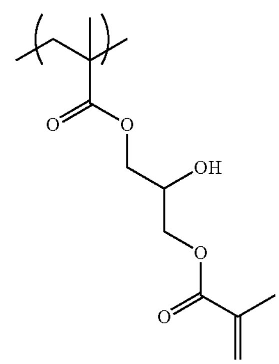

Into a 100-mL three-necked flask, Colorant Monomer M3 (8.21 g), methacrylic acid (1.08 g), dodecyl mercaptan (0.25 g), and propylene glycol 1-monomethyl ether 2-acetate (PGMEA) (23.3 g) were added, and the mixture was heated at 80° C. under a nitrogen atmosphere. To this solution was added dropwise a mixed solution (the turbidity of this mixed solution was 8 ppm at room temperature) of Colorant Monomer M3 (8.21 g), methacrylic acid (1.08 g), dodecyl mercaptan (0.25 g), dimethyl 2,2'-azobis(isobutyrate) (0.58 g), and PGMEA (23.3 g) over 2 hours. Thereafter, after stirring for 3 hours, the mixture was warmed to 90° C., heated under stirring for 2 hours, and left to be cooled to obtain a solution of (MD-1) in PGMEA. Next, glycidyl methacrylate (1.42 g), tetrabutylammonium bromide (80 mg), and p-methoxyphenol (20 mg) were added thereto, and the mixture was heated at 100° C. for 15 hours under an air atmosphere to confirm the loss of glycidyl methacrylate. After cooling, the mixture was added dropwise to a mixed solvent of methanol/ion-exchanged water=100 mL/10 mL and reprecipitated to form 17.6 g of Dye i of structure represented by Formula (104). The halogen ion content of Dye i, obtained by ion chromatography was 500 ppm.

The weight average molecular weight (Mw) of Dye i as measured by GPC was 6,000, and the ratio of the weight average molecular weight/number average molecular weight (Mw/Mn) was 1.9. Furthermore, the acid value of Dye i by means of titration using a 0.1 N aqueous sodium hydroxide solution was 42 mg KOH/g, and the amount of the polymerizable group as measured by NMR was 22 mg/g for the Dye i (1 g).

(Synthesis of Dyes j to u)

Dyes j to u was synthesized in the same manner as the synthesis of Dye i, except that the kinds of colorant monomers were as those shown in the following Table 2.

In the following Table 2, Colorant Monomers M4 to M15, and Formula (105) to Formula (116) are as follows.

Herein, Colorant Monomers M4 and M5 are anthraquinone colorants, Colorant Monomers M6 is a squarylium colorant, Colorant Monomers M7 is a cyanine colorant, Colorant Monomers M8 is a phthalocyanine colorant, Colorant Monomers M9 is a subphthalocyanine colorant, Colorant Monomers M10 is a quinophthalone colorant, Colorant Monomers M11 is xanthene colorant, and Colorant Monomers M12 to M15 are azo colorants.

M4

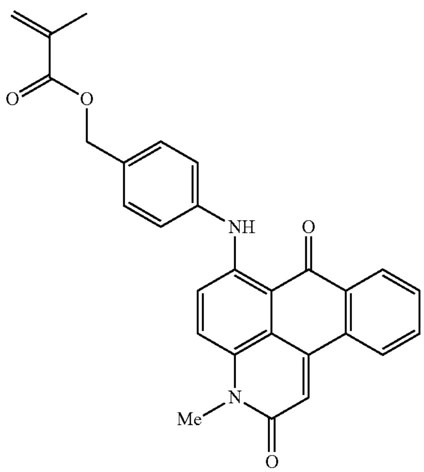

M5

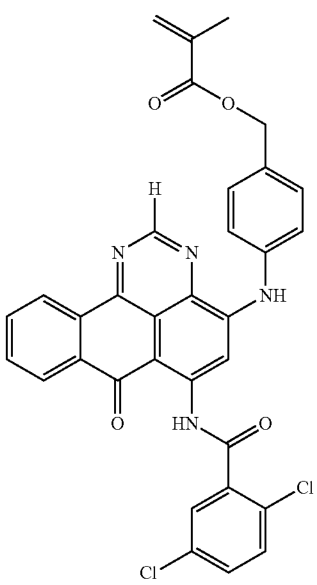

-continued

M6

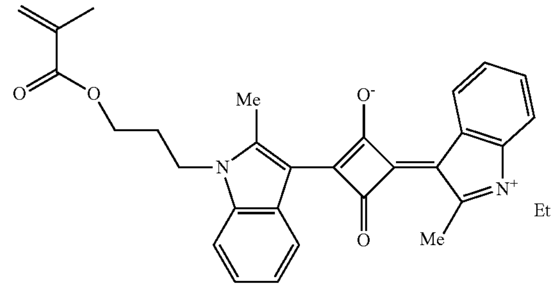

M7

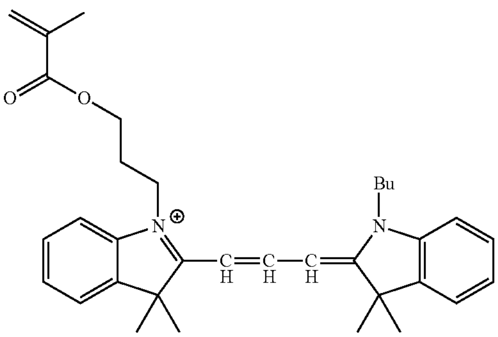

M8

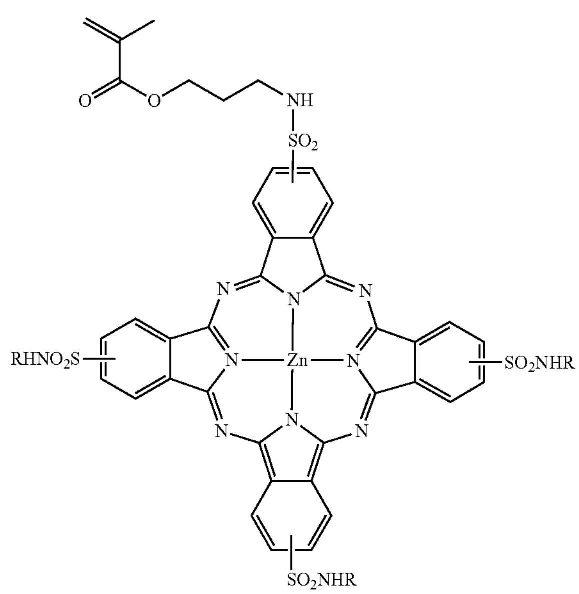

R = CH2CH2CH2OH

M9
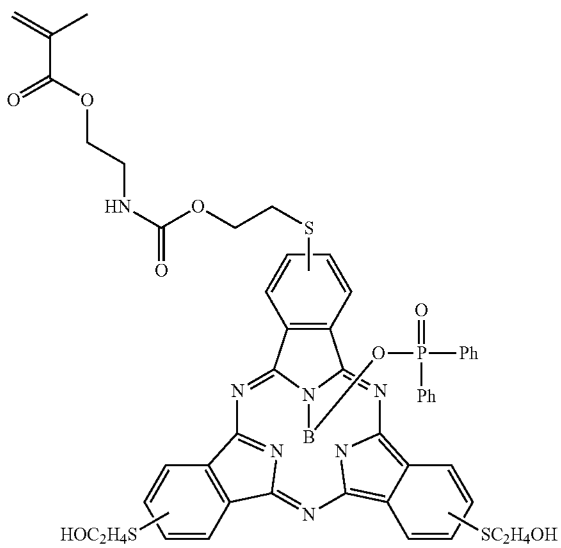
M10
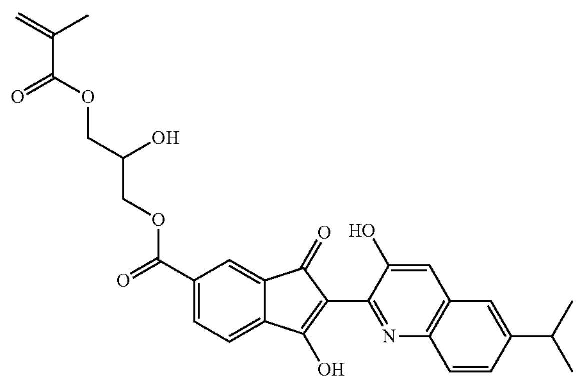
M11
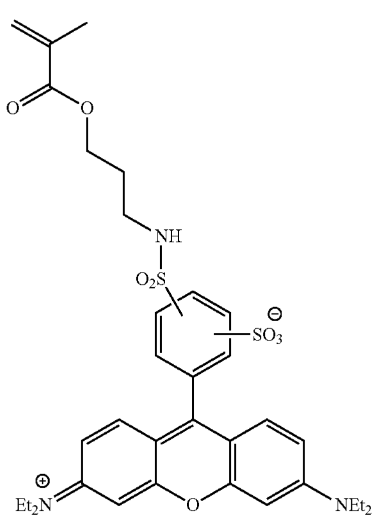
M12
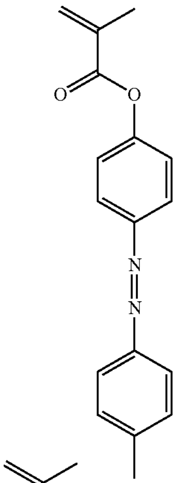
M13
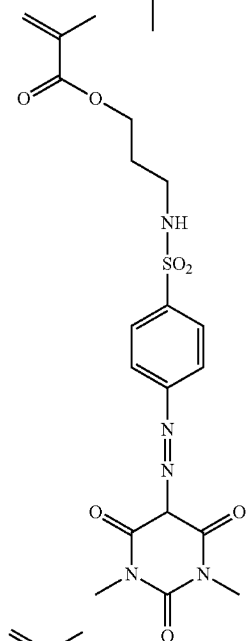
(M14)
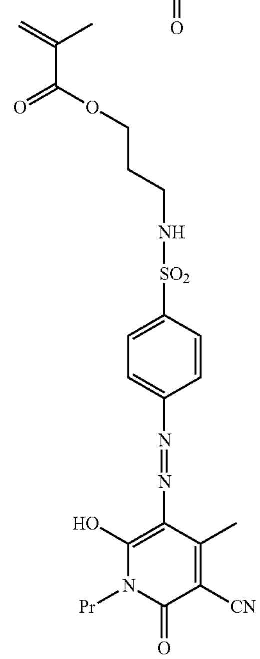

-continued
(M15)
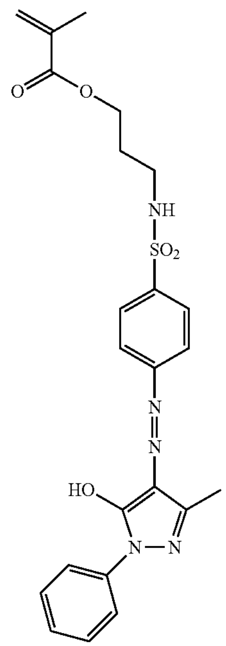
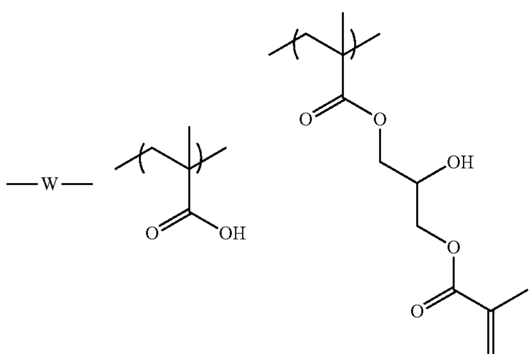
—W— =
Formula (105)
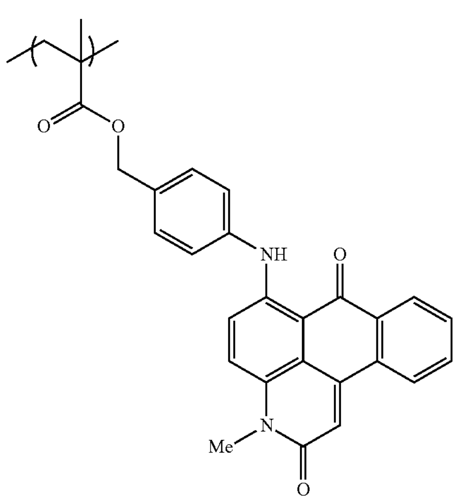
-continued
Formula (106)
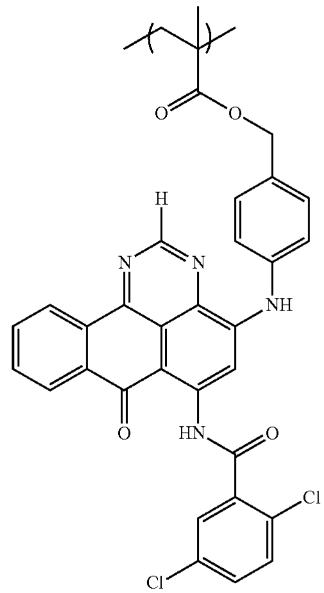
Formula (107)
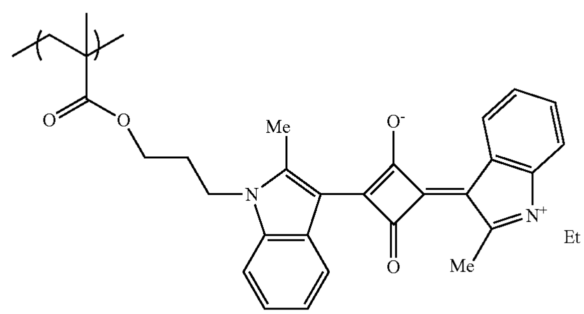
Formula (108)
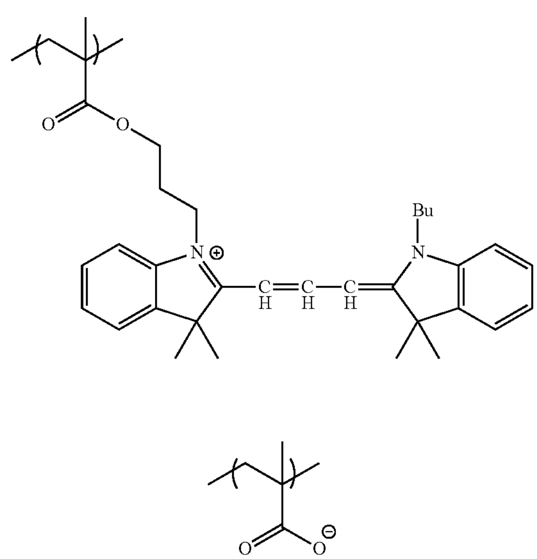

-continued
Formula (109)
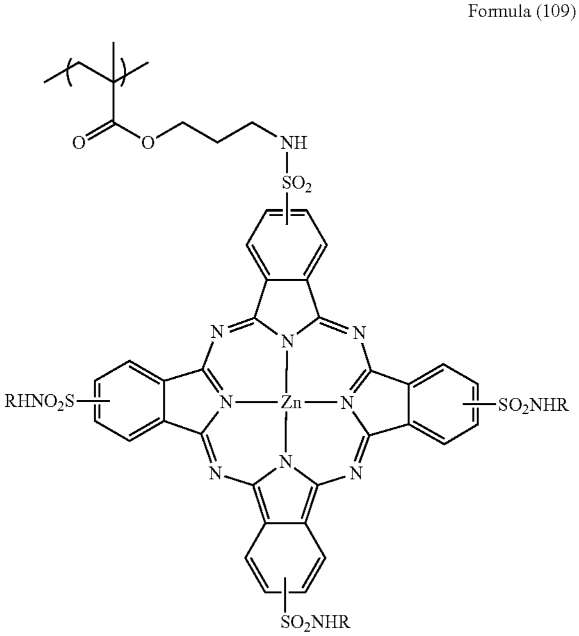
R = CH2CH2CH2OH
Formula (110)
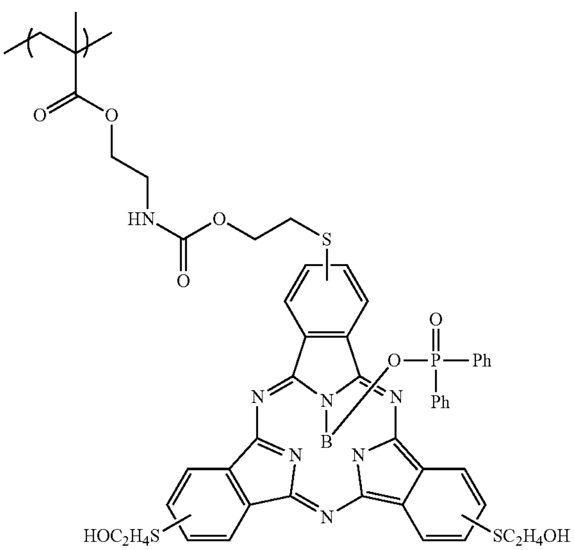
Formula (111)
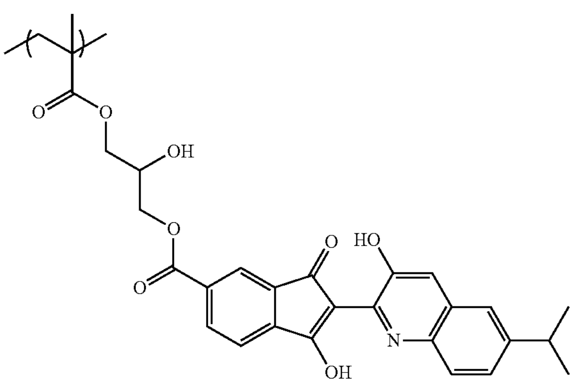
-continued
Formula (112)
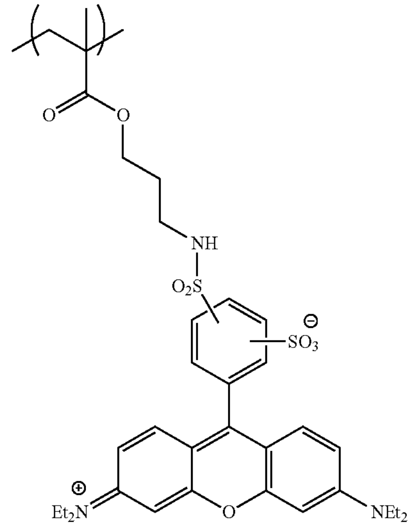
—W— =
Formula (113)
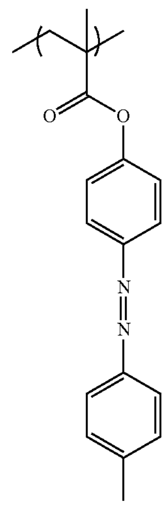
Formula (114)
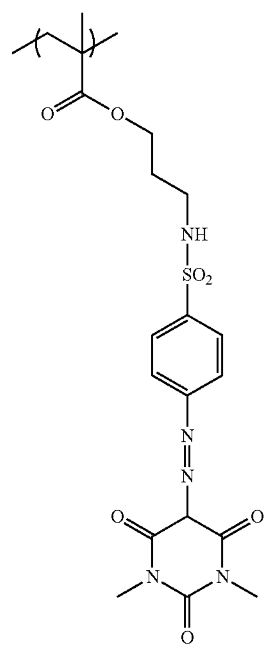

-continued

Formula (115)

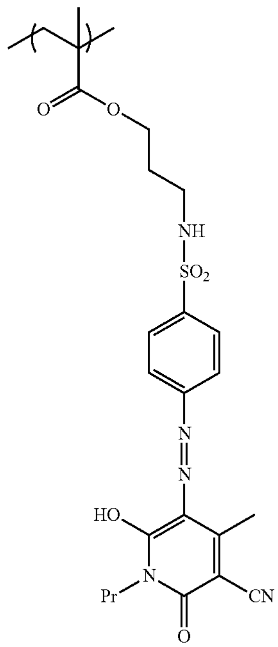

Formula (116)

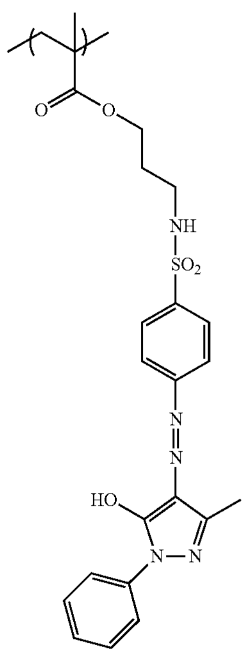

TABLE 2

| Colorant | Structure | Colorant Monomer | Acid value (mg KOH/g) | Mw | Halogen Ion Content (ppm) |
|---|---|---|---|---|---|
| Colorant f | Formula (103) | M2 | 190 | 28000 | 10000 |
| Colorant g | Formula (103) | M2 | 200 | 25000 | 40 |
| Colorant h | Formula (103) | M2 | 200 | 26000 | 400 |
| Colorant i | Formula (104) | M3 | 42 | 6000 | 500 |
| Colorant j | Formula (105) | M4 | 35 | 6400 | 10 |
| Colorant k | Formula (106) | M5 | 48 | 6200 | 20 |
| Colorant l | Formula (107) | M6 | 32 | 7500 | 400 |
| Colorant m | Formula (108) | M7 | 38 | 6800 | 200 |
| Colorant n | Formula (109) | M8 | 41 | 7700 | 50 |
| Colorant o | Formula (110) | M9 | 53 | 4300 | 500 |
| Colorant p | Formula (111) | M10 | 51 | 5500 | 950 |
| Colorant q | Formula (112) | M11 | 35 | 5800 | 300 |
| Colorant r | Formula (113) | M12 | 41 | 7000 | 400 |
| Colorant s | Formula (114) | M13 | 36 | 6100 | 400 |
| Colorant t | Formula (115) | M14 | 45 | 6000 | 350 |
| Colorant u | Formula (116) | M15 | 50 | 4900 | 500 |

Example 4

Preparation of Radiation-Sensitive Colored Composition (Preparation of Pigment Dispersion (Dispersion of C.I. Pigment Blue 15:6))

A pigment dispersion (dispersion of C.I. Pigment Blue 15:6 was prepared as follows.

That is, a mixed solution containing 11.8 parts by mass (average particle size of 55 nm) of C.I. Pigment Blue 15:6 (blue pigment: hereinafter, is also referred to as "PB15:6"), 5.9 parts by mass of a pigment dispersant BY-161 (manufactured by BYK Chemie GmbH), and 82.3 parts by mass of PGMEA was mixed and dispersed using a beads mill (zirconia beads having a diameter of 0.3 mm) for 3 hours. Then, the pigment dispersion was subjected to a dispersion treatment under a pressure of 2,000 kg/cm$^3$ at a flow rate of 500 g/min using a high pressure dispersing machine equipped with a pressure-reducing system NANO-3000-10 (manufactured by Japan Beryu Co., Ltd.). This dispersion treatment was repeated 10 times to obtain a dispersion of C.I. Pigment Blue 15:6 as a pigment dispersion. The average particle size of the pigment in the obtained dispersion of C.I. Pigment Blue 15:6 measured by a dynamic light scattering method using (Microtrac Nanotrac UPA-EX150 (manufactured by Nikkiso Co., Ltd.)) was 24 nm.

(Preparation of Colored Composition)

Each component described below was mixed, dispersed and dissolved to prepared a colored composition (a radiation-sensitive colored composition).

—Components of Colored Composition—

| | |
|---|---|
| Cyclohexanone | 1.133 parts |
| The following alkali-soluble resin J1 | 1.009 parts |
| SOLSPERSE 20000 (1% cyclohexane solution, manufacture by Japan Lubrizol Advanced Materials) | 0.125 parts |
| Photopolymerization Initiator I-1 (IRUGACURE OXE01, manufactured by BASF; Compound name: 1,2-octandione, 1-[4-(phenylthio)-, 2-(O-benzoyl oxime)) | 0.087 parts |
| Dye b described above (Colorant Monomer M1) | 0.183 parts |
| Pigment dispersion (Dispersion of C.I. Pigment Blue 15:6) (Solid Concentration 17.70%, Pigment Concentration 11.80%) | 2.418 parts |

-continued

| | |
|---|---|
| Dipentaerytritol hexaacrylate | 0.521 parts |
| Glycerol propoxylate (1% cyclohexane solution) | 0.048 parts |

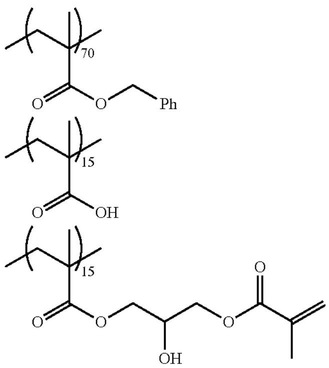

J 1
Mw = 15000

<Preparation of Silicon Substrate with Undercoating Layer>

(Preparation of Resist Solution for Undercoating Layer)

The following components of the composition were mixed, and dissolved to prepare a resist solution for undercoating layer.

—Constitution of a Resist Solution for Undercoating Layer—

| | |
|---|---|
| Sovlent: Propylene glycol monomethyl ether acetate | 19.20 parts |
| Sovlent: Ethyl lactate | 36.67 parts |
| Alkali-Soluble Resin: 40% PGMEA solution of benzyl methacrylate/methacrylic acid/2-hydroxy-ethyl methacrylate copolymer (molar ratio of 60/22/18, weight average molecular weight: 15,000, number average molecular weight: 9,000) | 30.51 parts |
| Compound containing ethylenically unsaturated double bond: Dipentaerythritol hexaacrylate (as a commercially available product, KAYARAD DPHA; manufactured by Nippon Kayaku Co., Ltd.) | 12.20 parts |
| Polymerization inhibitor (p-methoxyphenol) | 0.0061 part |
| Fluorine-based surfactant (F-475, manufactured by DIC Corporation) | 0.83 parts |
| Photopolymerization initiator Trihalomethyltriazine based photopolymerization initiator: (TAZ-107, manufactured by Midori Kagaku Co., Ltd.) | 0.586 parts |

(Preparation of Silicon Substrate with Undercoating Layer)

6 inch of silicon wafer was heat-treated in an oven under 200° C. for 30 minutes. Subsequently, the resist solution for undercoating layer was applied on this silicon wafer such that the wafer after drying had a thickness of 1.5 μm, and further the wafer was heated and dried in an oven at 220° C. for 1 hour to form an undercoating layer, and to obtain a silicon wafer substrate with an undercoating layer.

<Preparation of Color Filter (Colored Pattern)>

The colored composition prepared in the above was applied on the undercoating layer of the silicon wafer substrate with the undercoating layer produced in the above to form a colored layer (coated film). Then, the substrate was heat-treated (pre-baked) using a hot plate at 100° C. for 120 seconds such that the coated film r after drying had a thickness of 1 μm.

Subsequently, the colored layer was exposed through an island pattern mask having a 1.2 μm-square pattern at a wavelength of 365 nm at a variety of exposure doses of 50 to 1200 mJ/cm$^2$, using an i-ray stepper exposure device (FPA-3000i5+, manufactured by Canon Inc.).

After the exposure, the silicon wafer substrate on which the irradiated coated film had been formed was mounted on the horizontal rotary table of a spin-shower developing machine (Model DW-30, manufactured by Chemitronics Co., Ltd.), and subjected to paddle development at 23° C. for 60 seconds using a CD-2000 (manufactured by Fujifilm Electronic Materials Co., Ltd.) to form a colored pattern on the undercoating layer of the silicon wafer substrate with the undercoating layer.

The silicon wafer having the colored pattern was fixed on the horizontal rotary table using a vacuum chuck, and rinsed by a shower of pure water fed from a jet nozzle above the center of rotation while the silicon wafer was being rotated by a rotator at a rotation speed of 50 rpm, followed by spray drying.

As described above, a silicon wafer with a colored pattern of the configuration in which a colored pattern (color filter) had been provided on the undercoating layer on a silicon wafer with an undercoating layer, was obtained.

Thereafter, the size of the colored pattern was measured using an SEM "S-9260A" (Hitachi High-Technology Corporation).

Evaluation of development residues was performed on the colored pattern of an exposure dose of making the size of pattern be 1.2 μm.

<Performance Evaluation>

Device Contamination

After pattern forming, the presence and absence of corrosion on the device was checked.

A: Corrosion on the device was not observed.

X: Marked corrosion on the device was confirmed.

Residue

The portion other than the above colored pattern forming portion (unexposed portion) was observed with a Scanning Electron Microscope (SEM) (at a magnification of 10000 times), and the development residue was evaluated, in accordance with the following evaluation criteria.

—Evaluation Criteria on Development Residue—

A: In the portion other than the colored pattern forming portion (unexposed portion), the residue was not observed at all.

B: In the portion other than the colored pattern forming portion (unexposed portion), the slight residue was observed, but was such a degree that is acceptable in practical use.

C: In the portion other than the colored pattern forming portion (unexposed portion), the marked residue was observed.

The evaluation results shown in the following Table 3.

Examples 4 to 21, and Comparative Examples 3 to 5

Except that the Dye b used for the preparation of the colored composition in Example 4 was altered to the dyes shown in the following Table 3, and that the pigment dispersion was altered to the dispersion of the pigment shown in the following Table 3, in the same manner as in Example 1, colored compositions were prepared. Silicon wafers with colored patterns were produced using the obtained colored composition in the same manner as in Example 1, and the evaluation was performed thereon.

The evaluation results shown in the following Table 3.

Except that for the dispersions of pigments shown in the following Table 3, the following pigments were used, instead of C.I. Pigment Blue 15:6 used as a blue pigment in the "Preparation of Dispersion of C.I. Pigment Blue 15:6" in Example 1, the dispersions were prepared in the same manner as the "Preparation of Dispersion of C.I. Pigment Blue 15:6" in Example 1.

Red Pigment A

C.I. Pigment Red 254 (PR254) (Average particle size: 26 nm)

Red Pigment B

C.I. Pigment Red 177 (PR177) (Average particle size: 28 nm)

Green Pigment A

C.I. Pigment Green 36 (PG36) (Average particle size: 25 nm)

Green Pigment B

C.I. Pigment Green 58 (PG58) (Average particle size: 30 nm)

Yellow Pigment A

C.I. Pigment Yellow 139 (PY139) (Average particle size: 27 nm)

Yellow Pigment B

C.I. Pigment Yellow 150 (PY150) (Average particle size: 26 nm)

TABLE 3

| | Resist | | | | |
|---|---|---|---|---|---|
| | Dye | | | Performance | |
| | Dye | Halogen Ion Content (ppm) | Pigment | Device Contamination | Residue |
| Example 4 | Dye b | 400 | PB15:6 | A | B |
| Example 5 | Dye c | 100 | PB15:6 | A | A |
| Example 6 | Dye e | 500 | PB15:6 | A | A |
| Example 7 | Dye g | 40 | PB15:6 | A | A |
| Example 8 | Dye h | 400 | PB15:6 | A | A |
| Example 9 | Dye i | 500 | PY139 | A | A |
| Example 10 | Dye j | 10 | PY139 | A | A |
| Example 11 | Dye k | 20 | PB15:6 | A | A |
| Example 12 | Dye l | 400 | PB15:6 | A | A |
| Example 13 | Dye m | 200 | PB15:6 | A | A |
| Example 14 | Dye n | 50 | PB15:6 | A | A |
| Example 15 | Dye o | 500 | PG36 | A | A |
| Example 16 | Dye p | 950 | PB15:6 | B | A |
| Example 17 | Dye q | 300 | PR254 | A | A |
| Example 18 | Dye r | 400 | PR177 | A | A |
| Example 19 | Dye s | 400 | PG58 | A | A |
| Example 20 | Dye t | 350 | PG36 | A | A |
| Example 21 | Dye u | 500 | PG36 | A | A |
| Comparative Example 3 | Dye a | 10000 | PB15:6 | X | C |
| Comparative Example 4 | Dye d | 40000 | PB15:6 | X | C |
| Comparative Example 5 | Dye f | 10000 | PB15:6 | X | C |

From the results of Table 3, it is understood that by suppressing the halogen ion content, the device contamination can be prevented. In addition, the content of halogen ions also has a remarkable influence on the residues.

That is to say, it was clearly proved that a certain range of halogen ion content leads to the avoidance of device contamination and the decrease of residues.

What is claimed is:

1. A radiation-sensitive colored composition comprising:

(A) a dye containing of from 10 ppm to 1000 ppm of a halogen ion;

(B) a polymerizable compound; and (C) a solvent, and further comprising a pigment, wherein:

the dye (A) is a multimer having two or more partial structures derived from a colorant compound, and the colorant compound is at least one selected from the group consisting of a dipyrromethene colorant, an anthraquinone colorant, a triphenylmethane colorant, a xanthene colorant, a cyanine colorant, a squarylium colorant, a quinophthalone colorant, a phthalocyanine colorant and a subphthalocyanine colorant, the pigment is at least one selected from a group consisting of C.I. Pigment Violet 23, C.I. Pigment Blue 15:3, and C.I. Pigment Blue 15:6, and the multimer contains a repeating unit having an ethylenically unsaturated bond after polymerization.

2. The radiation-sensitive colored composition according to claim 1, further comprising (D) a polymerization initiator.

3. The radiation-sensitive colored composition according to claim 2, wherein the polymerization initiator is an oxime-based compound.

4. The radiation-sensitive colored composition according to claim 1, further comprising an alkali-soluble resin.

5. The radiation-sensitive colored composition according to claim 1, wherein the dye (A) is a dye obtained through a dissolution process of dissolving the dye in a good solvent, and a reprecipitation process of adding a solution of the dye dropwise to a poor solvent to reprecipitate the dye.

6. The radiation-sensitive colored composition according to claim 1, wherein the dye (A) is a dye obtained through a dissolution process of dissolving the dye in a heated solvent, and a reprecipitation process of cooling a solution of the dye to reprecipitate the dye.

7. A colored cured film obtained by curing the radiation-sensitive colored composition according to claim 1.

8. A color filter comprising the colored cured film according to claim 7.

9. A solid-state imaging device equipped with the color filter according to claim 8.

10. A liquid crystal display apparatus equipped with the color filter according to claim 8.

11. A method of producing a color filter, the method comprising:

(A) applying the radiation-sensitive colored composition according to claim 1 onto a support to form a radiation-sensitive colored composition layer; and (B) exposing the radiation-sensitive colored composition layer formed in the process (A) via a mask, and then developing the exposed layer to form a patternwise colored cured film.

12. The radiation-sensitive colored composition according to claim 1, wherein the colorant compound is a dipyrromethene colorant and/or a xanthene colorant.

13. The radiation-sensitive colored composition according to claim 1, wherein the multimer includes a constitutional unit represented by the following general formulae (A), (A)

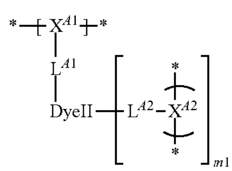

wherein in the general formula (A), $X^{A1}$ represents a linking group formed by polymerization; $L^{A1}$ represents a single bond or a divalent linking group; DyeII represents a color structure; $X^{A2}$ represents a linking group formed by polymerization; $L^{A2}$ represents a single bond or a divalent linking group; and m1 represents 0.

14. The radiation-sensitive colored composition according to claim 1, wherein the repeating unit having an ethylenically unsaturated bond is at least one selected from the group consisting of the following repeating units (G-1) to (G-11):

(G-1)

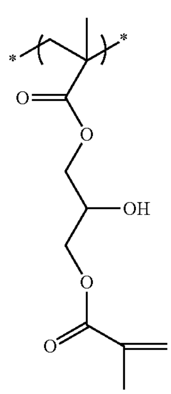

-continued (G-2)

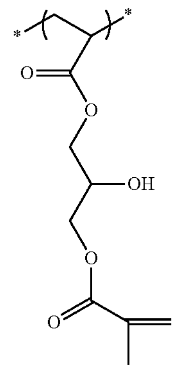

(G-3)

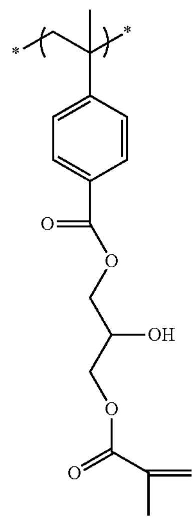

(G-4)

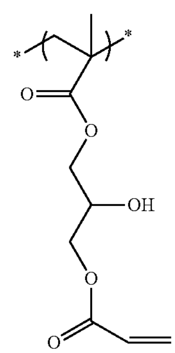

(G-5

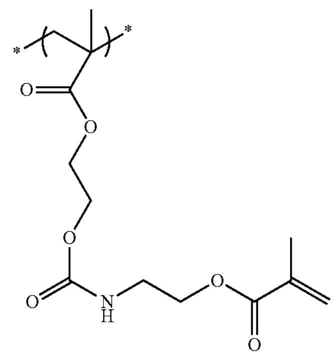

-continued (G-6)

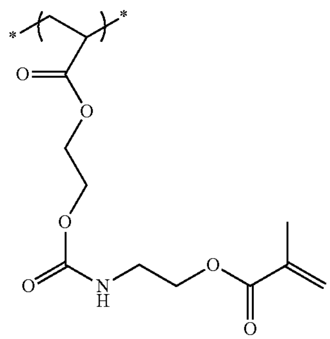

(G-7)

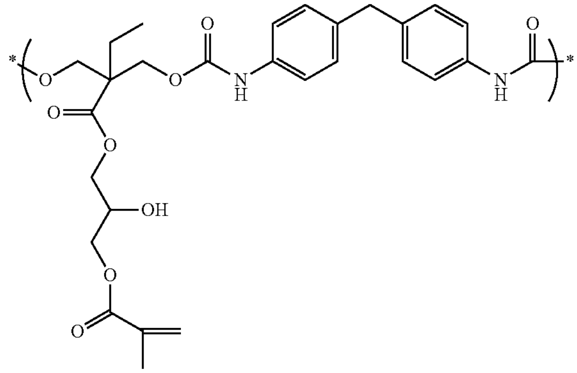

(G-8)

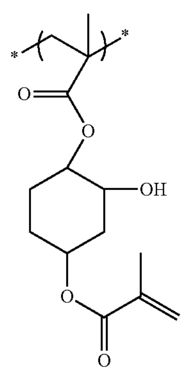

-continued (G-9)

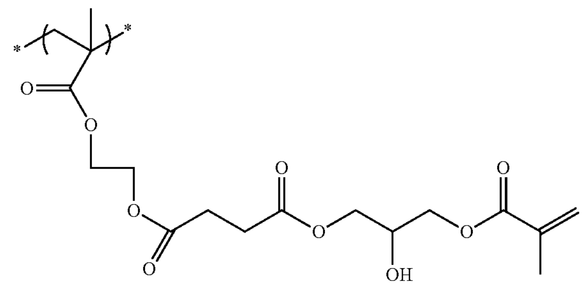

(G-10)

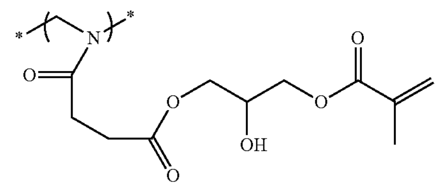

(G-11)

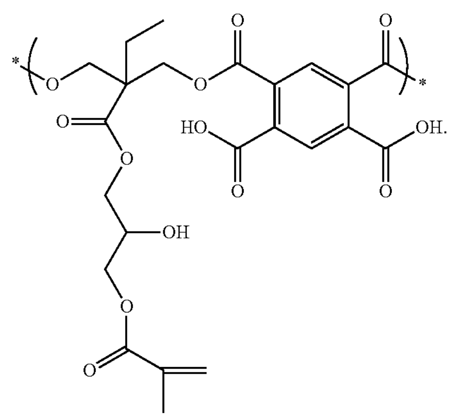

15. The radiation-sensitive colored composition according to claim 1, wherein the dye (A) has an alkali-soluble group and has an acid value of 30 mg KOH/g to 150 mg KOH/g.

16. The radiation-sensitive colored composition according to claim 1, wherein the weight average molecular weight (Mw) of the multimer is in the range of 3000 to 30000.

17. The radiation-sensitive colored composition according to claim 1, wherein the polymerizable compound comprises at least one selected from the group consisting of the following compounds (a) to (f):

(a)

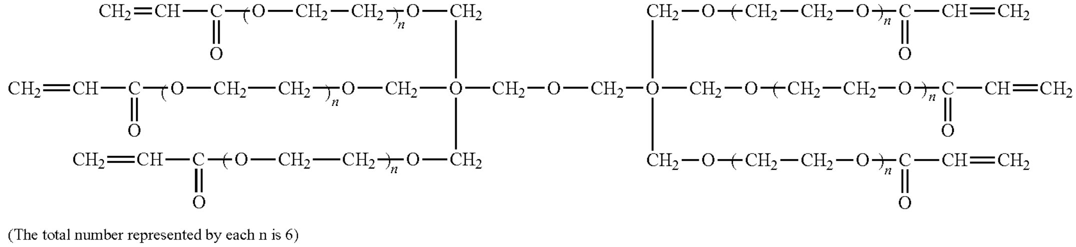

(The total number represented by each n is 6)

-continued
(b)
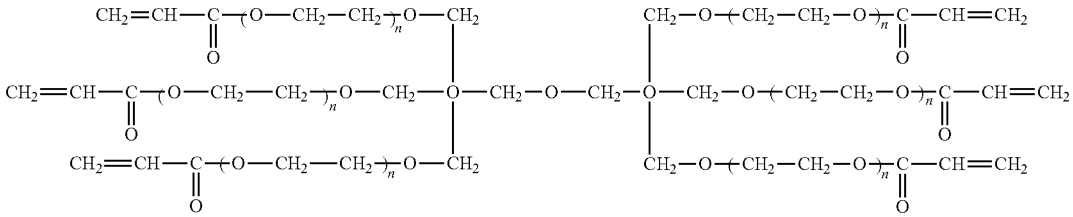
(The total number represented by each n is 12)
(c)
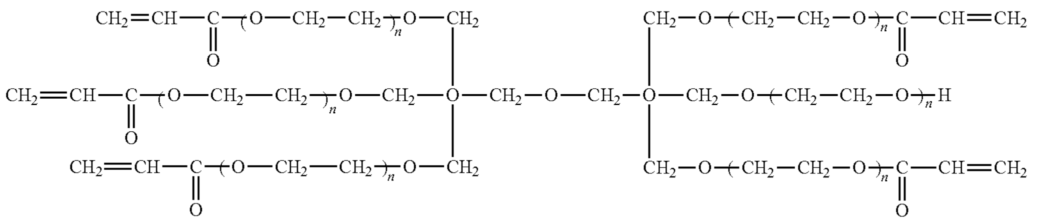
(The total number represented by each n is 12)
(d)
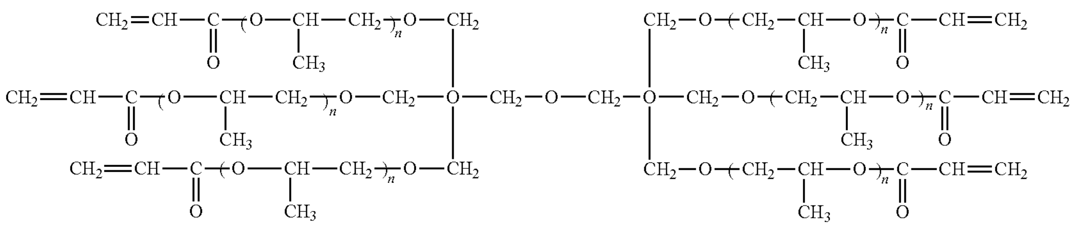
(The total number represented by each n is 6)
(e)
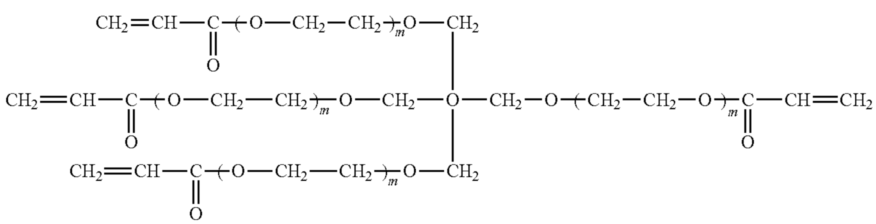
(The total number represented by each n is 4)
(f)
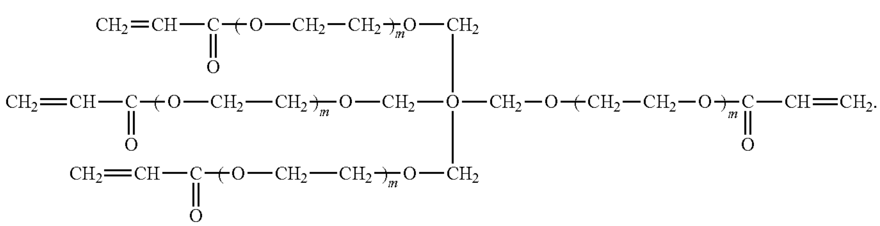
(The total number represented by each n is 12)
* * * * *